US008405172B2

(12) United States Patent
Tsujiuchi et al.

(10) Patent No.: US 8,405,172 B2
(45) Date of Patent: Mar. 26, 2013

(54) SEMICONDUCTOR DEVICE AND SEMICONDUCTOR DEVICE ASSEMBLY

(75) Inventors: Mikio Tsujiuchi, Kanagawa (JP); Masayoshi Tarutani, Tokyo (JP); Yosuke Takeuchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 21 days.

(21) Appl. No.: 13/075,681

(22) Filed: Mar. 30, 2011

(65) Prior Publication Data
US 2011/0241140 A1 Oct. 6, 2011

(30) Foreign Application Priority Data
Mar. 31, 2010 (JP) .................................. 2010-082465

(51) Int. Cl.
*H01L 29/82* (2006.01)
(52) U.S. Cl. .. 257/421; 257/632; 257/758; 257/E29.323
(58) Field of Classification Search .................. 257/421, 257/E29.323, 632, 758, E21.24
See application file for complete search history.

(56) References Cited

U.S. PATENT DOCUMENTS
7,088,610 B2 * 8/2006 Tai .................................. 365/158

2004/0032010 A1 2/2004 Kools et al.
2005/0002267 A1 * 1/2005 Daughton et al. ............ 365/232

FOREIGN PATENT DOCUMENTS
JP 2009-38221 2/2009

* cited by examiner

*Primary Examiner* — Kimberly Rizkallah
*Assistant Examiner* — Timor Karimy
(74) *Attorney, Agent, or Firm* — McDermott Will & Emery LLP

(57) ABSTRACT

A semiconductor device excellent in the magnetic shielding effect of blocking off external magnetic fields is provided. The semiconductor device includes: an interlayer insulating film so formed as to cover a switching element formed over a main surface of a semiconductor substrate; a flat plate-like lead wiring; a coupling wiring coupling the lead wiring and the switching element with each other; and a magnetoresistive element including a magnetization free layer the orientation of magnetization of which is variable and formed over the lead wiring. The semiconductor device has a wiring and another wiring through which the magnetization state of the magnetization free layer can be varied. In a memory cell area where multiple magnetoresistive elements are arranged, a first high permeability film arranged above the magnetoresistive elements is extended from the memory cell area up to a peripheral area that is an area other than the memory cell area.

14 Claims, 132 Drawing Sheets

CLAD

CELL  CELL  PERIPHERAL CIRCUIT PC

CELL  CELL  MEMORY CELL PORTION  VII

CLAD

CLAD  GAP

CELL  CELL  PERIPHERAL CIRCUIT PC

CELL  CELL  MEMORY CELL PORTION

SEMICONDUCTOR DEVICE AND SEMICONDUCTOR DEVICE ASSEMBLY

CROSS-REFERENCE TO RELATED APPLICATIONS

The disclosure of Japanese Patent Application No. 2010-82465 filed on Mar. 31, 2010 including the specification, drawings and abstract is incorporated herein by reference in its entirety.

BACKGROUND OF THE INVENTION

The present invention relates to semiconductor devices and semiconductor device assemblies and in particular to a semiconductor device and a semiconductor device assembly incorporating a magnetoresistive element.

As semiconductor devices such as semiconductor integrated circuits for storage, DRAMs (Dynamic Random Access Memories) and SRAMs (Static Random Access Memories) have been conventionally in wide use. MRAMs (Magnetic Random Access Memories) are devices that store information by magnetism and are superior to other memory technologies in high-speed operation, rewriting resistance, nonvolatility, and the like.

The MRAM incorporates a magnetoresistive element designated as MTJ (Magnetic Tunnel Junction) element utilizing the TMR (Tunneling Magnetoresistive) effect and stores information by the magnetization state of the magnetoresistive element. The magnetoresistive elements are arranged in areas where digit lines extended, for example, in one direction and bit lines extended in the direction substantially orthogonal thereto intersect with each other and are formed in an array configuration. In each magnetoresistive element, two magnetic layers are laminated with a tunnel insulating film in between. Each magnetoresistive element includes a layer the direction of magnetization of which is varied by a magnetic field generated by currents passed through a digit line and a bit line. The magnetoresistive element stores this direction of magnetization as information. The electrical resistance of the magnetoresistive element is varied according to the magnetization direction of this layer. The information stored in the magnetoresistive element is detected by detecting change in the current passed through the magnetoresistive element by this variation in electrical resistance.

In general, a cladding layer including a high permeability film comprised of a thin film formed of a material high in magnetic permeability is arranged over the side surfaces and upper surfaces of wirings such as bit lines. This is intended to intensively supply a magnetoresistive element with a magnetic field generated by currents passed through a bit line and the like in the above-mentioned semiconductor device. It is further intended to shield a magnetic field supplied to that magnetoresistive element against magnetic fields generated by currents passed through bit lines and the like other than the desired bit line.

For example, in the semiconductor device described in Japanese Unexamined Patent Publication No. 2009-38221 (Patent Document 1), a high permeability film is formed above the bit line of each magnetic memory element with an insulating film in between. The high permeability film arranged above a bit line as mentioned above has a role to block off magnetic fields (external magnetic fields) generated by currents passed through bit lines other than the relevant bit line so that the following is implemented: problems that arise when the magnetoresistive element arranged under the bit line is influenced by the external magnetic fields are suppressed.

For example, in the semiconductor device described in US 2004/0032010A1 (Patent Document 2), a shielding layer (equivalent to a high permeability film) formed of amorphous soft magnetic material is arranged above an MRAM device. Layers formed of amorphous soft magnetic material as mentioned above have a role to suppress reduction in magnetic permeability due to eddy current or ferromagnetic resonance and suppress degradation in the functionality of MRAM devices.

[Patent Document 1]
Japanese Unexamined Patent Publication No. 2009-38221
[Patent Document 2]
US 2004/0032010A1

SUMMARY OF THE INVENTION

In the above-mentioned semiconductor device, two areas are formed as viewed in a plane. One is a memory cell portion (memory cell area), where multiple magnetoresistive elements are arranged and multiple bit lines, digit lines, and the like are arranged so that they intersect with each other. The other is a peripheral circuit portion (peripheral area) that is the area other than the memory cell portion and arranged in the outer region of the memory cell portion.

The memory cell portion is an area where information is written to a magnetoresistive element and information written to each magnetoresistive element is read. The peripheral circuit portion is an area for carrying out the following processing: a desired magnetoresistive element is selected from among the multiple magnetoresistive elements arranged in the memory cell portion to read or write data; and electrical information in the memory cell portion or current is supplied to an external load through an electrode pad. As disclosed in Japanese Unexamined Patent Publication No. 2009-38221, for example, the following measure is taken in the direction (vertical direction) of lamination of the layers comprising a semiconductor device: wiring similar to bit lines is arranged in the peripheral circuit portion at substantially the same height as the bit line.

However, in the semiconductor device disclosed in Japanese Unexamined Patent Publication No. 2009-38221, the following measure is not taken though a high permeability film is arranged above the bit lines in the memory cell portion: a high permeability film is arranged above wiring (at substantially the same height as the bit lines) in the peripheral circuit portion.

With respect to the semiconductor device described in US 2004/0032010A1, only the memory cell portion is disclosed but no peripheral circuit portion is disclosed. In this patent publication, however, it is explicitly stated that a shielding layer is arranged directly above and directly under an MRAM device and in proximity thereto. Also with respect to this semiconductor device, therefore, it is presumed that a shielding layer is not arranged in the peripheral circuit portion.

In the above-mentioned cases, a high permeability film is arranged only above the wiring in the memory cell portion but a high permeability film is not arranged above the wiring in the peripheral circuit portion. In these cases, an external magnetic field (a magnetic field from outside a semiconductor chip) such as a stray magnetic field can have influence on the magnetoresistive elements of the memory cell portion. There is a higher possibility that it has influence on, especially, magnetoresistive elements arranged in an area in proximity to a memory cell end of the memory cell portion.

The invention has been made in consideration with the above problem. It is an object thereof to provide a semiconductor device with the enhanced effect of blocking off a magnetic field arising from an external magnetic field such as a stray magnetic field (magnetic shielding effect). It is another object thereof to provide a semiconductor device assembly using this semiconductor device.

A semiconductor device in an embodiment of the invention includes the following constituent elements: a semiconductor substrate; a switching element formed over the main surface of the semiconductor substrate; an interlayer insulating film so formed as to cover the switching element; a flat plate-like lead wiring formed over the interlayer insulating film; a coupling wiring coupling the lead wiring and the switching element with each other; a magnetoresistive element including a magnetization free layer with the orientation of magnetization variable and formed over the lead wiring; and a wiring that is positioned above the magnetoresistive element and extended toward the direction along the main surface of the semiconductor substrate and makes it possible to change the magnetization state of the magnetization free layer. In the memory cell area where multiple magnetoresistive elements are arranged, a first high permeability film arranged above the magnetoresistive elements is extended from the memory cell area to the peripheral area as the area other than the memory cell area.

According to this embodiment, the wiring in the peripheral area is also covered with the first high permeability film from above similarly to the wirings, such as the bit lines, in the memory cell area. For this reason, magnetic fields, such as stray magnetic fields, from outside the semiconductor chip are blocked off by the first high permeability film arranged above the wiring in the peripheral area. The following is implemented by the effect of blocking off external magnetic fields (magnetic shielding effect) brought about by the first high permeability film arranged in the peripheral area: magnetic flux externally entering the first high permeability film in the peripheral area is once collected in the first high permeability film and then guided to the outside again. Therefore, it is possible to reduce a possibility that an external magnetic field, such as a stray magnetic field, arrives at the magnetoresistive elements in the memory cell area and has influence on the magnetoresistive elements.

BRIEF DESCRIPTION OF THE DRAWINGS

FIG. 114 is a schematic sectional view illustrating a mode of the peripheral circuit portion at the same manufacturing process step as in FIG. 112;

FIG. 115 is a schematic sectional view illustrating a first manufacturing process step for forming a marking area;

FIG. 116 is a schematic sectional view illustrating a manufacturing process step subsequent to the manufacturing process step illustrated in FIG. 115;

FIG. 117 is a schematic sectional view illustrating a manufacturing process step subsequent to the manufacturing process step illustrated in FIG. 116;

FIG. 118(A) is a schematic sectional view illustrating a first manufacturing process step for forming a marking area by a method different from that in FIG. 115 to FIG. 117;

FIG. 118(B) is a schematic sectional view illustrating a manufacturing process step subsequent to the manufacturing process step illustrated in FIG. 118(A);

FIG. 119 is an enlarged schematic diagram illustrating the configuration of the same memory cell portion and peripheral circuit portion as in FIG. 2, as viewed in a plane, in a sixth embodiment of the invention;

FIG. 120(A) is an enlarged schematic diagram illustrating a mode of the upper cladding layer, as viewed in a plane, covering the memory cell portion and the peripheral circuit portion from above in the sixth embodiment of the invention;

FIG. 120(B) is an enlarged schematic diagram illustrating a mode of the lower cladding layer, as viewed in a plane, covering the memory cell portion and the peripheral circuit portion from above in the sixth embodiment of the invention;

FIG. 120(C) is an enlarged schematic diagram illustrating a mode of the memory cell portion and the peripheral circuit portion, as viewed in a plane, covered with the cladding layers in FIGS. 120(A) and 120(B) from above in the sixth embodiment of the invention;

FIG. 121 is a schematic sectional view illustrating a mode of a magnetoresistive element arranged in the memory cell portion, as viewed from the same direction as in FIG. 5, in the sixth embodiment of the invention;

FIG. 122 is a schematic sectional view taken along line CXXII-CXXII of FIG. 121;

Figure 2:
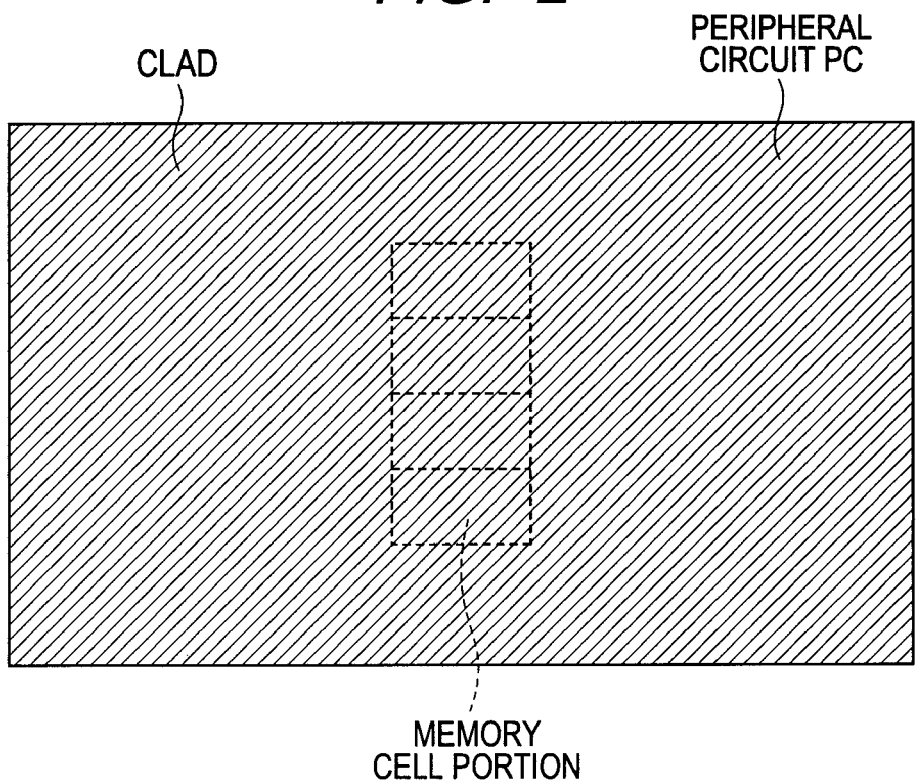
FIG. 2 is an enlarged schematic diagram illustrating the configuration of the area "II" encircled with a broken line in FIG. 1, that is, the memory cell portion and the peripheral circuit portion in the first embodiment of the invention as viewed in a plane.
Figure 5:
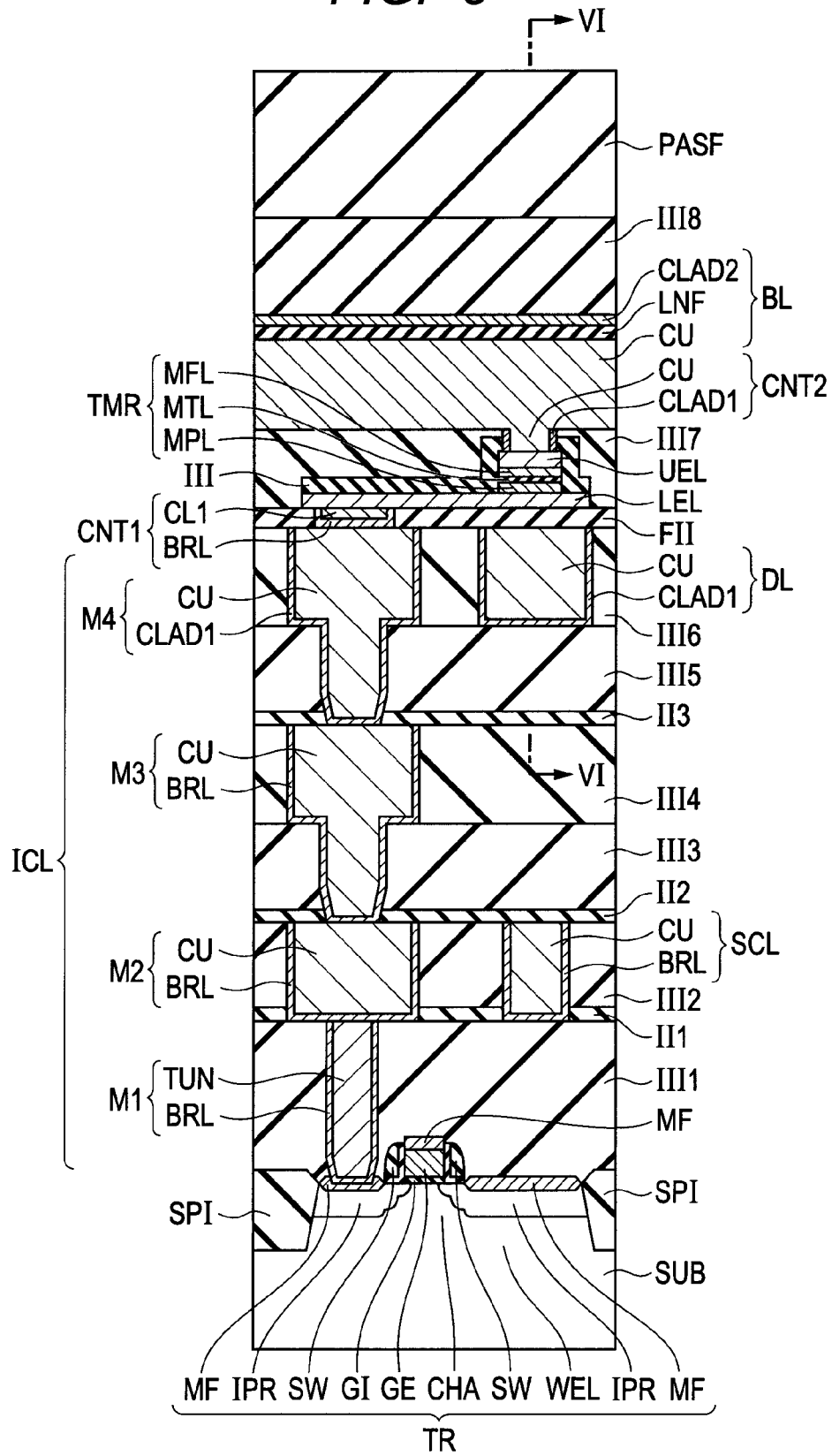
FIG. 5 is a schematic sectional view taken along line V-V of FIG. 4.
Figure 7:
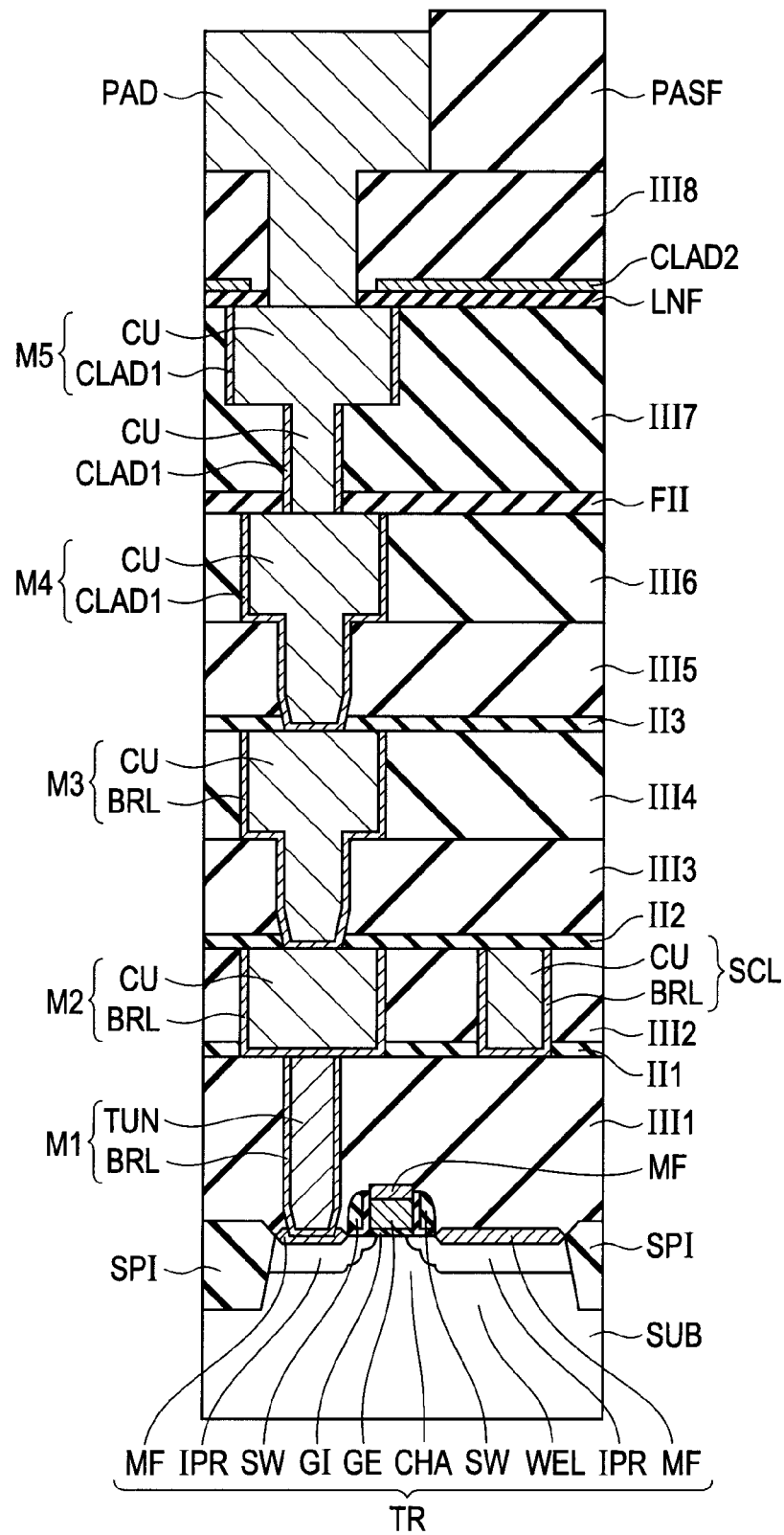
FIG. 7 is a schematic sectional view of a peripheral circuit portion "VII" encircled with a broken line in FIG. 3(B), similar to FIG. 5 and FIG. 6.
Figure 53:
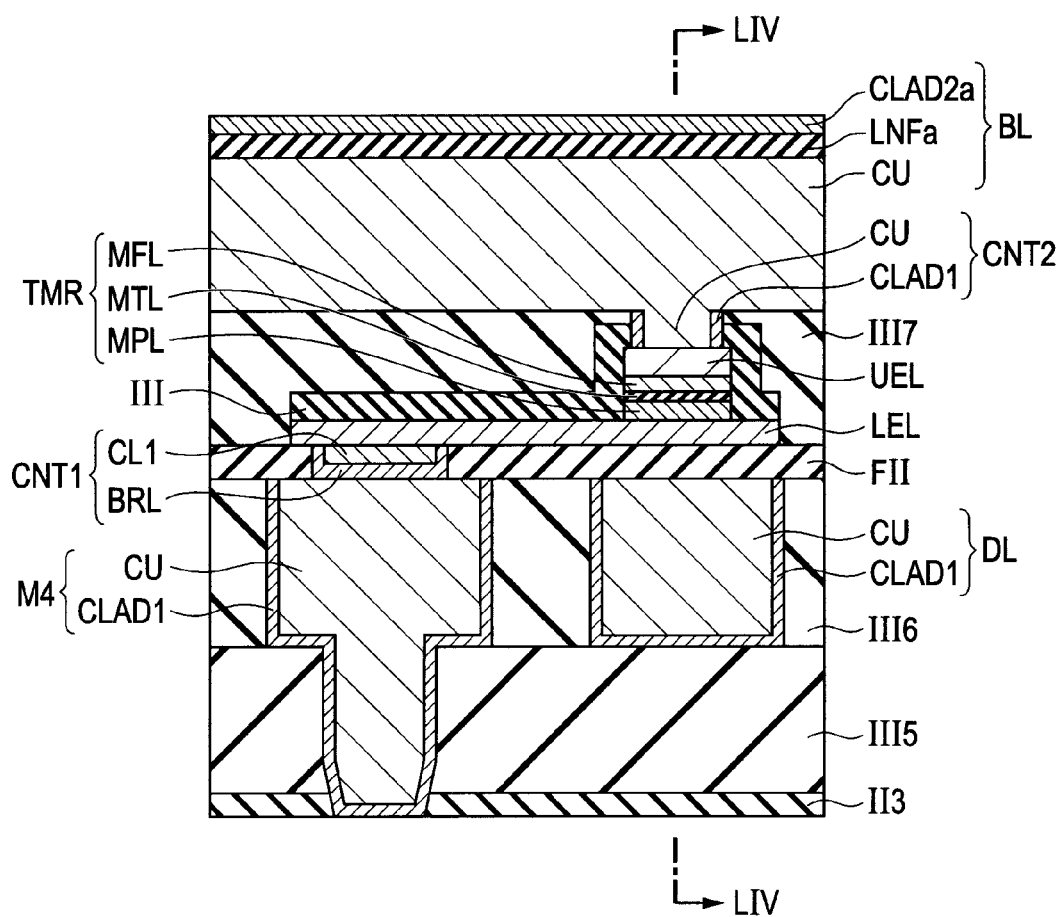
FIG. 53 is a schematic sectional view illustrating a manufacturing process step subsequent to the manufacturing process step illustrated in FIG. 50.
Figure 120A:
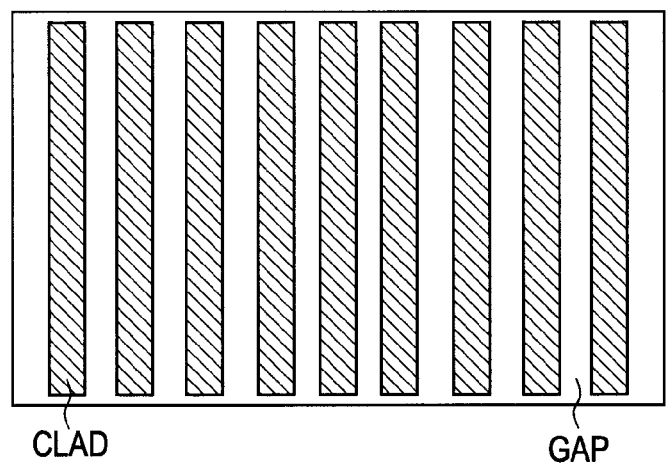
Figure 120B:
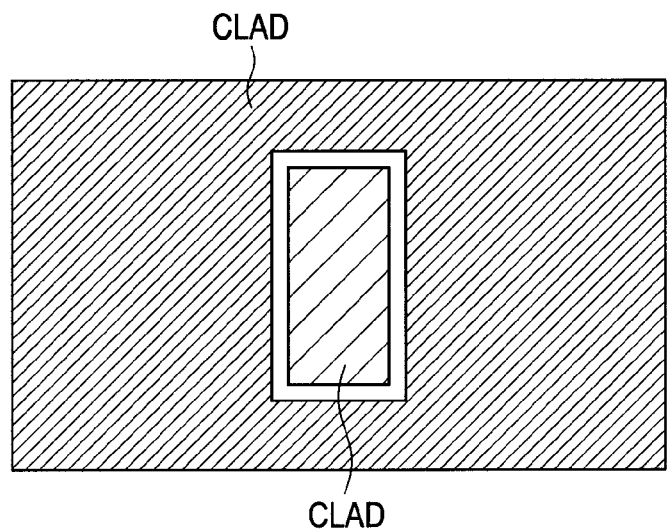
Figure 120C:
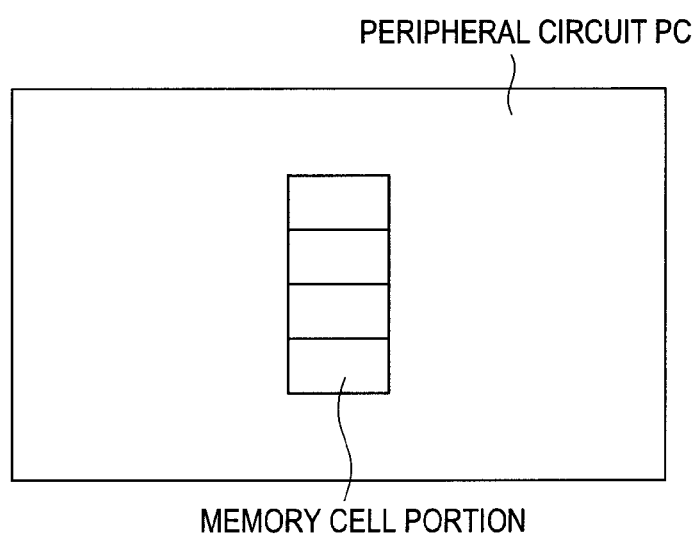
Figure 123:
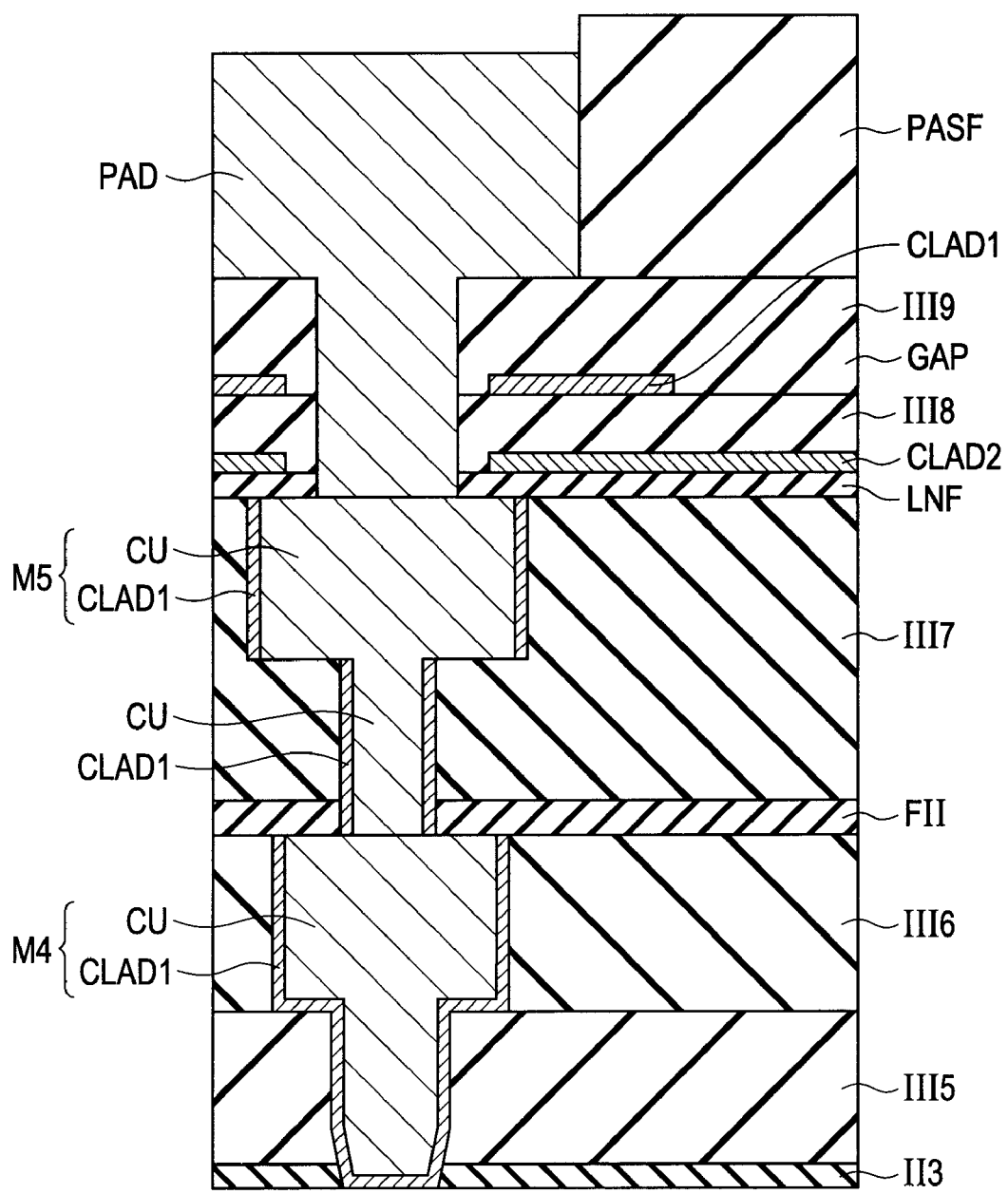
Figure 124A:
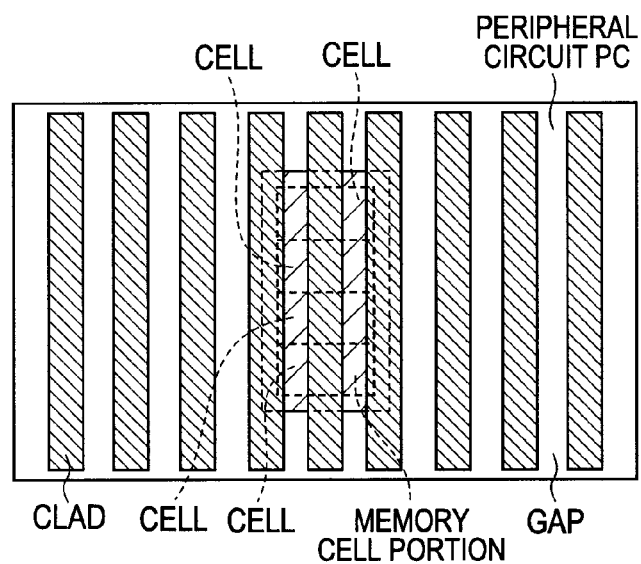
Figure 124B:
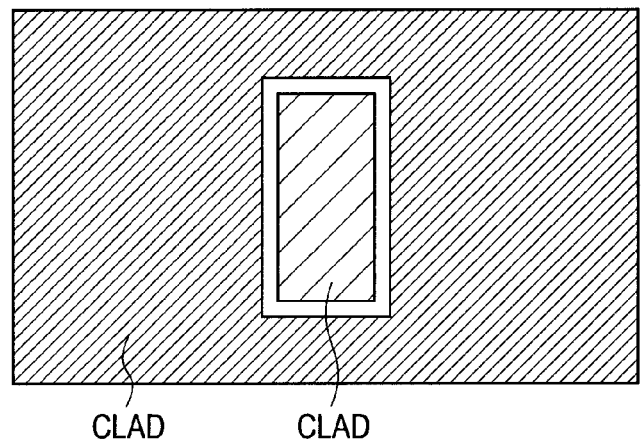
Figure 124C:
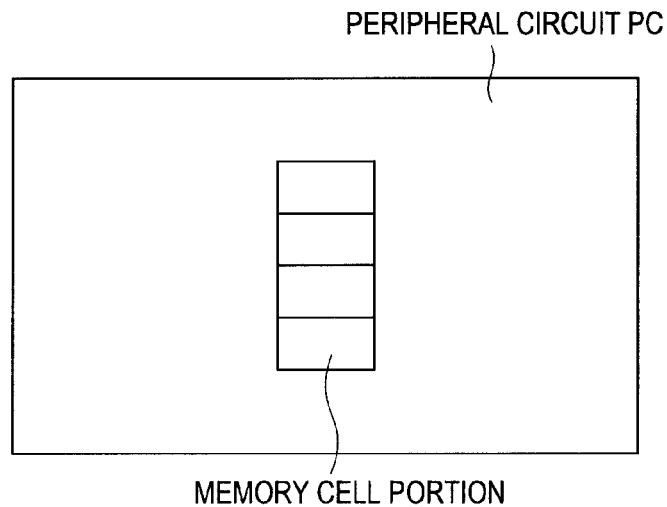
Figure 125A:
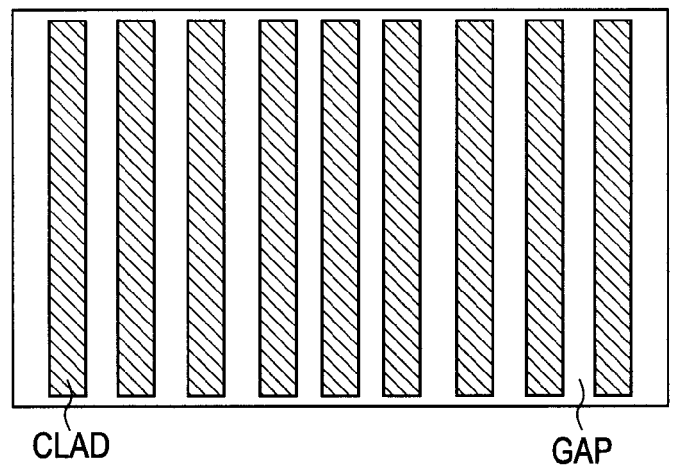
Figure 125B:
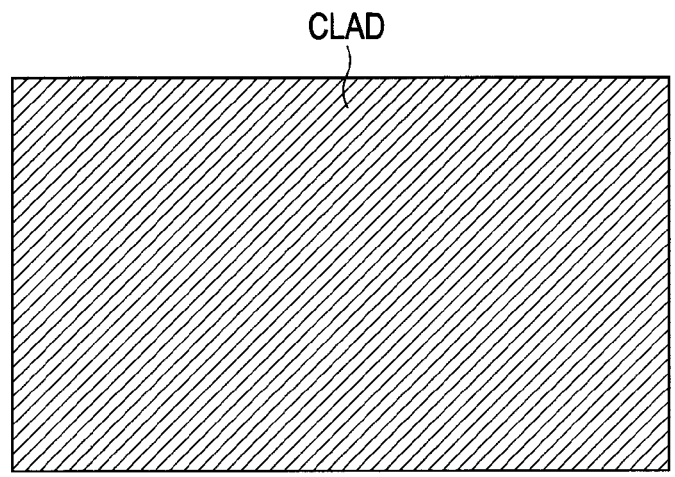
Figure 125C:
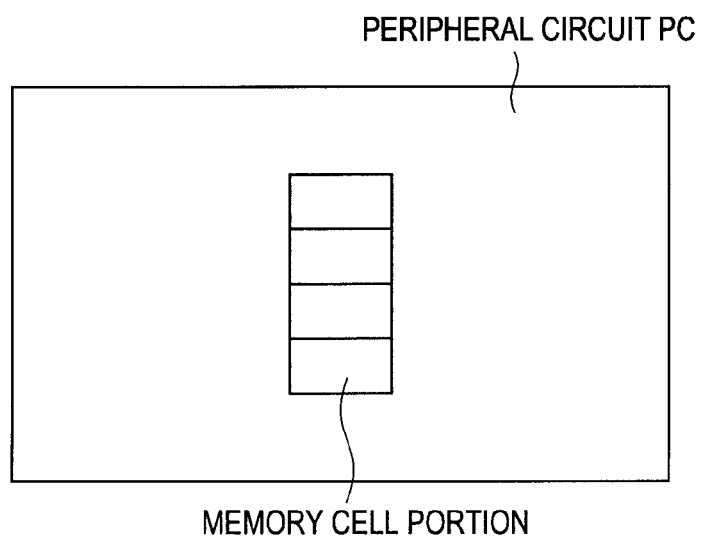
Figure 126:
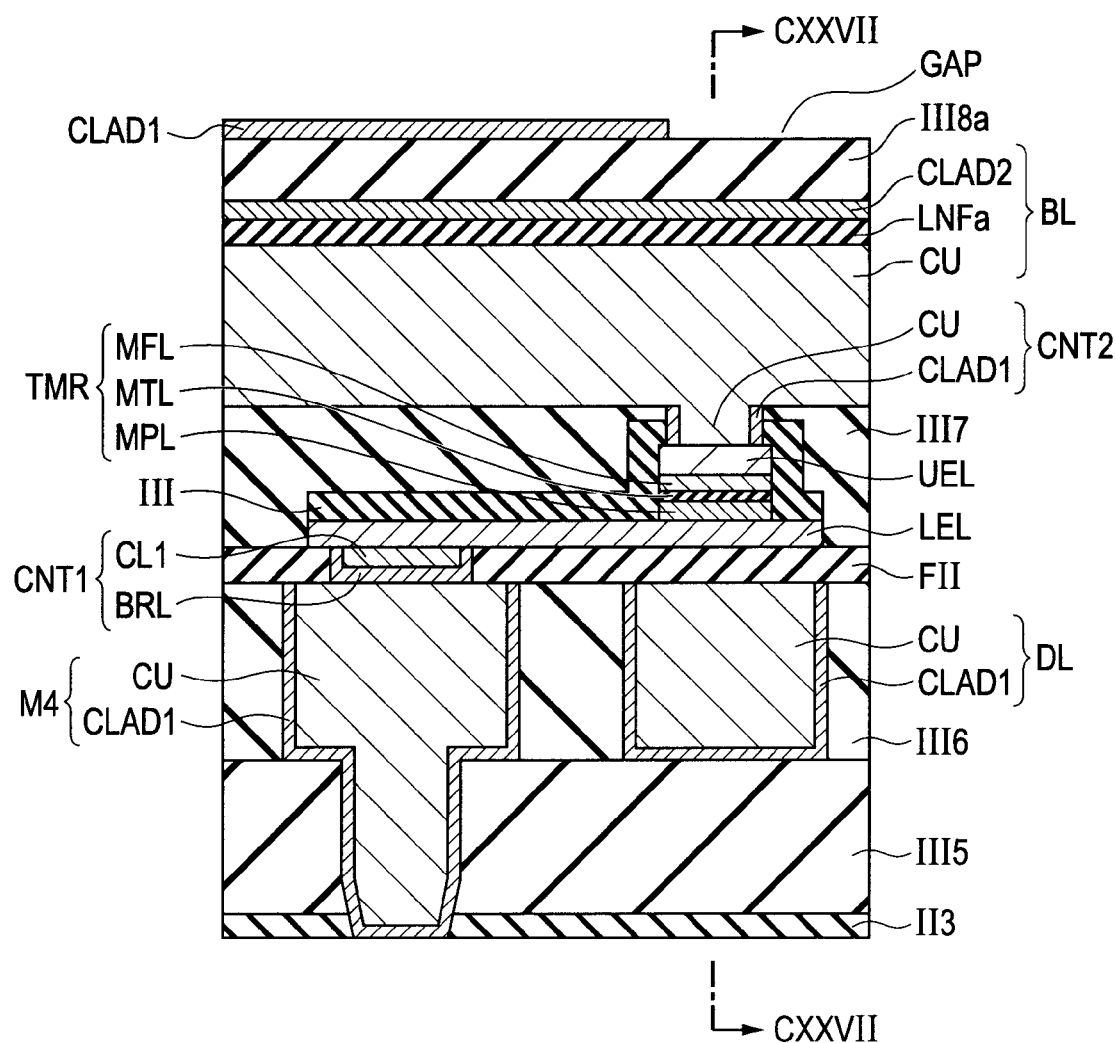
Figure 127:
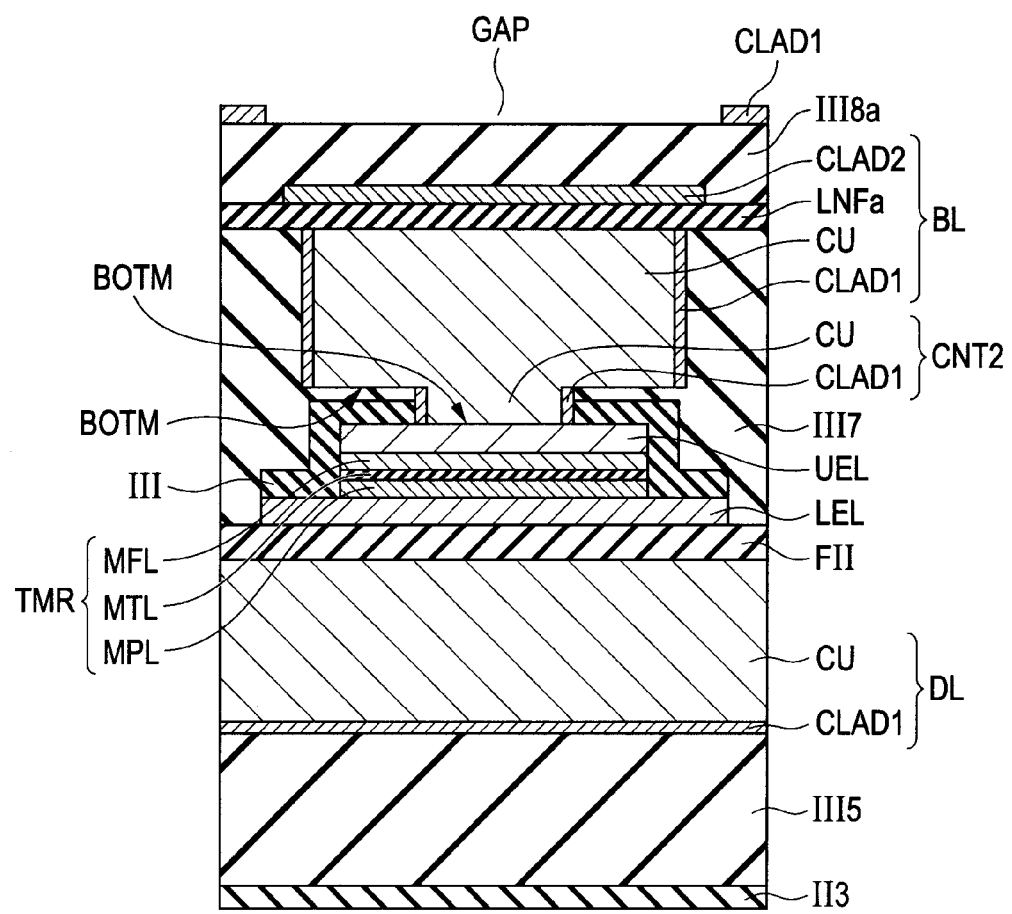
Figure 128:
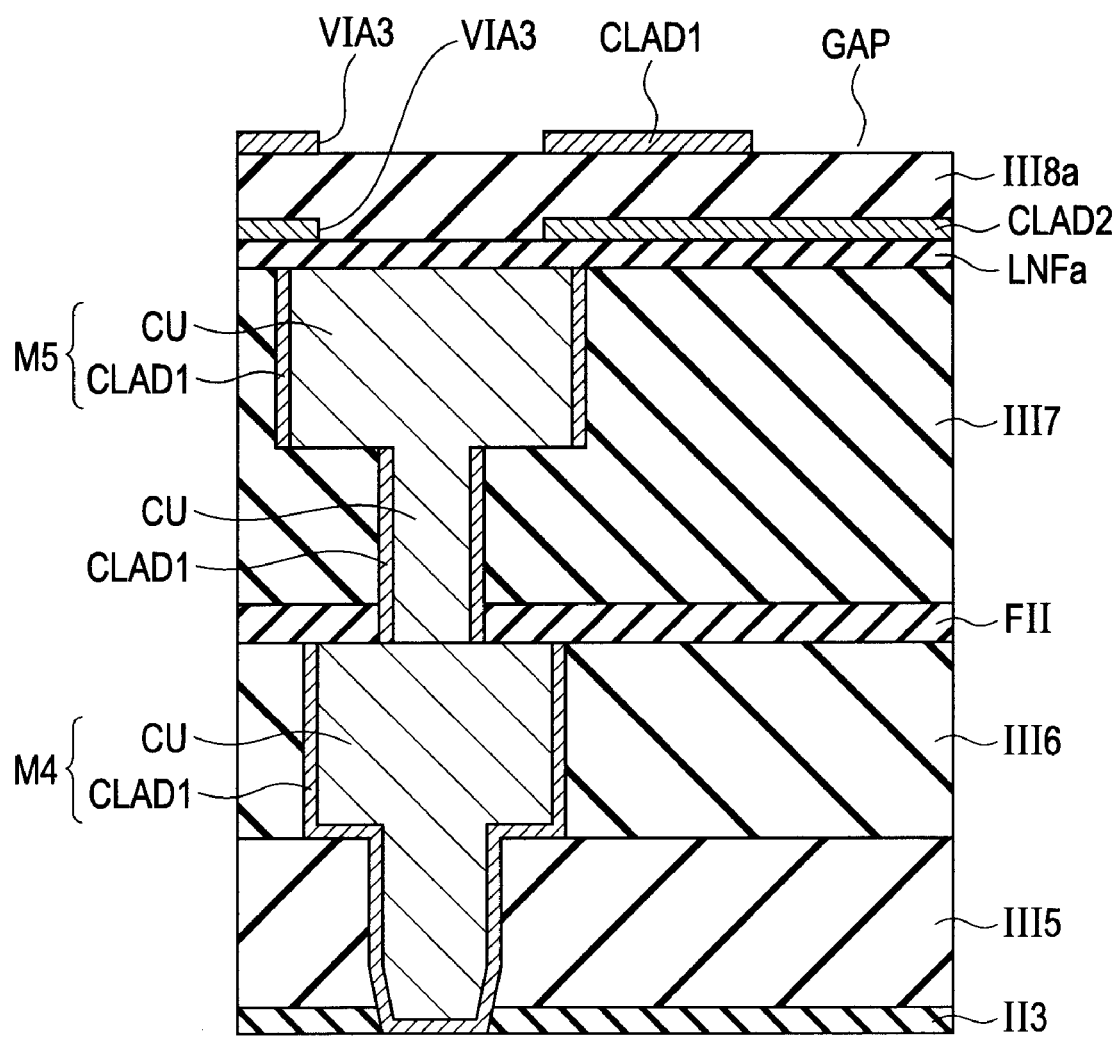
Figure 129:
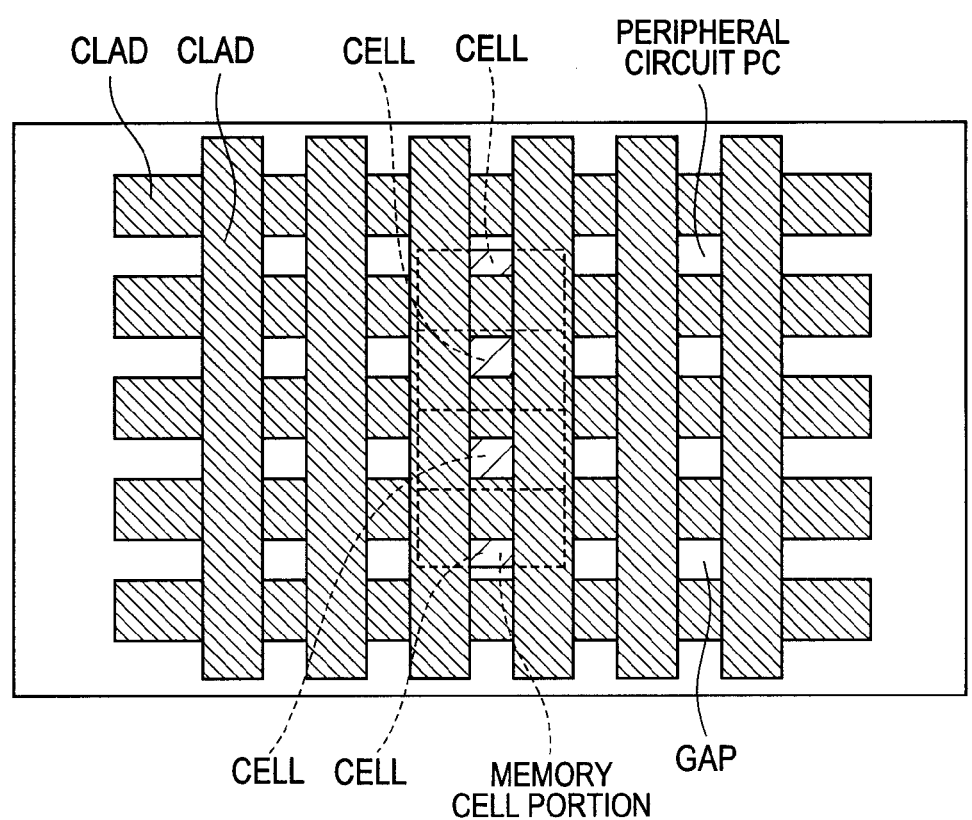
Figure 130A:
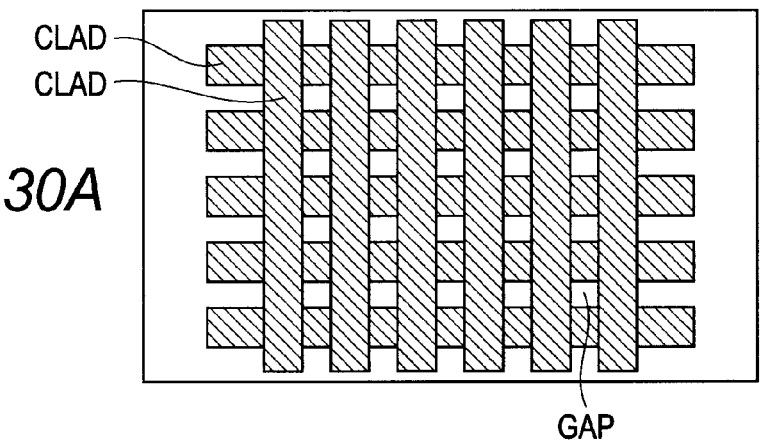
Figure 130B:
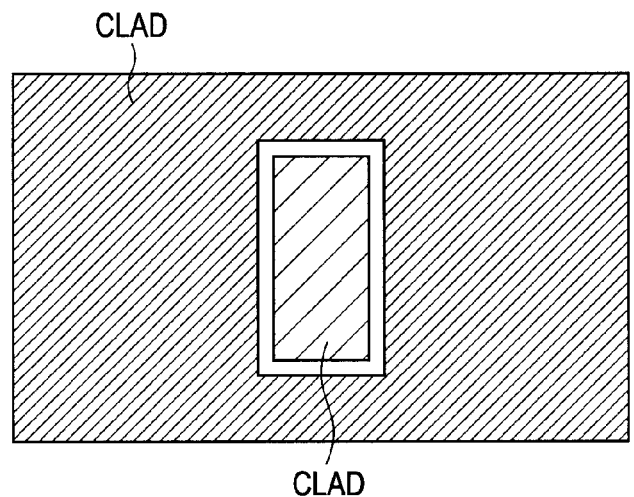
Figure 130C:
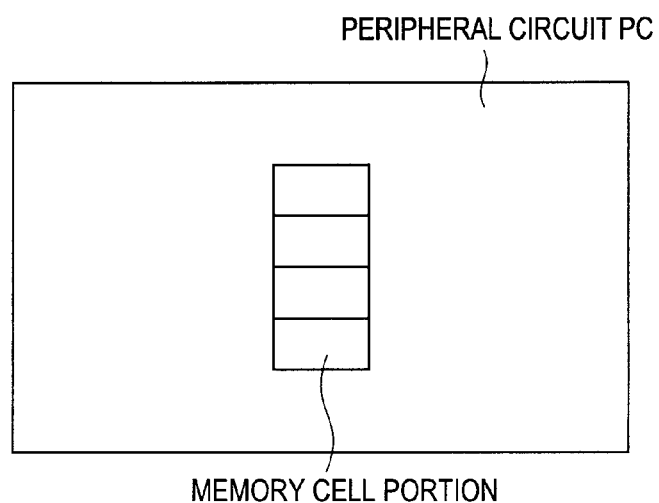
Figure 131A:
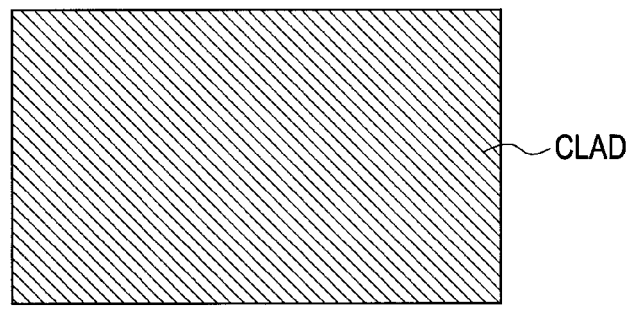
Figure 131B:
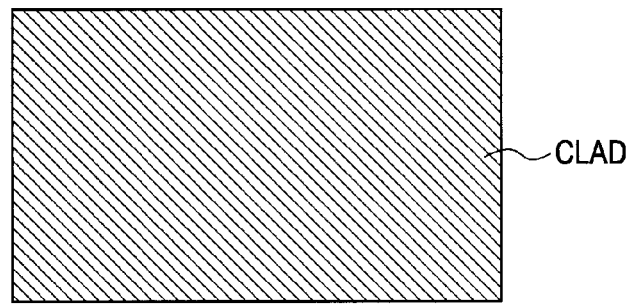
Figure 131C:
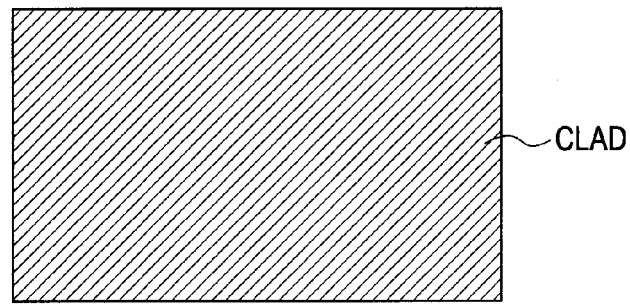
Figure 131D:
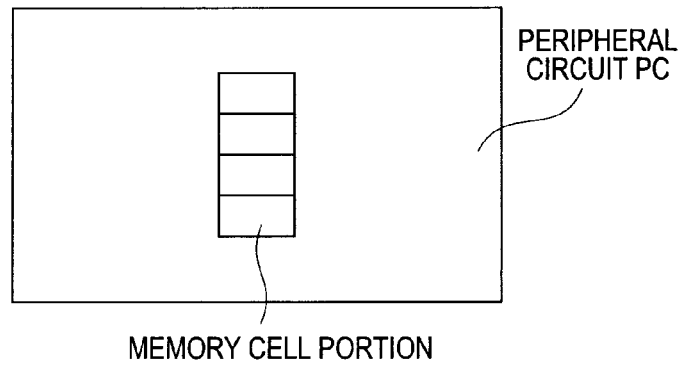
Figure 132:
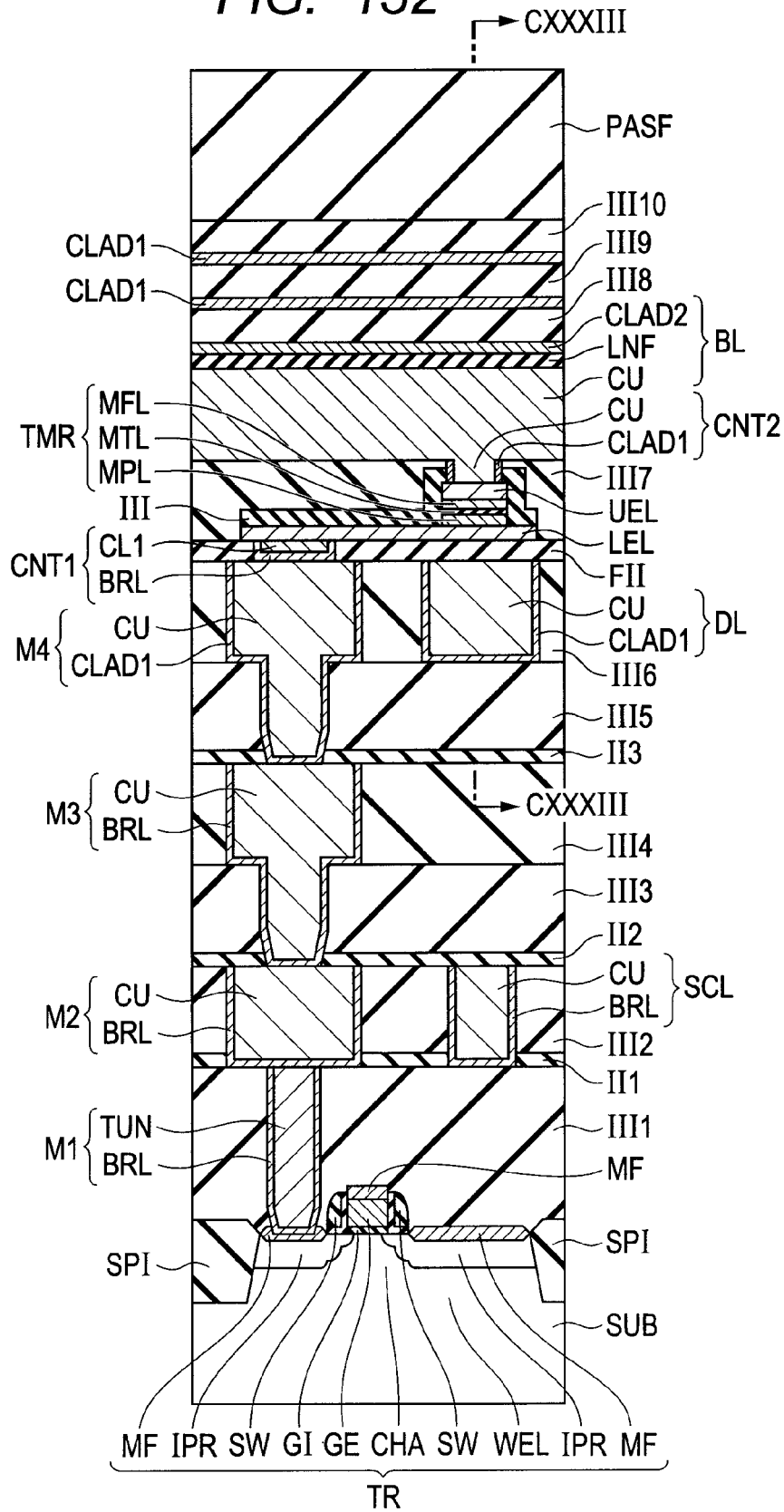
Figure 133:
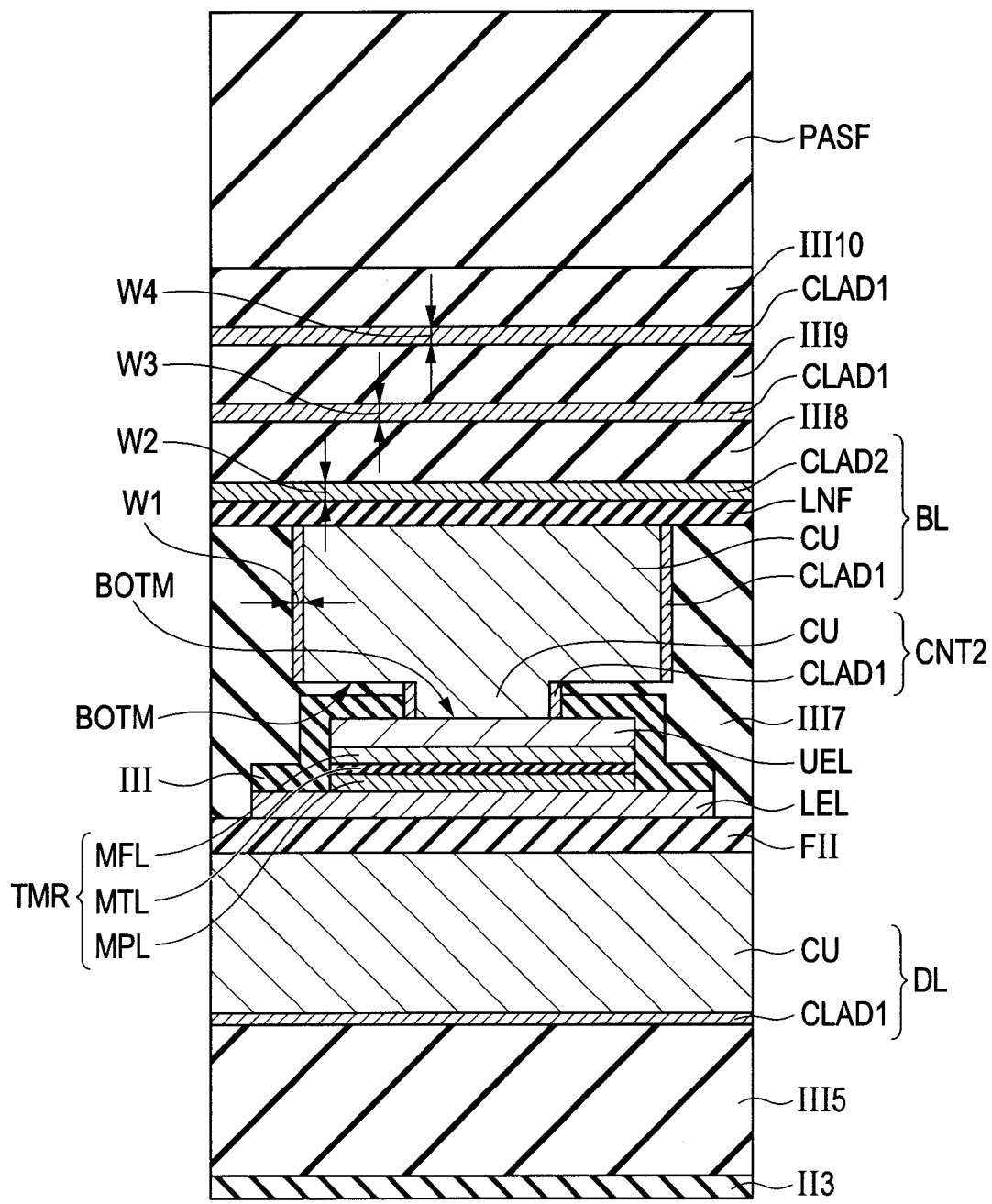
Figure 134:
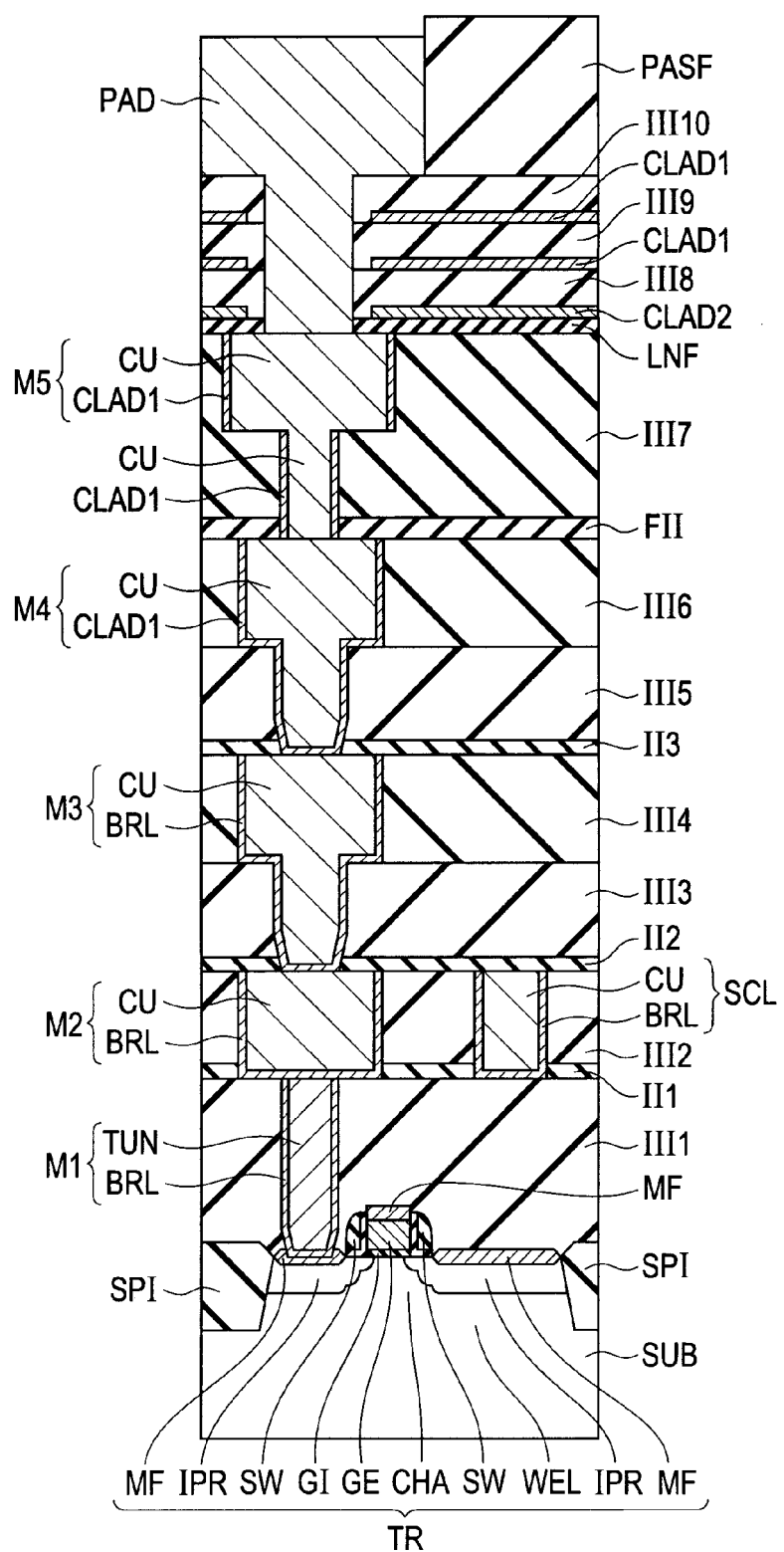
Figure 135:
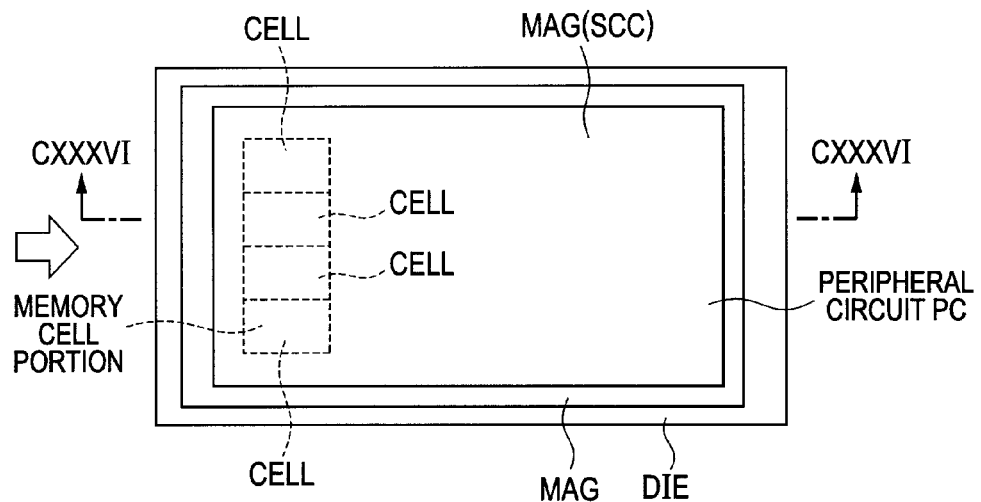
Figure 136:
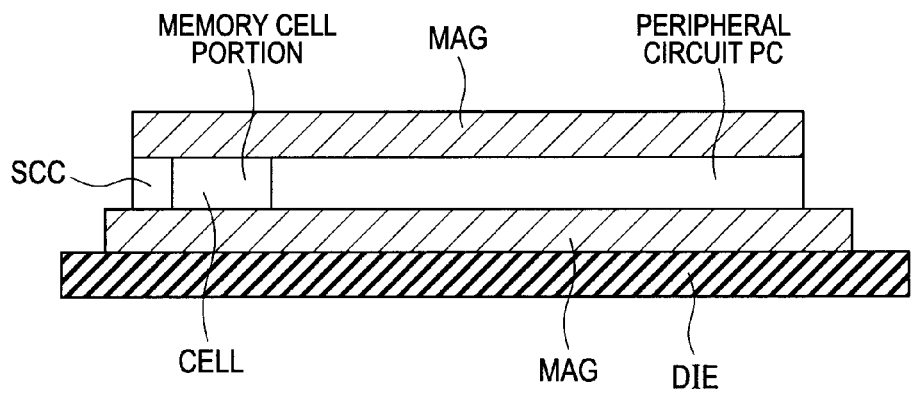
Figure 137:
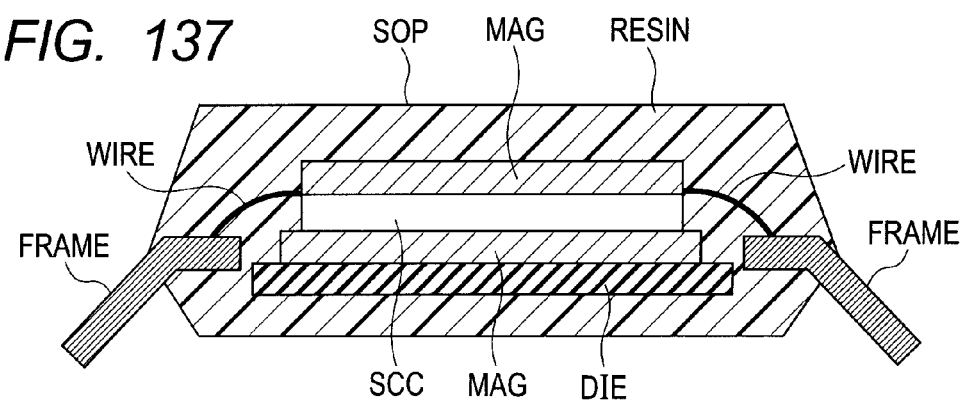
Figure 138:
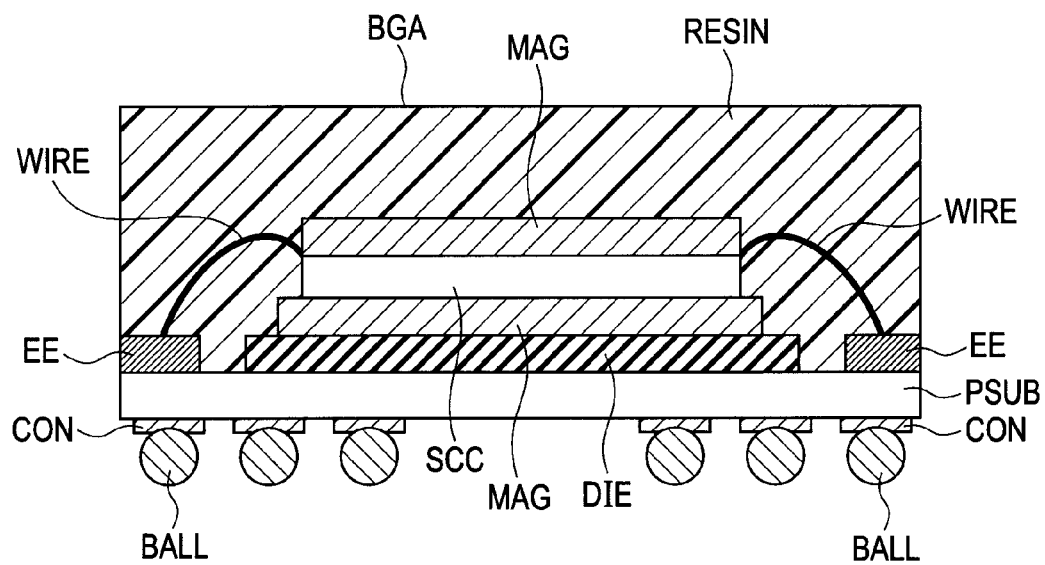
Figure 139:
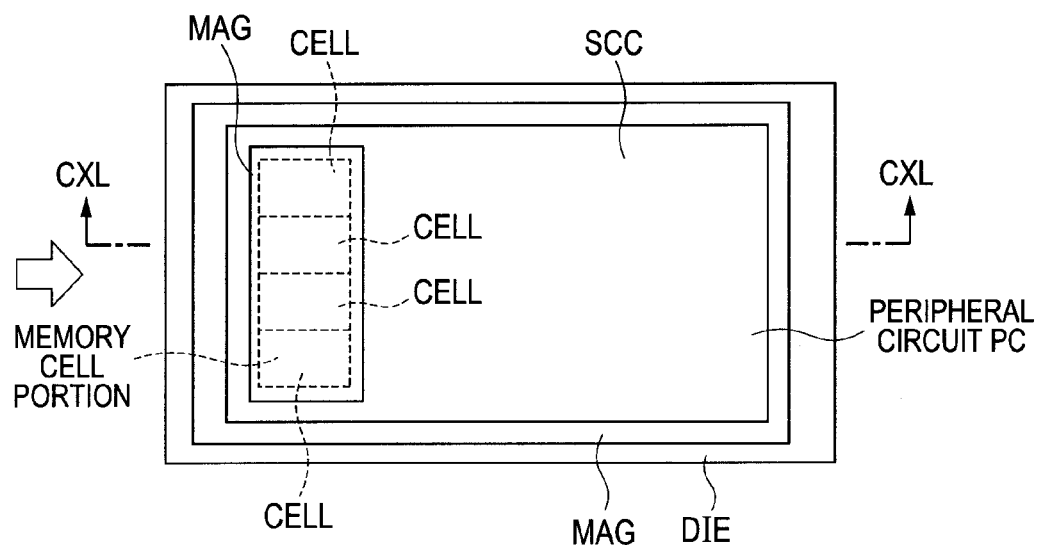
Figure 140:
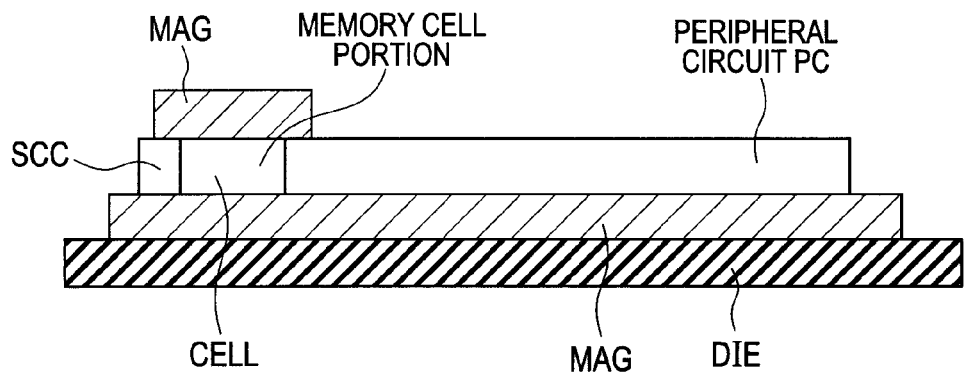
Figure 141:
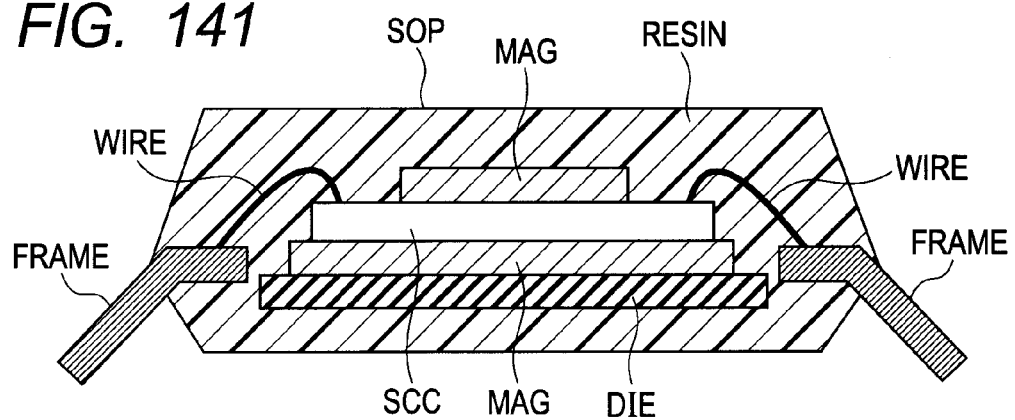
Figure 142:
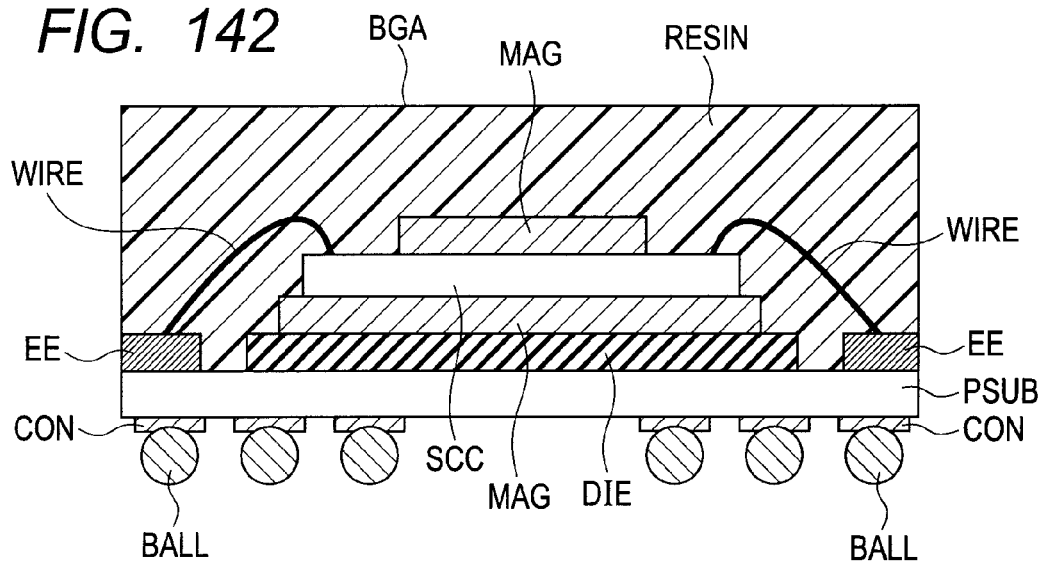
Figure 143:
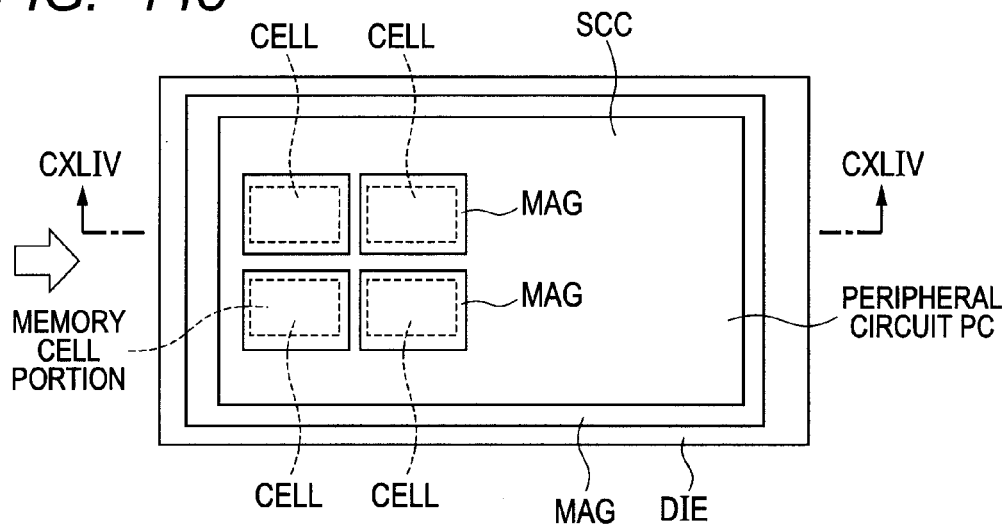
Figure 144:
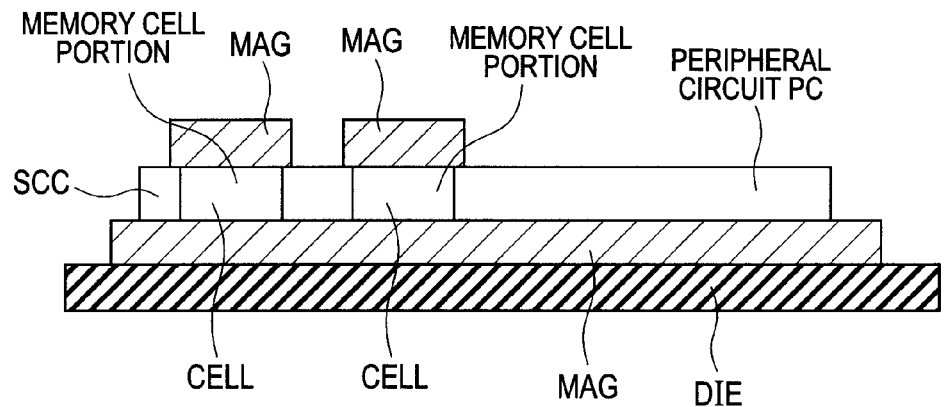
Figure 145:
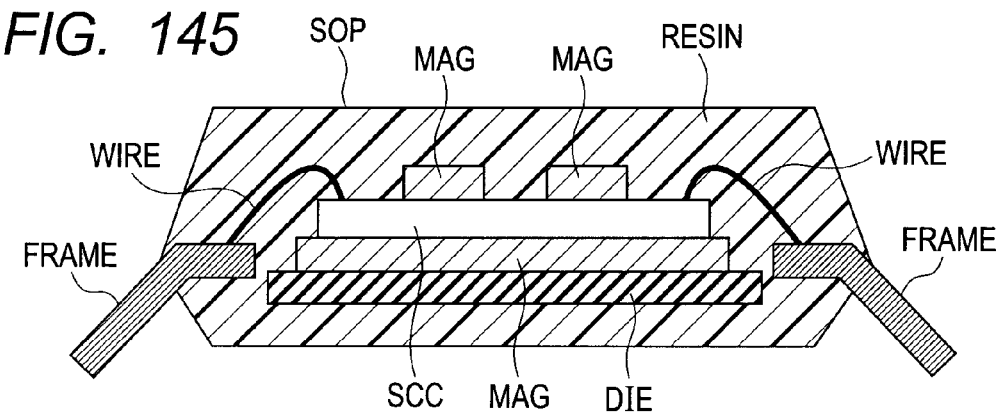
Figure 146:
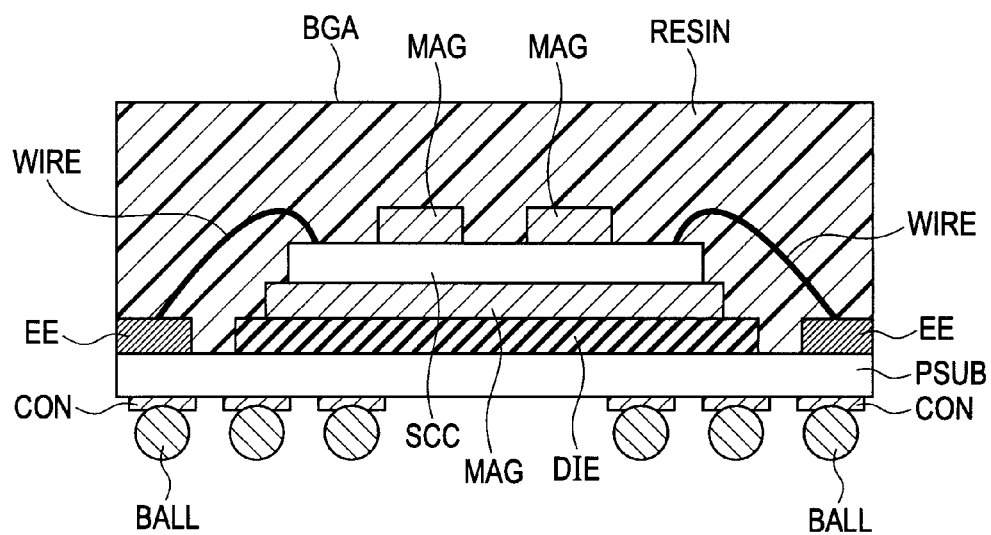
Figure 147:
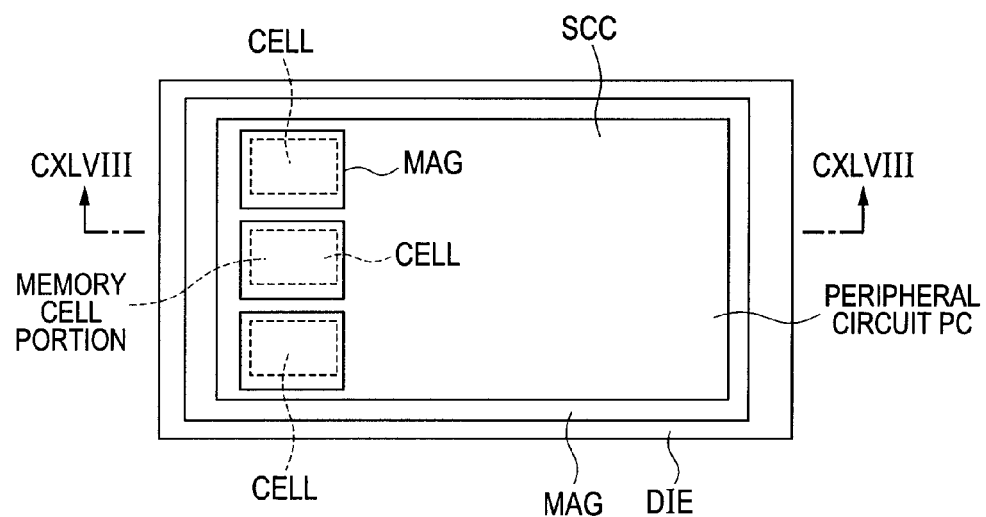
Figure 148:
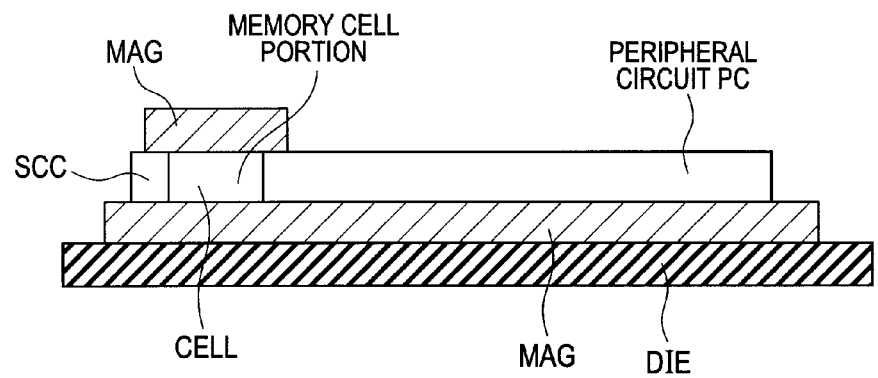
Figure 149:
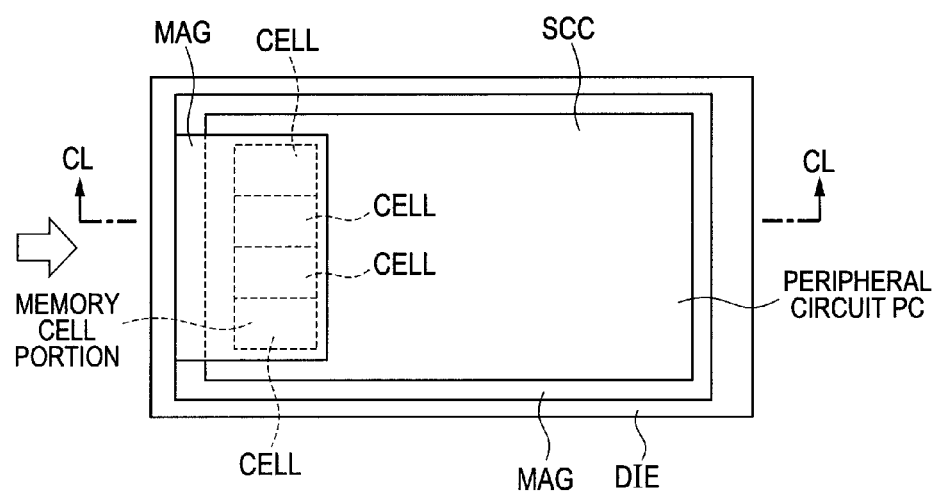
Figure 150:
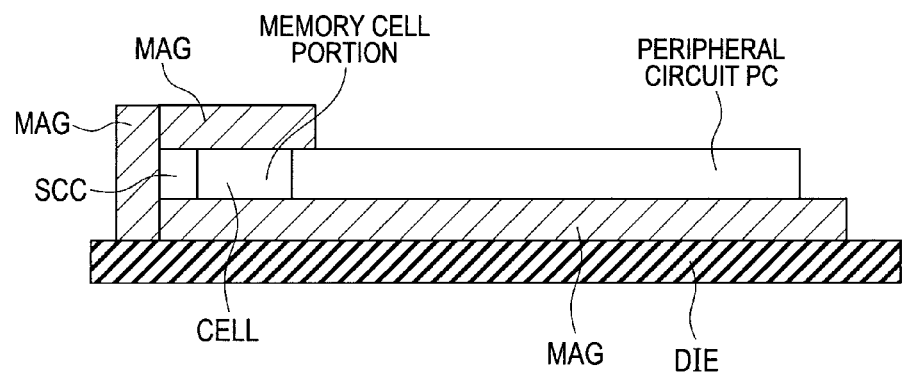
Figure 151:
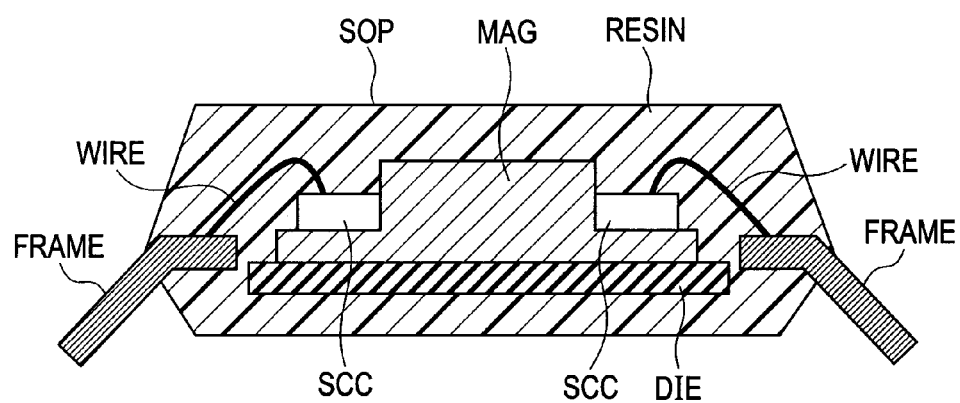
Figure 152:
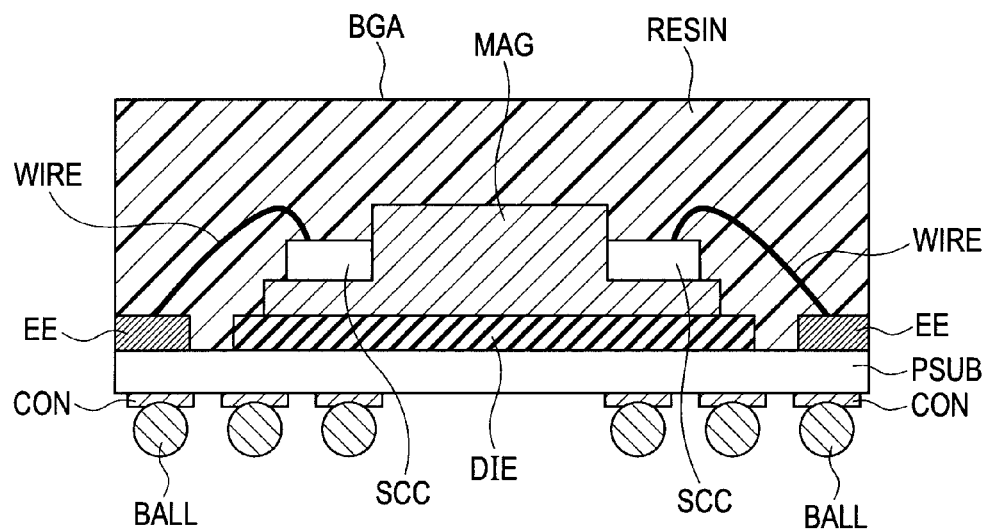

FIG. 123 is a schematic sectional view illustrating a mode of a magnetoresistive element arranged in the peripheral circuit portion, as viewed from the same direction as in FIG. 7, in the sixth embodiment of the invention;

FIG. 124(A) is an enlarged schematic diagram illustrating a mode of the upper cladding layer, as viewed in a plane, covering the memory cell portion and the peripheral circuit portion from above in a modification, different from that in FIGS. 120(A) to 120(C), to the sixth embodiment of the invention;

FIG. 124(B) is an enlarged schematic diagram illustrating a mode of the lower cladding layer, as viewed in a plane, covering the memory cell portion and the peripheral circuit portion from above, in the modification, different from that in FIGS. 120(A) to 120(C), to the sixth embodiment of the invention;

FIG. 124(C) is an enlarged schematic diagram illustrating a mode of the memory cell portion and the peripheral circuit portion, as viewed in a plane, covered with the cladding layers in FIGS. 124(A) and 124(B) in the modification, different from that in FIGS. 120(A) to 120(C), to the sixth embodiment of the invention;

FIG. 125(A) is an enlarged schematic diagram illustrating a mode of the upper cladding layer, as viewed in a plane, covering the memory cell portion and the peripheral circuit portion from above in a modification, different from those in FIGS. 120(A) to 120(C) and FIGS. 124(A) to 124(C), to the sixth embodiment of the invention;

FIG. 125(B) is an enlarged schematic diagram illustrating a mode of the lower cladding layer, as viewed in a plane, covering the memory cell portion and the peripheral circuit portion from above in the modification, different from those in FIGS. 120(A) to 120(C) and FIGS. 124(A) to 124(C), to the sixth embodiment of the invention;

FIG. 125(C) is an enlarged schematic diagram illustrating a mode of the memory cell portion and the peripheral circuit portion, as viewed in a plane, covered with the cladding layers in FIGS. 125(A) and 125(B) from above in the modification, different from those in FIGS. 120(A) to 120(C) and FIGS. 124(A) to 124(C), to the sixth embodiment of the invention;

FIG. 126 is a schematic sectional view illustrating a manufacturing process step subsequent to the manufacturing process step illustrated in FIG. 53, as viewed from the same direction as in FIG. 5, in a method of manufacturing a semiconductor device in the sixth embodiment of the invention;

FIG. 127 is a schematic sectional view taken along line CXXVII-CXXVII of FIG. 126;

FIG. 128 is a schematic sectional view illustrating a mode of the peripheral circuit portion at the same manufacturing process step as in FIG. 126;

FIG. 129 is an enlarged schematic diagram illustrating the configuration of the same memory cell portion and peripheral circuit portion as in FIG. 2, as viewed in a plane, in a seventh embodiment of the invention;

FIG. 130(A) is an enlarged schematic diagram illustrating a mode of the upper cladding layer, as viewed in a plane, covering the memory cell portion and the peripheral circuit portion from above in the seventh embodiment of the invention;

FIG. 130(B) is an enlarged schematic diagram illustrating a mode of the lower cladding layer, as viewed in a plane, covering the memory cell portion and the peripheral circuit portion from above in the seventh embodiment of the invention;

FIG. 130(C) is an enlarged schematic diagram illustrating a mode of the memory cell portion and the peripheral circuit portion, as viewed in a plane, covered with the cladding layers in FIGS. 130(A) and 130(B) from above in the seventh embodiment of the invention;

FIG. 131(A) is an enlarged schematic diagram illustrating a mode of the uppermost cladding layer, as viewed in a plane, covering the memory cell portion and the peripheral circuit portion from above in an eighth embodiment of the invention;

FIG. 131(B) is an enlarged schematic diagram illustrating a mode of the cladding layer located under that in FIG. 131 (A), as viewed in a plane, covering the memory cell portion and the peripheral circuit portion from above in the eighth embodiment of the invention;

FIG. 131(C) is an enlarged schematic diagram illustrating a mode of the cladding layer located under that in FIG. 131 (B), as viewed in a plane, covering the memory cell portion and the peripheral circuit portion from above in the eighth embodiment of the invention;

FIG. 131(D) is an enlarged schematic diagram illustrating a mode of the memory cell portion and the peripheral circuit portion, as viewed in a plane, covered with the cladding layers in FIGS. 130(A) to 130(C) from above in the eighth embodiment of the invention;

FIG. 132 is a schematic sectional view illustrating a mode of a magnetoresistive element, as viewed from the same direction as in FIG. 5, arranged in the memory cell portion in FIGS. 131(A) to 131(D);

FIG. 133 is a schematic sectional view taken along line CXXXIII-CXXXIII of FIG. 132;

FIG. 134 is a schematic sectional view illustrating a mode of a magnetoresistive element, as viewed from the same direction as in FIG. 7, arranged in the peripheral circuit portion in the eighth embodiment of the invention;

FIG. 135 is a schematic diagram illustrating the configuration of a semiconductor device assembly, as viewed in a plane, in which a high magnetic permeability material is stuck to each semiconductor device in the first embodiment to the eighth embodiment in an example of a ninth embodiment of the invention;

FIG. 136 is a schematic sectional view taken along line CXXXVI-CXXXVI of FIG. 135;

FIG. 137 is a schematic sectional view illustrating a mode in which the semiconductor device assembly in FIG. 135 sealed in SOP;

FIG. 138 is a schematic sectional view illustrating a mode in which the semiconductor device assembly in FIG. 135 sealed in BGA;

FIG. 139 is a schematic diagram illustrating the configuration of a semiconductor device assembly, as viewed in a plane, in which a high magnetic permeability material is stuck to each semiconductor device in the first embodiment to the eighth embodiment in a modification, different from that in FIG. 135, to the ninth embodiment of the invention;

FIG. 140 is a schematic sectional view taken along line CXL-CXL of FIG. 139;

FIG. 141 is a schematic sectional view illustrating a mode in which the semiconductor device assembly in FIG. 139 is sealed in SOP;

FIG. 142 is a schematic sectional view illustrating a mode in which the semiconductor device assembly in FIG. 139 is sealed in BGA;

FIG. 143 is a schematic diagram illustrating the configuration of a semiconductor device assembly, as viewed in a plane, in which a high magnetic permeability material is stuck to each semiconductor device in the first embodiment to the eighth embodiment in another modification, different from that in FIG. 139, to the ninth embodiment of the invention;

FIG. 144 is a schematic sectional view taken along line CXLIV-CXLIV of FIG. 143;

FIG. 145 is a schematic sectional view illustrating a mode in which the semiconductor device assembly in FIG. 143 is sealed in SOP;

FIG. 146 is a schematic sectional view illustrating a mode in which the semiconductor device assembly in FIG. 143 is sealed in BGA;

FIG. 147 is a schematic sectional view illustrating a mode in which a semiconductor device assembly in the same modification as in FIG. 143 is sealed in SOP and the arrangement of the memory cell portion is different from that in FIG. 143;

FIG. 148 is a schematic sectional view taken along line CXLVIII-CXLVIII of FIG. 147;

FIG. 149 is a schematic diagram illustrating the configuration of a semiconductor device assembly, as viewed in a plane, in which a high magnetic permeability material is stuck to each semiconductor device in the first embodiment to the eighth embodiment in further another modification, different from that in FIG. 143, to the ninth embodiment of the invention;

FIG. 150 is a schematic sectional view taken along line CL-CL of FIG. 149;

FIG. 151 is a schematic sectional view illustrating a mode in which the semiconductor device assembly in FIG. 149 is sealed in SOP; and FIG. 152 is a schematic sectional view illustrating a mode in which the semiconductor device assembly in FIG. 149 is sealed in BGA.

DETAILED DESCRIPTION OF THE PREFERRED EMBODIMENTS

Hereafter, description will be given to embodiments of the invention with reference to the drawings.

First Embodiment

Figure 1:
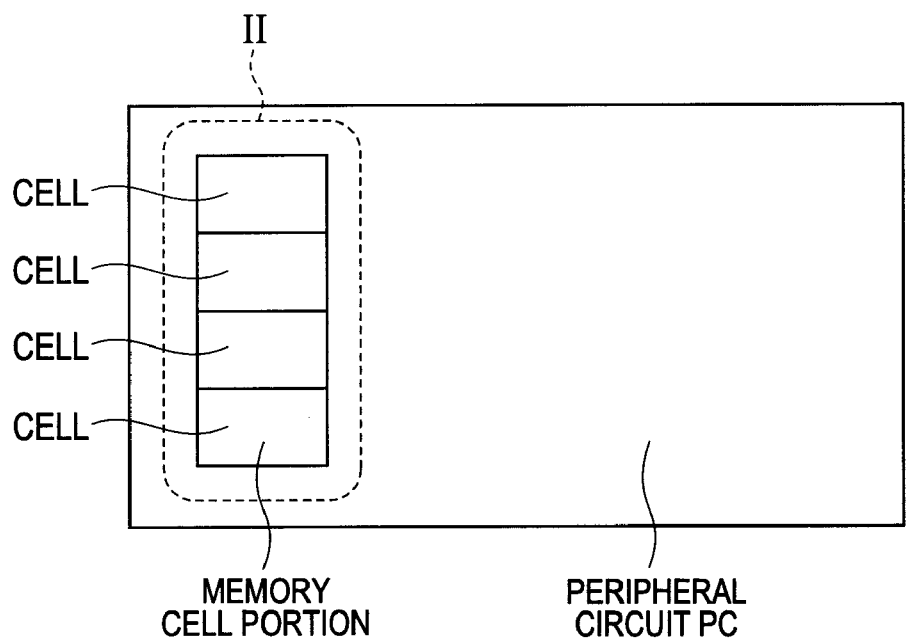
FIG. 1 is a schematic diagram illustrating the configuration of a semiconductor device of the invention as viewed in a plane.

As illustrated in FIG. 1, a semiconductor device in this embodiment is an integrated circuit for storage in which elements are formed over a semiconductor substrate and includes a memory cell portion and a peripheral circuit portion.

In the memory cell portion (memory cell area), multiple elements for storage are arranged and information is rewritten or read there. The memory cell portion is, for example, a region comprised of multiple cell regions CELL.

The peripheral circuit portion (peripheral area) is the area other than the memory cell portion (on the periphery of the memory cell portion) in the semiconductor device. It is used to couple an external load with electrical signals and select elements arranged in the memory cell portion. Though not shown in FIG. 1, the peripheral circuit portion is coupled with a contact portion for electrical coupling with an external load.

In the semiconductor device in this embodiment, as illustrated in FIG. 2, both the memory cell portion and the peripheral circuit portion are covered with a cladding layer CLAD. As described later, the cladding layer CLAD includes a high permeability film and in addition, for example, a metal thin film is laminated there.

Figure 3A:
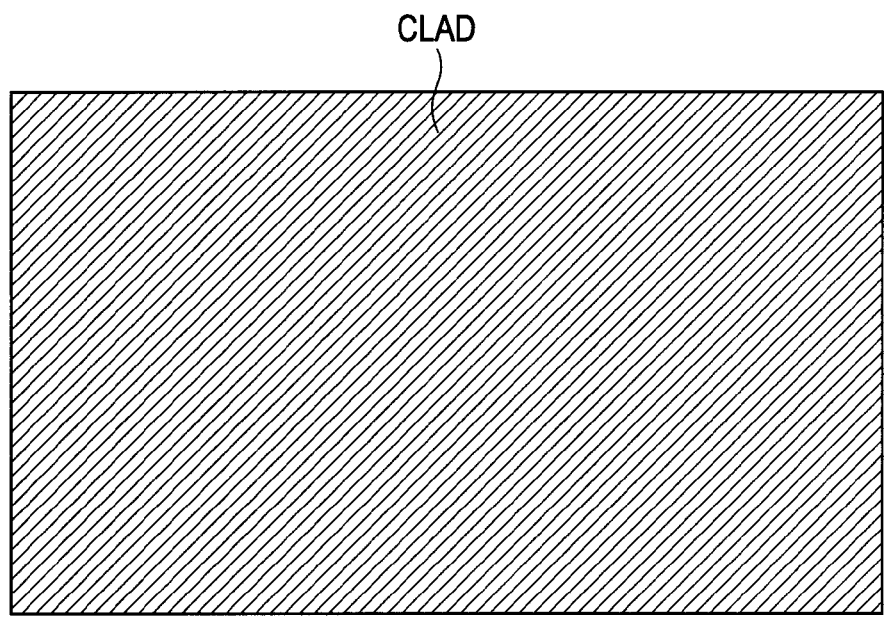
FIG. 3(A) is an enlarged schematic diagram illustrating a mode of a cladding layer covering the memory cell portion and the peripheral circuit portion from above in a first embodiment of the invention.
Figure 3B:
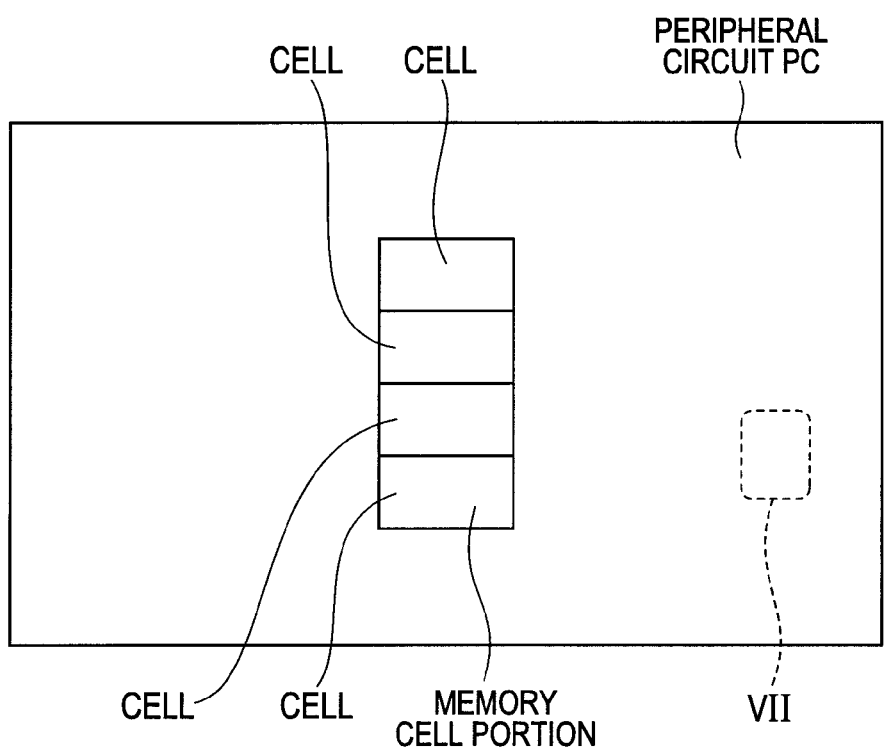
FIG. 3(B) is an enlarged schematic diagram illustrating a mode of the memory cell portion and the peripheral circuit portion covered with the cladding layer in FIG. 3(A) from above, as viewed in a plane, in the first embodiment of the invention.

FIG. 2 shows a mode in which the following layers are superposed on each other: the memory cell portion and part of the peripheral circuit in FIG. 1 (lower layer); and the cladding layer CLAD arranged above the wiring arranged in the memory cell portion and the peripheral circuit portion in FIG. 1 (upper layer). FIGS. 3(A) and 3(B) more clearly show FIG. 2 with the upper layer and the lower layer separated from each other. That is, FIG. 3(A) illustrates the upper layer (the cladding layer CLAD covering the circuitry); and FIG. 3(B) illustrates the lower layer (the memory cell portion and the peripheral circuit portion) covered with the cladding layer in FIG. 3(A).

In the first embodiment, as illustrated in FIG. 2 and FIG. 3(A), the cladding layer CLAD is so arranged as to substantially entirely cover the memory cell portion and the peripheral circuit portion from above. That is, the cladding layer CLAD as a first high permeability film is extended from the memory cell portion up to the peripheral circuit portion.

Figure 4:
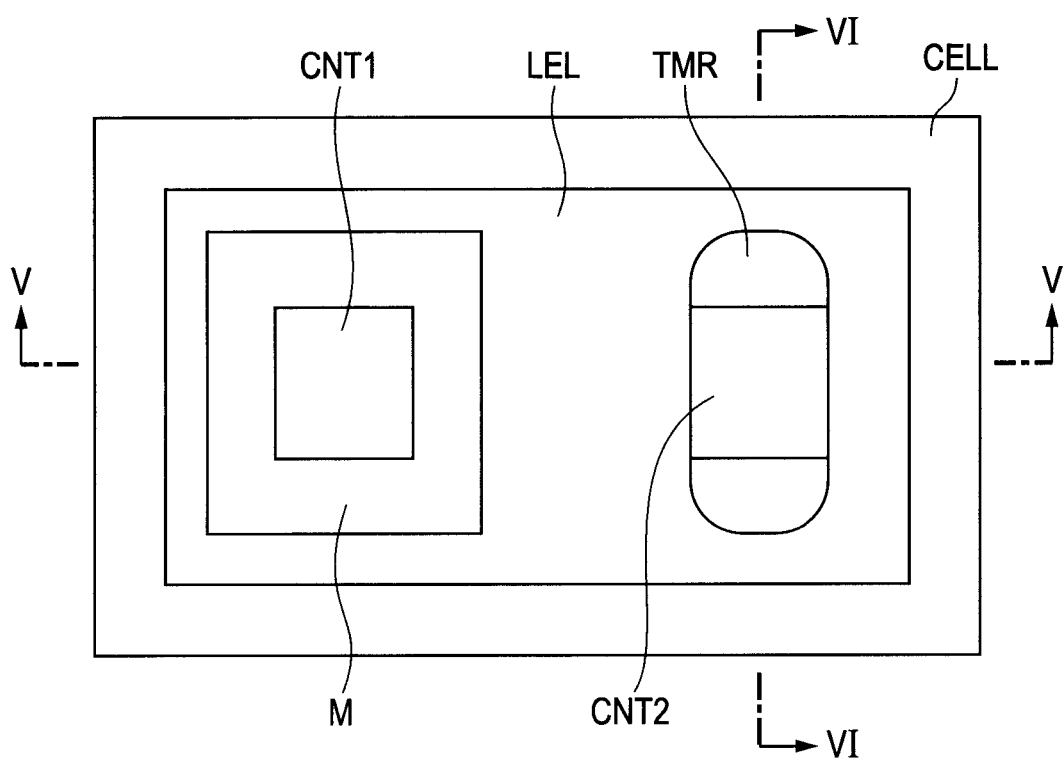
FIG. 4 is a schematic diagram illustrating a mode of a magnetoresistive element arranged in the memory cell portion, as viewed in a plane, in an example of the first embodiment of the invention.

As illustrated in FIG. 4, each of the elements for storage arranged in the memory cell portion of the semiconductor device in this embodiment is, for example, MRAM including a magnetoresistive element TMR. FIG. 4 illustrates only the magnetoresistive element TMR, an electrode (lower electrode LEL) for supplying electrical signals to the magnetoresistive element TMR; and a contact portion CNT1 and a contact portion CNT2 as electrical coupling portions.

As illustrated in FIG. 4, the magnetoresistive element TMR is, for example, in a shape close to an ellipse. The metal wiring portion M in FIG. 4 is an expression collectively indicating the contact M1 described later and a plug M2, a plug M3, and a plug M4 each of which is a combination of a via hole and a metal wiring filled therein. That is, a region designated as metal wiring portion M does not actually exist under the contact portion CNT1. The metal wiring portion M is shown in the drawing to explain that the plugs M4, M3 and the like are arranged under the contact portion CNT1.

Figure 6:
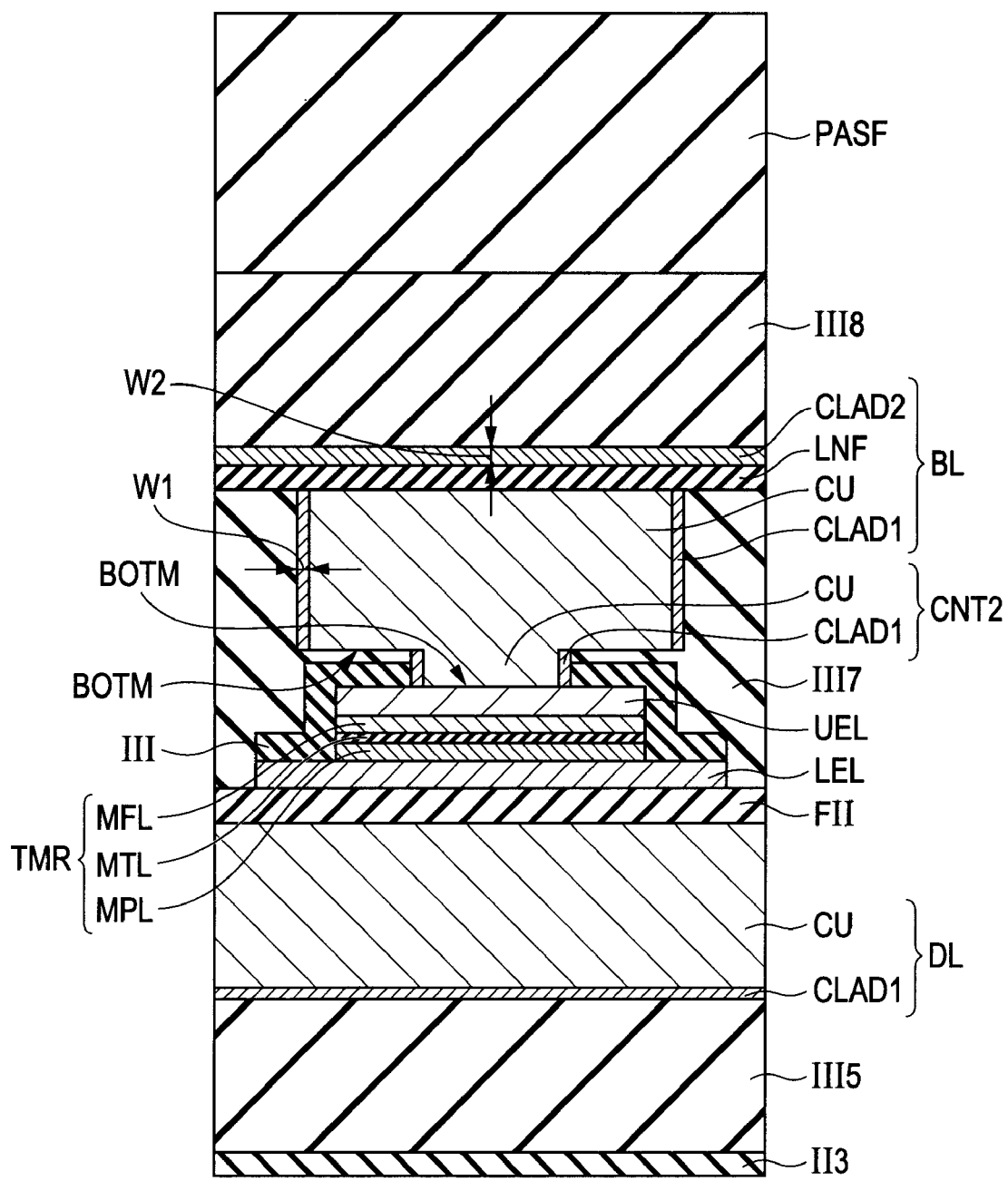
FIG. 6 is a schematic sectional view taken along line VI-VI of FIG. 4.

FIG. 5 and FIG. 6 are sectional views illustrating a mode in which a single magnetoresistive element TMR and wiring, a switching element, and the like electrically directly coupled with the magnetoresistive element TMR are provided in a semiconductor device. FIG. 6 is a sectional view viewed from the direction orthogonal to the direction in FIG. 5 and the part positioned under the insulating film II3 in FIG. 5 (semiconductor substrate SUB side) is omitted in the drawing.

A unit obtained by combining the single magnetoresistive element TMR and wiring and a switching element electrically directly coupled with this magnetoresistive element TMR illustrated in FIG. 5 and FIG. 6 will be defined as (single) MRAM.

For example, multiple MRAMs including the magnetoresistive element TMR illustrated in FIG. 5 are arranged at intervals in the memory cell portion of the semiconductor device in this embodiment (within the cell regions CELL in FIG. 1 or FIG. 2). Above the memory cell portion (the upper side in FIG. 5 and FIG. 6), the following lines are provided: bit lines BL as wirings extended in one direction (the left and right direction in FIG. 5); and digit lines DL so formed that they are positioned under the bit lines BL (the lower side in FIG. 5 and FIG. 6) and intersect with the bit lines BL.

Multiple magnetoresistive elements TMR are formed at intervals as viewed in a plane. For this reason, the multiple bit lines BL are extended in one direction and are formed at intervals as viewed in a plane. The multiple digit lines DL are lined in the direction of the arrangement of the bit lines BL and are formed at intervals in the direction of extension of the bit lines BL. The magnetoresistive element TMR is provided at each portion where a digit line DL and a bit line BL intersect with each other. More specifically, the magnetoresistive element TMR is formed in each area where a digit line DL and a bit line BL intersect with each other as viewed in a plane.

Each MRAM in the memory cell portion includes: a semiconductor substrate SUB; a MOS transistor (switching element) formed over the main surface of the semiconductor substrate SUB (the upper side in FIG. 5); multiple interlayer insulating films (interlayer insulating films III1, III2, and so on) and insulating films (insulating films II1 and so on) and a flat insulating film FII so formed as to cover this MOS transistor; and a lower electrode LEL as a flat plate-like lead wiring formed over the interlayer insulating films (over the flat insulating film FII).

The main surface of the semiconductor substrate SUB refers to a principal surface largest in area among the surfaces thereof. Specifically, it refers to a surface extended in the horizontal direction intersecting with the direction (the up and down direction in FIG. 5) in which multiple layers are laminated.

The multiple MOS transistors comprising each MRAM are formed at intervals with respect to the direction along the main surface of the semiconductor substrate SUB.

Each MOS transistor has: a channel region formed in the main surface of the semiconductor substrate SUB; impurity regions IPR formed on both sides of this channel region; a gate insulating film GI; and a gate electrode GE formed over the gate insulating film GI. The MOS transistor includes; a side wall SW formed over the side surface of the gate electrode GE; a metal silicide film MF formed over the upper surfaces of the impurity regions IPR; and a metal silicide film MF formed over the gate electrode.

The metal wiring portion M is coupled to the impurity region IPR that functions as a drain electrode and the other impurity region IPR functions as a source electrode.

A contact portion, not shown, is coupled to the impurity region IPR that functions as a source electrode and it is coupled to a source wiring SCL formed in the interlayer insulating films.

Further, the MRAM has a metal wiring portion M that couples the lower electrode LEL as a lead wiring and a MOS transistor as a switching element with each other and a magnetoresistive element TMR is arranged over the lower electrode LEL.

The lower electrode LEL of a magnetoresistive element TMR and a MOS transistor are electrically coupled with each other through the following: a contact M1 (including conductive material filled in the contact M1), plugs M2, M3, M4, and a contact portion CNT1 so formed that they penetrate the multiple interlayer insulating films III1 and so on and the insulating films II1 and so on. An upper electrode UEL formed in the upper surface of a magnetoresistive element TMR and a bit line BL are electrically coupled with each other through a contact portion CNT2.

The magnetoresistive element TMR is formed over one main surface (upper side) of the lower electrode LEL. The magnetoresistive element TMR includes: a magnetization pinned layer MPL formed over the lower electrode LEL and coupled with the lower electrode LEL; a tunnel insulating film MTL formed over this magnetization pinned layer MPL; and a magnetization free layer MFL formed over the tunnel insulating film MTL.

The direction of magnetization of the magnetization free layer MFL can be varied by the action of a magnetic field. The magnetization pinned layer MPL is fixed in magnetization direction and is so formed that its magnetization direction is kept constant even though a magnetic field is applied from the surroundings.

Each bit line BL is comprised of a copper wiring body portion CU as the body portion of the wiring and a cladding layer CLAD1 covering the side wall surface of the copper wiring body portion CU. However, the body portion together with a liner film LNF over the copper wiring body portion CU and a cladding layer CLAD2 thereover may be considered as a bit line BL. When a current flows in the direction of extension of the copper wiring body portion CU, data is thereby written to the magnetoresistive element TMR or data is thereby read from the magnetoresistive element TMR. The bit lines BL make it possible to change the magnetization state of a magnetization free layer MFL by the amount, direction, or the like of a current flowing there.

Each digit line DL is comprised of a copper wiring body portion CU as the body portion of the wiring and a cladding layer CLAD1 covering the side wall surface and bottom surface (inner surface) of the copper wiring body portion CU. When a current flows also in the copper wiring body portion CU of a digit line, data is thereby written to the magnetoresistive element TMR. Specifically, data is written to each magnetoresistive element TMR by a composite magnetic field of a magnetic field generated by a current passed through a bit line BL and a magnetic field generated by a current passed through a digit line DL as described later.

The cladding layer CLAD1 is so arranged that the following is implemented: a magnetic field generated by a current passed through the copper wiring body portion CU is intensively exerted on a desired magnetoresistive element TMR located directly thereunder; and the magnetoresistive element TMR is thereby caused to more efficiently and more accurately operate. The cladding layer CLAD1 includes a high permeability film similarly to the above-mentioned cladding layer CLAD. That is, the cladding layer CLAD1 has a magnetic field shielding effect and makes it possible to suppress the leakage of a magnetic field generated by the copper wiring body portion CU surrounded by this cladding layer CLAD1 to the outside.

The cladding layer CLAD2 arranged above a bit line BL (over the upper surface thereof) is also so arranged that the following is implemented, similarly to the cladding layer CLAD1 over the side wall surface of each bit line BL: a magnetic field generated by a current passed through the copper wiring body portion CU is more effectively exerted on the magnetoresistive element TMR. The cladding layer CLAD2 as a first high permeability film arranged over the upper surface of each bit line BL is equivalent to the above-mentioned cladding layer CLAD illustrated in FIG. 2 or FIG. 3(A). Therefore, as mentioned above, the cladding layer CLAD2 includes a high permeability film and is so formed as to substantially entirely cover the memory cell portion including the individual MRAMs.

As described later, the cladding layer CLAD2 over the upper surface of each bit line BL is comprised of a thin film of conductor. For this reason, if the cladding layer CLAD2 were formed directly on the upper surface of a bit line BL (on the upper surface of its copper wiring body portion CU), continuity would be established between the bit line BL and the cladding layer CLAD2. Then short-circuiting would take place between them. To suppress this, the liner film LNF comprised of an insulating film is formed over the upper surface of each bit line BL so that it is sandwiched between the bit line and the cladding layer CLAD2.

The liner film LNF substantially entirely covers the upper surfaces of the multiple lined bit lines BL including the areas between bit lines BL and the areas between the bit lines BL are thereby electrically insulated. Therefore, electrical continuity between adjoining MRAMs is interrupted.

In the memory cell portion (MRAM), in addition, a passivation film PASF is formed above the cladding layer CLAD2 with the interlayer insulating film (interlayer insulating film III8 in FIG. 5 and FIG. 6) in between.

In the above-mentioned semiconductor device in this embodiment, the configuration of each of multiple (single) circuits lined in the peripheral circuit portion is as shown in the sectional view in FIG. 7.

As illustrated in FIG. 7, the peripheral circuit portion is a circuit portion formed over the main surface of the same semiconductor substrate SUB as the memory cell portion is. For this reason, the following are formed over the main surface of the semiconductor substrate SUB in the peripheral circuit portion as in the memory cell portion; multiple interlayer insulating films such as an interlayer insulating film III1 and multiple insulating films such as an insulating film II1. A MOS transistor formed over the main surface of the semiconductor substrate SUB is electrically coupled with an electrode pad PAD electrically coupled to an external load through the following: a metal wiring portion M (that is, a contact M1, plugs M2, M3, M4) so formed that it penetrates the interlayer insulating films III1 and so on and the insulating films II1 and so on and a wiring M5 formed at the same time as the bit lines BL are.

The plugs M4 in the memory cell portion and the peripheral circuit portion are wirings formed by etching part of the interlayer insulating film III6 similarly to the digit lines DL. The wiring M5 in the peripheral circuit portion is formed by etching part of the interlayer insulating film III7 similarly to the bit lines BL. For this reason, it is desirable that the wiring M5 should have its side wall surface covered with the cladding layer CLAD1 similarly to the bit lines BL.

As illustrated in FIG. 5 to FIG. 7, it is desirable that: the inner surfaces of the contacts M1, plugs M2, and plugs M3 should be covered with a barrier layer BRL; and the inner surfaces of the plugs M4 and the digit lines DL should be covered with the cladding layer CLAD1. In FIG. 5 to FIG. 7, the side wall surfaces of the bit lines BL and wiring M5 are covered with the cladding layer CLAD1 and their bottom surfaces are not covered with a thin film. However, a barrier layer BRL may be formed over the bottom surfaces of the bit lines BL and the wiring M5.

Over the upper surface of the wiring M5 in the peripheral circuit portion in FIG. 7, a cladding layer CLAD2 is formed with a liner film LNF in between. This cladding layer CLAD2 is the same layer as the cladding layer CLAD2 over the bit line BL in FIG. 5 and FIG. 6 and is formed by extending the cladding layer CLAD2 in the memory cell area up to the peripheral circuit portion.

As mentioned above, the cladding layer CLAD (cladding layer CLAD2 in FIG. 5 to FIG. 7) (as a first high permeability film) substantially entirely covers the memory cell portion and the peripheral circuit portion above the bit lines BL. In actuality, however, the cladding layer CLAD2 is discontinuous in areas where a wiring portion, such as an electrode pad PAD, is arranged as illustrated in FIG. 7, for example. That is, areas not covered with the cladding layer CLAD2, though only a few, exist from place to place as required.

It is desirable that the thickness W2 of the cladding layer CLAD2 (especially, the high permeability film comprising the cladding layer CLAD2) located above the bit lines BL and the wiring M5, illustrated in FIG. 5 to FIG. 7, should be larger than the following thickness: the thickness W1 of the cladding layer CLAD1 (especially, the high permeability film comprising the cladding layer CLAD1) located above the side wall surfaces of the bit lines BL and the wiring M5.

Specifically, it is desirable that W1 should be, for example, not less than 5 nm and not more than 100 nm and W2 should be, for example, not less than 10 nm and not more than 100 nm. It is more desirable that W1 should be not less than 5 nm and not more than 40 nm and W2 should be not less than 10 nm and not more than 400 nm.

The passivation film PASF located in the uppermost layer of the semiconductor device in this embodiment is a layer comprised of an insulating film formed to electrically isolate an electrode pad PAD from the other areas as illustrated in FIG. 7.

Description will be given to the material and dimensions of main constituent elements of the above-mentioned semiconductor device. It is desirable that the multiple laminated interlayer insulating films III1, III2, and so on, insulating films II1, II2, and so on, and the passivation film PASF should be formed of, for example, a silicon nitride film (SiN). It is desirable that: the interlayer insulating films such as the interlayer insulating film III1 should be thicker than the insulating films such as the insulating film II1; and the passivation film PASF should be thicker than the interlayer insulating film.

It is desirable that the liner film LNF should be formed of a dielectric (insulator) material, such as SiN, SiC, SiON, SiOC, and SiON. Use of a material, such as SiN, different from $SiO_2$ for the liner film LNF and the like makes it possible to make favorable the adhesion between the interlayer insulating film III8 and the liner film LNF, and the copper wiring body portions CU.

The cladding layer CLAD2 arranged above the magnetoresistive element TMR in FIG. 5 to FIG. 7 is equivalent to the cladding layer CLAD in FIG. 2 and FIG. 3(A). Therefore, the cladding layer CLAD2 is formed by laminating a high permeability film and a metal thin film. This is the same with the cladding layer CLAD1.

Figure 8:
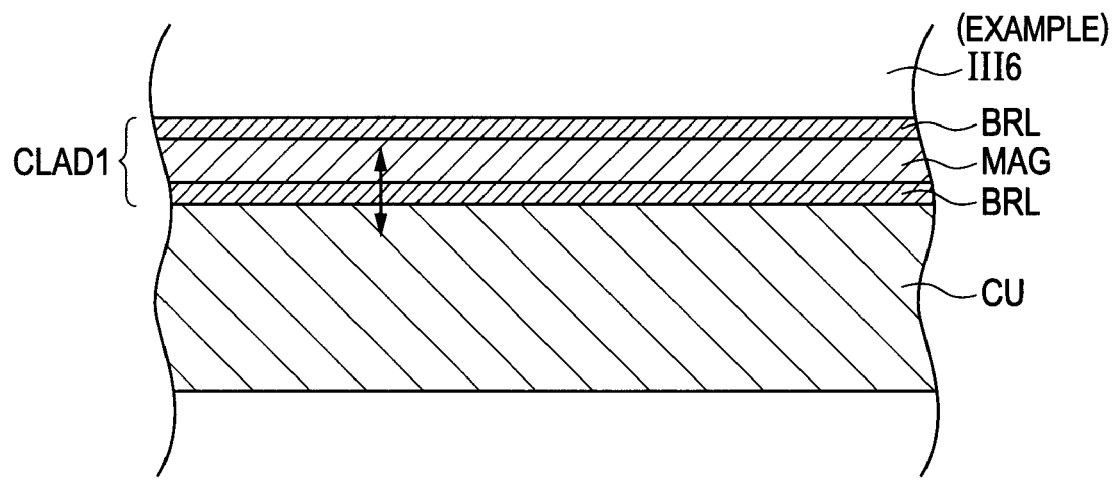
FIG. 8 is a schematic sectional view illustrating an example of a mode of a cladding layer.
Figure 9:
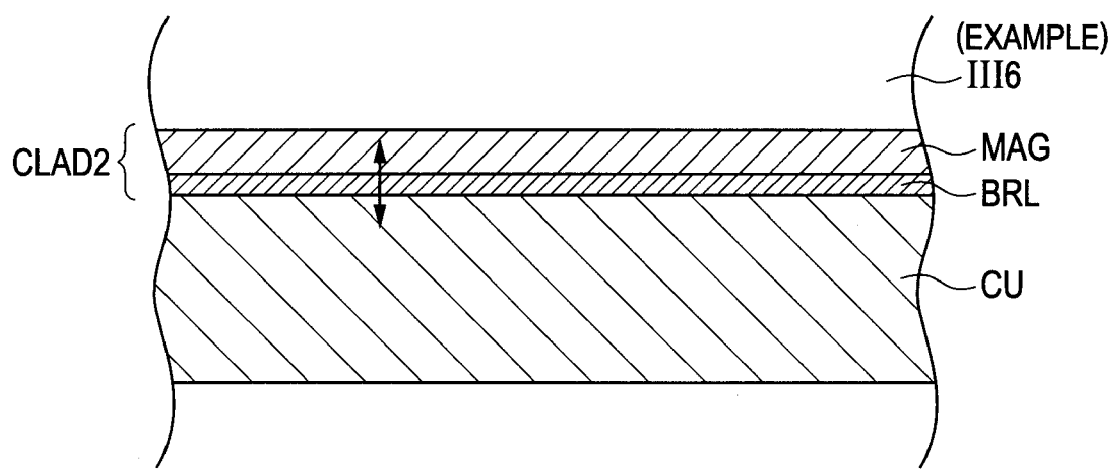
FIG. 9 is a schematic sectional view illustrating a modification to the mode of the cladding layer, different from that in FIG. 8.

Specifically, as illustrated in FIG. 8, for example, the cladding layer CLAD1 is of three-layer structure and is formed by laminating a barrier layer BRL as a thin film of metal material, a high permeability film MAG, and a barrier layer BRL in this order. As illustrated in FIG. 9, for example, the cladding layer CLAD2 is of two-layer structure and is formed by laminating a barrier layer BRL and a high permeability film MAG.

It is desirable that a nonmagnetic tantalum thin film or TaN (tantalum nitride) obtained by adding nitrogen thereto should be used for the barrier layer BRL. This is the same with the barrier layer BRL covering the inner surfaces of the contact M1, plug M2, and plug M3.

It is desirable that a soft magnetic material high in magnetic permeability and very low in remanent magnetization should be used for the high permeability film MAG. Specifically, it is desirable to use an alloy or an amorphous alloy of NiFe (nickel iron), NiFeMo, CoNbZr (cobalt niobium zirconium), CoFeNb, CoFeSiB, CoNbRu, CoNbZrMoCr, CoZrCrMo and the like. As mentioned above, it is desirable that the high permeability film MAG in the cladding layer CLAD2 located above the bit lines BL should be thicker than the high permeability film MAG in the cladding layer CLAD1 lateral to the bit lines BL.

Areas where a cladding layer is arranged are areas where a magnetic field generated by a current should be blocked off. Therefore, even when there is only a single high permeability film MAG, not the laminated structure illustrated in FIG. 8 or FIG. 9, it is possible to obtain the same magnetic field shielding effect as in cases where such a cladding layer with a laminated structure as illustrated in FIG. 8 and FIG. 9 is used.

By arranging a cladding layer, illustrated in FIG. 8 and FIG. 9, in which a barrier layer BRL is laminated over, for example, the upper surface of the copper wiring body portion CU (of each bit line BL), the following can be implemented: it is possible to suppress interdiffusion (indicated by an arrow in FIG. 8 and FIG. 9) of atoms between the high permeability film MAG and copper (Cu) composing the copper wiring body portion CU. That is, arranging a barrier layer BRL makes it possible to suppress problems such as a change of the properties and decline in the functionality of a copper wiring body portion CU or a high permeability film MAG.

However, the cladding layer CLAD2 over the bit lines BL is arranged over the liner film LNF as an insulating film. That is, the interdiffusion of atoms is less prone to occur between the copper wiring body portion CU and the high permeability film MAG over the liner film LNF. For this reason, for the cladding layer over the bit lines BL, it is desirable that the following measure should be taken: the cladding layer CLAD2, illustrated in FIG. 9, in which the high permeability film MAG is formed directly on the liner film LNF should be used in place of the cladding layer CLAD1.

In FIG. 8 and FIG. 9, as an example, a cladding layer in contact with the interlayer insulating film III6 is shown. The above-mentioned interdiffusion is less prone to occur between a silicon dioxide film comprising an interlayer insulating film and a high permeability film MAG. For this reason, no functional problem arises even though the interlayer insulating film and the high permeability film MAG are so arranged that they are in direct contact with each other (without a barrier layer BRL in between).

Therefore, the following configuration is acceptable: a configuration in which, for example, the cladding layer CLAD2 in FIG. 9 is used over the side wall surfaces of the bit lines BL and the single high permeability film MAG is arranged over the upper surfaces of the bit lines BL (liner film LNF).

The plug M4 is formed in the interlayer insulating film III5 illustrated in FIG. 5 and FIG. 7. Also for the cladding layer over the inner surfaces of the plugs M4, either of the cladding layer CLAD1 in FIG. 8 and the cladding layer CLAD2 in FIG. 9 can be used.

In the semiconductor device in FIG. 5, for example, the area of the lower electrode LEL as viewed in a plane is larger than the area of the upper electrode UEL as viewed in a plane. The area of the upper electrode UEL as viewed in a plane is substantially equal to the area of, for example, the magnetoresistive element TMR as viewed in plane. However, a mode in which the area of the upper electrode UEL or the lower electrode LEL as viewed in a plane is not as described above is also acceptable. For example, the upper electrode UEL may be larger in area as viewed in a plane than the magnetoresistive element TMR.

In this example, it is desirable that both the lower electrode LEL and the upper electrode UEL should be formed of, for example, Ta (tantalum), TaN (tantalum nitride), Ru (ruthenium), and TiN (titanium nitride). The lower electrode LEL and the upper electrode UEL may be of single layer but may also be formed by laminating multiple thin films formed of the above-mentioned different materials.

It is desirable that the thickness of the lower electrode LEL (in the up and down direction in FIG. 5 and FIG. 6) should be, for example, not less than 10 nm and not more than 100 nm. It is more desirable that the thickness should be not less than 20 nm and not more than 60 nm (40 nm as an example). It is desirable that the thickness of the upper electrode UEL should be, for example, not less than 30 nm and not more than 100 nm. It is more desirable that the thickness should be not less than 40 nm and not more than 80 nm (60 nm as an example).

Description will be given to the magnetoresistive element TMR. In FIG. 5 and FIG. 6, the magnetization pinned layer MPL is depicted as a single layer. In general, however, the following structures are used for the magnetization pinned layer MPL: a two-layer structure in which a ferromagnetic layer is laminated over an antiferromagnetic layer; a four-layer structure in which a ferromagnetic layer, a nonmagnetic layer, and a ferromagnetic layer are laminated over an antiferromagnetic layer in this order; a five-layer structure; or the like. However, the number of laminated layers or the order of laminated layers is not limited to the foregoing.

Figure 10:
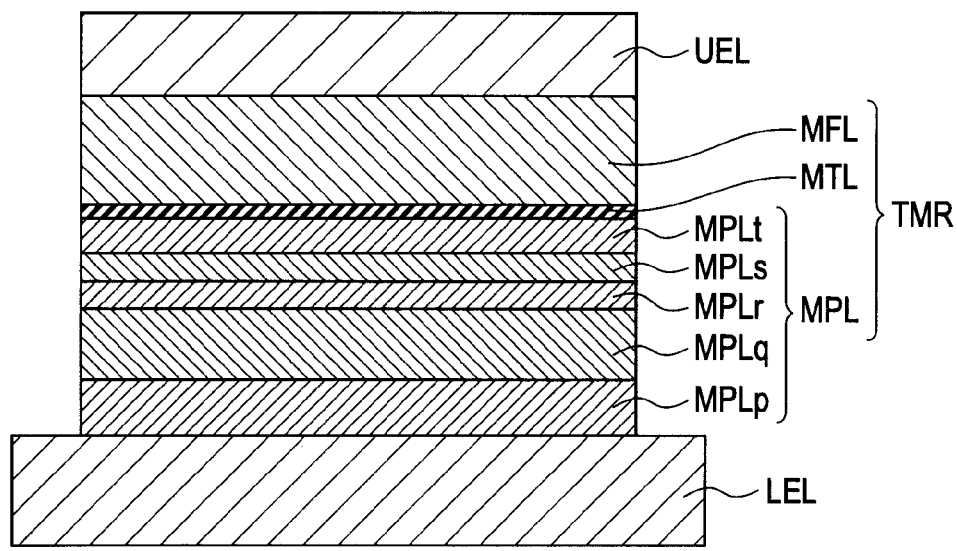
FIG. 10 is a schematic sectional view illustrating the configuration of a magnetoresistive element.

When the magnetization pinned layer MPL is of five-layer structure, for example, it is desirable to configure it as illustrated in FIG. 10. That is, a seed layer MPLp, an antiferromagnetic layer MPLq, a ferromagnetic layer MPLr, a nonmagnetic layer MPLs, and a ferromagnetic layer MPLt are laminated from bottom up in this order.

It is desirable that the seed layer MPLp should be comprised of a metal film formed of an alloy of Ta, Ru, or Ni (nickel) and Fe (iron). Alternatively, the seed layer MPLp may be a metal film formed of an alloy of Ni, Fe, and Cr (chromium). Alternatively, the seed layer MPLp may be formed by laminating multiple metal films formed of the various types of the above-mentioned alloys. It is desirable that the overall thickness of the seed layer MPLp should be not less than 0.5 nm and not more than 10 nm and it is more desirable that the thickness should be not less than 1.0 nm and not more than 8.5 nm.

It is desirable that the antiferromagnetic layer MPLq should be a metal film formed of any of the following: an alloy of Pt (platinum) and Mn (manganese), an alloy of Ir (iridium) and Mn (manganese), and an alloy of Ru and Mn. It is desirable that the thickness thereof should be not less than 10 nm and not more than 30 nm and it is more desirable that the thickness should be not more than 12 nm and not more than 25 nm.

It is desirable that the ferromagnetic layer MPLr should be a film of a single metal or an alloy comprised of one or more metals selected from among Ni, Co (cobalt), Fe, and B (boron). Alternatively, it may be configured by laminating multiple alloy layers obtained by appropriately combining these materials. It is desirable that the overall thickness of the ferromagnetic layer MPLr should be not less than 1.2 nm and not more than 3.0 nm and it is more desirable that the thickness should be not less than 1.5 nm and not more than 2.5 nm.

It is desirable that the nonmagnetic layer MPLs should be a metal film formed of Ru, not less than 0.4 nm and not more than 1.0 nm in thickness. It is more desirable that the thickness of the nonmagnetic layer MPLs should be not less than 0.6 nm and not more than 0.9 nm.

It is desirable that the ferromagnetic layer MPLt should be formed of the same material as that of the ferromagnetic layer MPLr. It is desirable to arranged its thickness so that its amount of magnetization is substantially equal to that of the ferromagnetic layer MPLr.

It is desirable that the tunnel insulating film MTL should be an insulating film formed of any of $AlO_x$ (aluminum oxide), MgO (magnesium oxide), and HfO (hafnium oxide). It is desirable that its thickness should be not less than 0.5 nm and not more than 2.0 nm and it is more desirable that the thickness should be not less than 0.6 nm and not more than 1.5 nm.

It is desirable that the magnetization free layer MFL should be a thin film comprised of a ferromagnetic layer. Specifically, it is desirable that it should be a film of a single metal or an alloy comprised of one or more metals selected from among Ni, Co, Fe, B, and Ru. Alternatively, it may be configured by laminating multiple thin films formed of the above-mentioned different alloys. It is desirable that its overall thickness should be not less than 2.0 nm and not more than 10 nm and it is more desirable that the thickness should be not less than 3.0 nm and not more than 9.0 nm.

It is desirable that the protective layer III covering the side surface of the magnetoresistive element TMR should be formed of, for example, SiN (silicon nitride) film. However, the protective layer III may be formed of $SiO_2$, $AlO_x$, or SiON in place of SiN.

Description will be given to modifications to a semiconductor device in this embodiment. The semiconductor device in this embodiment is characterized in that: the cladding layer positioned above the magnetoresistive elements TMR (especially, the bit lines BL) is extended from the memory cell portion up to the peripheral circuit portion. In this semiconductor device, as illustrated in FIG. 4 to FIG. 7, the bit lines BL and the magnetoresistive elements TMR (upper electrodes UEL) may be electrically coupled with each other through a contact portion CNT2. However, the semiconductor device may have the following configuration like the semiconductor device illustrated in FIG. 11 to FIG. 13, for example: the contact portion CMT2 is not provided between the lower parts (lowermost surfaces) of the bit lines BL and the upper parts (uppermost surfaces) of the magnetoresistive elements TMR (upper electrodes UEL); and they are directly coupled with each other.

Figure 11:
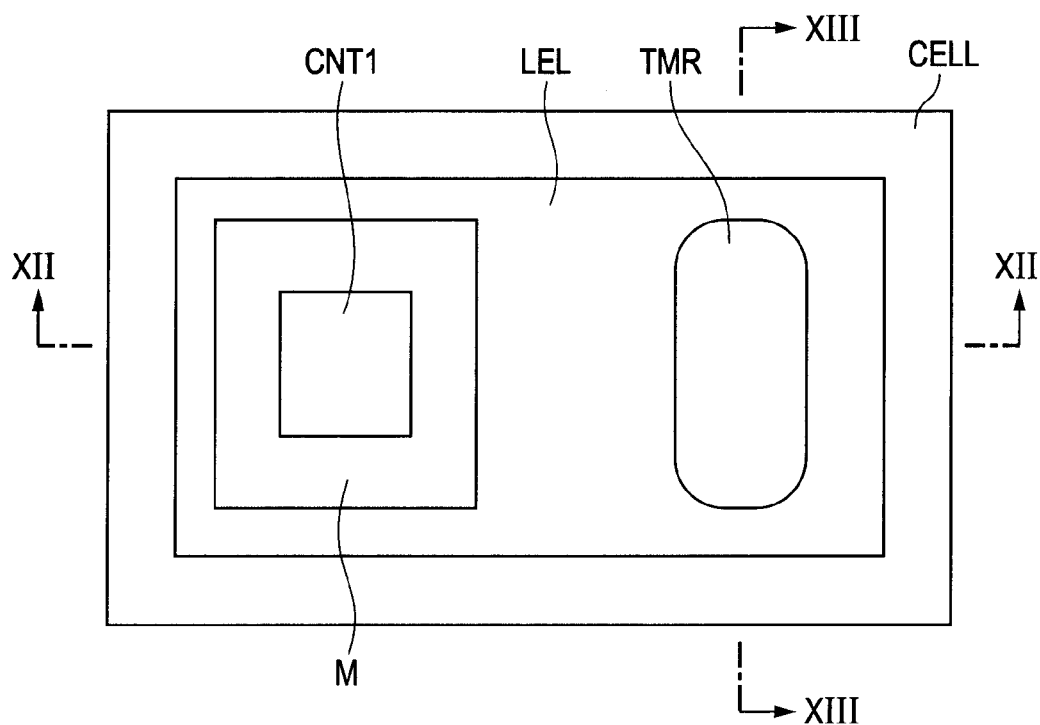
FIG. 11 is a schematic diagram illustrating a mode of a magnetoresistive element arranged in the memory cell portion, as viewed in a plane, in a modification to the first embodiment of the invention, different from that in FIG. 4.
Figure 12:
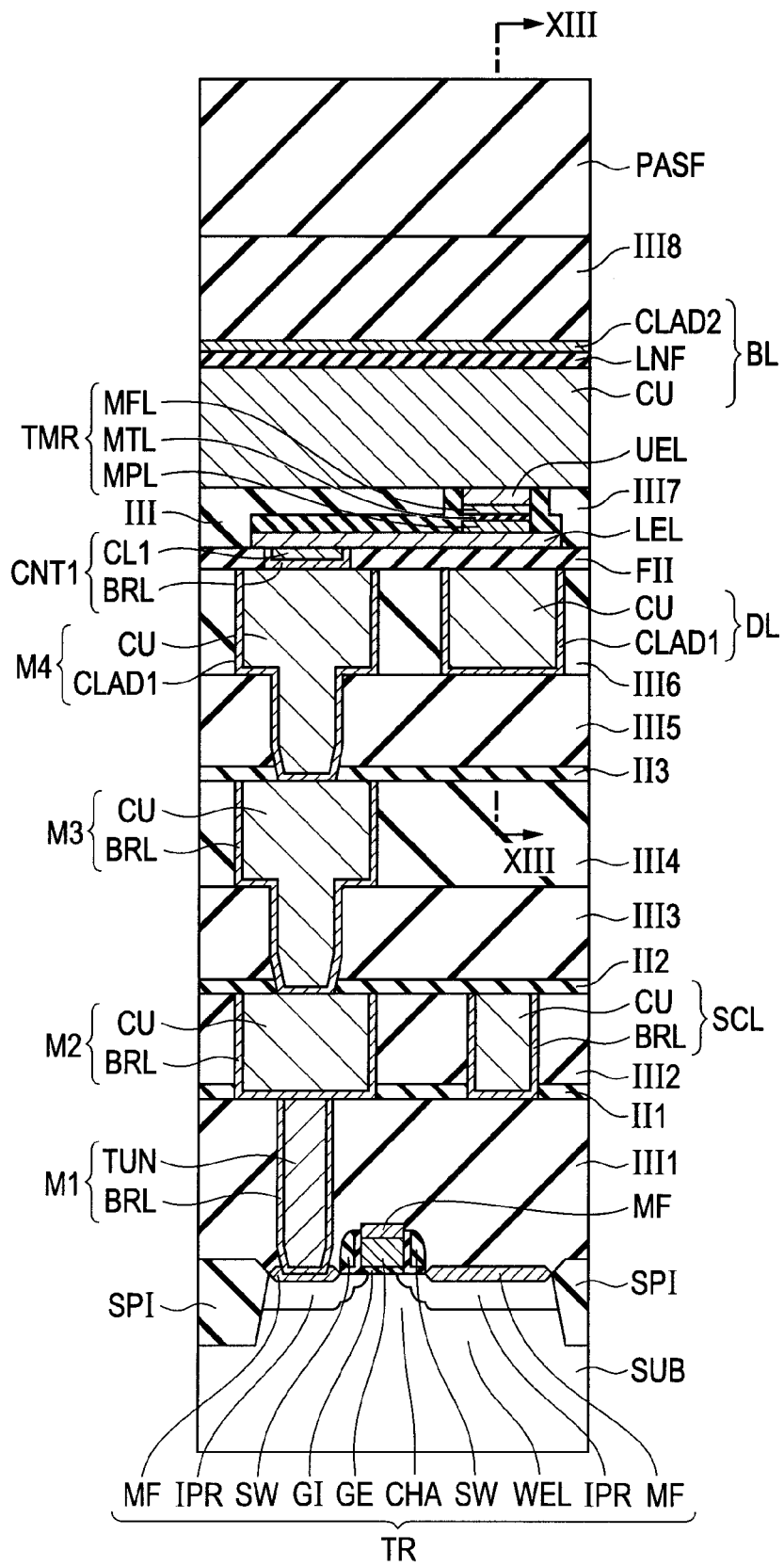
FIG. 12 is a schematic sectional view taken along line XII-XII of FIG. 11.
Figure 13:
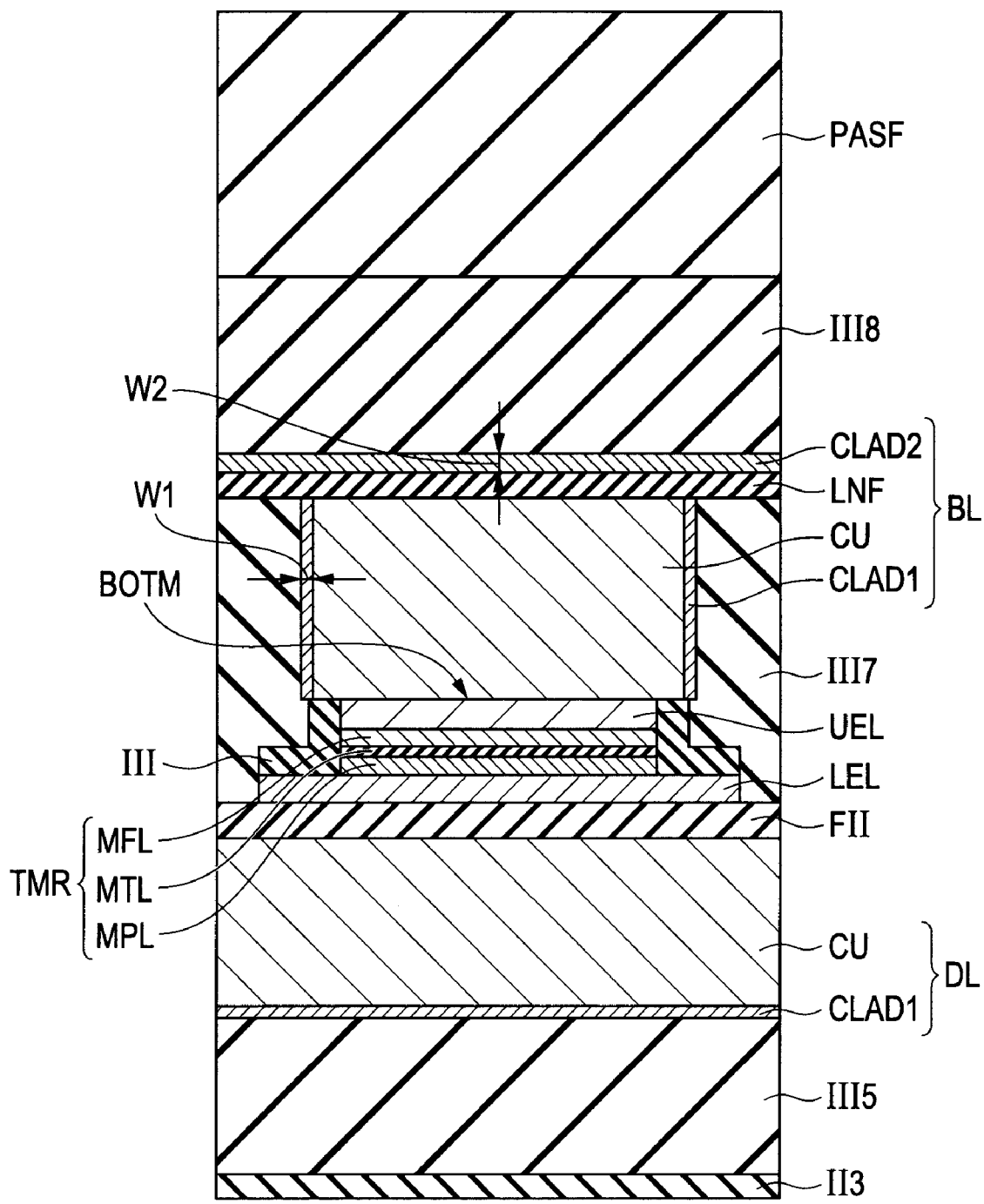
FIG. 13 is a schematic sectional view taken along line XIII-XIII of FIG. 11.

The semiconductor device including MRAM illustrated in FIG. 11 to FIG. 13 is different from the semiconductor device illustrated in FIG. 4 to FIG. 7 only in the above-mentioned mode in which the bit lines BL and the magnetoresistive elements TMR are coupled with each other. FIG. 11 corresponds to FIG. 4; FIG. 12 corresponds to FIG. 5; and FIG. 13 corresponds to FIG. 6. The mode of the peripheral circuit portion is identical with that in FIG. 7; therefore, the diagrammatic representation thereof is omitted.

Figure 14:
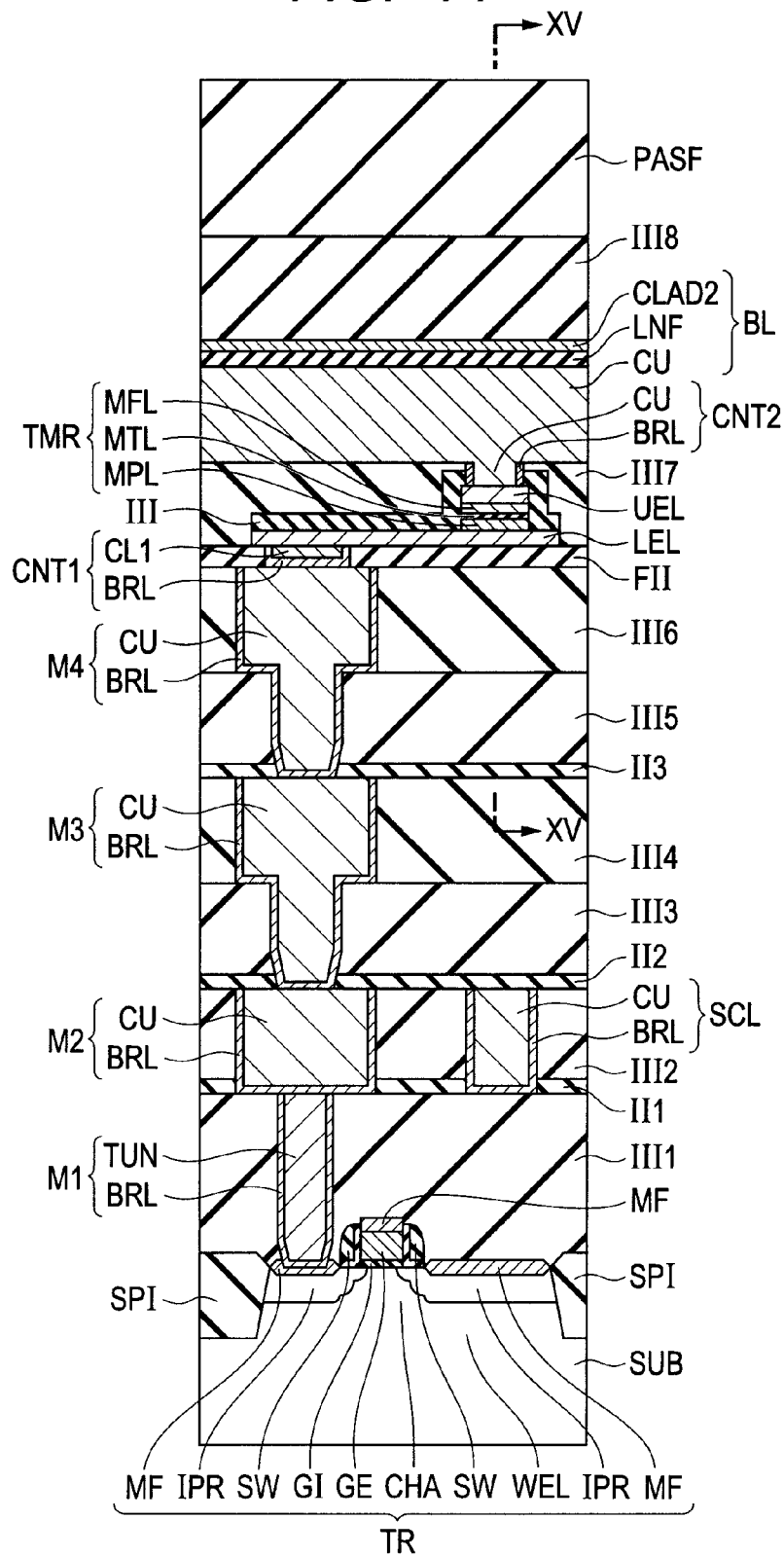
FIG. 14 is a schematic sectional view of a semiconductor device in another modification to the first embodiment of the invention, as viewed from the same direction as in FIG. 5, different that in from FIG. 11.
Figure 15:
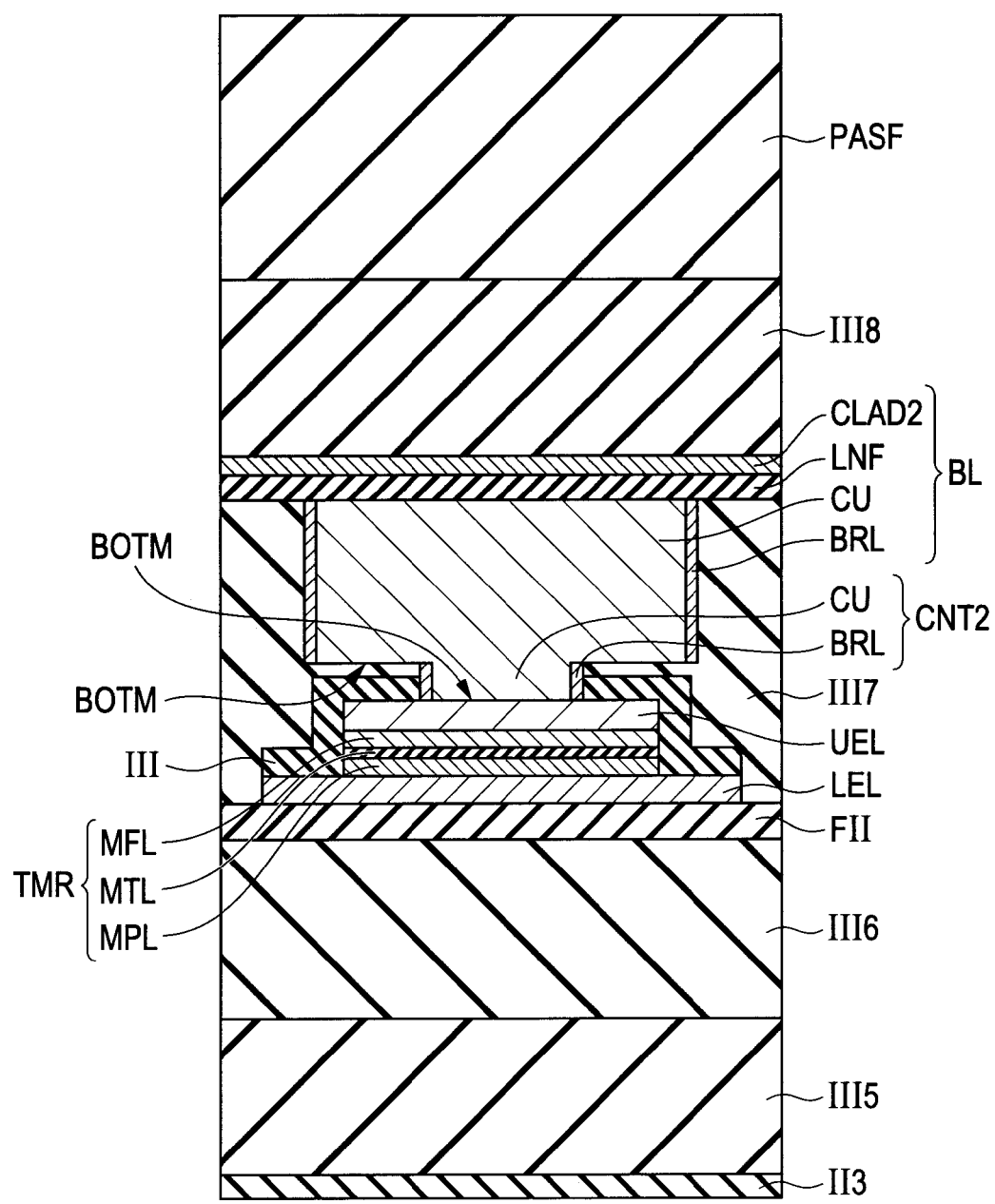
FIG. 15 is a schematic sectional view of the semiconductor device in FIG. 14 as viewed from the same direction as in FIG. 6.
Figure 16:
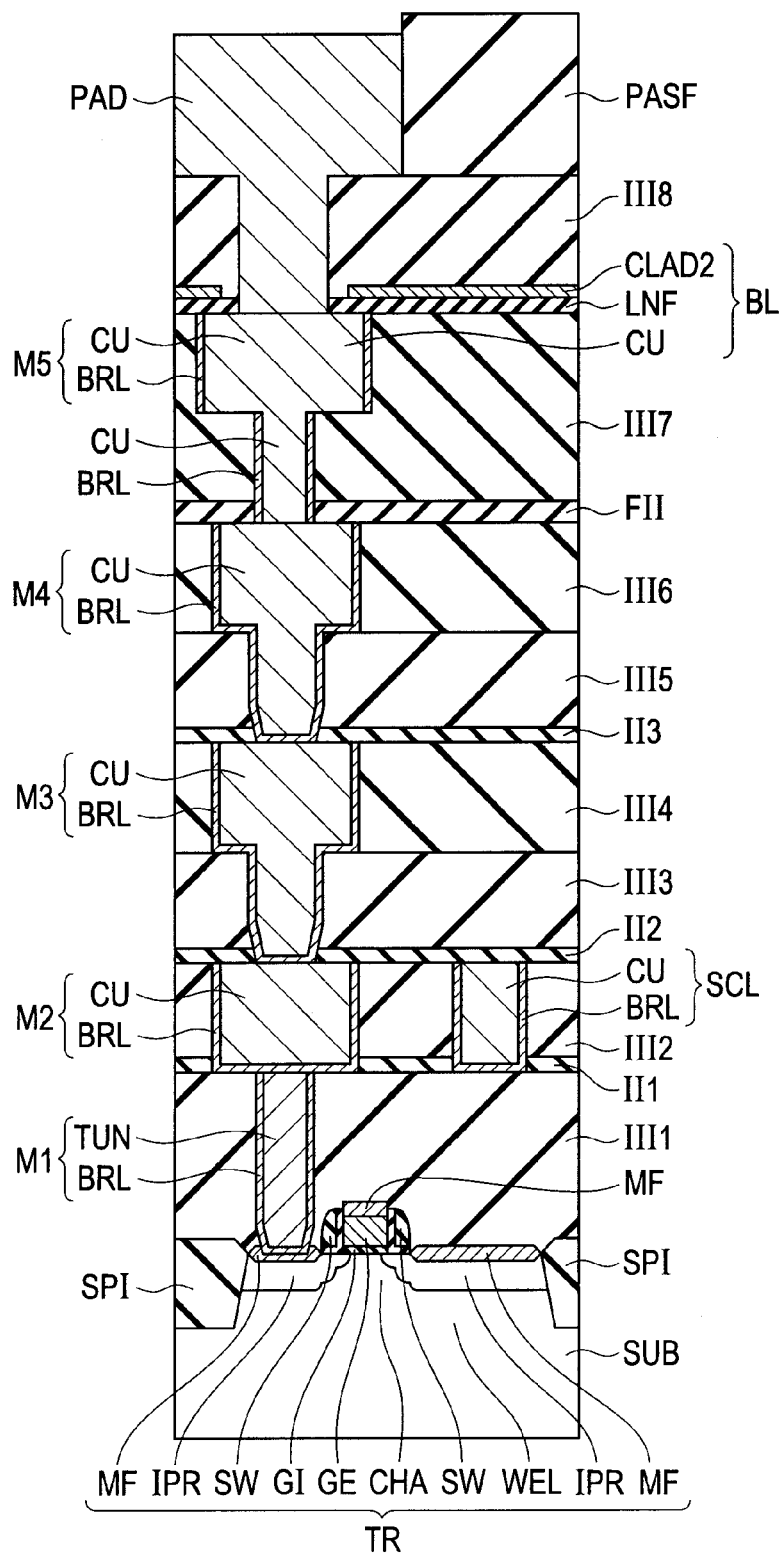
FIG. 16 is a schematic sectional view of the same peripheral circuit portion as in FIG. 7 of the semiconductor device in FIG. 14.

Alternatively, the semiconductor device may be so configured that multiple so-called STT (Spin Transfer Torque)-MRAMs are arranged like the semiconductor device illustrated in FIG. 14 to FIG. 16. The semiconductor device illustrated in FIG. 14 to FIG. 16 is different from the semiconductor device illustrated in FIG. 4 to FIG. 7 only in that: digit lines DL are not provided and the inner surfaces of the plugs M4 and the bit lines BL are covered only with a barrier layer BRL similarly to the inner surfaces of the contacts M1 and the plugs M2, M3. For example, the STT-MRAM in FIG. 14 to FIG. 16 may be provided with a mode in which a bit line BL and a magnetoresistive element TMR are directly coupled with each other like the MRAM in FIG. 11 to FIG. 13.

Description will be given to the principle of operation of a semiconductor device having the above-mentioned configuration. First, description will be given to the principle of operation of a semiconductor device in which a plurality of the MRAMs illustrated in FIG. 4 to FIG. 7 and FIG. 11 to FIG. 13 are arranged.

A desired MOS transistor is selected and a switch is turned on to pass a current through a desired digit line DL and bit line BL (copper wiring body portions CU). Then the orientation of magnetization of the magnetization free layer MFL of every magnetoresistive element TMR continuing thereto is changed.

When the currents passed through the digit line DL and the bit line BL (or the magnetic fields generated by these currents) are smaller than a current required for the inversion of the orientation of magnetization at this time, the following takes place: after the currents are turned off, the orientation of magnetization of the magnetization free layer MFL of every magnetoresistive element TMR continuing to the digit line DL or the bit line BL is returned to the state before the passage of currents. This means that a magnetic field generated by the currents is smaller than a magnetic field required for the inversion of the orientation of magnetization of the magnetization free layer MFL.

However, when the currents are larger than currents required for the inversion of the orientation of magnetization of the magnetization free layer MFL, the following takes place: after the currents are turned off, the orientation of magnetization of the magnetization free layer MFL of every magnetoresistive element TMR continuing to the digit line DL or the bit line BL is inverted. This means that a magnetic field generated by the currents is larger than a magnetic field required for the inversion of the orientation of magnetization of the magnetization free layer MFL.

Utilizing the above-mentioned characteristic, a current (first current) smaller than a current required for the inversion of the orientation of magnetization of each magnetization free layer MFL is passed through either of a digit line DL and a bit line BL. In this state, an appropriate current (second current) is passed through the other of the digit line DL and the bit line BL.

The appropriate current cited here refers to a current value required for implementing the following only in an area where the wirings through which the first current and the second current are passed intersect with each other: a composite magnetic field generated by the first current and the second current becomes larger than a magnetic field required for the inversion of the orientation of magnetization of the magnetization free layer MFL of each magnetoresistive element TMR.

As a result, the orientation of magnetization of the magnetization free layer MFL is inverted only in each magnetoresistive element TMR located in an area where the digit line DL and the bit line BL through which currents have been passed intersect with each other. Data is thereby rewritten. That is, when data is rewritten, selection of a magnetoresistive element TMR to be rewritten and this rewriting simultaneously occur.

Specifically, the orientation of magnetization of the magnetization free layer MFL becomes identical with the orientation of magnetization of the magnetization pinned layer MPL; or the orientation of magnetization of the magnetization free layer MFL becomes opposite to the orientation of magnetization of the magnetization pinned layer MPL. The electrical resistance of the magnetoresistive element TMR differs between the following occasions: when the orientation of magnetization of the magnetization free layer MFL and the orientation of magnetization of the magnetization pinned layer MPL agree with each other; and when the orientation of magnetization of the magnetization free layer MFL and the orientation of magnetization of the magnetization pinned layer MPL are opposite to each other. The difference in resistance value is utilized as information corresponding to "0" or "1."

When information in a selected magnetoresistive element TMR is read, a MOS transistor joined to the selected magnetoresistive element TMR is turned ON.

Then voltage is applied so that it passed through the MOS transistor and a bit line BL. Thus the resistance value of the selected magnetoresistive element TMR can be detected to read electrical information stored in the magnetoresistive element TMR.

The high permeability film MAG in the cladding layer arranged, for example, above and over the lateral of a bit line BL is arranged so as to implement the following: a magnetic field generated by a current passed through the bit line BL is more efficiently exerted on the magnetoresistive element TMR arranged directly under the bit line BL.

More specific description will be given. The magnetic field passes through the interior of the high permeability film MAG. Therefore, this magnetic field is prevented from acting on outside the high permeability film MAG, that is, a nearby magnetoresistive element TMR. Therefore, the nearby magnetoresistive element TMR is suppressed from being influenced by a magnetic field generated by an external current. The same effect is brought also with respect to (the high permeability film MAG in) the cladding layer CLAD1 arranged over the inner surface of each digit line DL.

Description will be given to the principle of operation of the semiconductor device in which multiple STT-MRAMs illustrated in FIG. 14 to FIG. 16 are arranged.

The principle of rewriting is as follows. A desired MOS transistor is selected and the switch is turned on. Then a current flows through a current path of the metal wiring portion M to the contact portion CNT1 to the lower electrode LEL to the magnetoresistive element TMR to the upper electrode UEL to the bit line BL positioned thereabove.

When a current is passed by supplying electrons from the MOS transistor side to the bit line BL side at this time, the following takes place. Only electrons having the same spin direction as the orientation of magnetization of the magnetization pinned layer MPL are injected into the magnetization free layer MFL beyond the tunnel insulating film MTL. Electrons having the opposite spin direction to the orientation of magnetization of the magnetization pinned layer MPL are reflected by the magnetization pinned layer MPL. That is, these electrons cannot arrive at the interior of the magnetization free layer MFL. As a result, the orientation of magnetization of the magnetization free layer MFL becomes identical with the orientation of magnetization of the magnetization pinned layer MPL.

Meanwhile, when a current is passed by supplying electrons from the bit line BL side to the MOS transistor side, the following takes place. Electrons having the same spin direction as the orientation of magnetization of magnetization pinned layer MPL pass through the magnetization pinned layer MPL. Electrons having the opposite spin direction to the orientation of magnetization of the magnetization pinned layer MPL are reflected by the magnetization pinned layer MPL. That is, these electrons migrate in the opposite direction and injected into the magnetization free layer MFL. As a result, the orientation of magnetization of the magnetization free layer MFL becomes opposite to the orientation of magnetization of the magnetization pinned layer MPL.

Thus the electrical resistance of the magnetoresistive element TMR varies as in the standard MRAM. This difference in resistance value is utilized as information corresponding to "0" or "1."

The principle under which information in a magnetoresistive element TMR whose STT-MRAM is selected is read is the same as that in the standard MRAMs in FIG. 4 to FIG. 7 and FIG. 11 to FIG. 13.

That is, also in the STT-MRAMs, a current flowing through a bit line BL changes the magnetization state of the magnetization free layer MFL by the direction of the current flowing there as in the standard MRAMs.

According to the above principle of operation, the following measure is taken both in MRAMs and in STT-MRAMs: a current flowing through a bit line BL changes the magnetization state of the magnetization free layer MFL; and the difference in the electrical resistance of the magnetoresistive element TMR arising from this change in magnetization state is utilized as information corresponding to "0" or "1."

Description will be given to a method of manufacturing a semiconductor device in this embodiment. First, description will be given to a method of a manufacturing a semiconductor device having the MRAM illustrated in FIG. 4 to FIG. 7 with reference to FIG. 17 to FIG. 64.

First, steps of preparing a base wiring are carried out. Specifically, a step of preparing a semiconductor substrate having a main surface and a step of forming abase circuit for the formation of MRAMs and a peripheral circuit over the main surface of this semiconductor substrate are carried out.

FIG. 17 to FIG. 23 are sectional views illustrating a mode in which MRAM in the memory cell portion is formed, as viewed from the same direction as in FIG. 5. At each step illustrated in FIG. 17 to FIG. 23, the same processing is carried out also in the peripheral circuit portion; therefore, the diagrammatic representation of the peripheral circuit portion is omitted.

Figure 17:
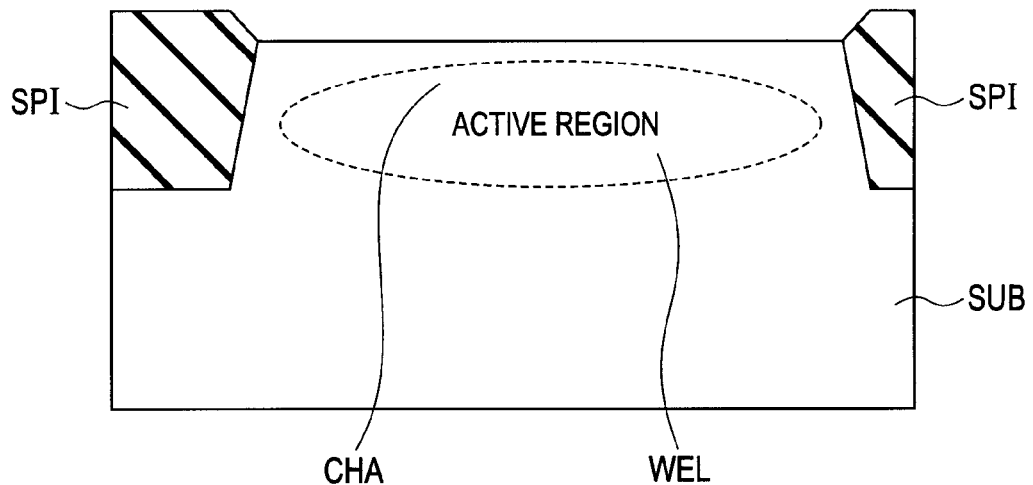
FIG. 17 is a schematic sectional view illustrating a first manufacturing process step of a method of manufacturing the semiconductor device in the first embodiment of the invention.

As illustrated in FIG. 17, first, a semiconductor substrate SUB having a main surface is prepared. A separating insulating film SPI is formed over the main surface of the semiconductor substrate SUB. An active region is formed over the main surface of the semiconductor substrate SUB by the separating insulating film SPI.

Subsequently, an impurity is implanted in the active region by an ion implantation technique or the like to sequentially form a well region WEL and a channel region CHA.

Figure 18:
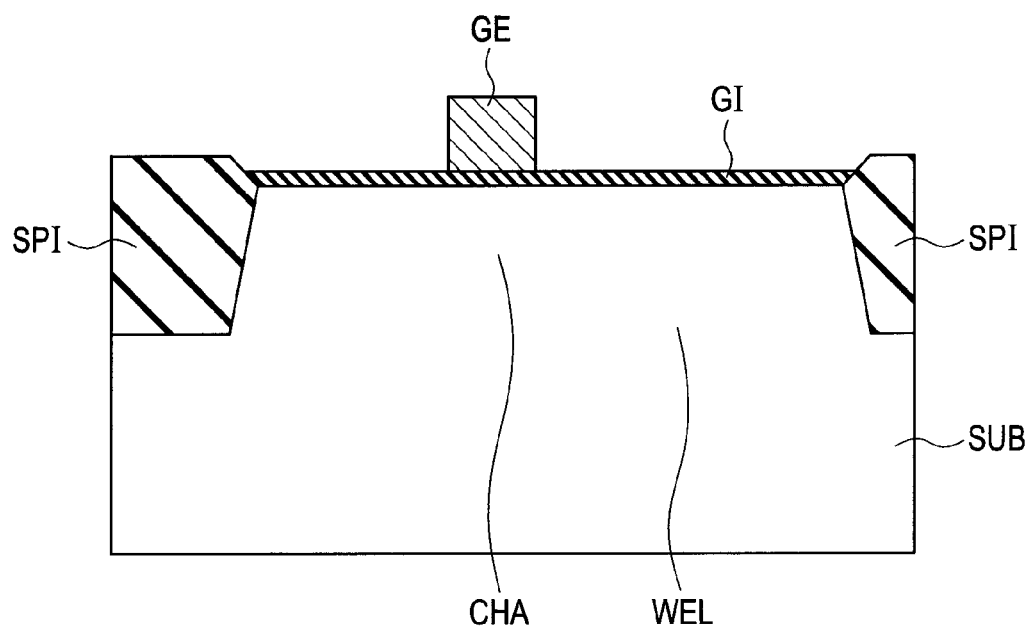
FIG. 18 is a schematic sectional view illustrating a manufacturing process step subsequent to the manufacturing process step illustrated in FIG. 17.

As illustrated in FIG. 18, a gate insulating film GI is formed over the main surface of the channel region CHA by a thermal oxidation method. Thereafter, a polycrystalline silicon film and the like are deposited and the polycrystalline silicon film and the like are patterned to form a gate electrode GE over the gate insulating film GI.

Figure 19:
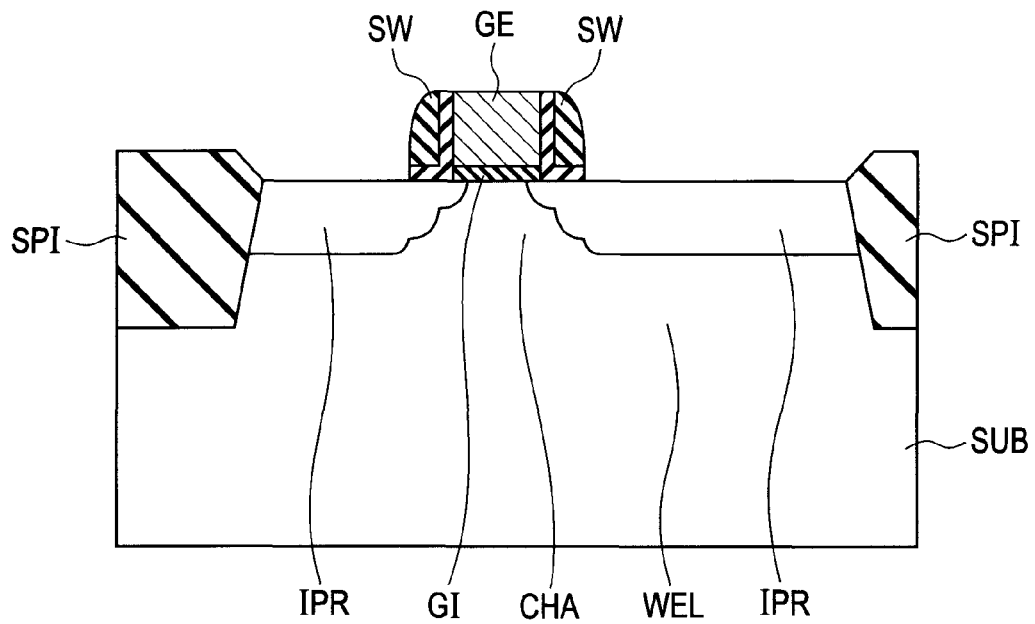
FIG. 19 is a schematic sectional view illustrating a manufacturing process step subsequent to the manufacturing process step illustrated in FIG. 18.

Subsequently, as illustrated in FIG. 19, an impurity of a predetermined conductivity type is implanted in the active region using the gate electrode GE as a mask. Further, an insulating film, such as a silicon dioxide film, is formed over the side surface of the gate electrode GE and after the formation of this insulating film, an impurity is implanted in the active region again.

After the impurity is implanted for the second time, insulating films, such as a silicon dioxide film and a silicon nitride film, are deposited. The deposited insulating films are dry etched to form a side wall SW. After the formation of the side wall SW, an impurity is implanted in the channel region CHA again. As a result, impurity regions IPR that function as a source or a drain are formed.

Figure 20:
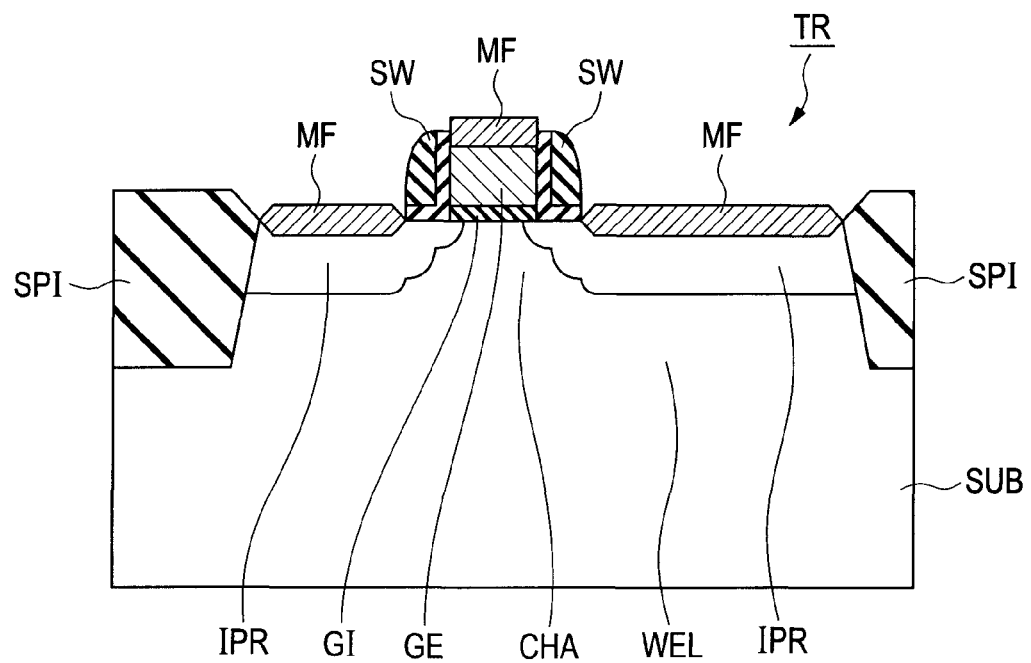
FIG. 20 is a schematic sectional view illustrating a manufacturing process step subsequent to the manufacturing process step illustrated in FIG. 19.

As illustrated in FIG. 20, a metal film is formed by sputtering and thereafter heat treatment is carried out. A metal silicide film MF is thereby formed in the upper surfaces of the impurity regions IPR and the upper surface of the gate electrode GE and thereafter an unwanted metal film is removed. As a result, a MOS transistor TR is formed.

Figure 21:
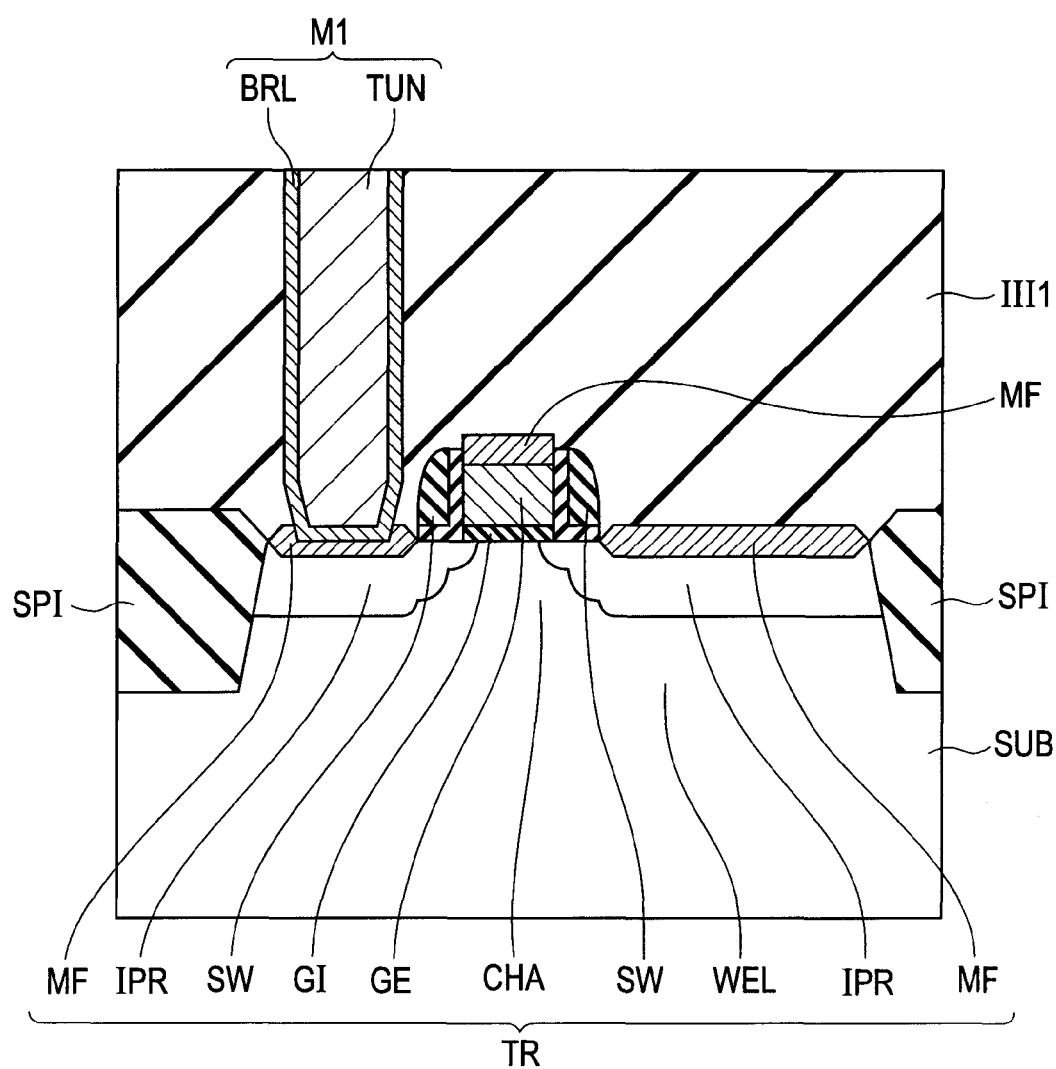
FIG. 21 is a schematic sectional view illustrating a manufacturing process step subsequent to the manufacturing process step illustrated in FIG. 20.

After the formation of the MOS transistor TR, as illustrated in FIG. 21, for example, an interlayer insulating film III1 formed of a silicon dioxide film or the like is formed so as to cover the MOS transistor TR.

The formed interlayer insulating film III1 is subjected to photolithography and etching to form a contact hole. This contact hole is so formed that it extends to the metal silicide film MF formed over an impurity region IPR.

Thereafter, a barrier layer BRL is formed over the inner surface of the contact hole by sputtering or the like. After the formation of the barrier layer BRL, the contact hole is filled with a conductive film TUN of tungsten or the like. Chemical mechanical polishing (CMP) processing is carried out on this conductive film TUN to form a contact M1.

Figure 22:
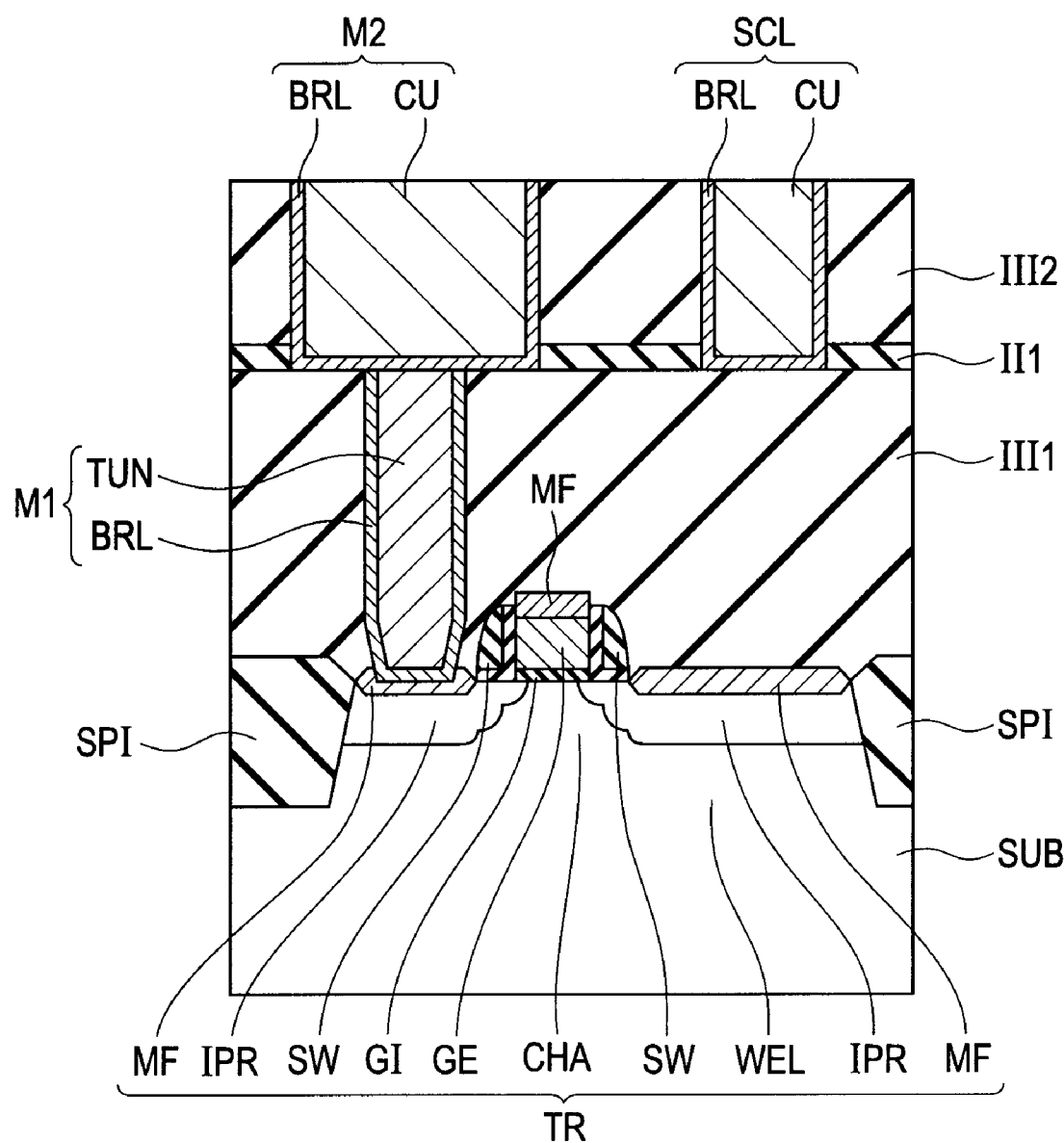
FIG. 22 is a schematic sectional view illustrating a manufacturing process step subsequent to the manufacturing process step illustrated in FIG. 21.

It is desirable to use, for example, a CVD method to fill the conductive film TUN. Subsequently, as illustrated in FIG. 22, an insulating film II1 and an interlayer insulating film III2 are formed over the upper surface of the interlayer insulating film III1 in this order. Groove portions are formed in the interlayer insulating film III2 and the insulating film II1. A barrier layer BRL is formed in the formed groove portions, which are filled with a conductive film CU. This conductive film CU is flattened to form a plug M2 and a source wiring SCL in the interlayer insulating film III2 and the insulating film II1. It is desirable to use, for example, a plating method to fill the conductive film CU.

Figure 23:
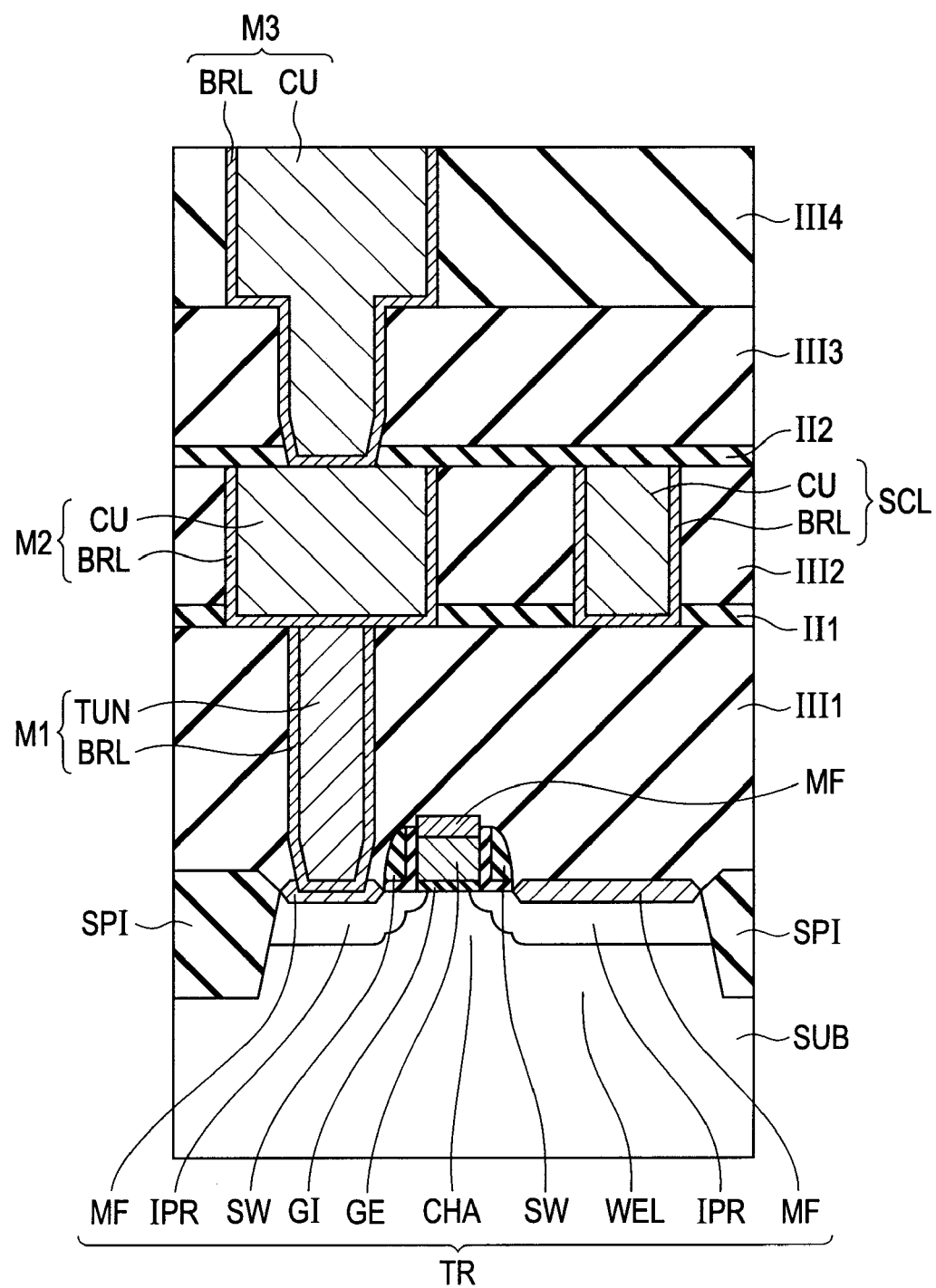
FIG. 23 is a schematic sectional view illustrating a manufacturing process step subsequent to the manufacturing process step illustrated in FIG. 22.

Subsequently, as illustrated in FIG. 23, an insulating film II2 and interlayer insulating films III3, III4 are formed in this order. Thereafter, a hole is formed in the insulating film II2 and the interlayer insulating films III3, III4 and a barrier layer BRL is formed over the inner surface of the hole. A conductive film CU is filled over the barrier layer BRL and this conductive film CU is flattened to form a plug M3.

With respect to each of the following steps illustrated in FIG. 24 to FIG. 43, the following sectional views are represented in parallel: sectional views illustrating a mode in which MRAM is formed in the memory cell portion, as viewed from the same direction as in FIG. 5, similarly to FIG. 17 to FIG. 23; and sectional views illustrating a mode in which the peripheral circuit is formed, as viewed from the same direction as in FIG. 7.

Figure 24:
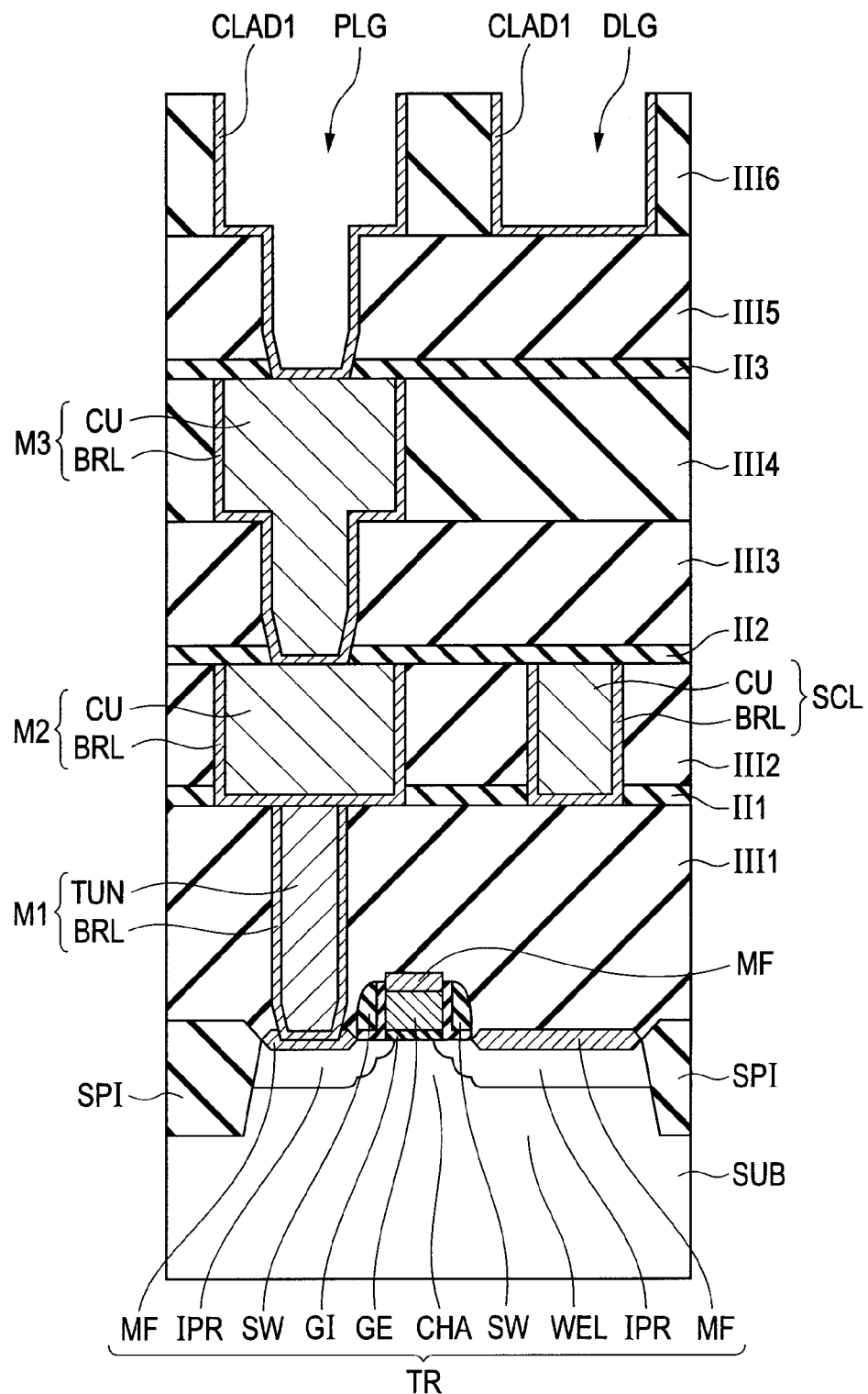
FIG. 24 is a schematic sectional view illustrating a manufacturing process step subsequent to the manufacturing process step illustrated in FIG. 23.

Subsequently, as illustrated in FIG. 24 (memory cell portion), an insulating film II3 and interlayer insulating films III5, III6 are formed over the upper surface of the interlayer insulating film III4 in this order. Thereafter, a plug hole PLG as a hole for forming a plug M4 in the insulating film II3 and the interlayer insulating films III5, III6 is formed. Further, a groove portion DLG for a digit line is formed in the interlayer insulating film III6.

Figure 25:
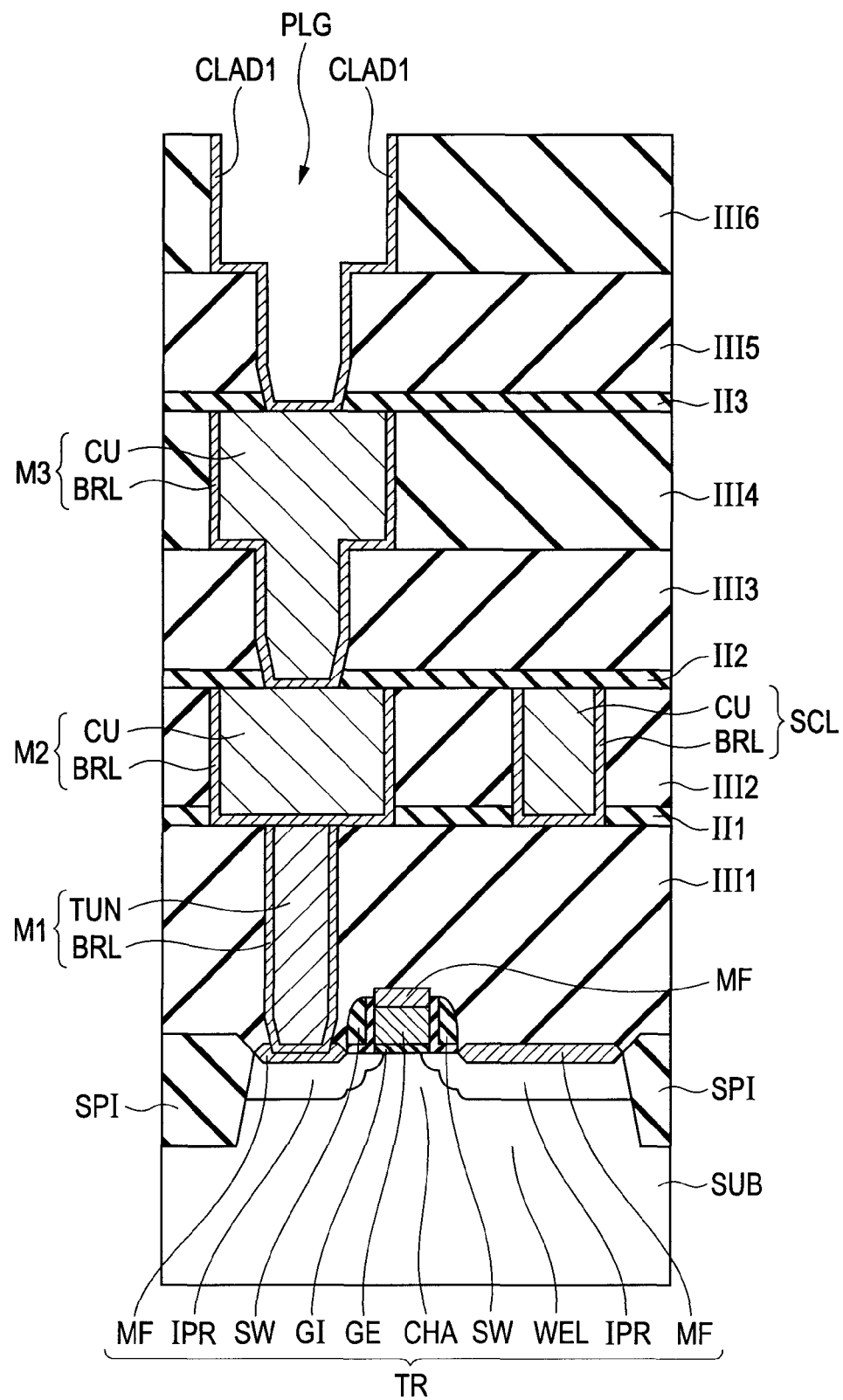
FIG. 25 is a schematic sectional view illustrating a mode of the peripheral circuit portion at the same manufacturing process step as in FIG. 24.

At this time, as illustrated in FIG. 25 (peripheral circuit portion), a plug hole PLG is formed in the insulating film II3 and the interlayer insulating films III5, III6 also in the peripheral circuit portion.

A cladding layer (for example, a cladding layer CLAD1) is formed in the plug holes PLG and a similar cladding layer (for example, a cladding layer CLAD1) is formed also over the inner surface of the groove portion DLG for a digit line.

Figure 26:
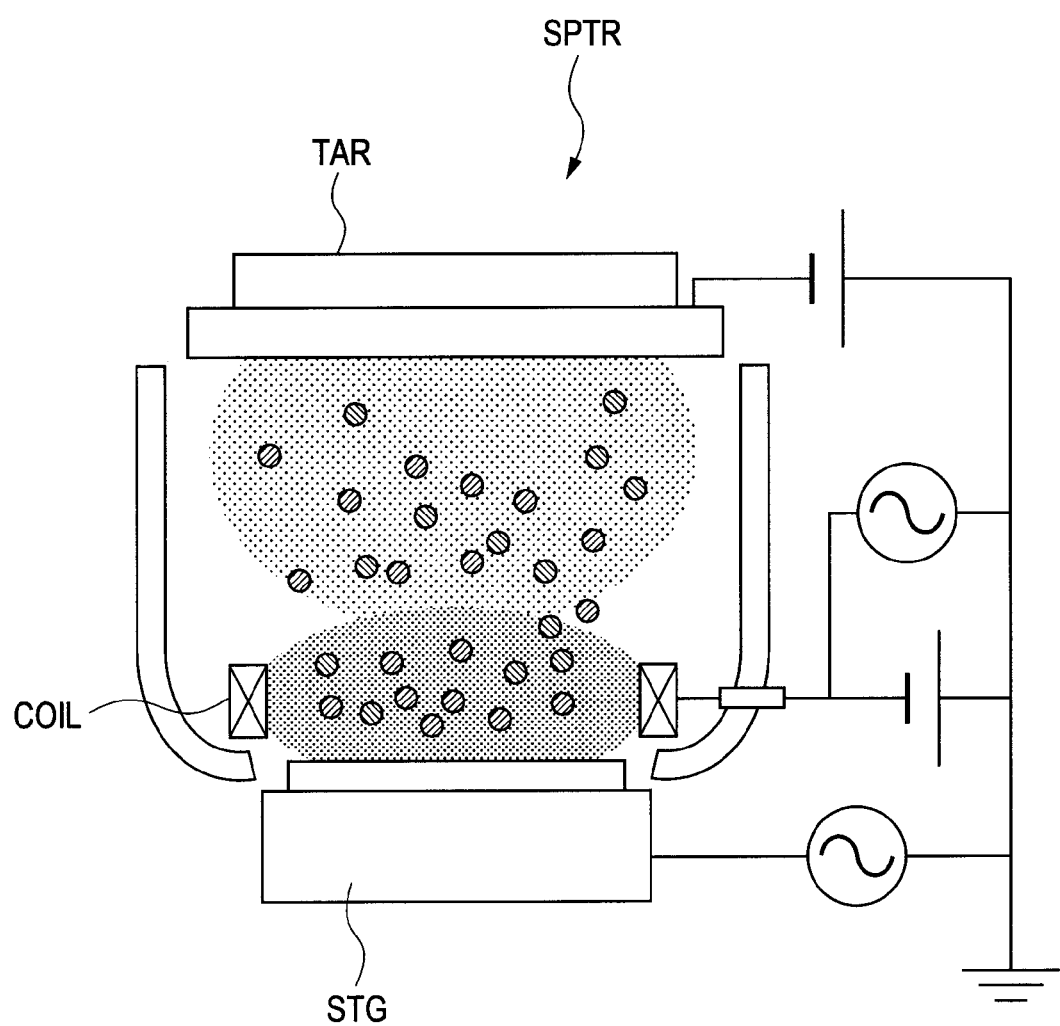
FIG. 26 is a diagramatic sketch of a sputter.

This cladding layer CLAD1 (barrier layers BRL and a high permeability film MAG) is formed using the sputter SPTR illustrated in FIG. 26. The sputter SPTR is arranged in a chamber and includes a stage STG over the upper surface of which a semiconductor substrate in manufacturing process is arranged, a target TAR, a direct-current coil COIL, and a high-frequency coil.

The directivity of particles in the chamber can be adjusted by magnetic force produced from the direct-current coil COIL and the high-frequency coil.

When a barrier layer BRL is formed, alternating-current power of, for example, 200 W to 230 W or so is applied to the stage STG. The side coverage ratio of the barrier layer BRL can be thereby enhanced.

The side coverage ratio cited here refers to the following ratio relative to the film formation speed at which a film is formed over the upper surface of the interlayer insulating film III6 illustrated in FIG. 24: the ratio of the film formation speed at which a film is formed over the side surfaces in the plug hole PLG and the groove portion DLG for a digit line to this film formation speed.

After the formation of the barrier layer BRL, a high permeability film MAG is formed. When the high permeability film MAG is formed, power of, for example, 2000 W or so is applied to the above-mentioned high-frequency coil. Power of, for example, 0 W to 500 W or so is applied to the direct-current coil COIL. The pressure in the chamber is arranged to 0.2 Pa or so. In addition, predetermined power is applied to the target TAR and the stage STG.

When the high permeability film MAG is formed under the above-mentioned conditions, the following is implemented: the film formation speed at which the film is formed over the side surface in the barrier layer BRL is made higher than the film formation speed at which the film is formed at the bottom of the barrier layer BRL.

That is, the side coverage ratio taken when the high permeability film MAG is higher than the side coverage ratio taken when the barrier layer BRL is formed.

While the film formation speed is adjusted, the barrier layer BRL and the high permeability film MAG are formed. This makes it possible to suppress, for example, the following and other problems: these films become excessively thick and the cross-sectional area in the direction intersecting with the direction of extension of digit lines and the like is reduced. That is, it is possible to suppress the electrical resistance of each digit line from becoming excessively high.

After the high permeability film MAG is formed as mentioned above, a barrier layer BRL is formed over the upper surface of the high permeability film MAG. For the film formation conditions for this barrier layer BRL, the film formation conditions under which the above-mentioned barrier layer BRL (formed before the high permeability film MAG is formed) was formed are adopted.

After the formation of the barrier layer BRL, a conductive film CU of copper or the like is filled over the barrier layer BRL. This filled conductive film is a copper wiring body portion CU for forming a plug M4 and the copper wiring body portion CU of a digit line DL.

Figure 27:
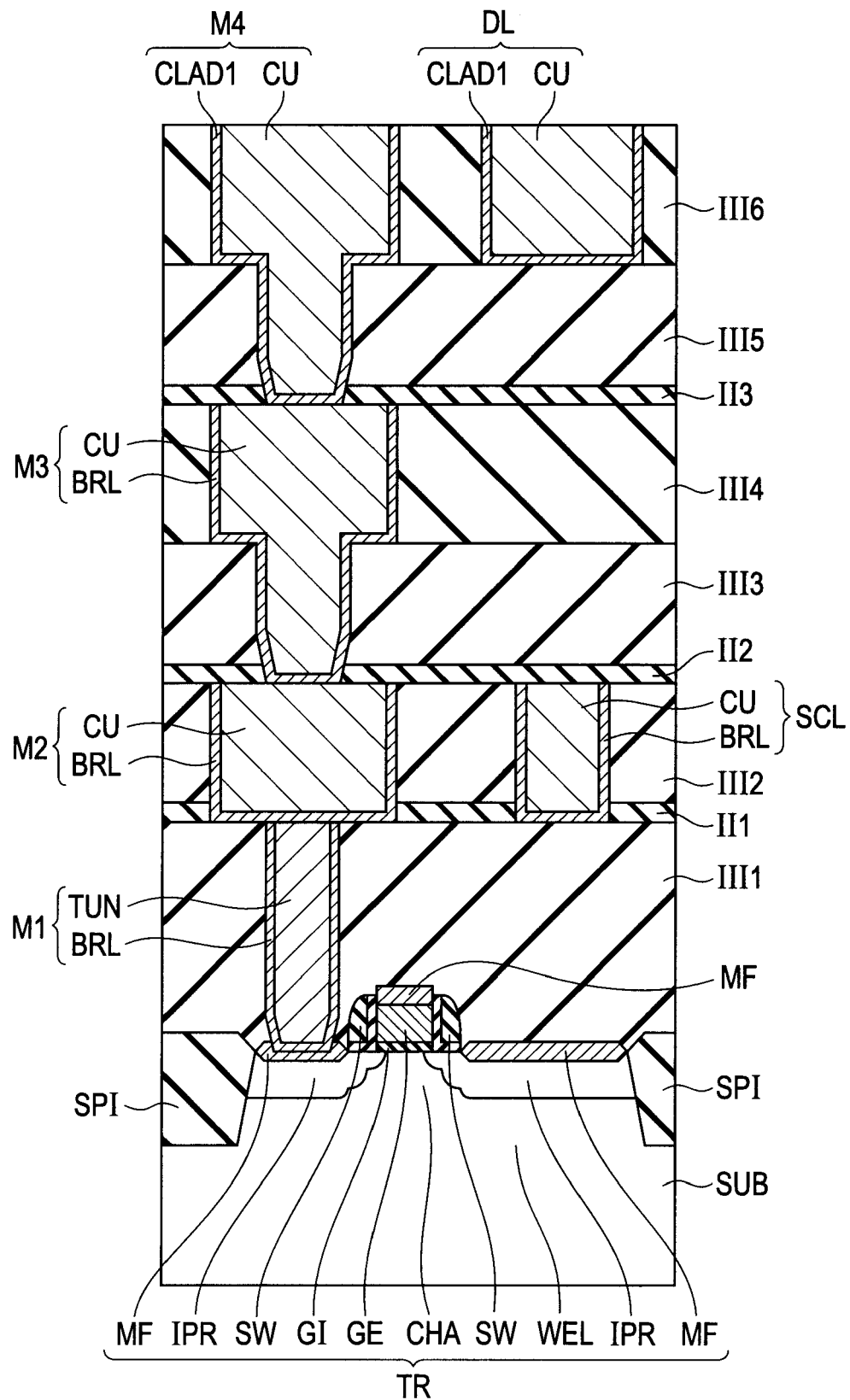
FIG. 27 is a schematic sectional view illustrating a manufacturing process step subsequent to the manufacturing process step illustrated in FIG. 24.
Figure 28:
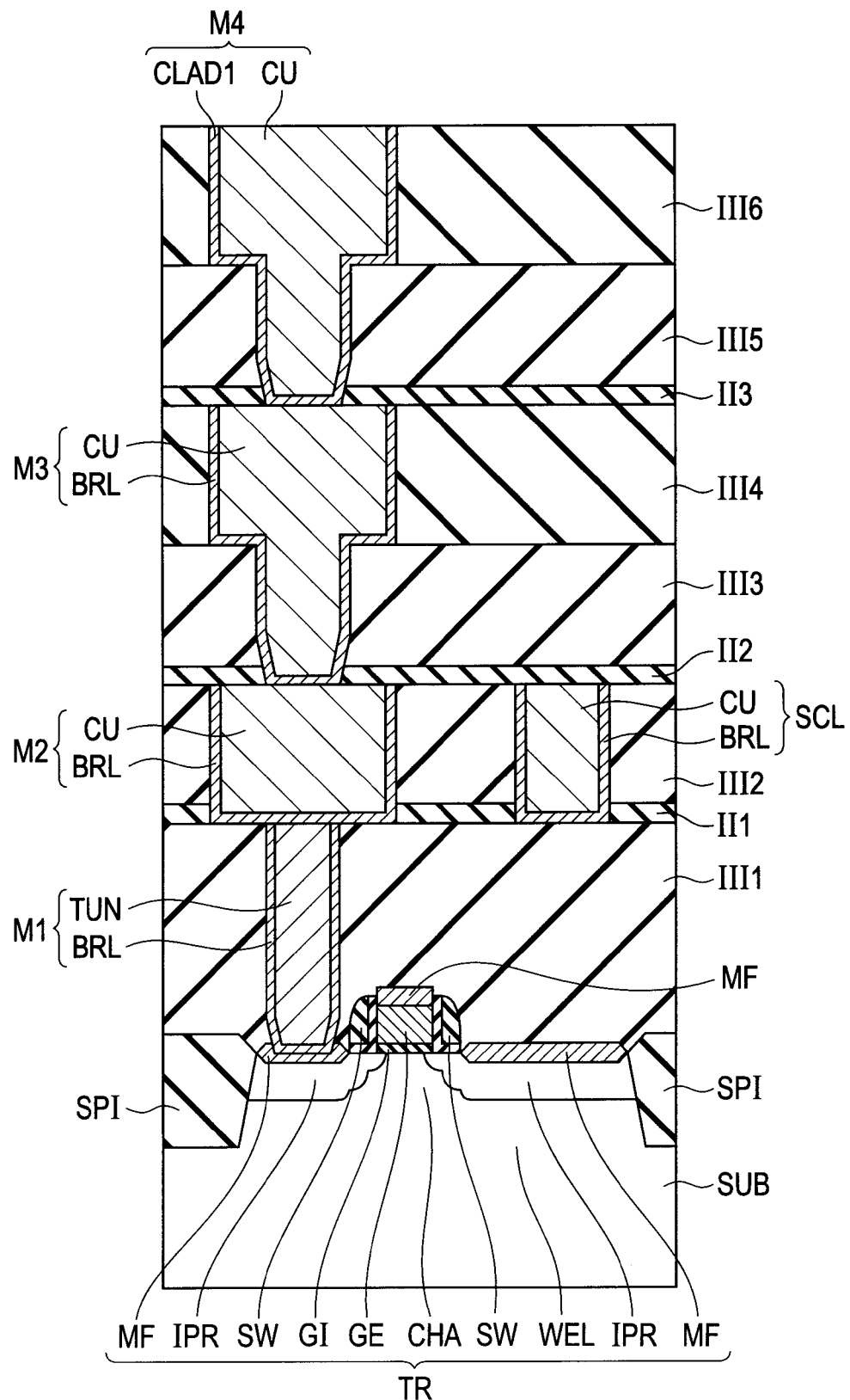
FIG. 28 is a schematic sectional view of a mode of the peripheral circuit portion at the same manufacturing process step as in FIG. 27.

After the conductive film is filled, as illustrated in FIG. 27 (memory cell portion), the upper surface of the interlayer insulating film III6 is flattened by a CMP method to form the plug M4 and the digit line DL. At the same time as the formation of the digit line DL, the plug M4 in the peripheral circuit portion can be formed as illustrated in FIG. 28.

Thus the interlayer insulating film III1, insulating film II1, interlayer insulating film III2, insulating film II2, interlayer insulating film III3, interlayer insulating film III4, insulating film II3, interlayer insulating film III5, and interlayer insulating film III6 are laminated in this order.

Further, the metal wiring portion M is formed by forming the contact M1 and the plugs M2, M3, M4 in this order.

Figure 29:
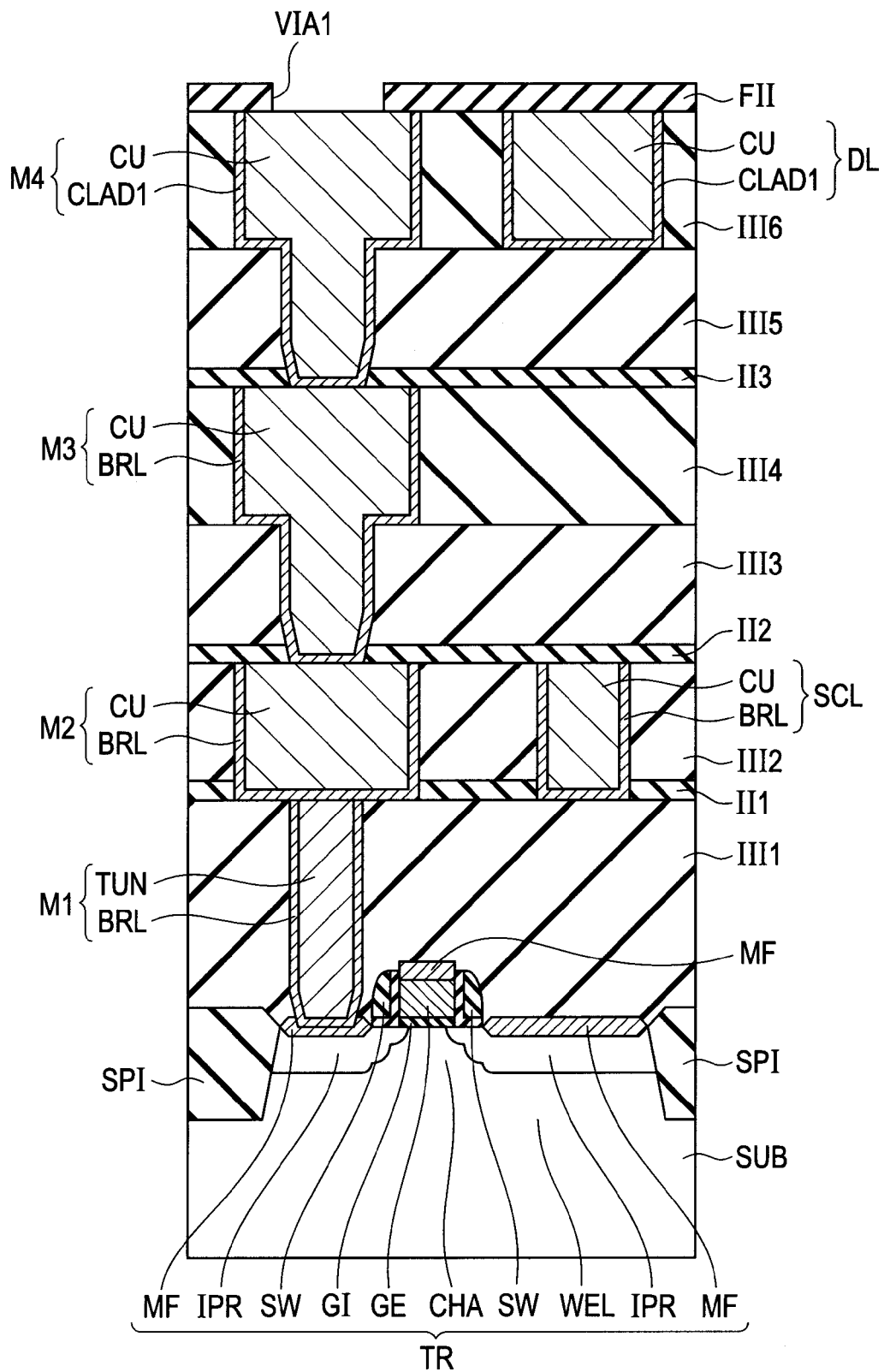
FIG. 29 is a schematic sectional view illustrating a manufacturing process step subsequent to the manufacturing process step illustrated in FIG. 27.
Figure 30:
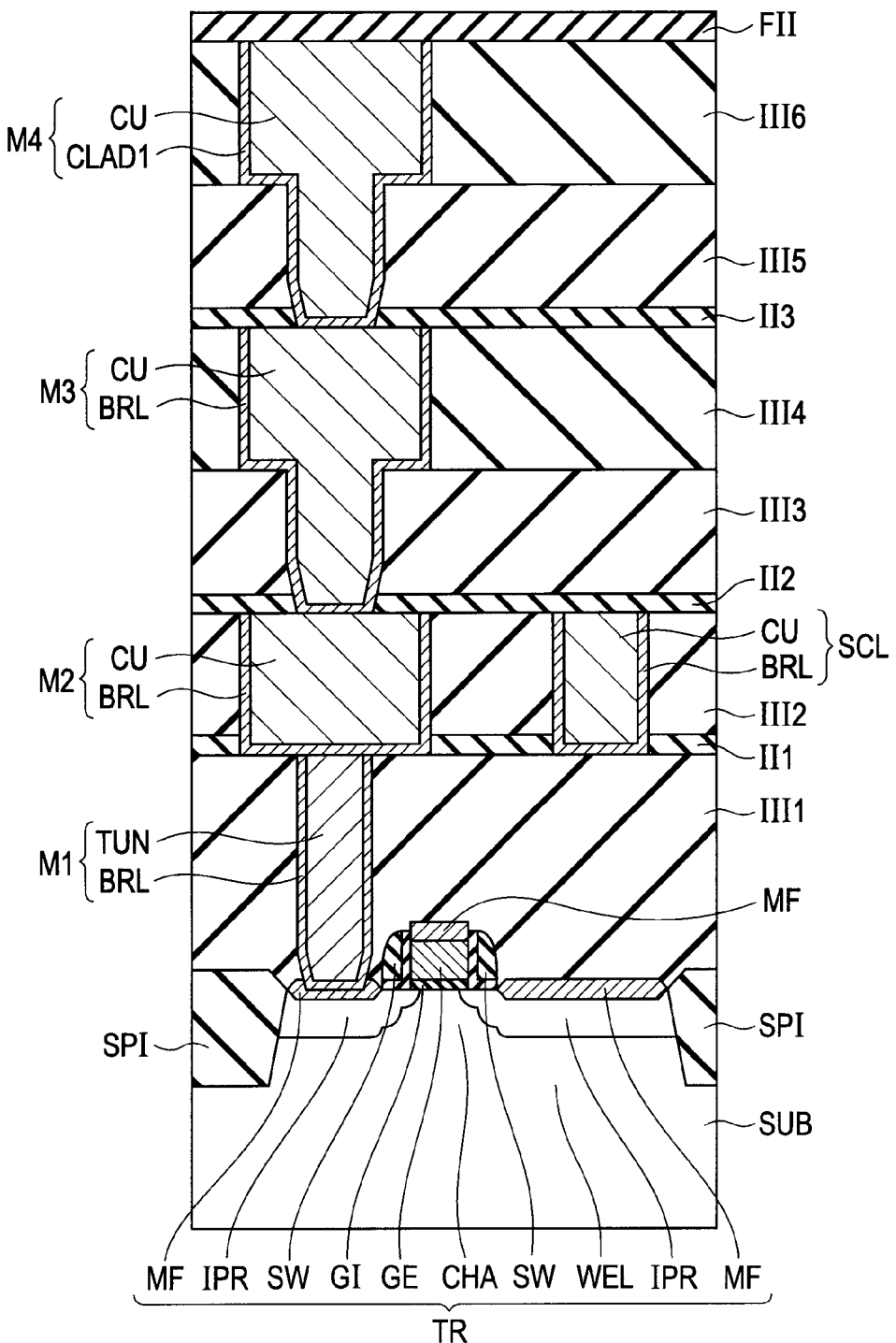
FIG. 30 is a schematic sectional view illustrating a mode of the peripheral circuit portion at the same manufacturing process step as in FIG. 29.
Figure 31:
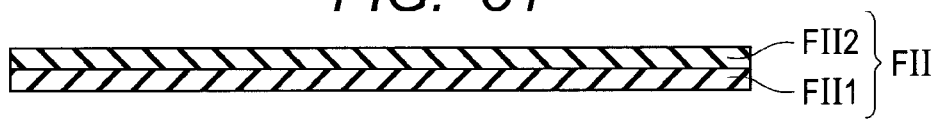
FIG. 31 is a schematic sectional view illustrating a flat insulating film that couples together a metal wiring portion and a magnetoresistive element.

Subsequently, as illustrated in FIG. 29 (memory cell portion) and FIG. 30 (peripheral circuit portion), an insulating film FII is formed over the upper surface of the interlayer insulating film III6. As illustrated in FIG. 31, it is desirable that the insulating film FII should be formed by taking the following procedure: an insulating film FII2 formed of a silicon dioxide ($SiO_2$) film or the like is laminated over the upper surface of an insulating film FII1 formed of a silicon nitride (SiN) film or the like. As illustrated in FIG. 29, a via hole VIA1 as a through hole is formed in the insulating film FII over the plug M4 in the memory cell portion.

Figure 32:
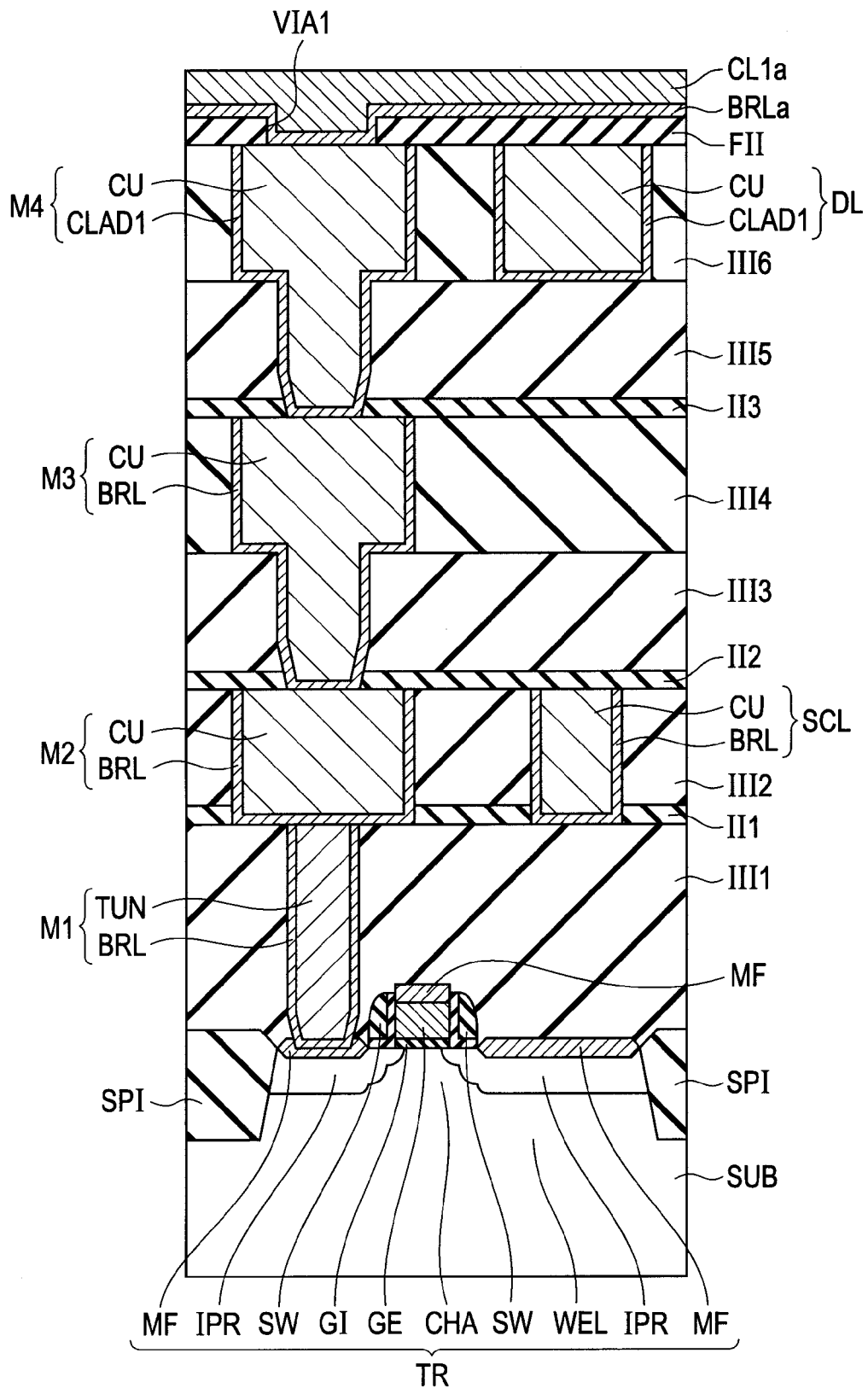
FIG. 32 is a schematic sectional view illustrating a manufacturing process step subsequent to the manufacturing process step illustrated in FIG. 29.
Figure 33:
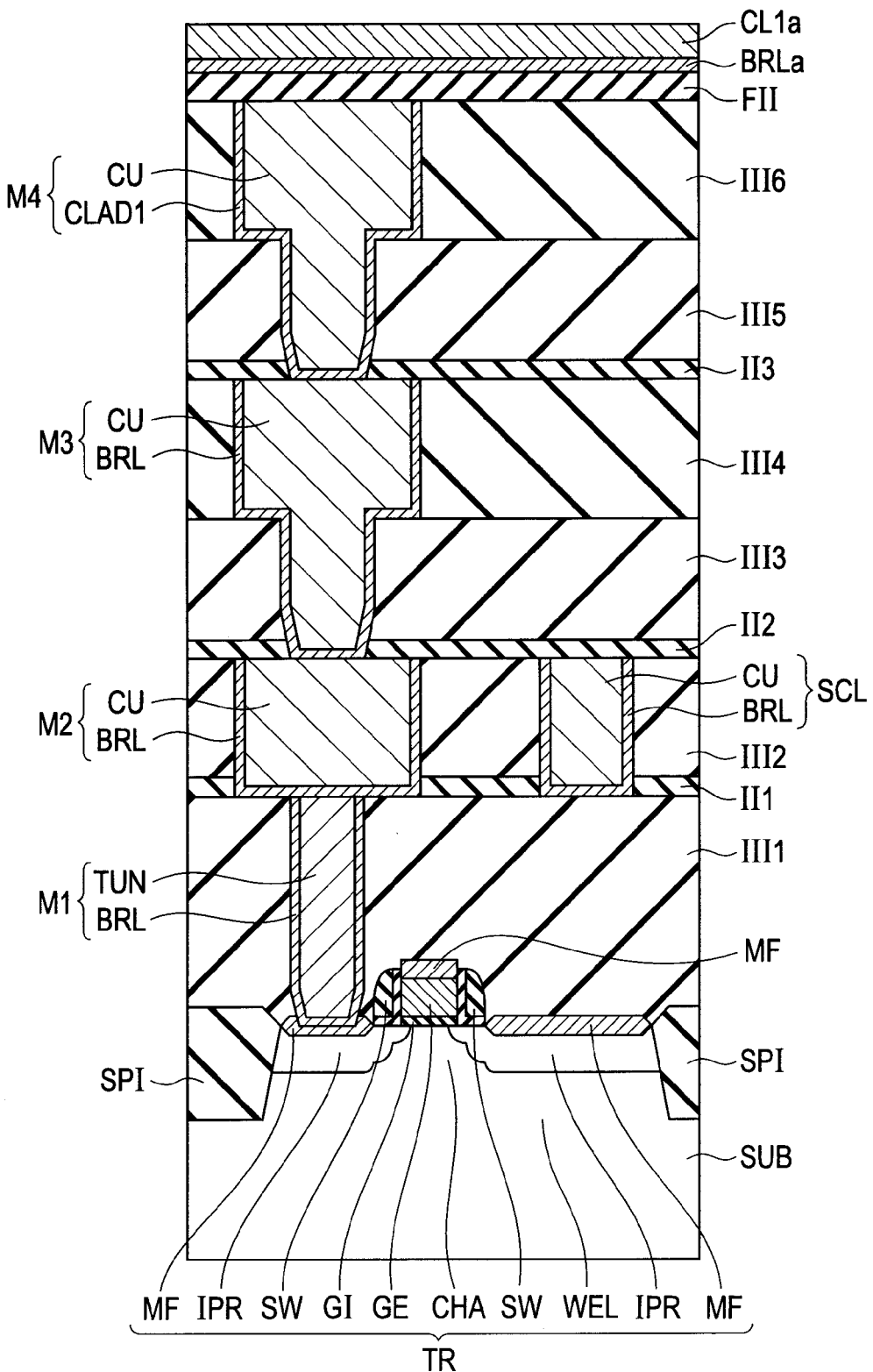
FIG. 33 is a schematic sectional view illustrating a mode of the peripheral circuit portion at the same manufacturing process step as in FIG. 32.

As illustrated in FIG. 32 (memory cell portion) and FIG. 33 (peripheral circuit portion), a barrier layer BRLa is formed over the insulating film FII and over the inner circumferential surface of the via hole VIA1. A conductive film CL1a is deposited over this barrier layer BRLa.

Figure 34:
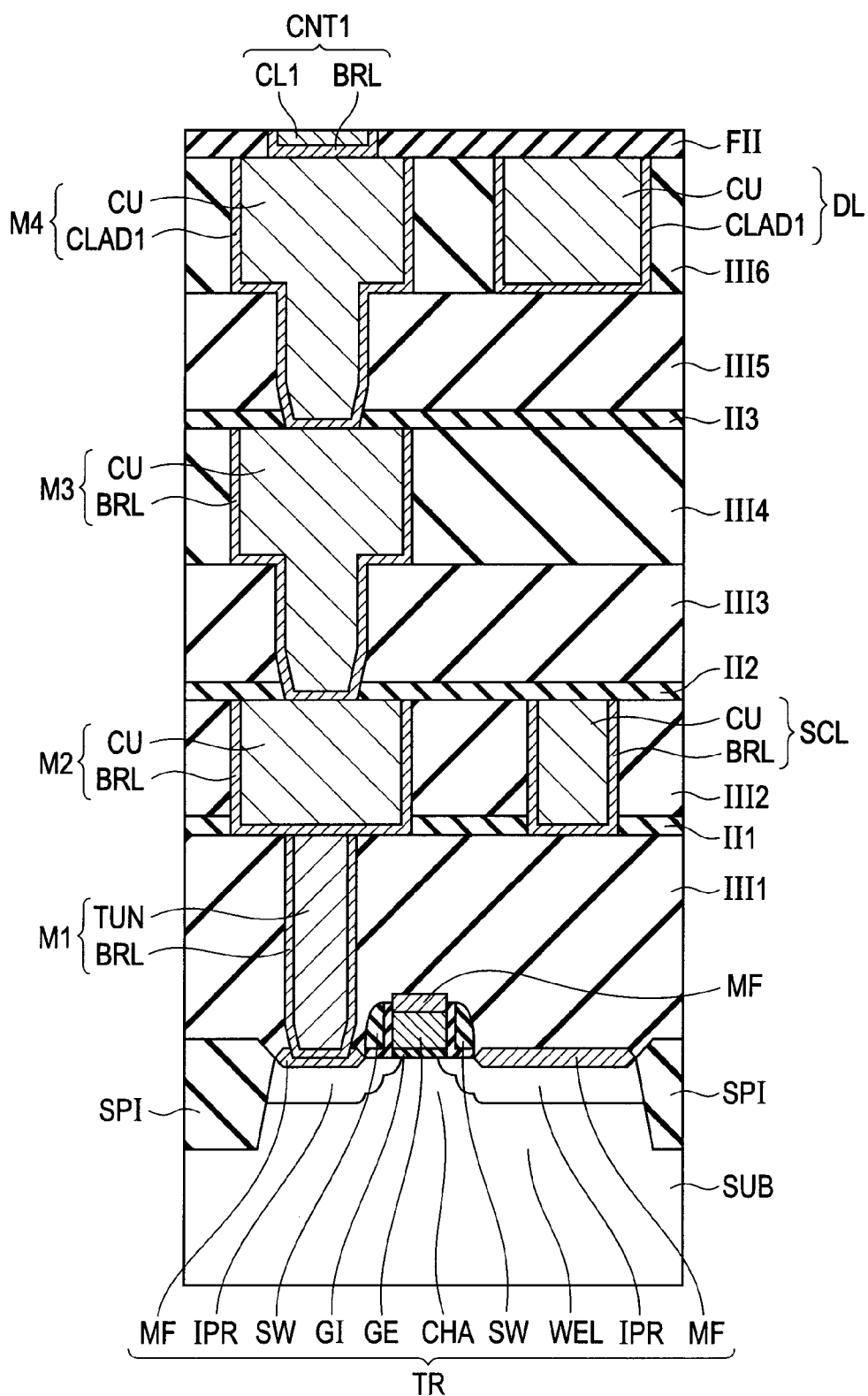
FIG. 34 is a schematic sectional view illustrating a manufacturing process step subsequent to the manufacturing process step illustrated in FIG. 32.
Figure 35:
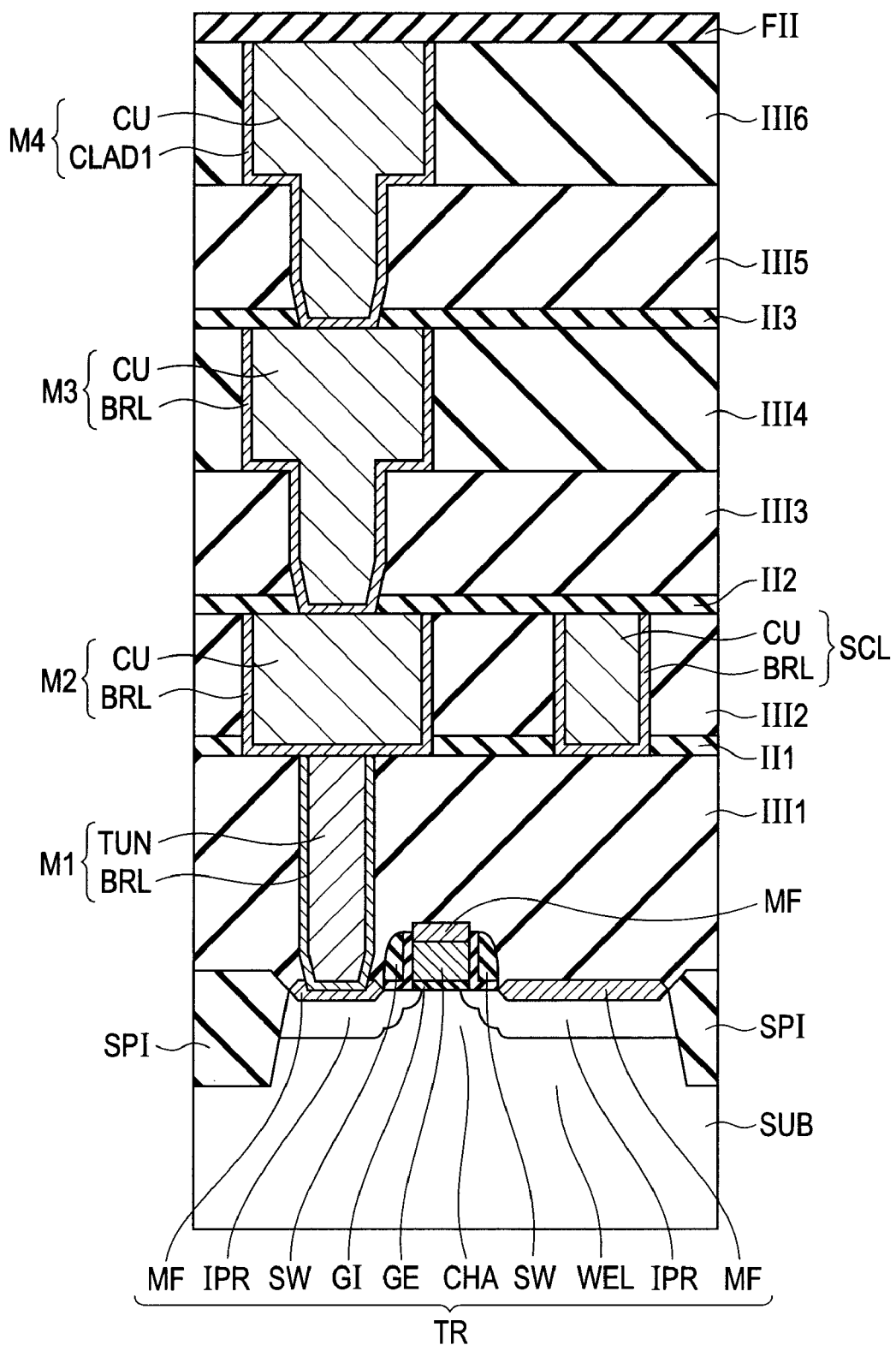
FIG. 35 is a schematic sectional view illustrating a mode of the peripheral circuit portion at the same manufacturing process step as in FIG. 34.

Thereafter, as illustrated in FIG. 34 (memory cell portion) and FIG. 35 (peripheral circuit portion), the barrier layer BRLa and conductive film CL1a formed over the insulating film FII are removed by a CMP method using the insulating film FII as a stopper film.

As a result, the contact portion CNT1 comprised of the barrier layer BRL and the conductive layer CL1 is formed. Meanwhile, the upper surface of the insulating film FII2 is flattened and a flat insulating film FII comprised of the flat insulating film FII1 and the flat insulating film FII2 is formed.

Figure 36:
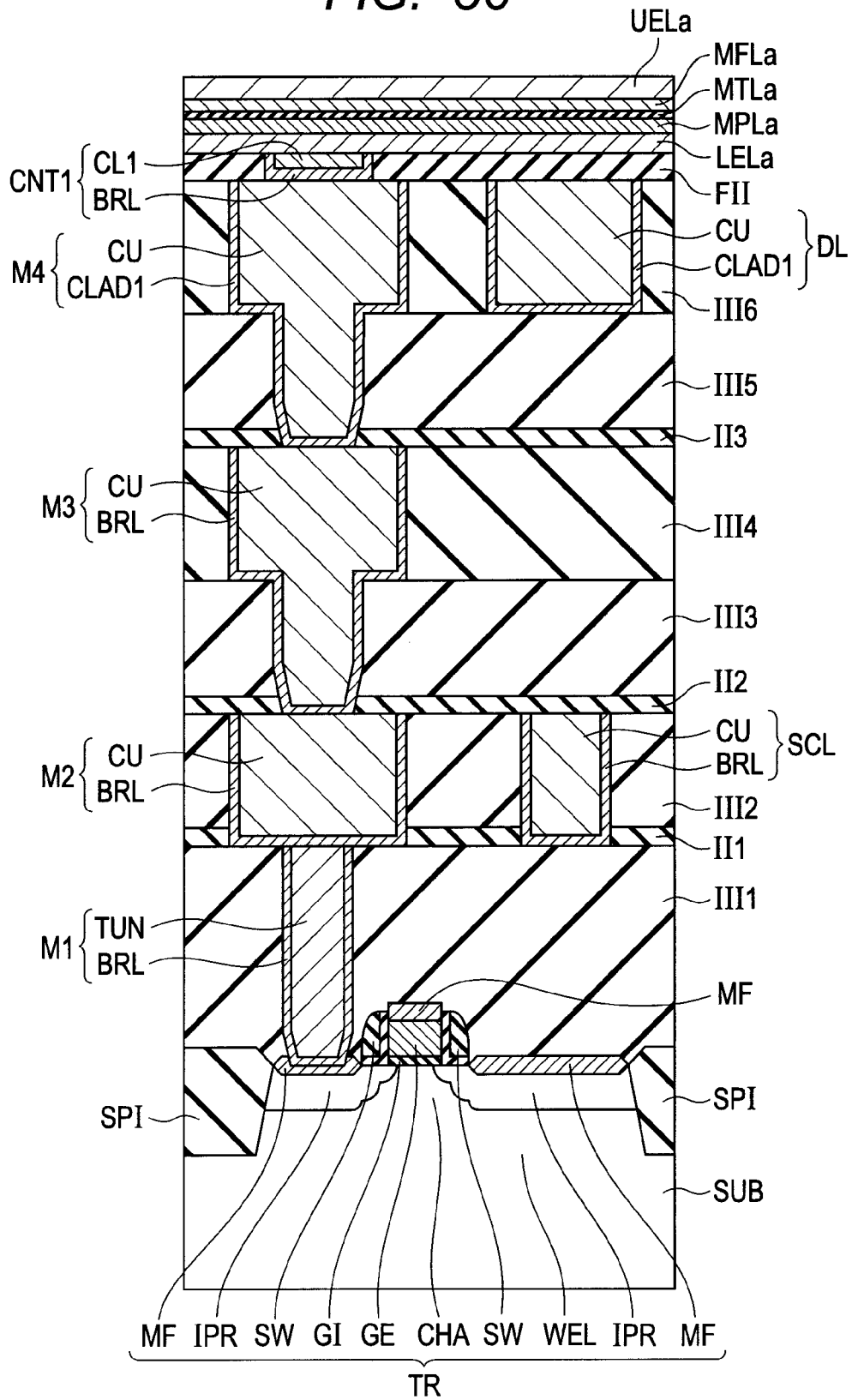
FIG. 36 is a schematic sectional view illustrating a manufacturing process step subsequent to the manufacturing process step illustrated in FIG. 34.
Figure 37:
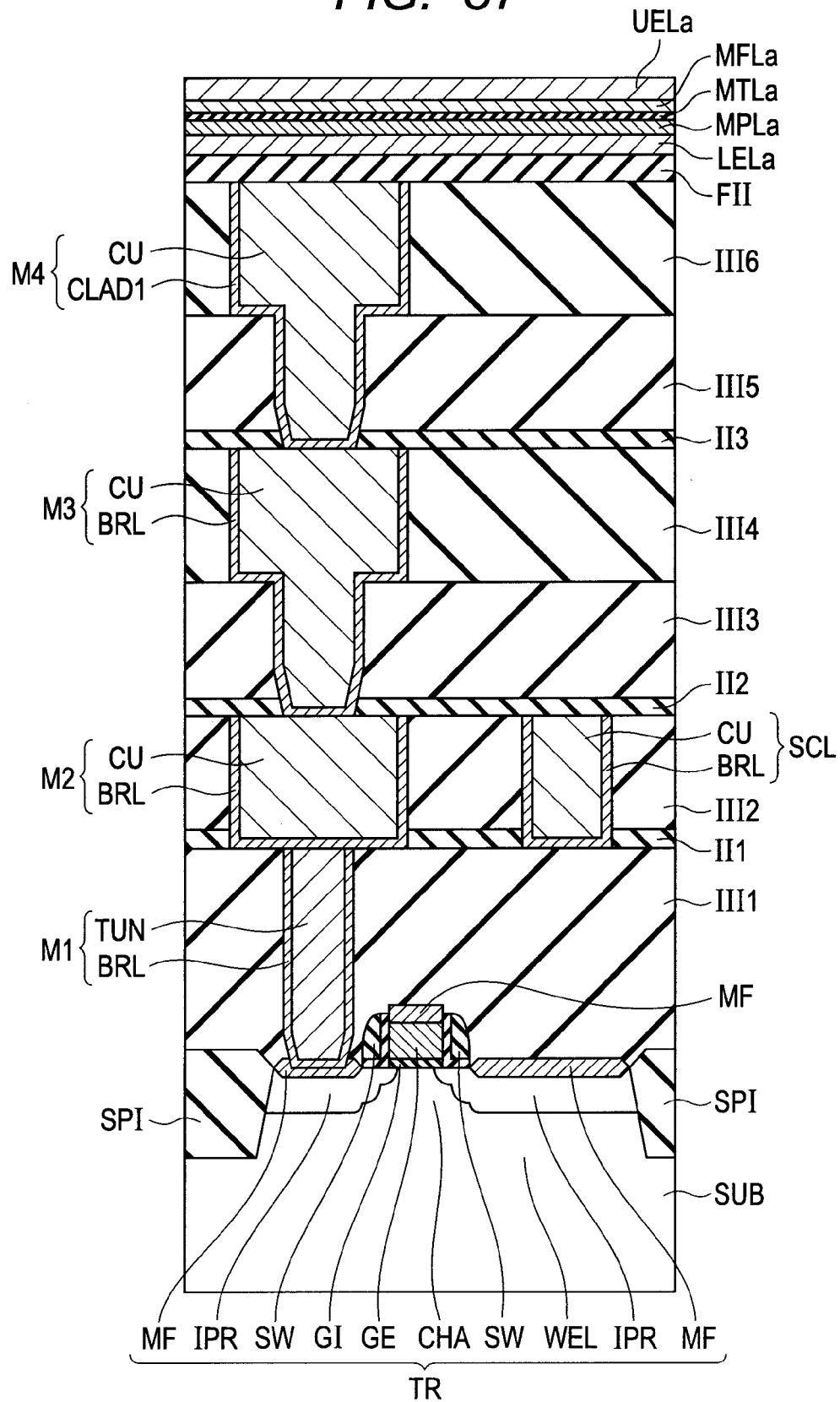
FIG. 37 is a schematic sectional view illustrating a mode of the peripheral circuit portion at the same manufacturing process step as in FIG. 36.

Subsequently, as illustrated in FIG. 36 (memory cell portion) and FIG. 37 (peripheral circuit portion), a conductive film LELa is formed over the flat insulating film FII (contact portion CNT1); and a conductive film MPLa, an insulating film MTLa, a conductive film MFLa, and a conductive film UELa are formed over the conductive film LELa in this order. The conductive film LELa is a layer to be the lower electrode LEL. The conductive film MPLa, insulating film MTLa, conductive film MFLa, and conductive film UELa are layers respectively to be the magnetization pinned layer MPL, tunnel insulating film MTL, magnetization free layer MFL, and upper electrode UEL. Therefore, it is desirable that the materials comprising each of the above-mentioned layers and their thicknesses should be identical with the materials of the lower electrode LEL, the magnetization pinned layer MPL, or the like to be formed and their thicknesses.

Figure 38:
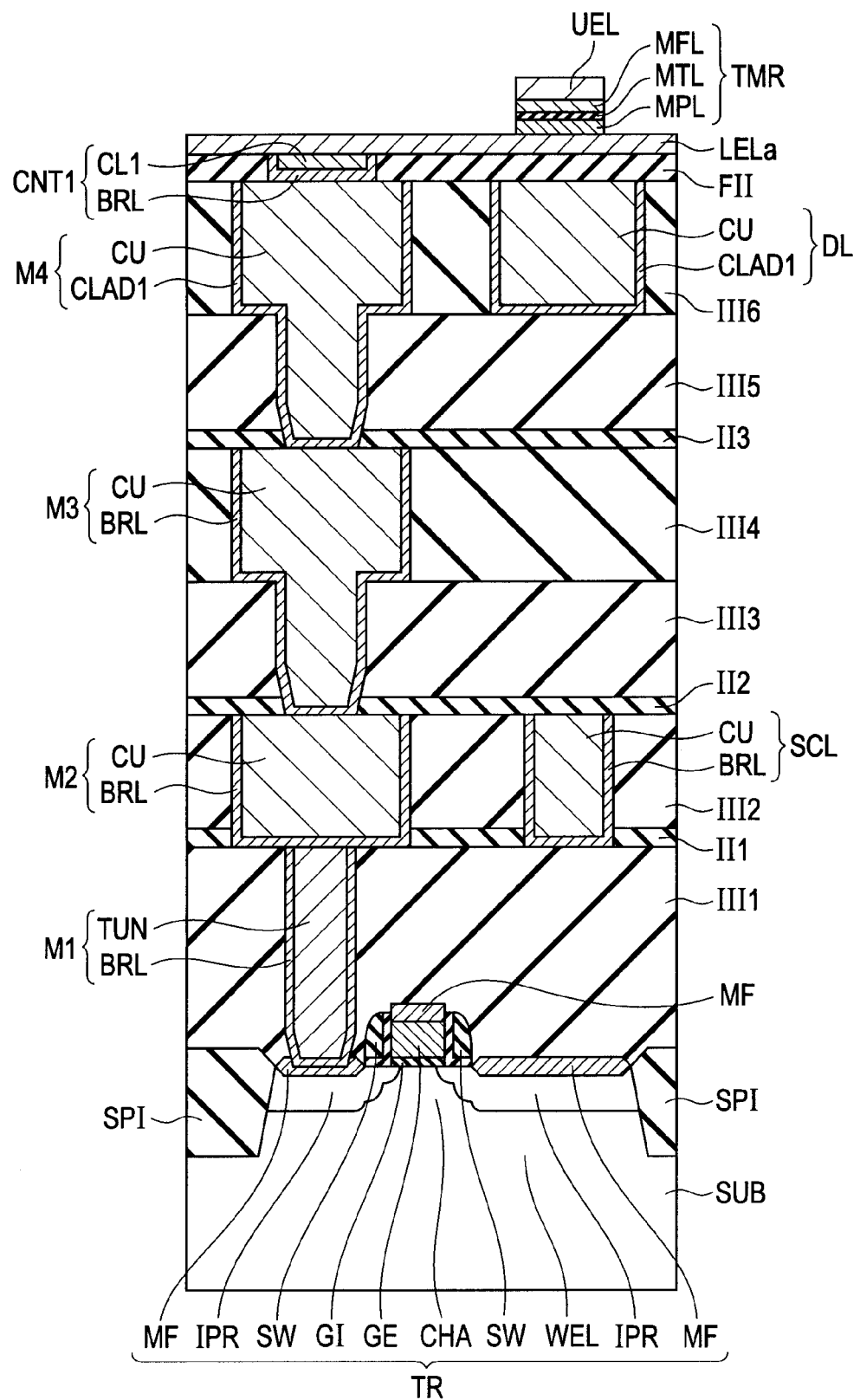
FIG. 38 is a schematic sectional view illustrating a manufacturing process step subsequent to the manufacturing process step illustrated in FIG. 36.
Figure 39:
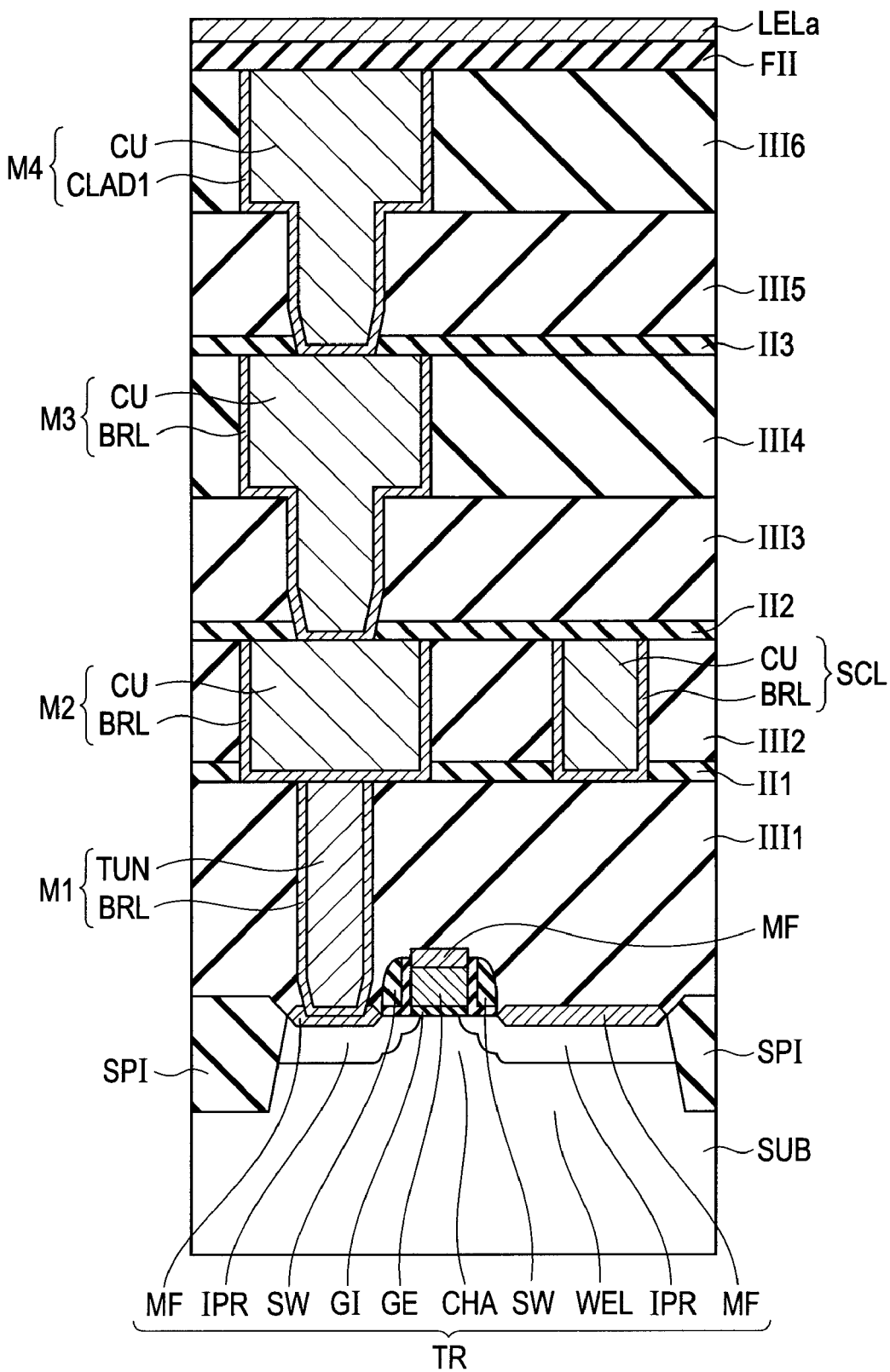
FIG. 39 is a schematic sectional view illustrating a mode of the peripheral circuit portion at the same manufacturing process step as in FIG. 38.

As illustrated in FIG. 38 (memory cell portion) and FIG. 39 (peripheral circuit portion), the conductive film MPLa, insulating film MTLa, conductive film MFLa, and conductive film UELa are patterned. A magnetoresistive element TMR and an upper electrode UEL formed over the upper surface of this magnetoresistive element TMR are thereby formed. The areas of the upper electrode UEL and lower electrode LEL illustrated in FIG. 38 as viewed in a plane are just examples. For example, the area of the upper electrode UEL as viewed in a plane may be larger than that of the magnetoresistive element TMR.

Figure 40:
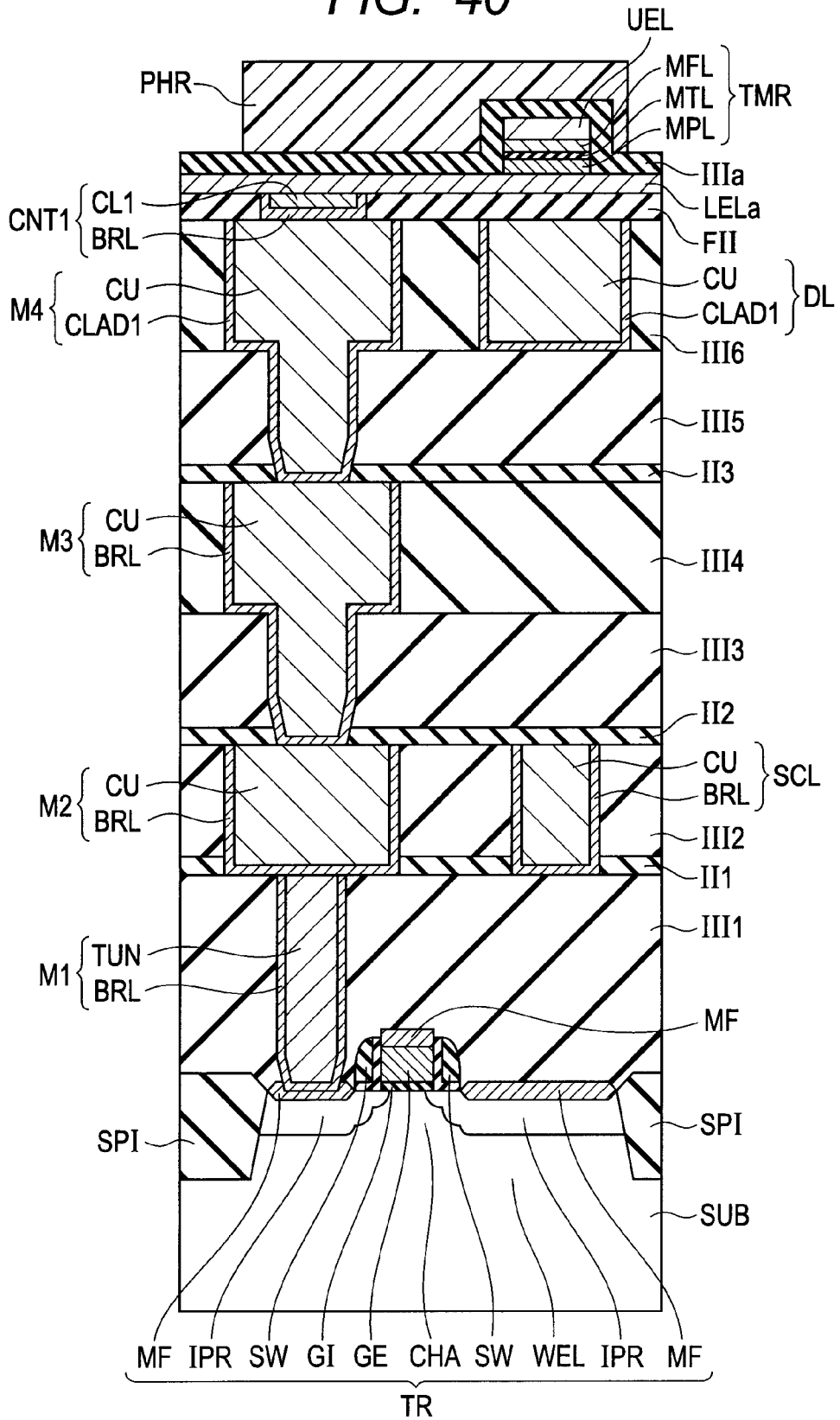
FIG. 40 is a schematic sectional view illustrating a manufacturing process step subsequent to the manufacturing process step illustrated in FIG. 38.
Figure 41:
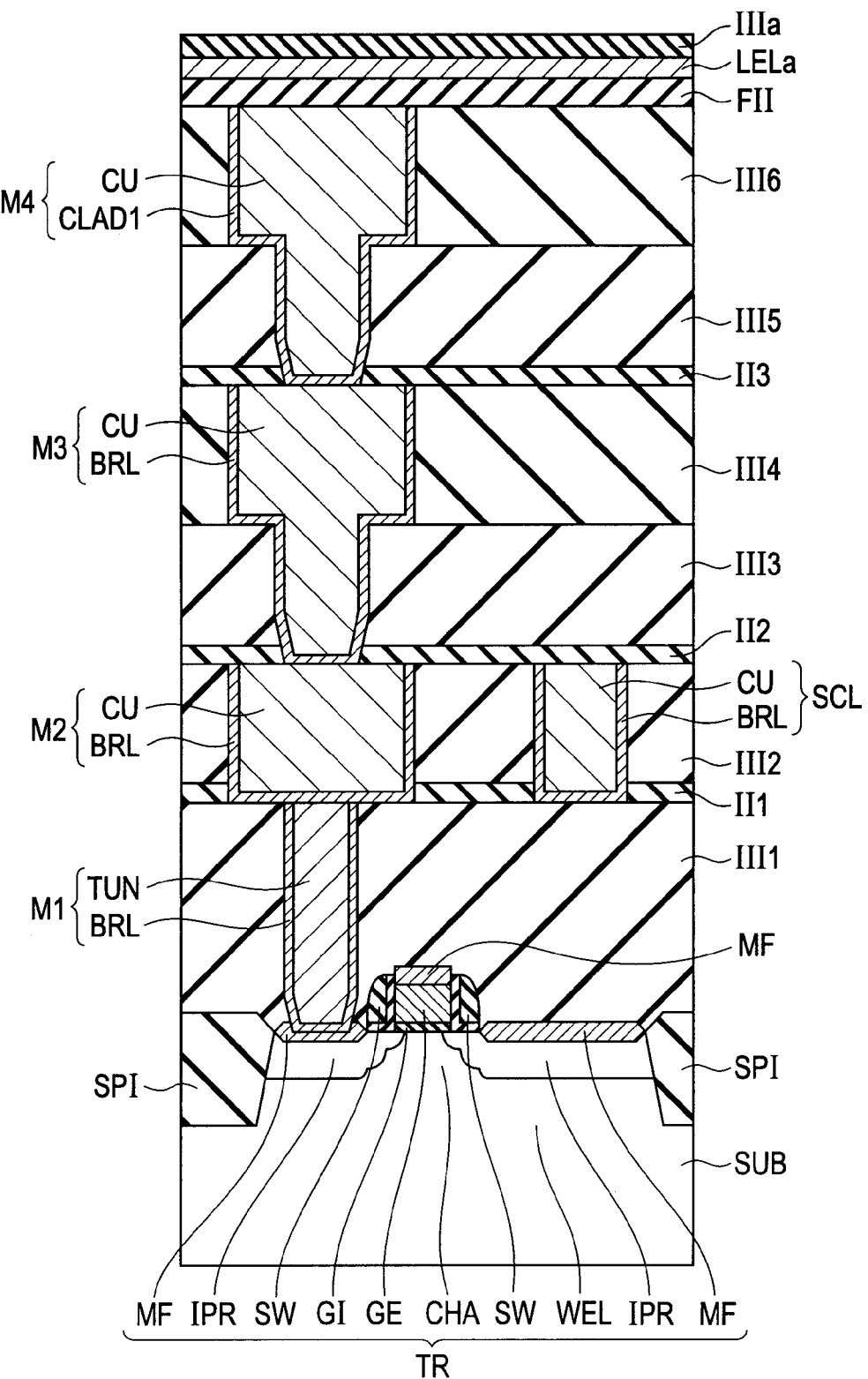
FIG. 41 is a schematic sectional view illustrating a mode of the peripheral circuit portion at the same manufacturing process step as in FIG. 40.

As illustrated in FIG. 40 (memory cell portion) and FIG. 41 (peripheral circuit portion), an insulating film IIIa formed of a silicon nitride film or the like is formed over the conductive film LELa so that the magnetoresistive element TMR is covered therewith. This insulating film IIIa is a layer to be a protective layer III. The protective layer III is used to suppress problems, such as the leakage of a magnetic field, due to the following: oxidation of the side surfaces of, especially, the magnetization free layer MFL, the magnetization pinned layer MPL, and the like comprising each magnetoresistive element TMR. It is desirable to use a CVD (Chemical Vapor Deposition) method or the like to form the insulating film IIIa. It is desirable that the film thickness of the insulating film IIIa should be not less than 10 nm and not more than 80 nm; and it is more desirable that the film thickness should be not less than 40 nm and not more than 70 nm.

Figure 42:
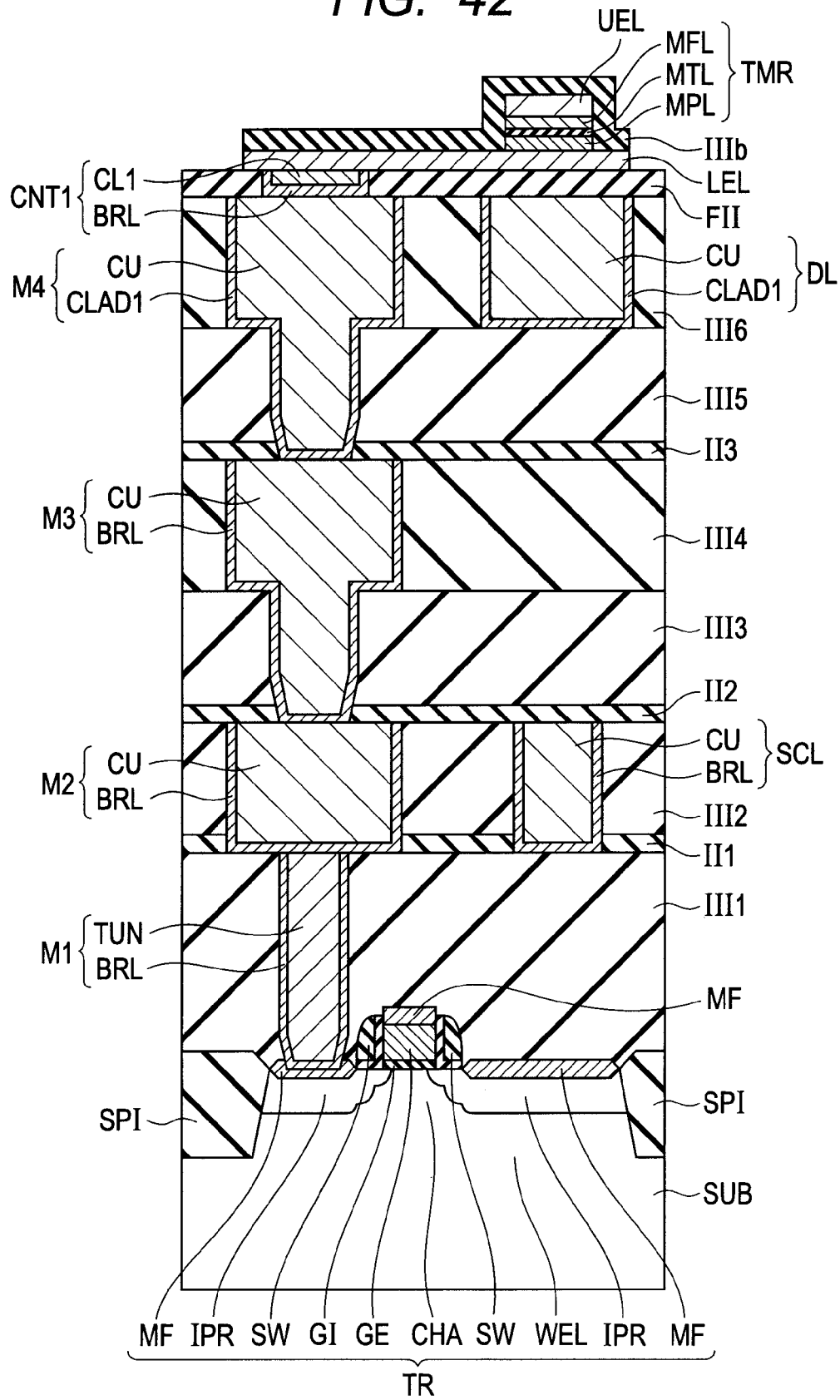
FIG. 42 is a schematic sectional view illustrating a manufacturing process step subsequent to the manufacturing process step illustrated in FIG. 40.
Figure 43:
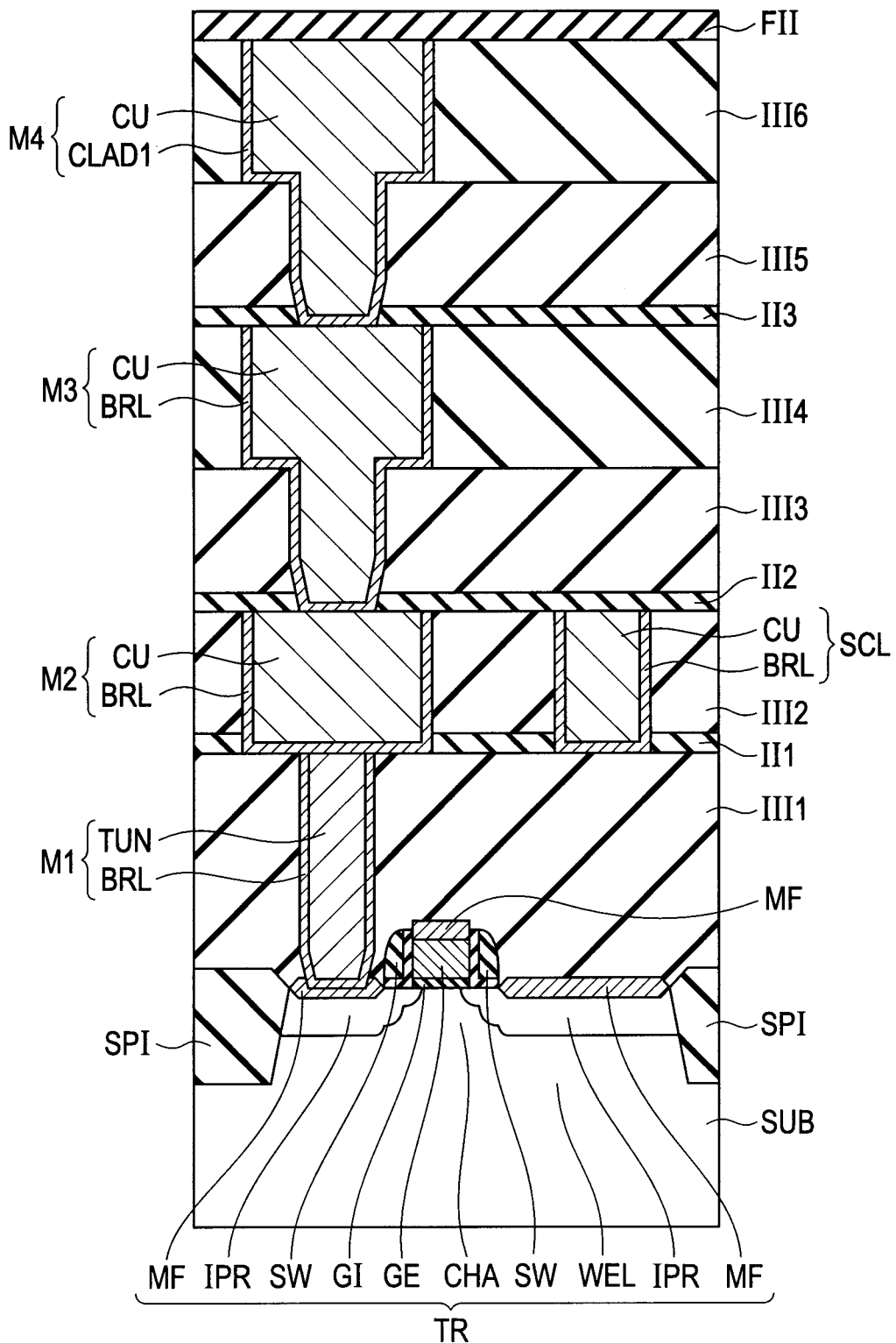
FIG. 43 is a schematic sectional view illustrating a mode of the peripheral circuit portion at the same manufacturing process step as in FIG. 42.

A resist film is formed over this insulating film IIIa and the resist film is patterned for the formation of a lower electrode LEL to form a resist pattern PHR. Using this resist pattern as a mask, the insulating film IIIa and the conductive film LELa are patterned. As illustrated in FIG. 42 (memory cell portion), an insulating film IIIb and a lower electrode LEL are thereby formed. The mode of the peripheral circuit portion at this time is as illustrated in FIG. 43.

With respect to each of the following steps illustrated in FIG. 44 to FIG. 58, the following three views are represented in parallel: a sectional view illustrating a mode in which MRAM in the memory cell portion is formed, as viewed from the same direction as in FIG. 5, similarly to FIG. 17 to FIG. 23; a sectional view illustrating a mode in which MRAM in the memory cell portion is formed, as viewed from the same direction as in FIG. 6; and a sectional view illustrating a mode in which the peripheral circuit is formed, as viewed from the same direction as in FIG. 7. In each drawing, the part located under the insulating film II3 (on the semiconductor substrate SUB side) is omitted.

Figure 44:
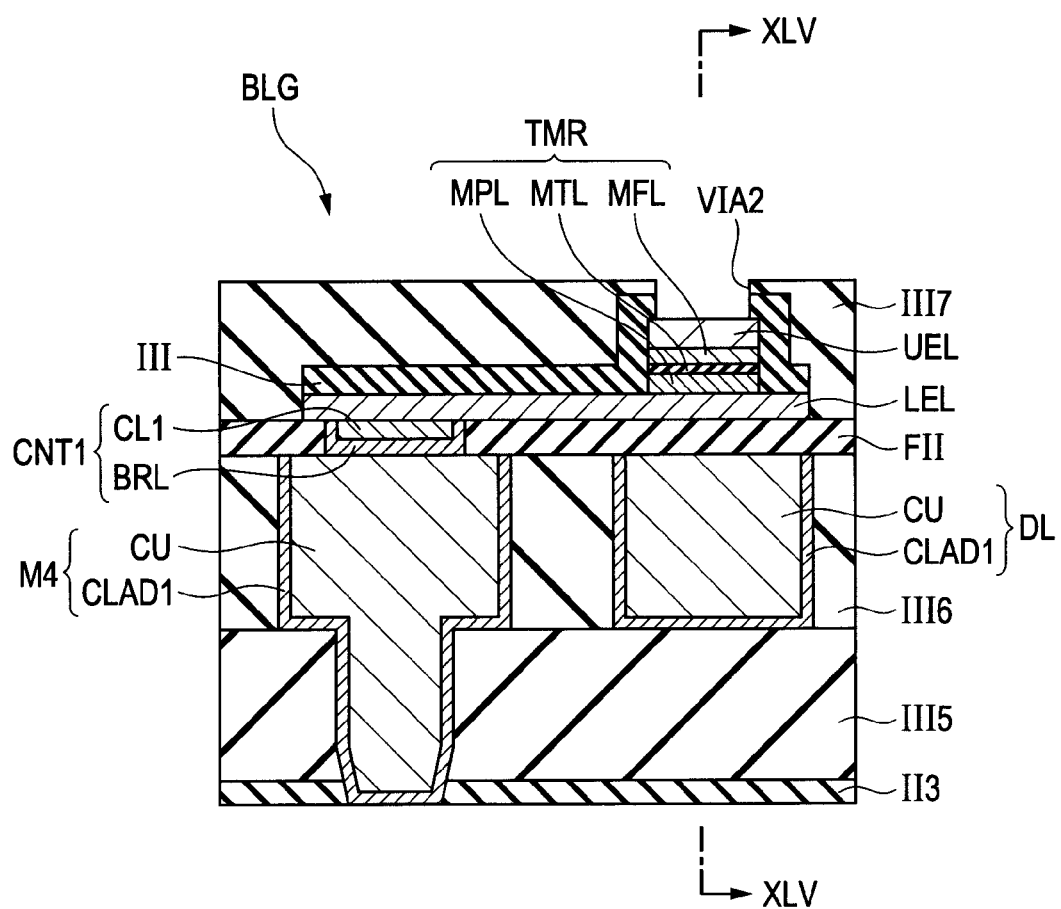
FIG. 44 is a schematic sectional view illustrating a manufacturing process step subsequent to the manufacturing process step illustrated in FIG. 42.
Figure 45:
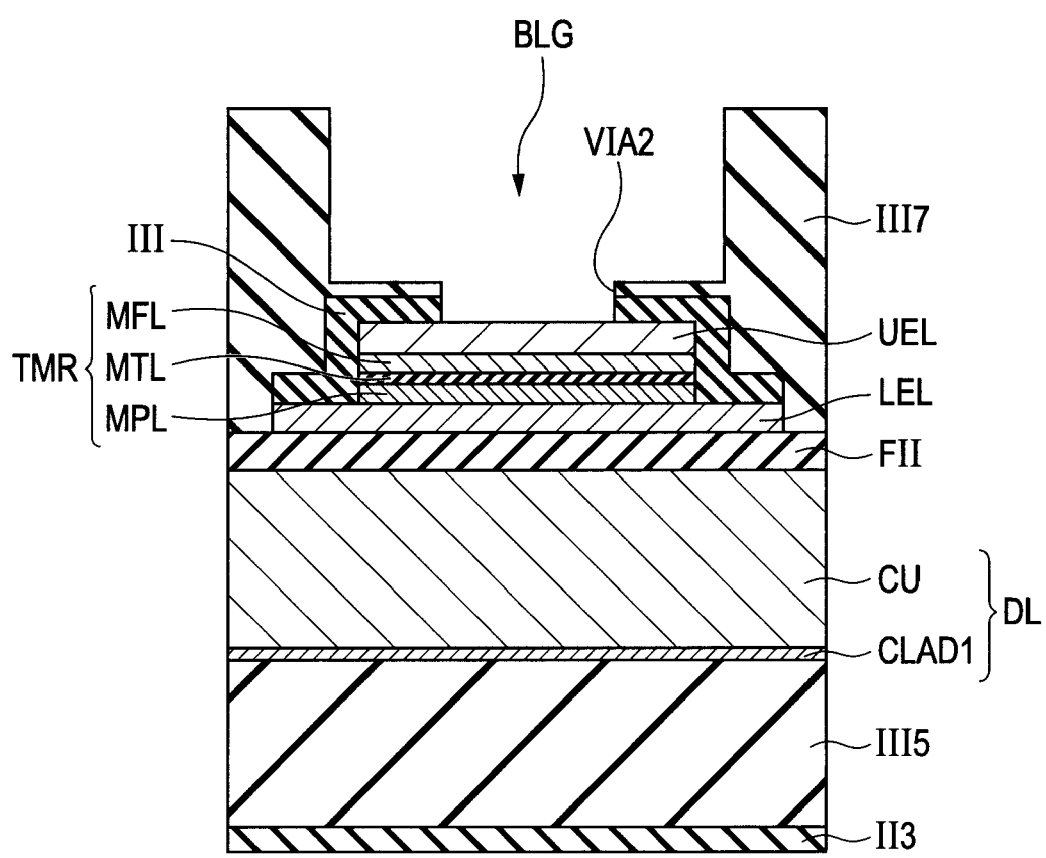
FIG. 45 is a schematic sectional view taken along line XLV-XLV of FIG. 44.

As illustrated in FIG. 44 and FIG. 45 (memory cell portion), an interlayer insulating film III7 comprised of a silicon dioxide film or the like is formed. This interlayer insulating film III7 is so formed that the areas over and around the insulating film IIIb of the magnetoresistive element TMR in FIG. 42 and the area around the lower electrode LEL in the same drawing are covered therewith. Chemical mechanical polishing (CMP) processing is carried out on this interlayer insulating film III7. Then groove portions BLG for bit lines extended so that they couple the multiple magnetoresistive elements TMR arranged in the left and right direction in FIG. 44 are formed in the interlayer insulating film III7. As the same time, a via hole VIA2 as a through hole is formed in a position where it overlaps with the upper electrode UEL as viewed in a plane.

Figure 46:
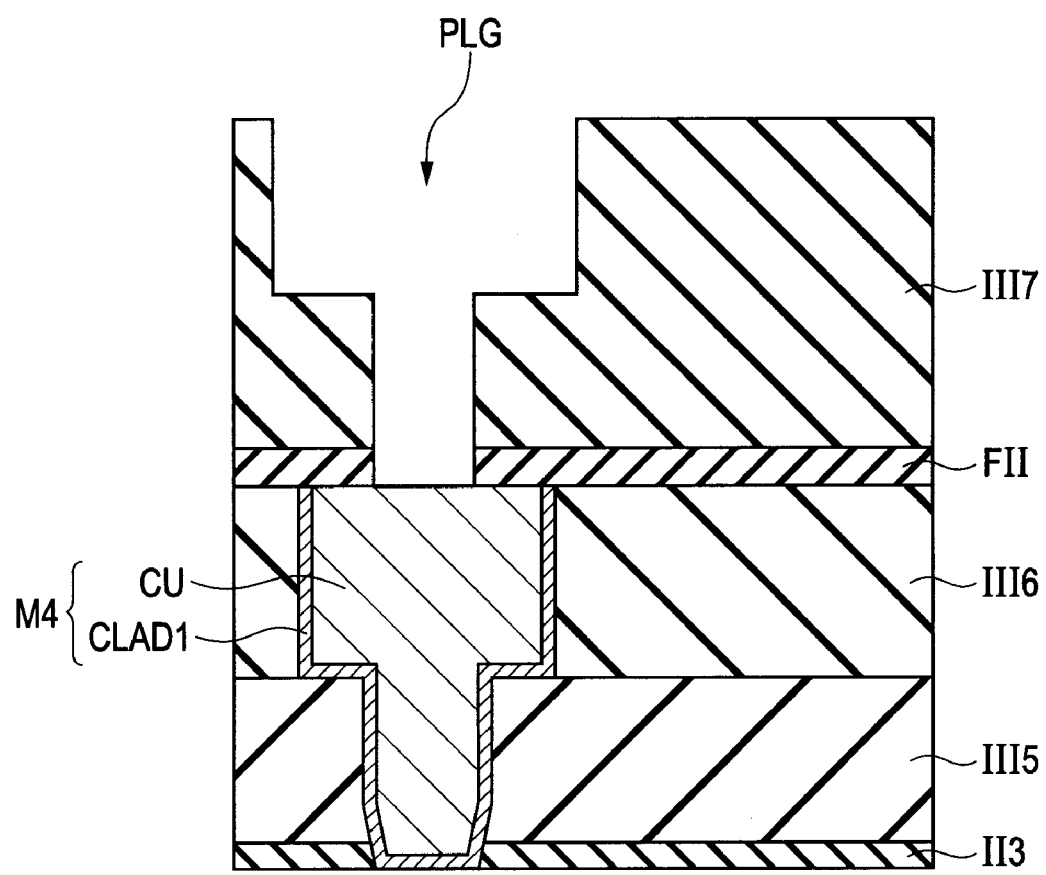
FIG. 46 is a schematic sectional view illustrating a mode of the peripheral circuit portion at the same manufacturing process step as in FIG. 44.

At the same time as the foregoing, as illustrated in FIG. 46, a plug hole PLG is formed in the interlayer insulating film III7 in the peripheral circuit portion. This plug hole PLG is so formed that it extends to the lowermost face of the flat insulating film FII (the uppermost upper surface of the plug M4).

Figure 47:
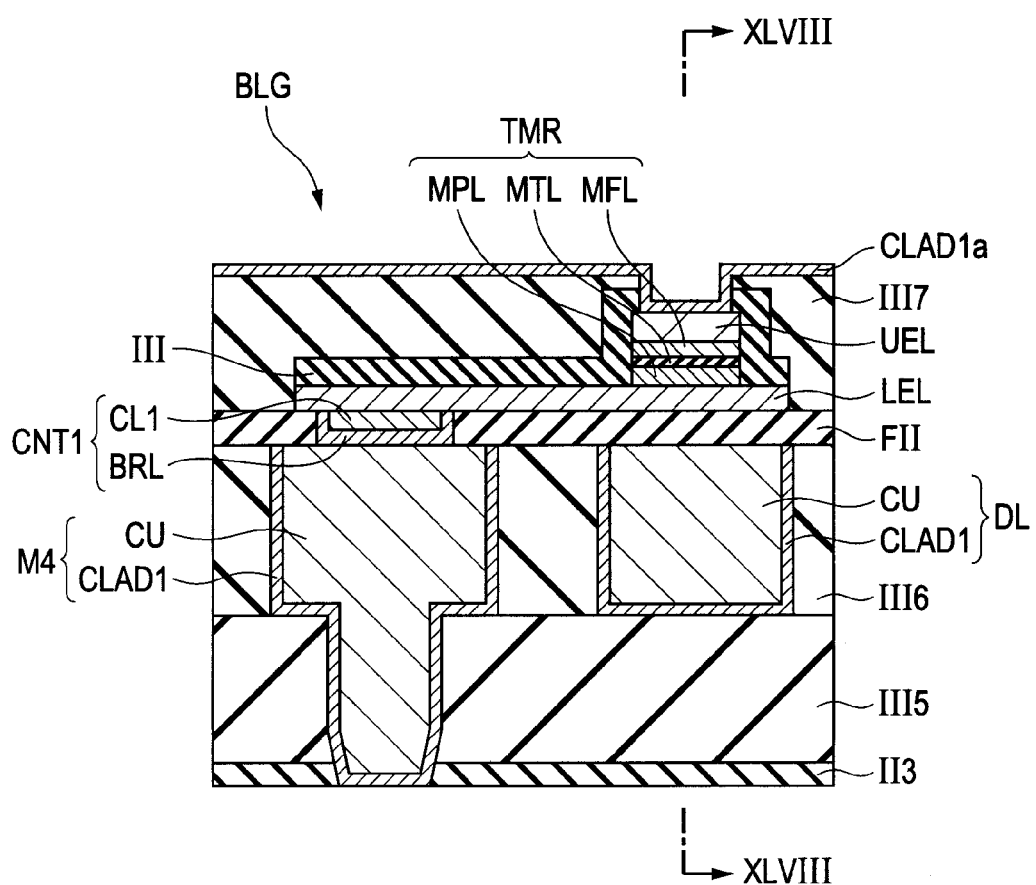
FIG. 47 is a schematic sectional view illustrating a manufacturing process step subsequent to the manufacturing process step illustrated in FIG. 44.
Figure 48:
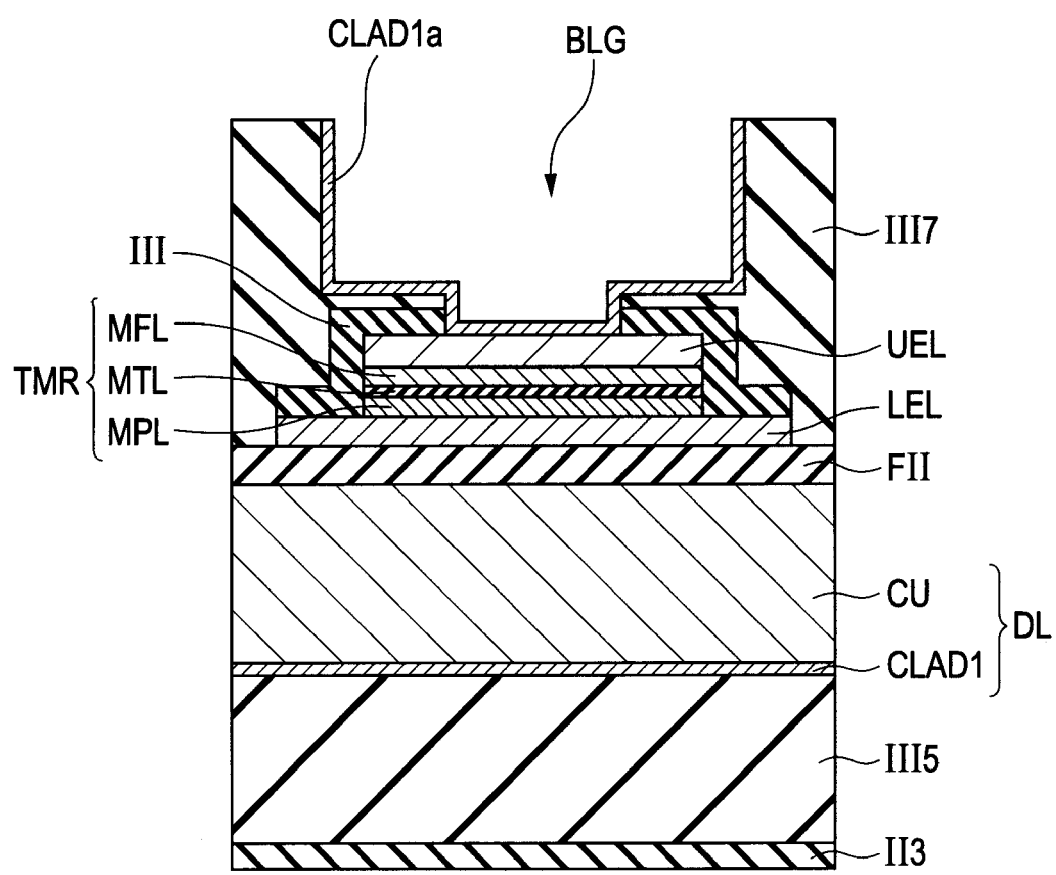
FIG. 48 is a schematic sectional view taken along line XLVIII-XLVIII of FIG. 47.

Subsequently, as illustrated in FIG. 47 and FIG. 48 (memory cell portion) and FIG. 49 (peripheral circuit portion), the same cladding layer CLAD1a as in FIG. 24 and FIG. 25 is formed over the following inner surfaces: the inner surfaces of the groove portions BLG for bit lines and the via holes VIA2 and the inner surfaces of the plug holes PLG in the peripheral circuit portion.

Figure 49:
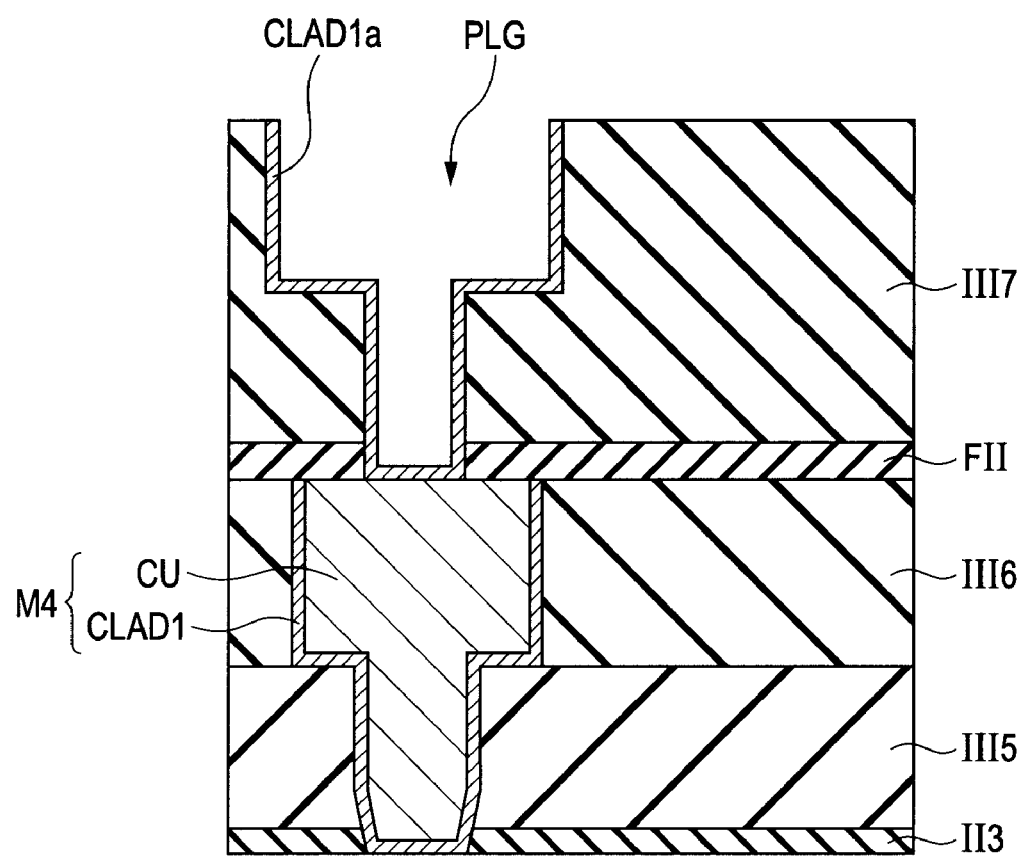
FIG. 49 is a schematic sectional view illustrating a mode of the peripheral circuit portion at the same manufacturing process step as in FIG. 47.
Figure 50:
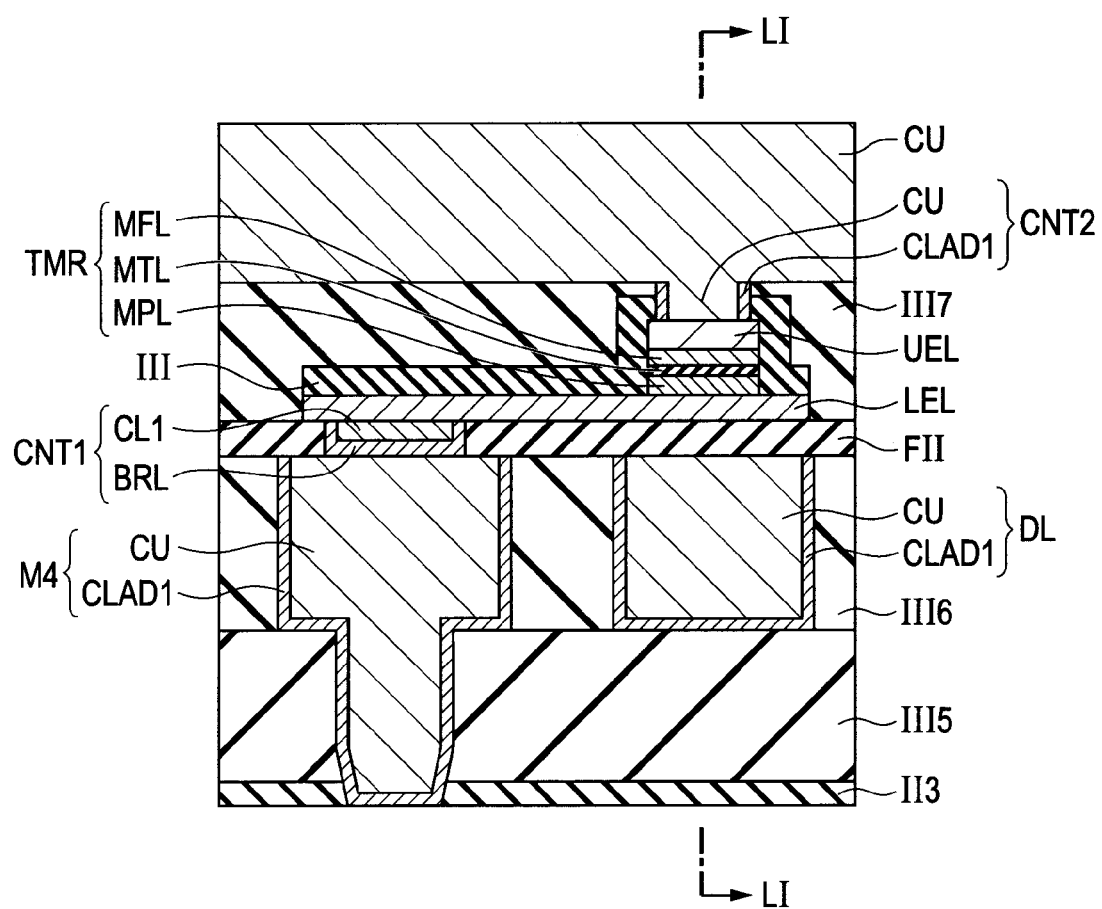
FIG. 50 is a schematic sectional view illustrating a manufacturing process step subsequent to the manufacturing process step illustrated in FIG. 47.
Figure 51:
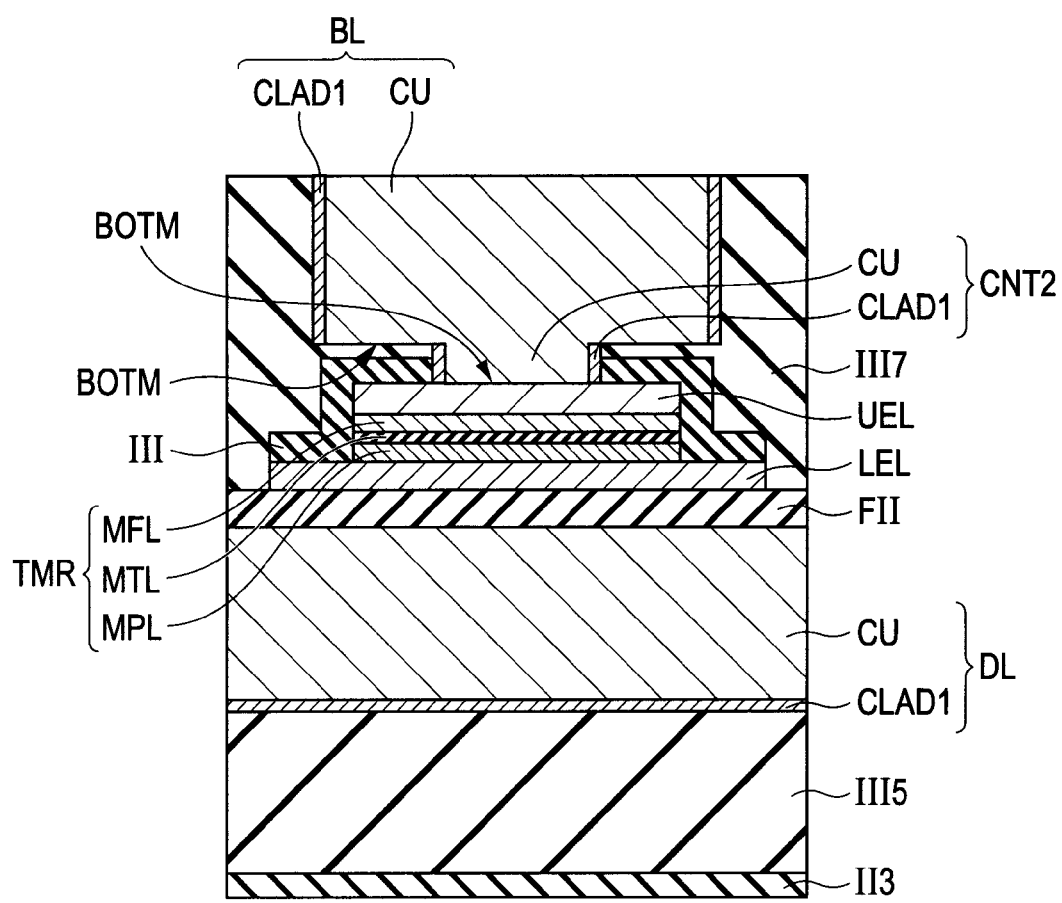
FIG. 51 is a schematic sectional view taken along line LI-LI of FIG. 50.
Figure 52:
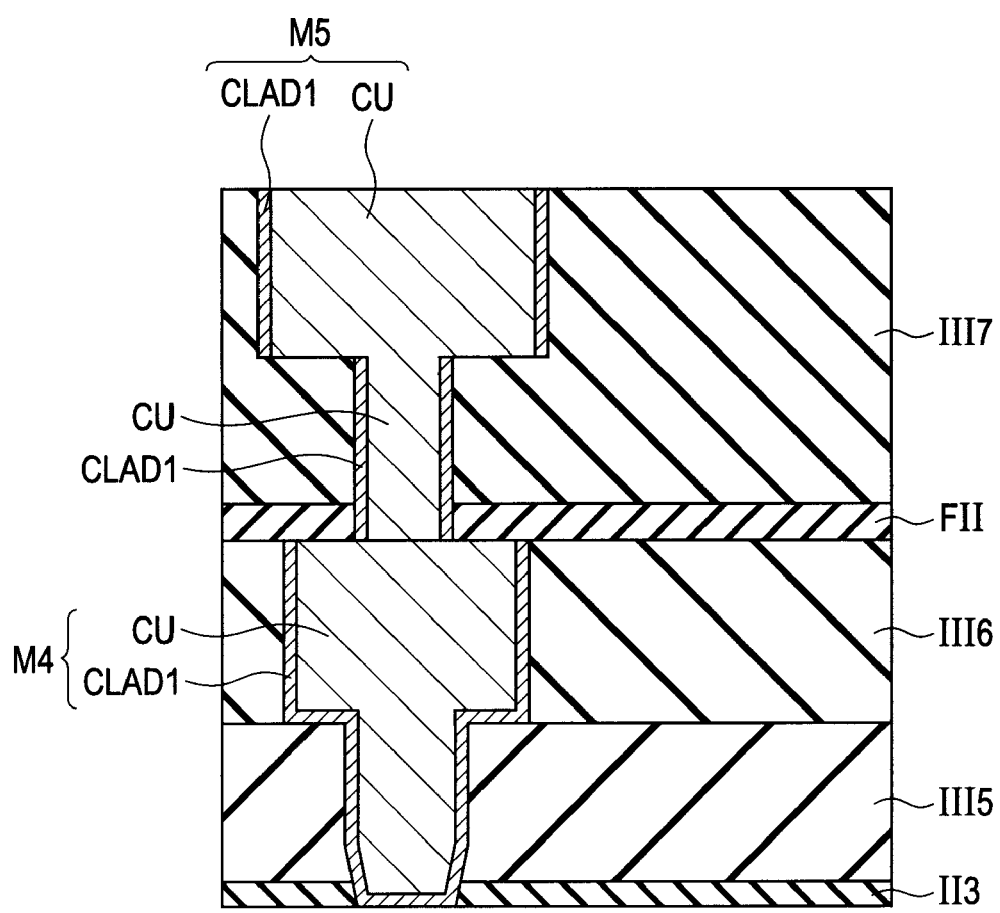
FIG. 52 is a schematic sectional view illustrating a mode of the peripheral circuit portion at the same manufacturing process step as in FIG. 50.

Subsequently, as illustrated in FIG. 50 and FIG. 51 (memory cell portion) and FIG. 52 (peripheral circuit portion), it is desirable to carry out the following processing: of the cladding layer CLAD1a formed at the process illustrated in FIG. 47 to FIG. 49, part formed at the bottom BOTM is removed by etching to turn the cladding layer CLAD1a into the cladding layer CLAD1.

Thereafter, a conductive film CU of copper or the like is filled in the groove portion BLG for a bit line, a via hole VIA2, and a plug hole PLG. Then this conductive film CU is flattened to form a bit line BL, wiring M5, and a contact portion CNT2.

Figure 54:
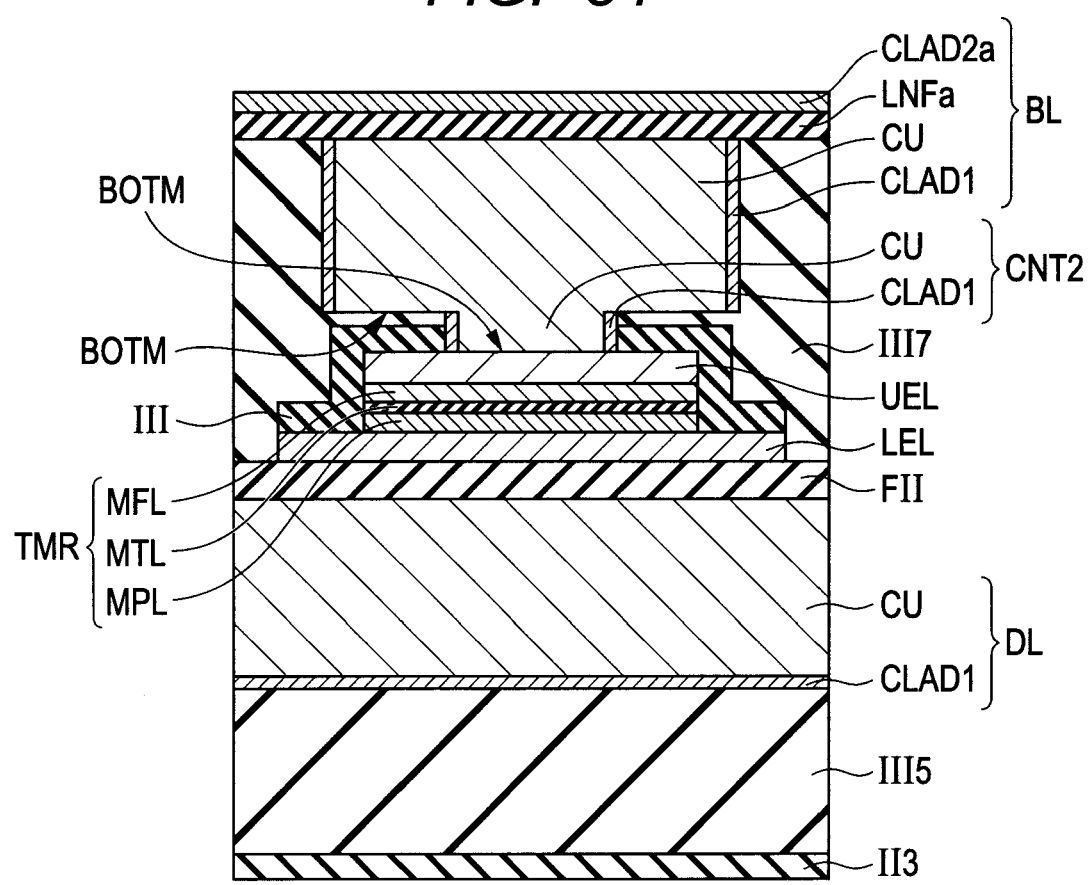
FIG. 54 is a schematic sectional view taken along line LIV-LIV of FIG. 53.

Subsequently, as illustrated in FIG. 53 and FIG. 54 (memory cell portion) and FIG. 55 (peripheral circuit portion), a liner film LNFa and a cladding layer CLAD2a are formed over the bit line BL and the wiring M5. The film and the layer are layers respectively to be a liner film LNF and a cladding layer CLAD2.

Figure 56:
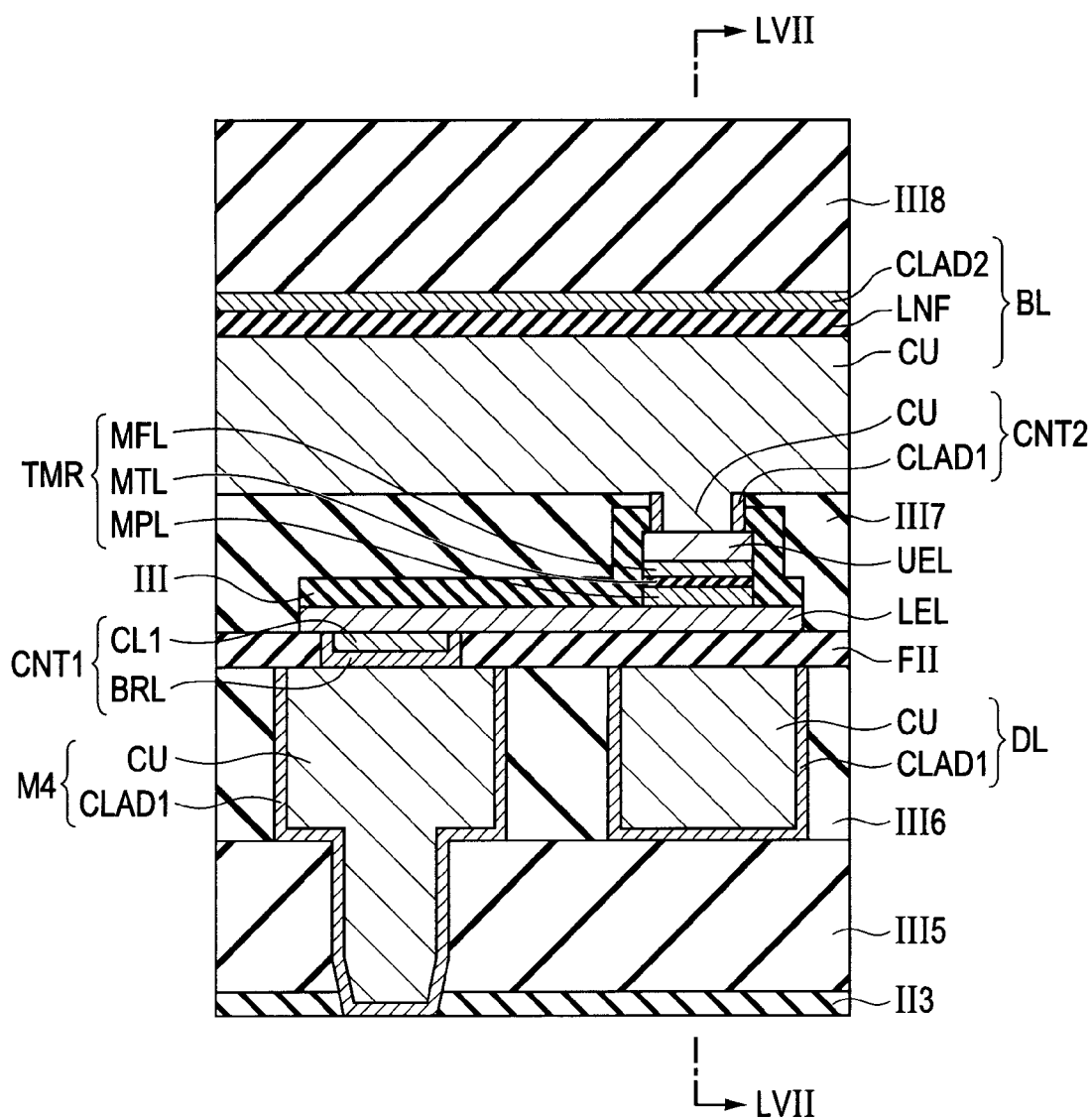
FIG. 56 is a schematic sectional view illustrating a manufacturing process step subsequent to the manufacturing process step illustrated in FIG. 53.
Figure 57:
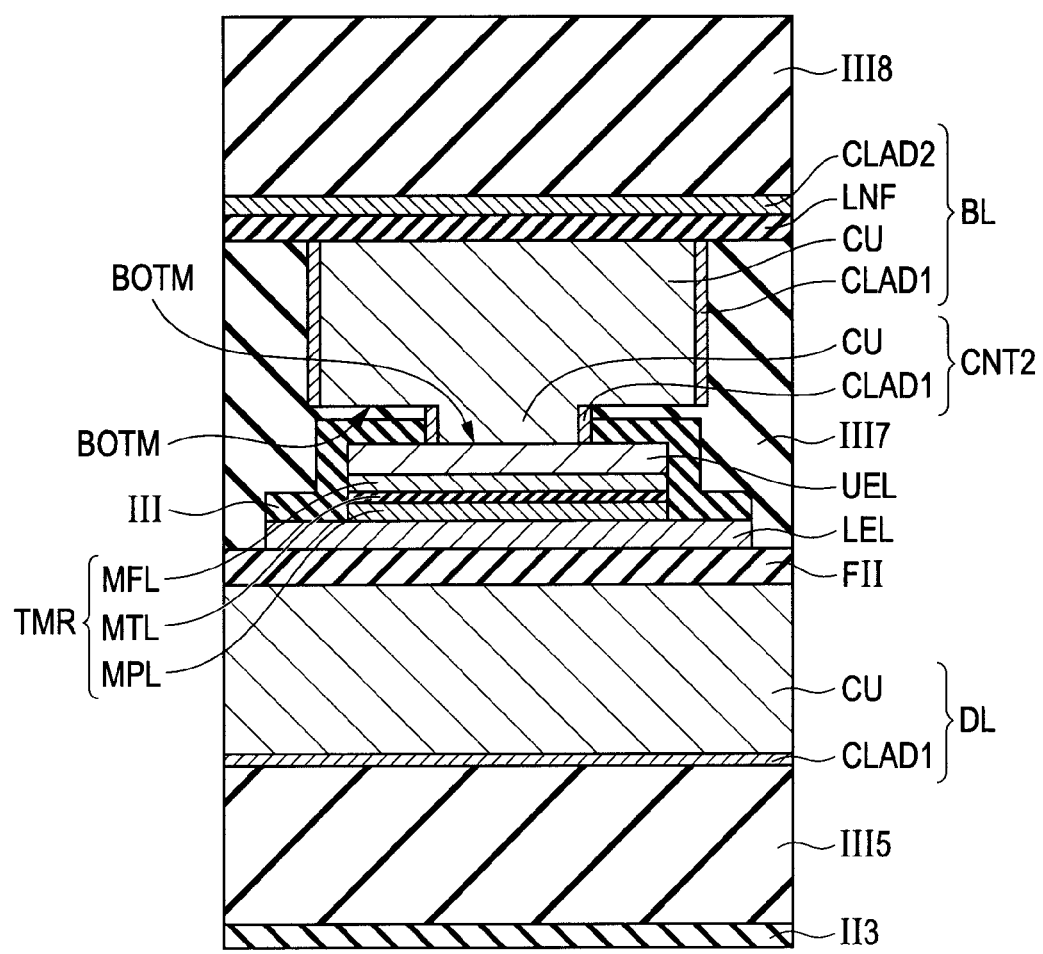
FIG. 57 is a schematic sectional view taken along line LVII-LVII of FIG. 56.

It is desirable that the liner film LNF should be formed by a CVD method or the like. Further, as illustrated in FIG. 56 and FIG. 57 (memory cell portion) and FIG. 58 (peripheral circuit portion), an interlayer insulating film III8 is formed over the cladding layer CLAD2a. Thereafter, part of the interlayer insulating film III8, cladding layer CLAD2a, and liner film LNFa in an area overlapping with the wiring M5 as viewed in a plane is removed to expose the wiring M5.

The via hole VIA3 and the via hole VIA4 are formed as mentioned above. At this time, the via hole VIA3 is so formed that its area is larger than that of the via hole VIA4 as viewed in plane. The reason for this is as follows: since the via hole VIA3 is provided in the cladding layer CLAD2, it is required to electrically insulate the electrode pad PAD so formed later as to fill the via hole VIA4 and the cladding layer CLAD2 from each other.

Thereafter, an electrode pad PAD is formed so that it fills the via hole VIA4 and a passivation film PASF is formed so that it decouples one electrode pad PAD from another electrode pad PAD. Thus the semiconductor device in this embodiment illustrated in FIG. 5 to FIG. 7 is formed.

When the electrode pad PAD is formed, it is desirable to take the following procedure: the barrier layer BRL is formed over the side surface of the interior of the via hole VIA4 by sputtering; and then a metal film of tungsten or the like is filled there. Thereafter, the passivation film PASF is formed over the via hole VIA4 and the interlayer insulating film III8; and a groove for the electrode pad PAD is formed in an area in the passivation film PASF overlapping with the via hole VIA4 as viewed in a plane. Then the interior of the groove is filled with a metal film of tungsten or the like to form the electrode pad PAD.

Description will be given to a modification to the method of forming the contact portion CNT2 with reference to FIG. 59 to FIG. 64. Also with respect to these drawings, three views are presented in parallel similarly to FIG. 44 to FIG. 58 and the part located under the insulating film II3 (on the semiconductor substrate SUB side) is omitted.

Figure 59:
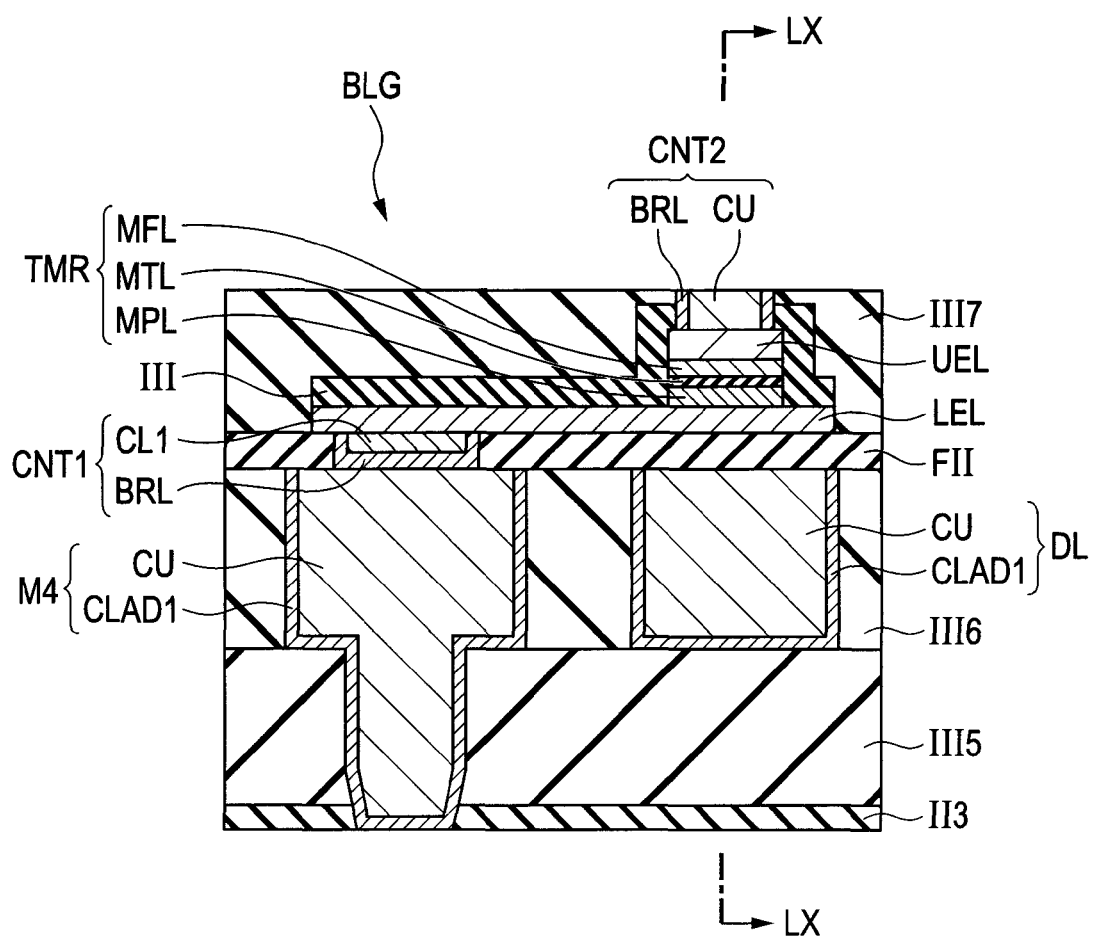
FIG. 59 is a schematic sectional view illustrating a manufacturing process step, at which the mode of a contact portion is different from that in FIG. 47, subsequent to the manufacturing process step illustrated in FIG. 44.
Figure 60:
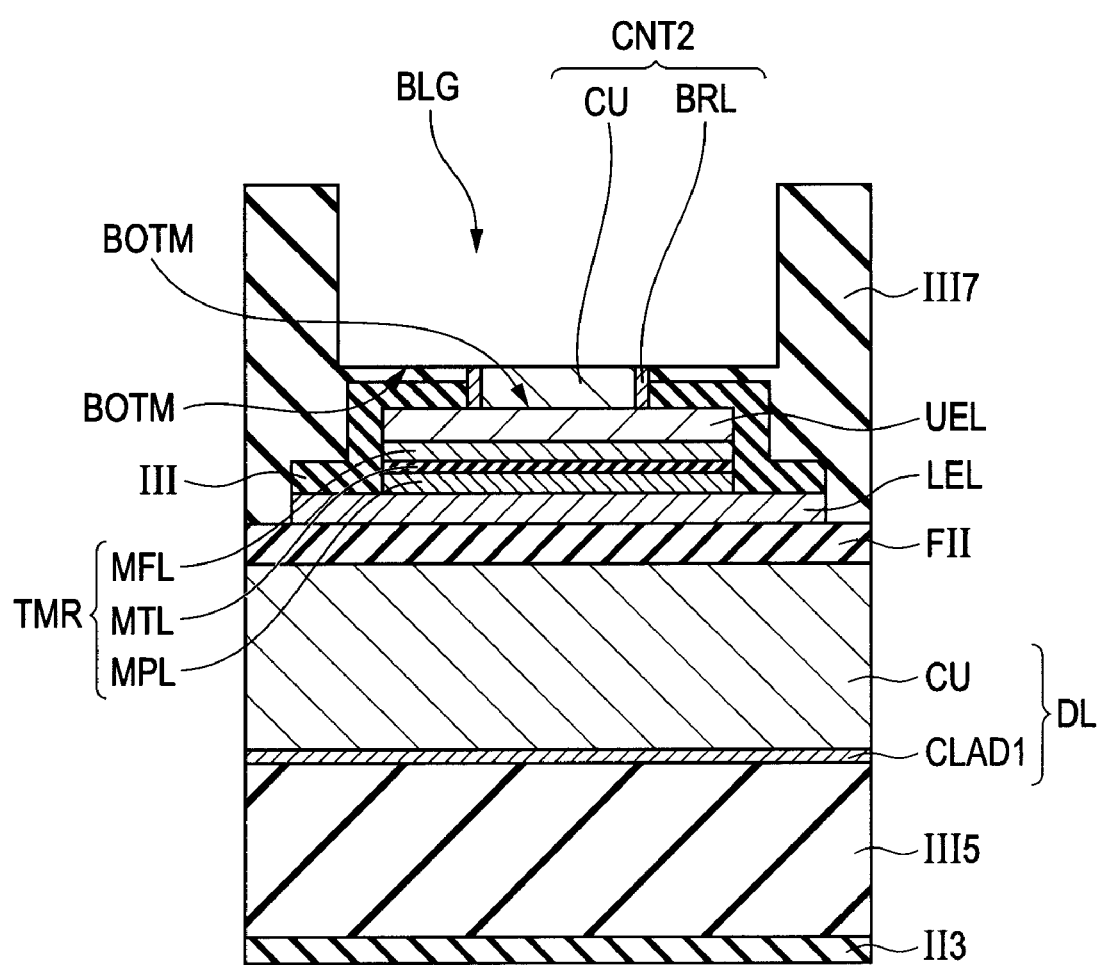
FIG. 60 is a schematic sectional view taken along line LX-LX of FIG. 59.
Figure 61:
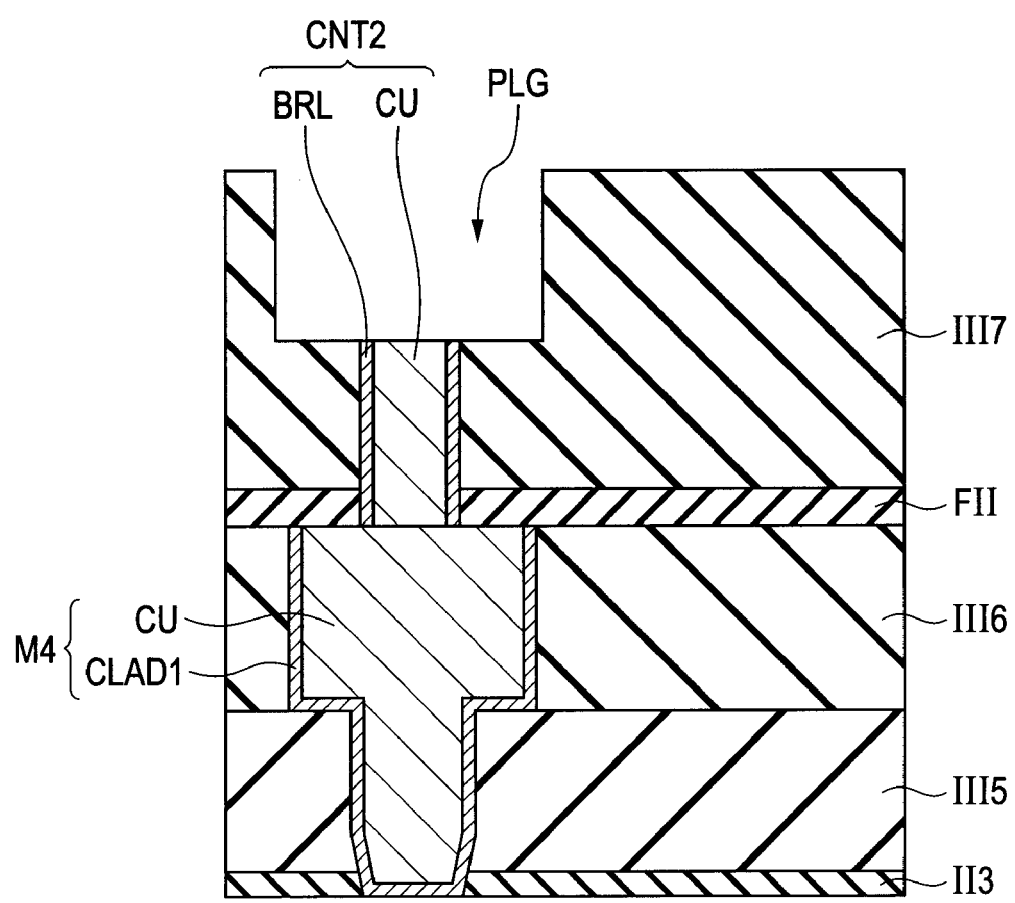
FIG. 61 is a schematic sectional view illustrating a mode of the peripheral circuit portion at the same manufacturing process step as in FIG. 59.

As illustrated in FIG. 59 and FIG. 60 (memory cell portion) and FIG. 61 (peripheral circuit portion), the following processing is carried out subsequently to the step illustrated in FIG. 44 to FIG. 46: the barrier layer BRL is formed only over the side surfaces of the via hole VIA2 and the lower part (area reduced in width in each sectional view) of the plug hole PLG; and the interior of them is filled with the conductive film CU.

Figure 62:
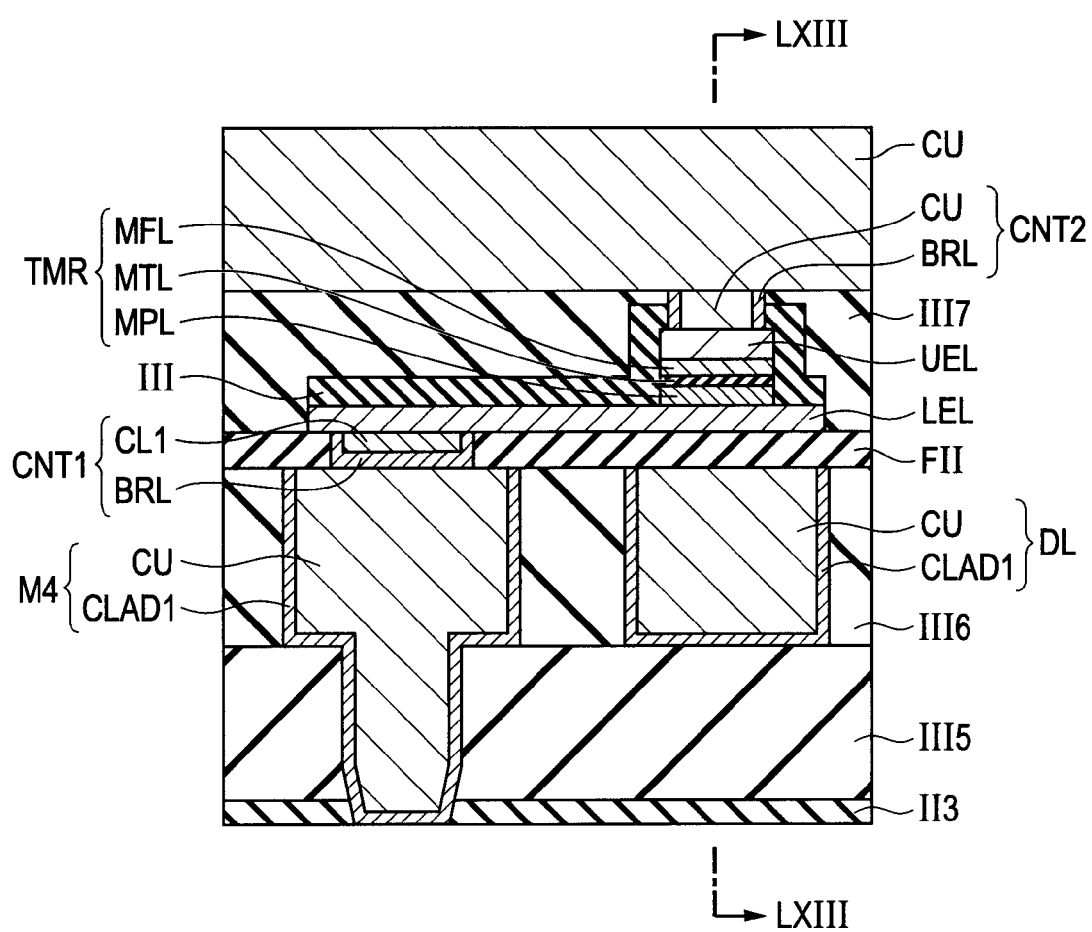
FIG. 62 is a schematic sectional view illustrating a manufacturing process step subsequent to the manufacturing process step illustrated in FIG. 59.
Figure 63:
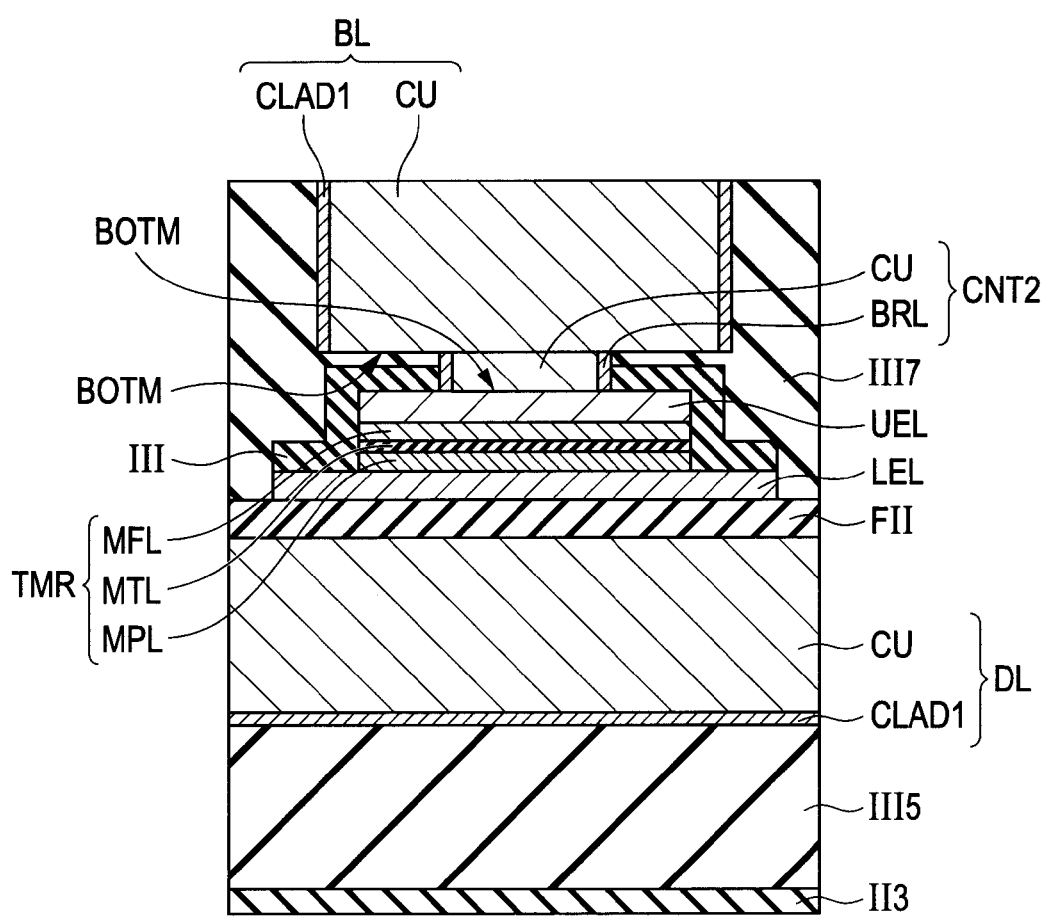
FIG. 63 is a schematic sectional view taken along line LXIII-LXIII of FIG. 62.
Figure 64:
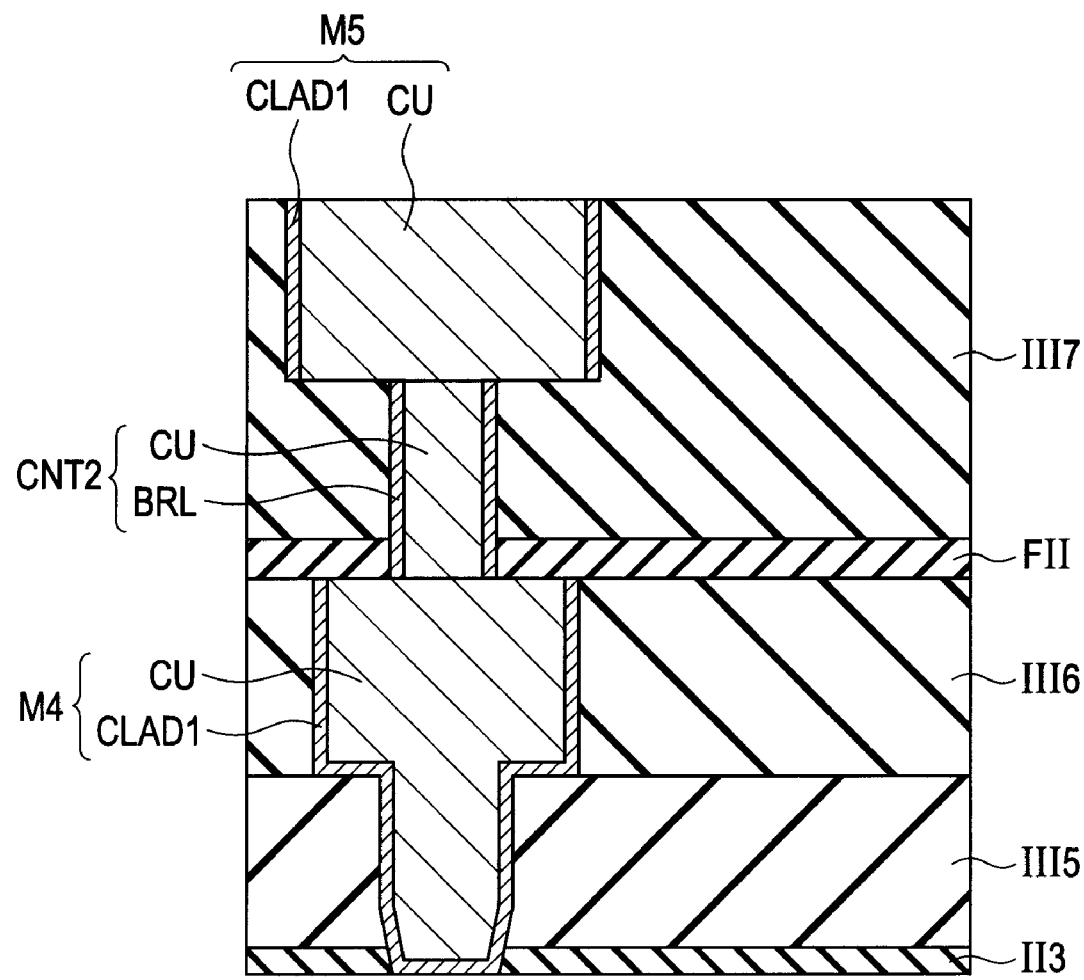
FIG. 64 is a schematic sectional view illustrating a mode of the peripheral circuit portion at the same manufacturing process step as in FIG. 62.

Moreover, as illustrated in FIG. 62 and FIG. 63 (memory cell portion) and FIG. 64 (peripheral circuit portion), the following processing is carried out: the cladding layer CLAD1 is formed over the side surfaces of the interior of the groove portion BLG for a bit line and the upper part (area increased in width in each sectional view) of the plug hole PLG; thereafter, the interior of them is filled with the conductive film CU and this conductive film CU is flattened. FIG. 62 to FIG. 64 are different from FIG. 50 to FIG. 52 only in the mode of the contact portion CNT2 and processing may be carried out so as to obtain this configuration.

Subsequently to the step illustrated in FIG. 62 to FIG. 64, the same processing as illustrated in FIG. 53 to FIG. 58 is carried out. As a result, a semiconductor device different only in the mode of the contact portion CNT2 is formed.

Description will be given to a method of manufacturing a semiconductor device having the MRAM illustrated in FIG. 11 to FIG. 13 with reference to FIG. 65 to FIG. 70. Also with respect to these drawings, three views are presented in parallel similarly to FIG. 44 to FIG. 58 and the part located under the insulating film II3 (on the semiconductor substrate SUB side) is omitted.

Figure 65:
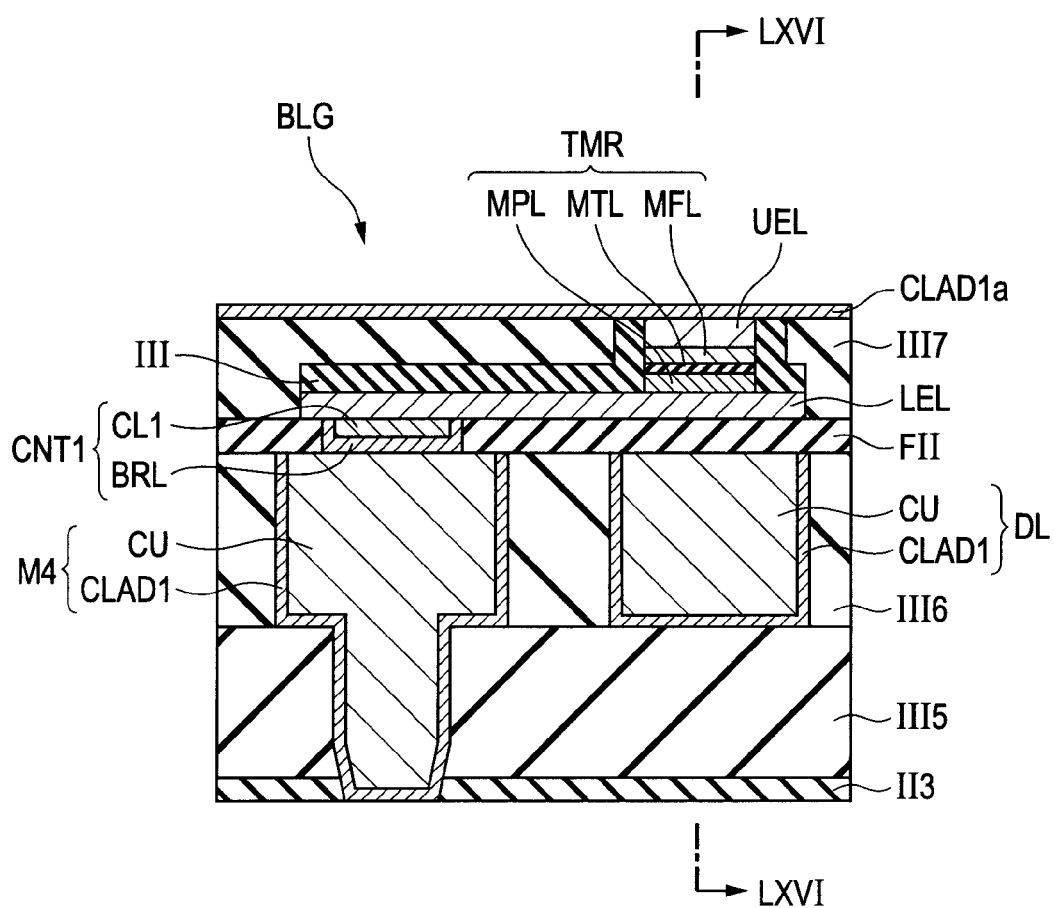
FIG. 65 is a schematic sectional view illustrating a manufacturing process step subsequent to the manufacturing process step illustrated in FIG. 42, explaining a method of manufacturing the modification, illustrated in FIG. 11 to FIG. 13, to the first embodiment of the invention.
Figure 66:
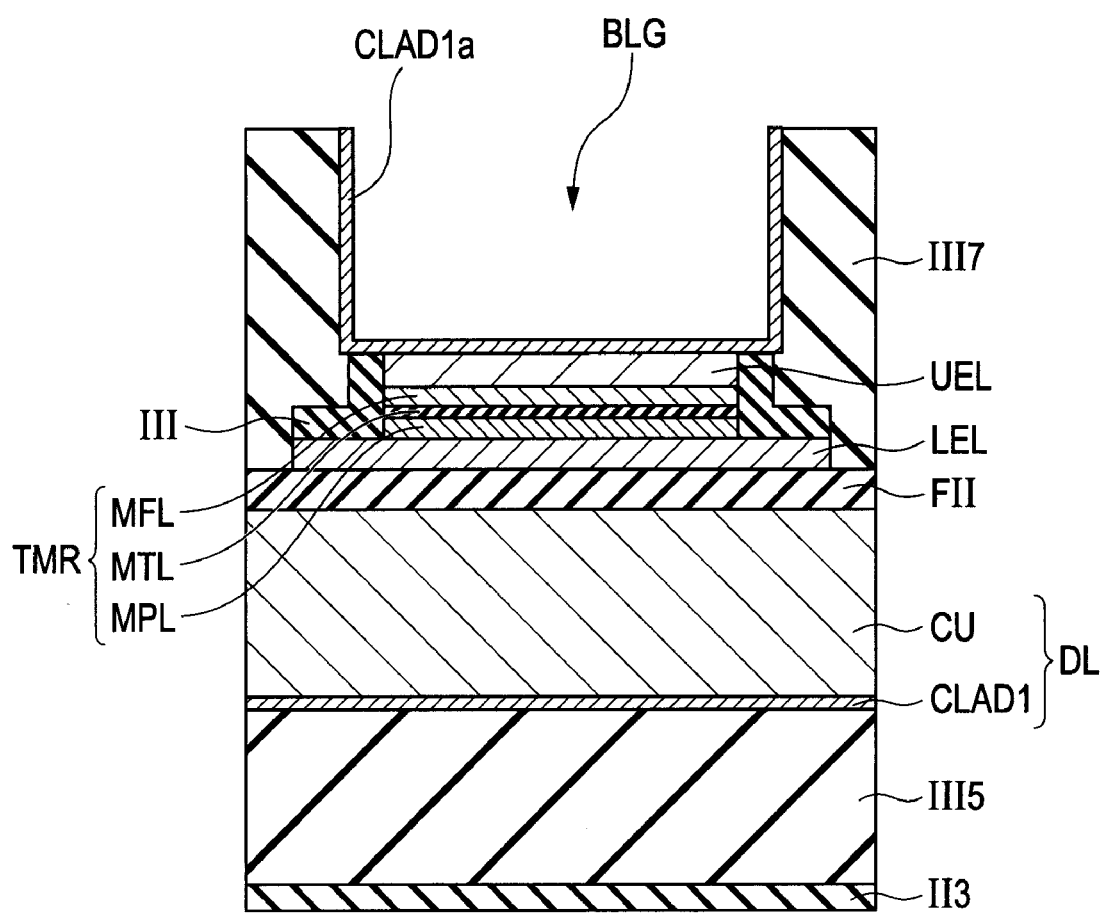
FIG. 66 is a schematic sectional view taken along line LXVI-LXVI of FIG. 65.
Figure 67:
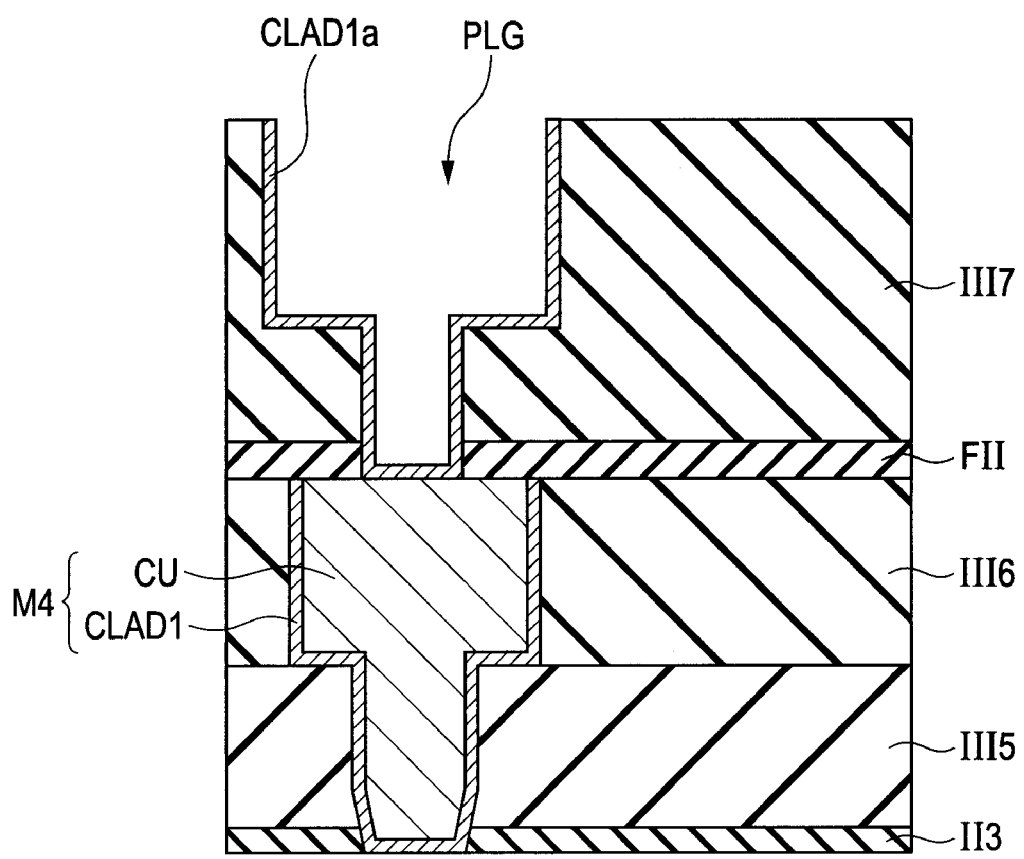
FIG. 67 is a schematic sectional view illustrating a mode of the peripheral circuit portion at the same manufacturing process step as in FIG. 65.

As illustrated in FIG. 65 and FIG. 66 (memory cell portion) and FIG. 67 (peripheral circuit portion), the following processing is carried out subsequently to the step illustrated in FIG. 42 to FIG. 43: the interlayer insulating film III7 is so formed that it covers the areas over and around the insulating film IIIb of the magnetoresistive element TMR in FIG. 42, the area over the upper electrode UEL, and the area around the lower electrode LEL. Subsequently, the insulating film IIIb and interlayer insulating film III7 over the upper electrode UEL is removed by CMP process to form the protective layer III. Thereafter, the groove portion BLG for a bit line and the plug hole PLG are formed in the same manner as illustrated in FIG. 44 to FIG. 46; and the cladding layer CLAD1a is formed in the same manner as illustrated in FIG. 47 to FIG. 49.

When the groove portion BLG for a bit line is formed, it is desirable that its bottom (lowermost part) is positioned at substantially the same height as the uppermost surface of the upper electrode UEL.

Figure 68:
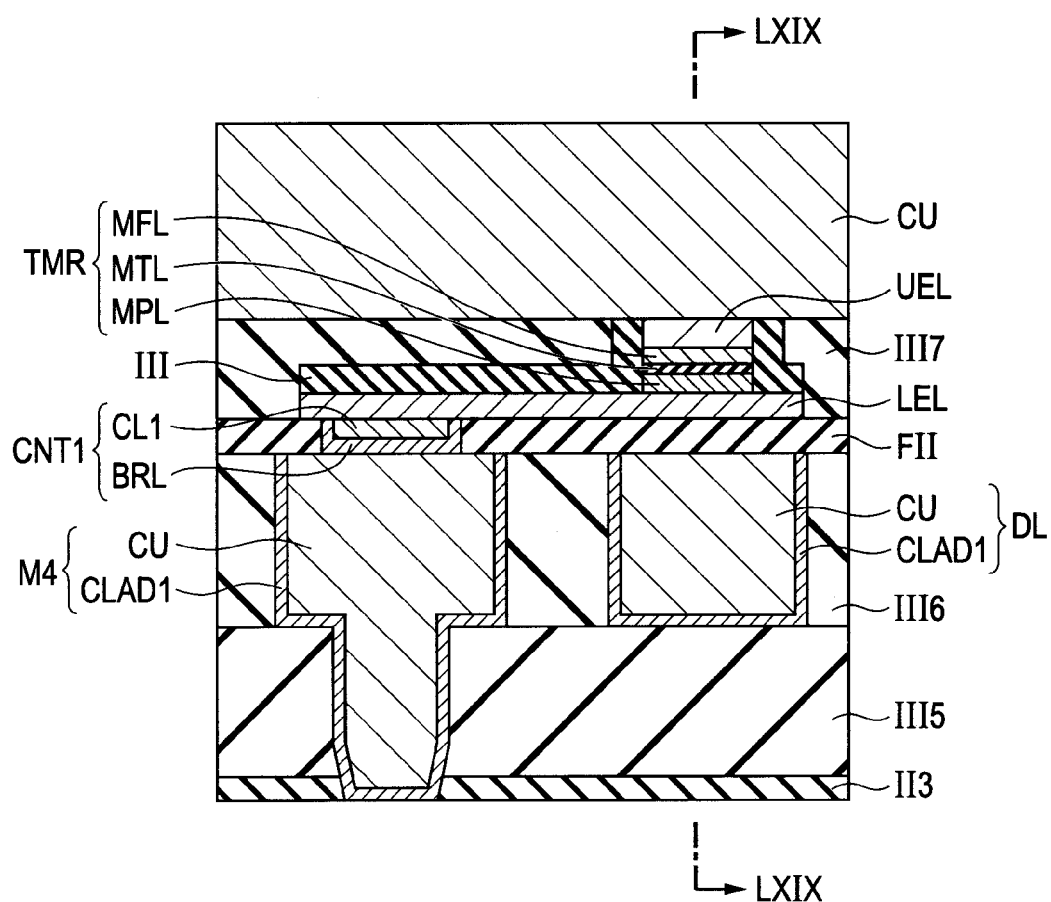
FIG. 68 is a schematic sectional view illustrating a manufacturing process step subsequent to the manufacturing process step illustrated in FIG. 65.
Figure 69:
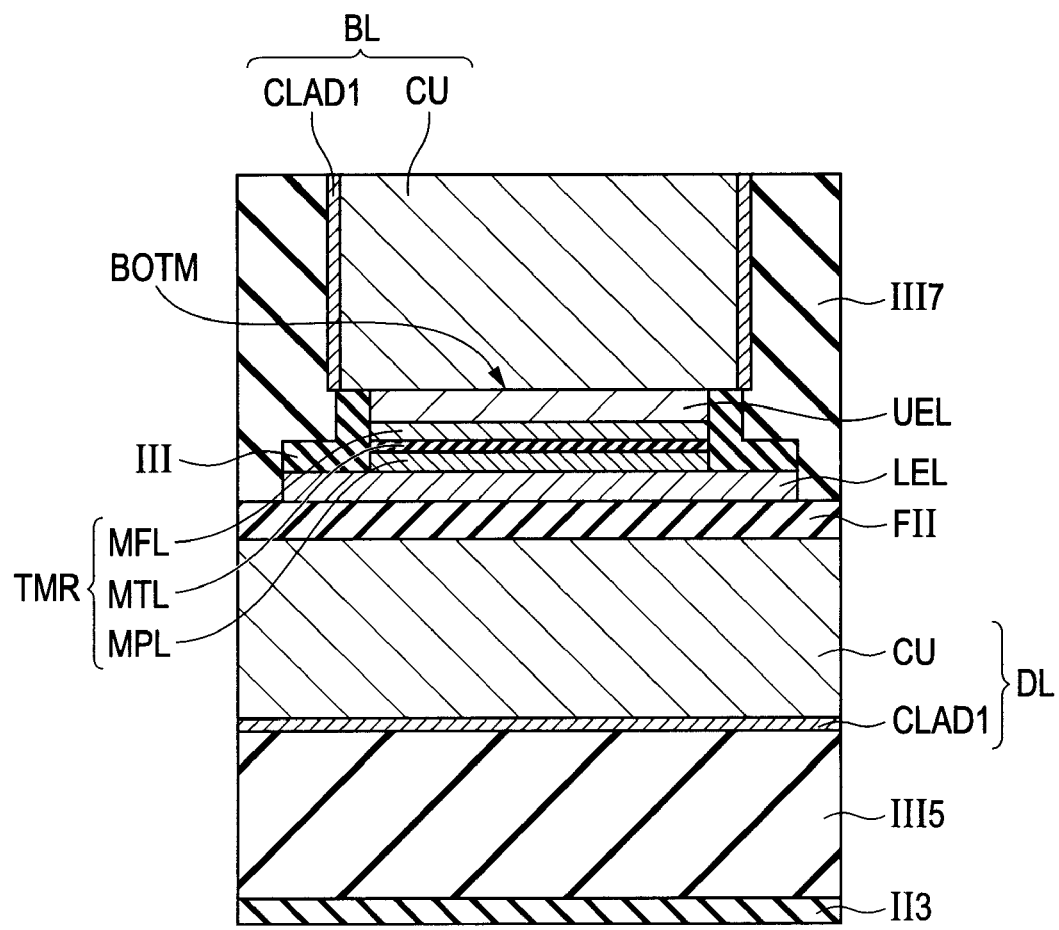
FIG. 69 is a schematic sectional view taken along line LXIX-LXIX of FIG. 68.
Figure 70:
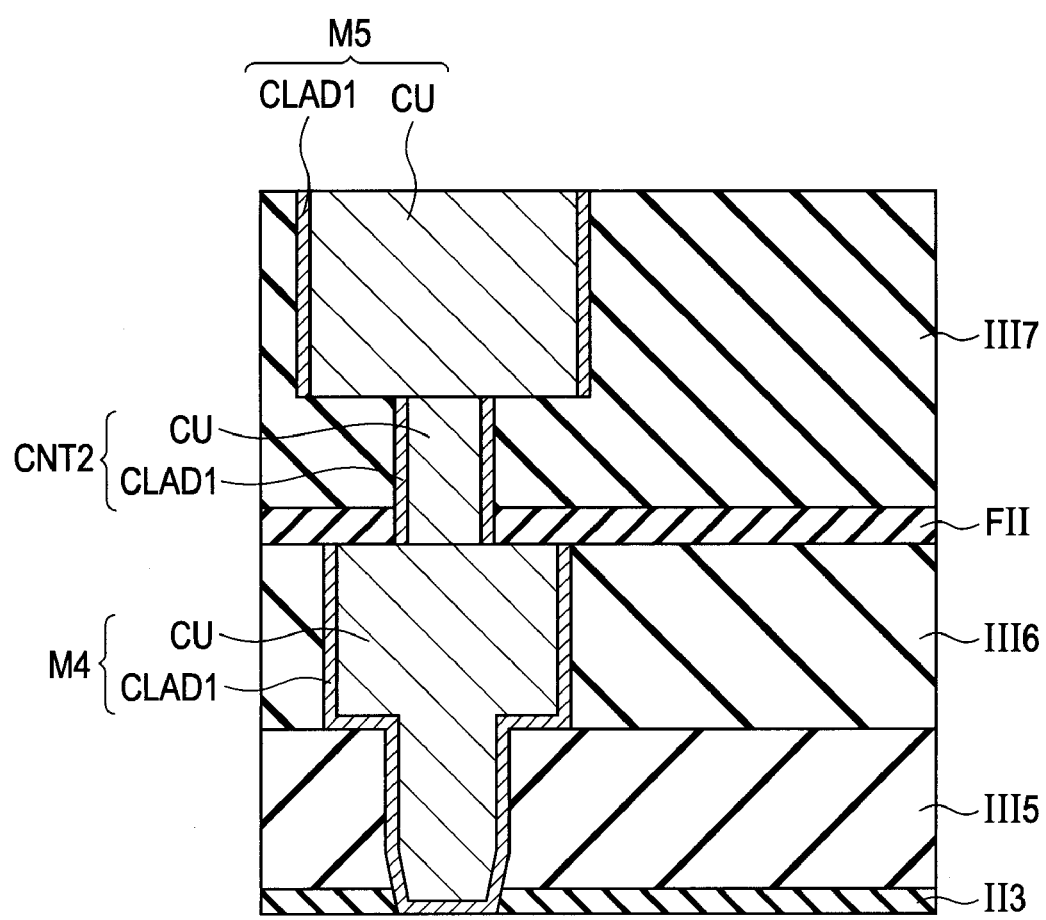
FIG. 70 is a schematic sectional view illustrating a mode of the peripheral circuit portion at the same manufacturing process step as in FIG. 68.

Subsequently, as illustrated in FIG. 68 and FIG. 69 (memory cell portion) and FIG. 70 (peripheral circuit portion), the following processing is carried out as at the step illustrated in FIG. 50 to FIG. 52: the cladding layer CLAD1a is formed over the inner surfaces of the groove portion BLG for a bit line and the plug hole PLG. Then the interior of them is filled with the conductive film CU and the conductive film CU is flattened.

Subsequently, the same steps as described above with reference to FIG. 53 to FIG. 58 are carried out to form the passivation film PASF and the electrode pad PAD. Thus the semiconductor device in this embodiment illustrated in FIG. 11 to FIG. 13 is formed.

Description will be given to a method of manufacturing a semiconductor device having the STT-MRAM illustrated in FIG. 14 to FIG. 16 with reference to FIG. 71 to FIG. 80. Also with respect to FIG. 71 to FIG. 74, two views are presented in parallel similarly to FIG. 24 to FIG. 25 and the like and with respect to FIG. 75 to FIG. 80, three views are presented in parallel similarly to FIG. FIG. 44 to FIG. 58. In FIG. 75 to FIG. 80, the part located under the insulating film II3 (on the semiconductor substrate SUB side) is omitted.

Figure 71:
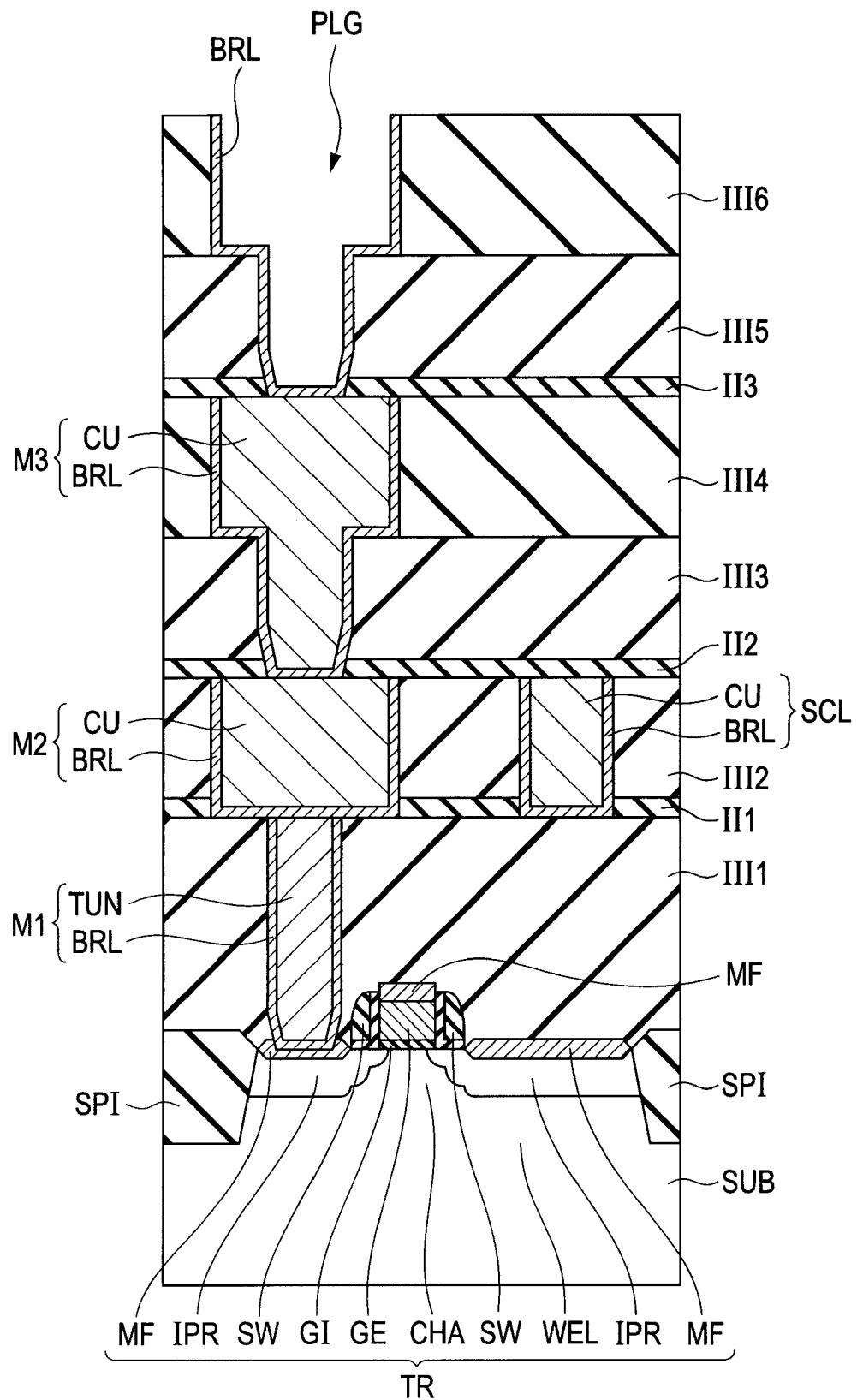
FIG. 71 is a schematic sectional view illustrating a manufacturing process step subsequent to the manufacturing process step illustrated in FIG. 23, explaining a method of manufacturing another modification, illustrated in FIG. 14 to FIG. 16, to the first embodiment of the invention.
Figure 72:
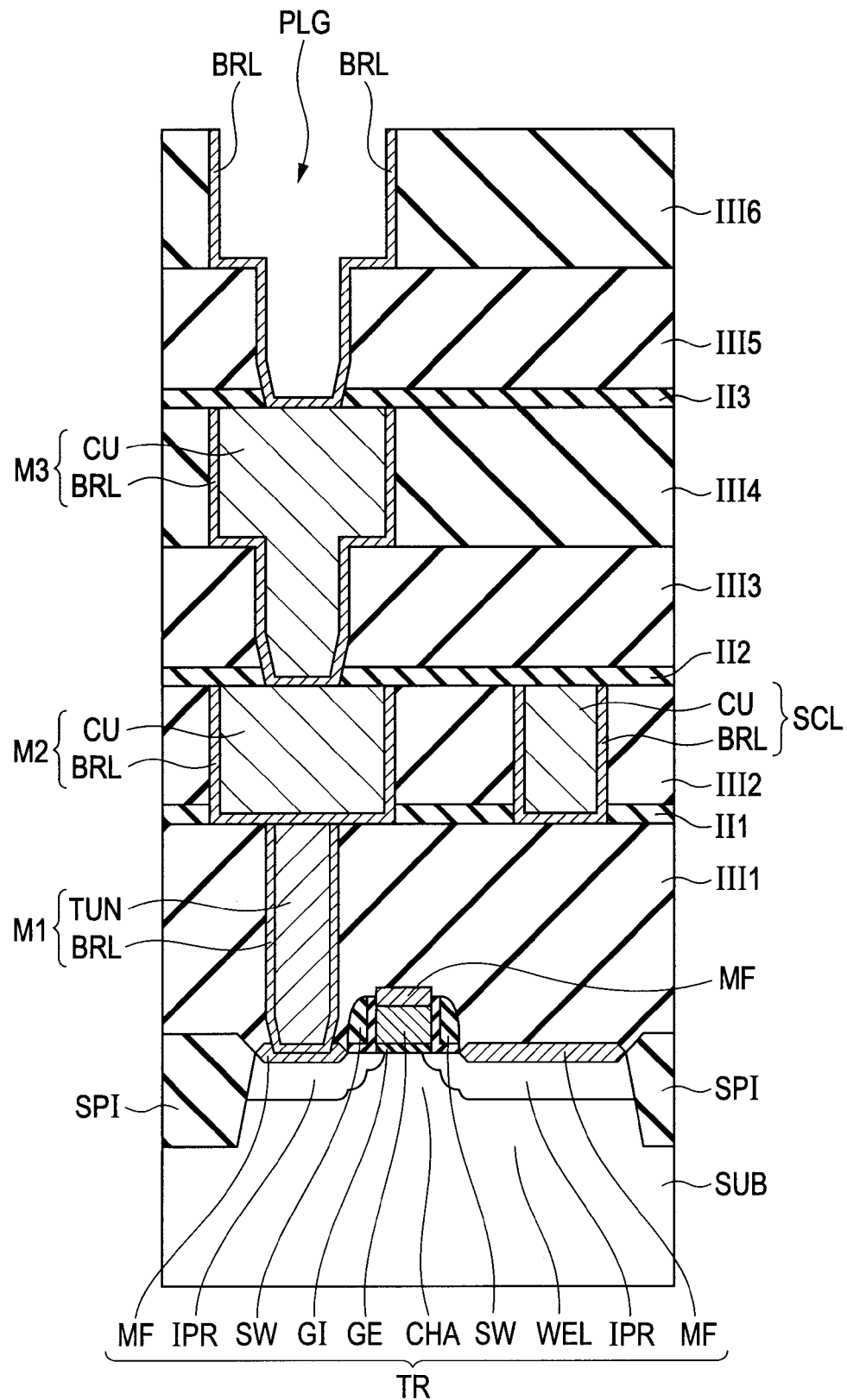
FIG. 72 is a schematic sectional view illustrating a mode of the peripheral circuit portion at the same manufacturing process step as in FIG. 71.

As illustrated in FIG. 71 (memory cell portion) and FIG. 72 (peripheral circuit portion), the following processing is carried out subsequently to the step illustrated in FIG. 23: the insulating film II3 and the interlayer insulating films III5, III6 are formed over the upper surface of the interlayer insulating film III4 in this order. Thereafter, the plug hole PLG is formed in the insulating film II3 and the interlayer insulating films III5, III6. However, such a groove portion DLG for a digit line as illustrated in FIG. 24 is not formed.

A barrier layer BRL is formed in place of a cladding layer over the inner surfaces of the plug holes PLG in the memory cell portion and the peripheral circuit portion.

Figure 73:
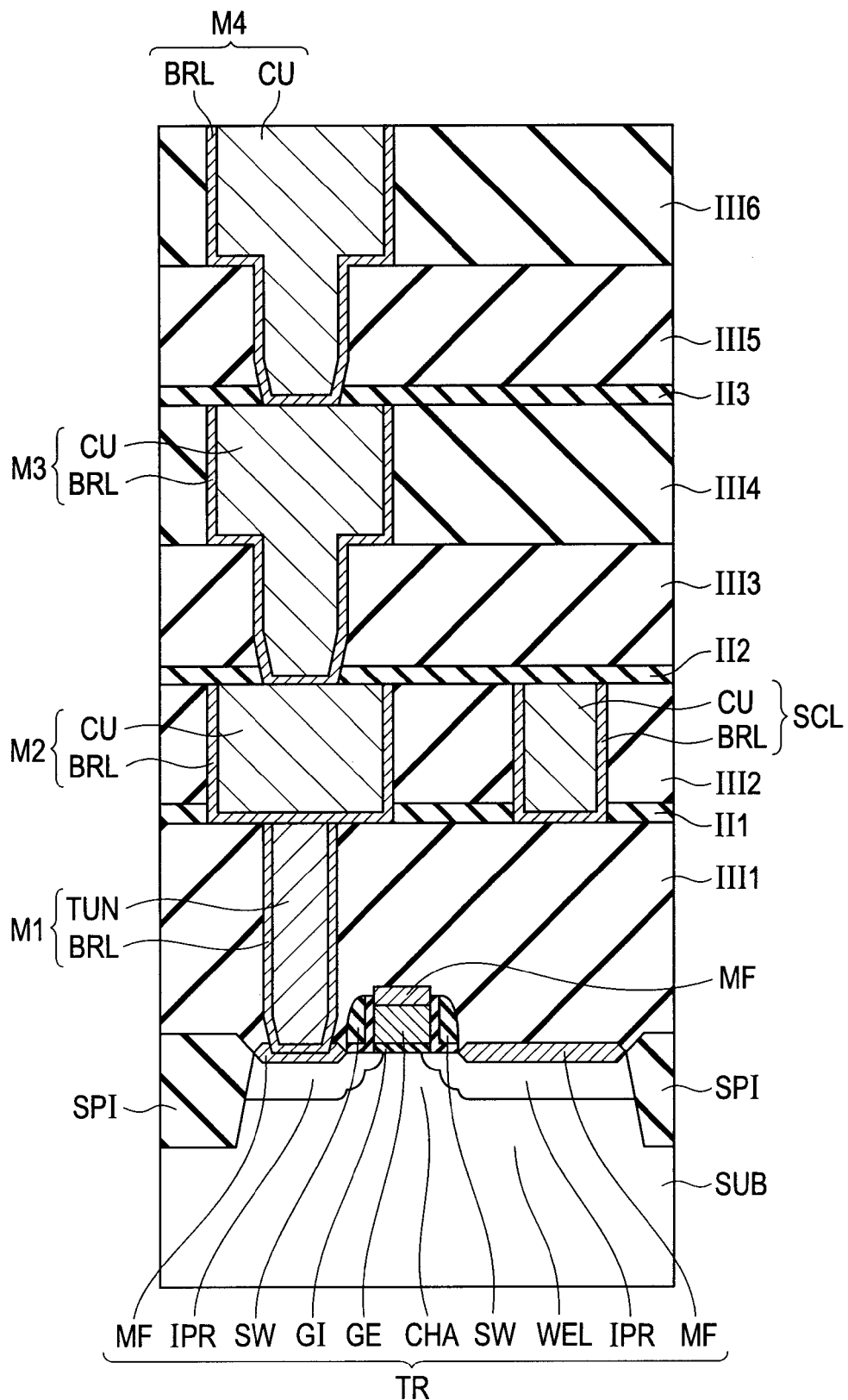
FIG. 73 is a schematic sectional view illustrating a manufacturing process step subsequent to the manufacturing process step illustrated in FIG. 71.
Figure 74:
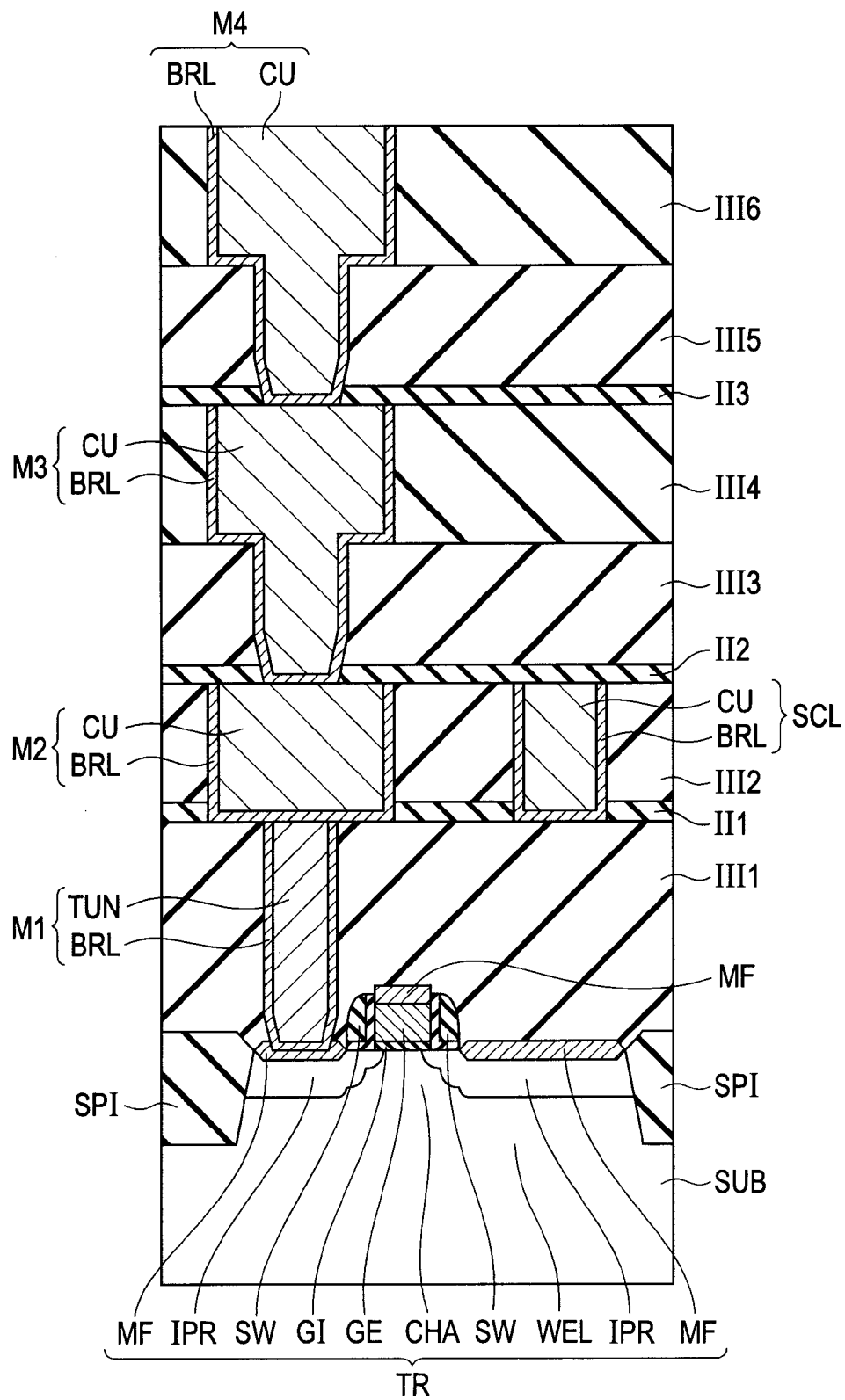
FIG. 74 is a schematic sectional view illustrating a mode of the peripheral circuit portion at the same manufacturing process step as in FIG. 73.

Subsequently, as illustrated in FIG. 73 (memory cell portion) and FIG. 74 (peripheral circuit portion), the interior of the plug holes PLG is filled with the conductive film CU of copper or the like in the same manner as illustrated in FIG. 27 and FIG. 28. Then the upper surface of the interlayer insulating film III6 is flattened by a CMP method to form the plug M4.

Figure 75:
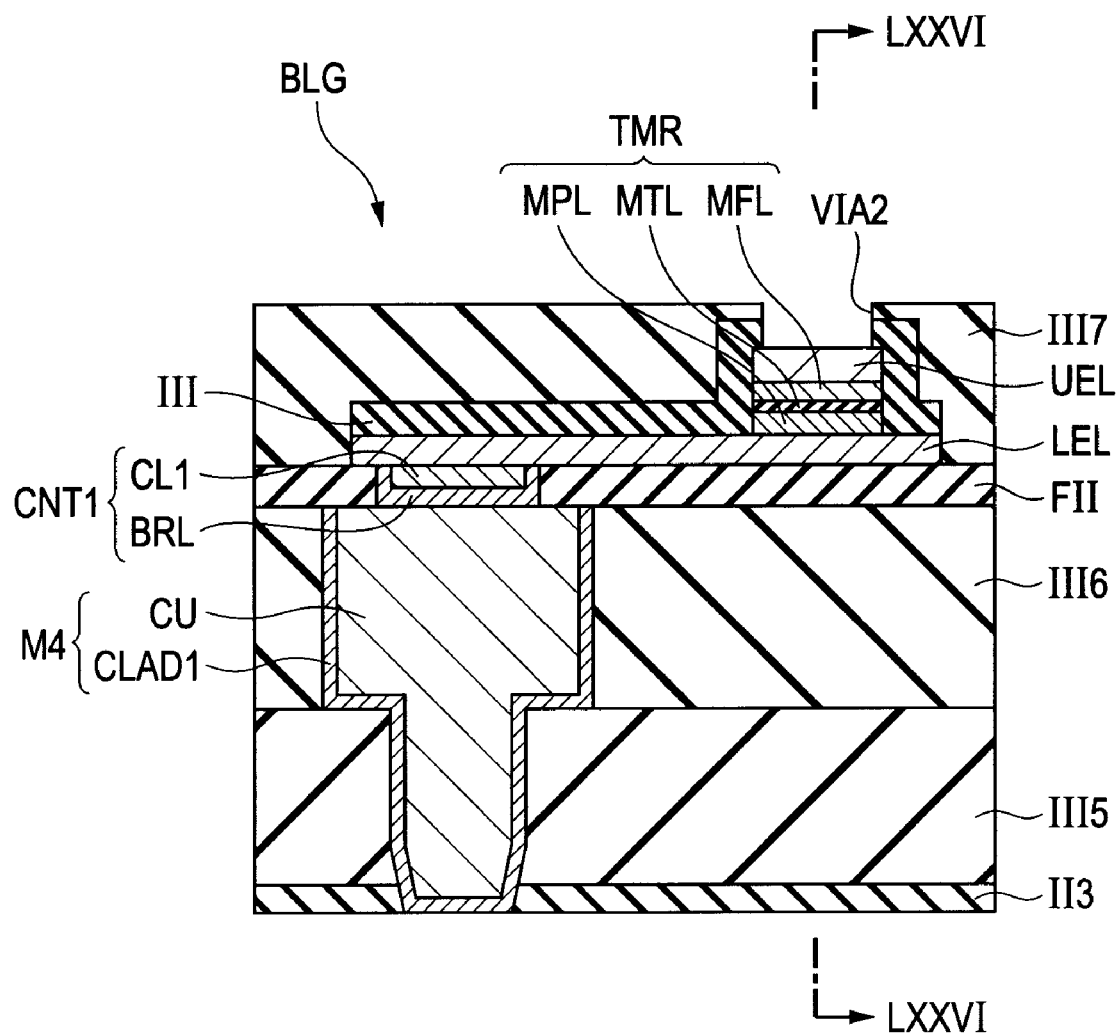
FIG. 75 is a schematic sectional view illustrating a manufacturing process step subsequent to the manufacturing process step illustrated in FIG. 73.
Figure 76:
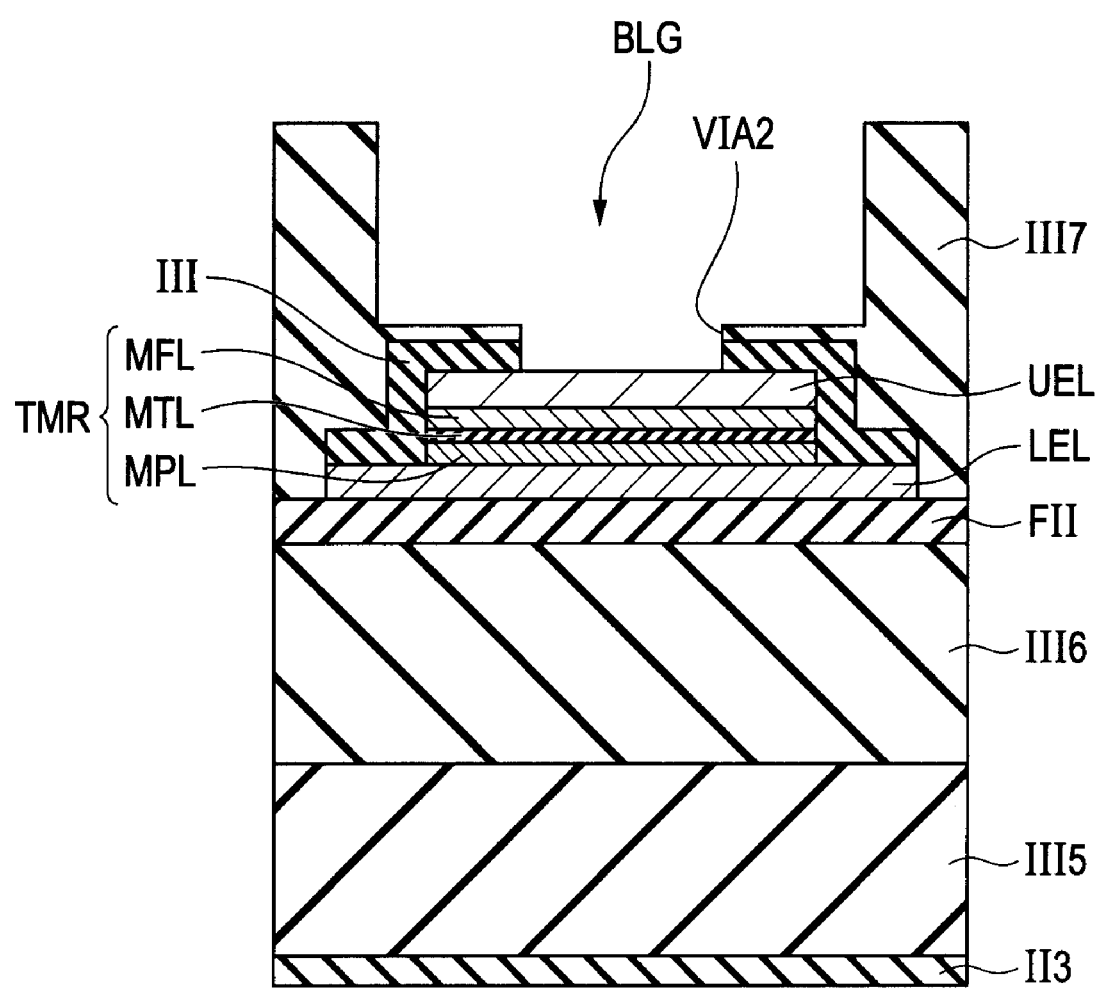
FIG. 76 is a schematic sectional view taken along line LXXVI-LXXVI of FIG. 75.
Figure 77:
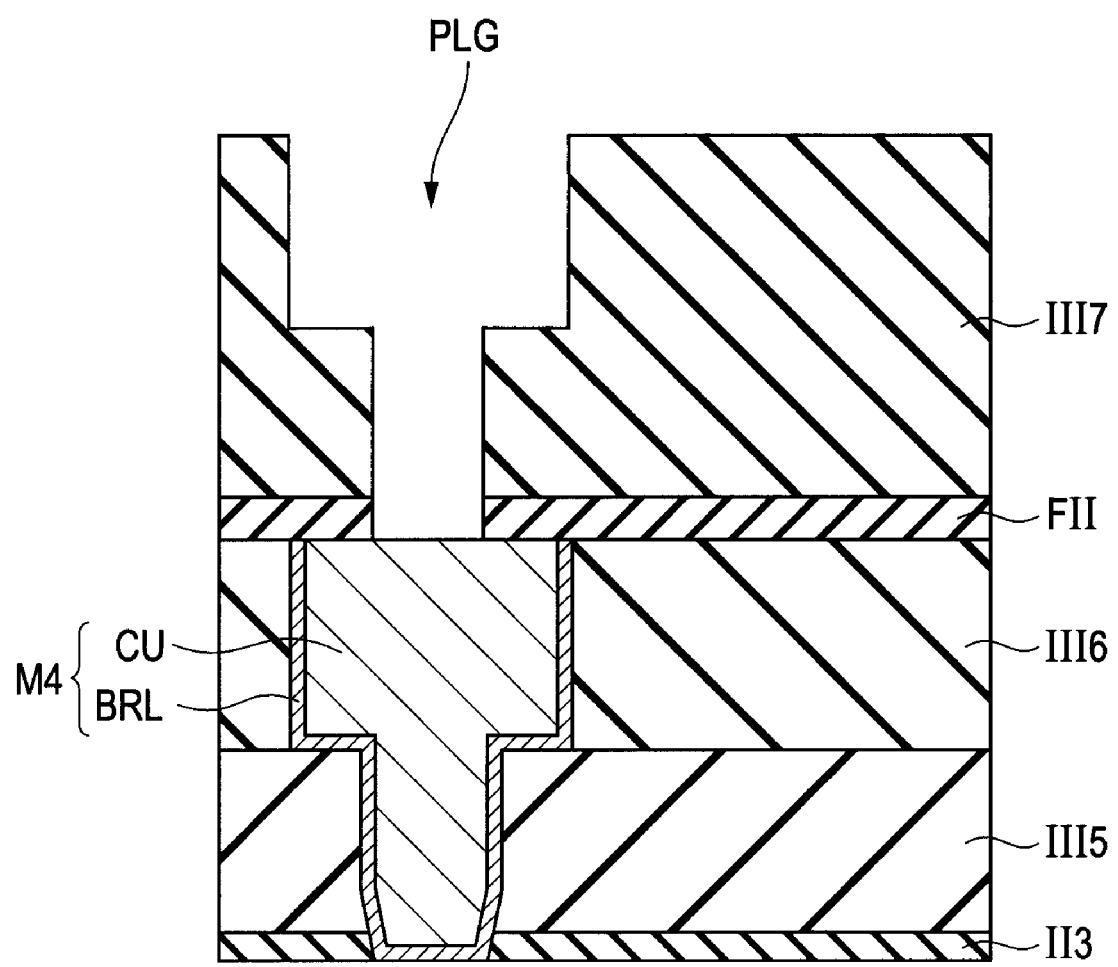
FIG. 77 is a schematic sectional view illustrating a mode of the peripheral circuit portion at the same manufacturing process step as in FIG. 75.

Subsequently, as illustrated in FIG. 75 and FIG. 76 (memory cell portion) and FIG. 77 (peripheral circuit portion), the same processing as illustrated in FIG. 29 to FIG. 46 is carried out.

Figure 78:
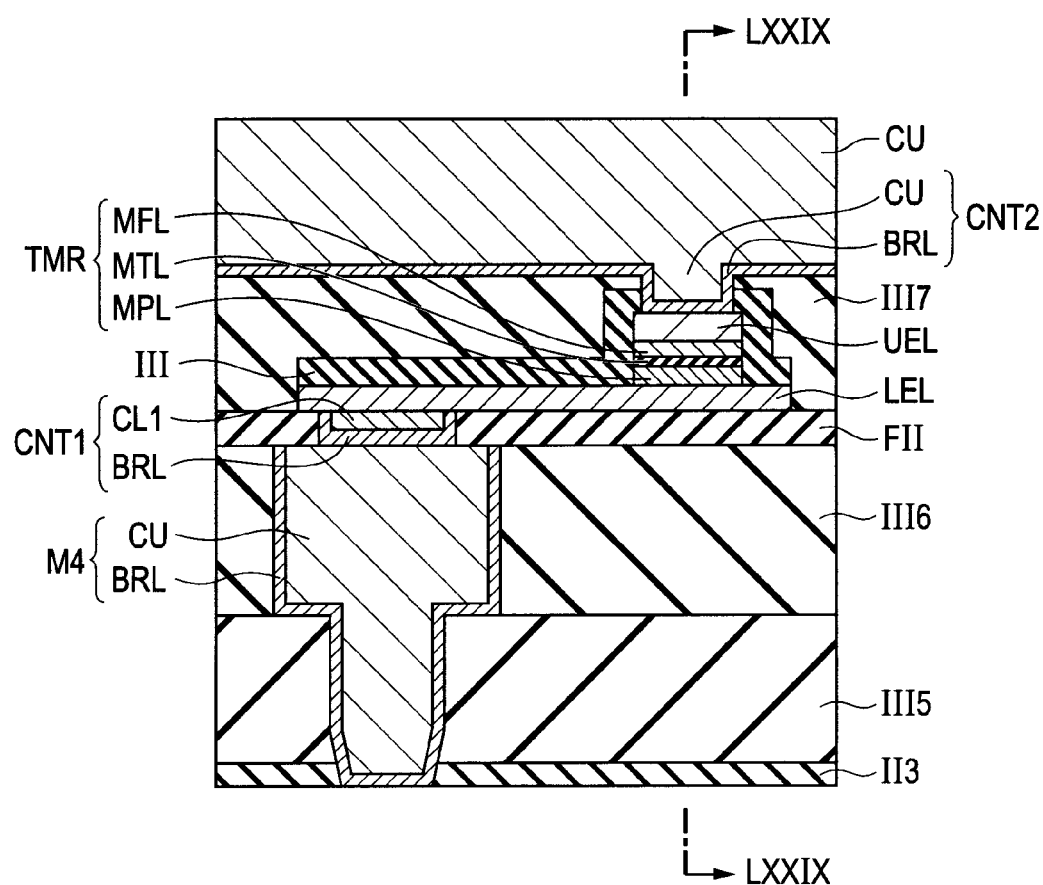
FIG. 78 is a schematic sectional view illustrating a manufacturing process step subsequent to the manufacturing process step illustrated in FIG. 75.
Figure 79:
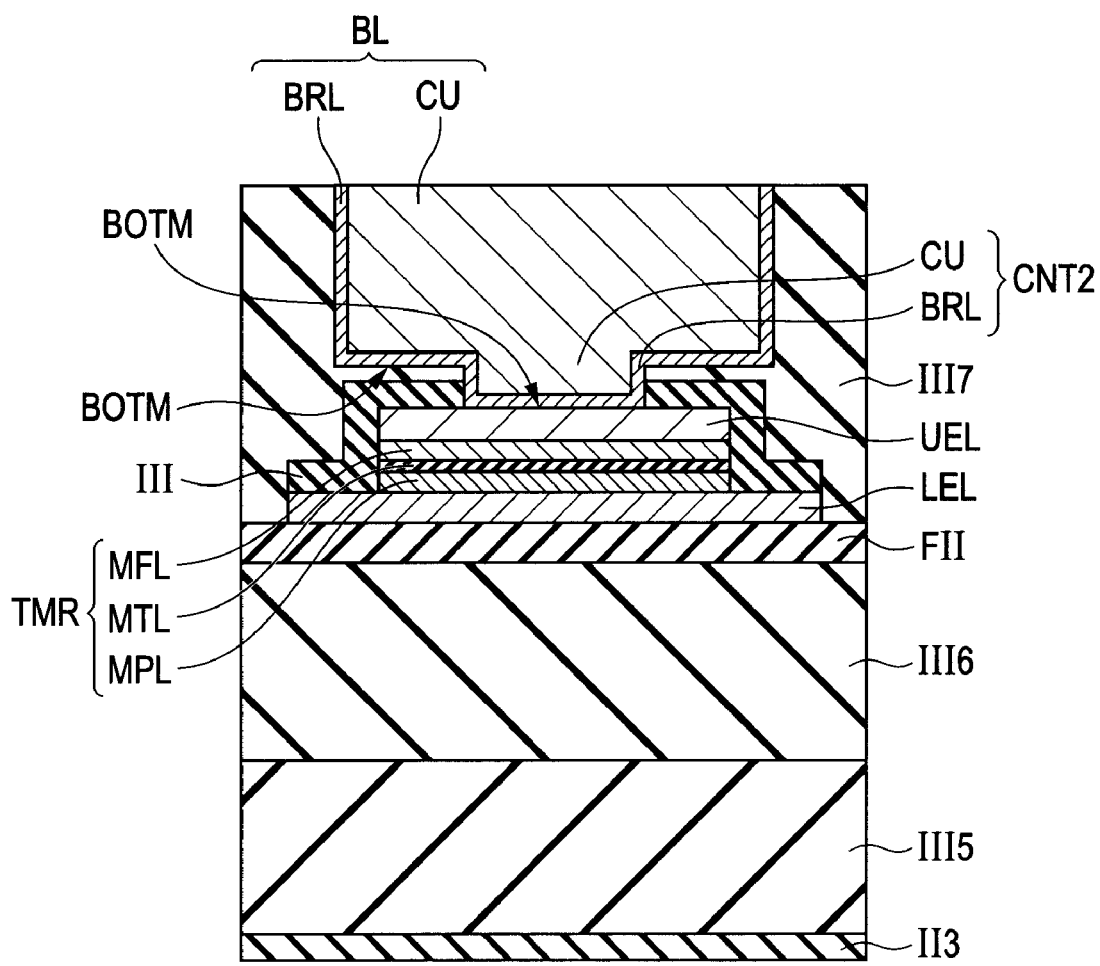
FIG. 79 is a schematic sectional view taken along line LXXIX-LXXIX of FIG. 78.
Figure 80:
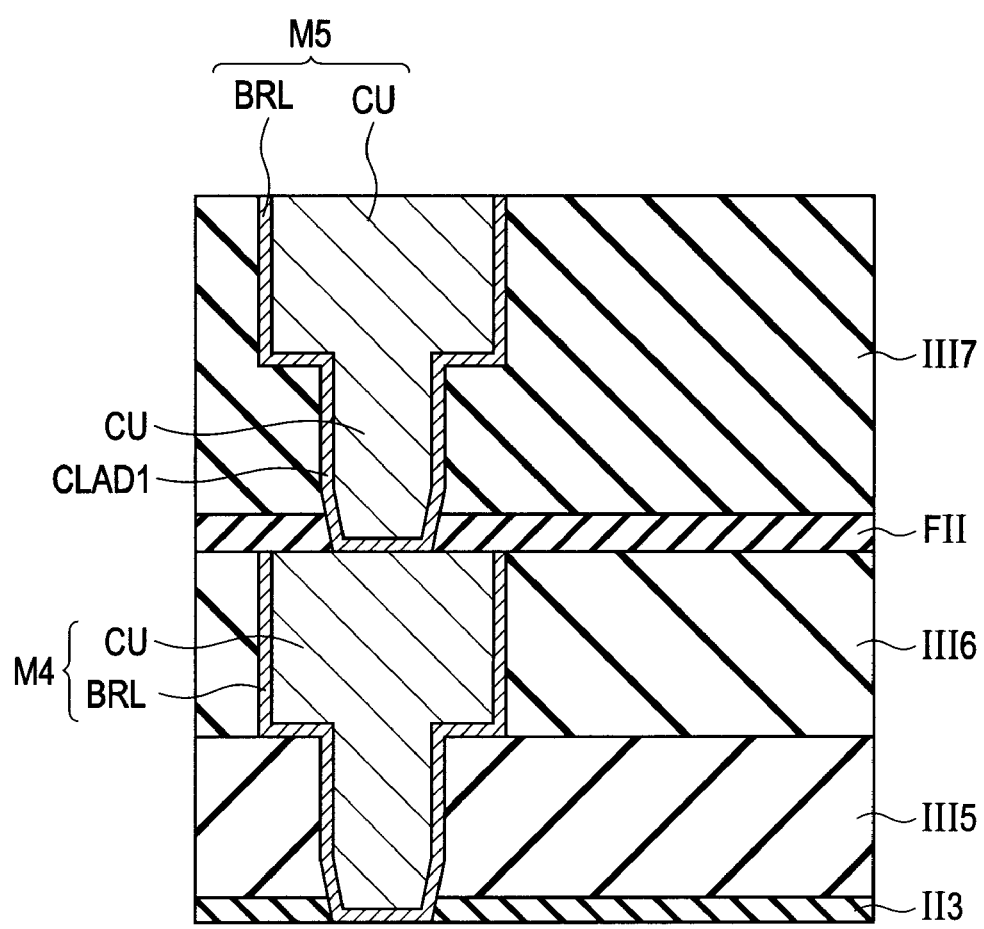
FIG. 80 is a schematic sectional view illustrating a mode of the peripheral circuit portion at the same manufacturing process step as in FIG. 78.

Further, as illustrated in FIG. 78 and FIG. 79 (memory cell portion) and FIG. 80 (peripheral circuit portion), a barrier layer BRL is formed in place of the following cladding layer: the cladding layer CLAD1a formed over the inner surface of the groove portion BLG for a bit line at the step illustrated in FIG. 47 to FIG. 49. Then the interior of the groove portion BLG for a bit line is filled with CU or the like in the same manner as illustrated in FIG. 50 to FIG. 52.

FIG. 75 to FIG. 80 illustrates a configuration in which the contact portion CNT2 is formed in the same manner as illustrated in FIG. 4 to FIG. 7 and a bit line BL and a magnetoresistive element TMR are thereby coupled with each other. Instead, however, STT-MRAM so configured that a bit line BL and a magnetoresistive element TMR (upper electrode UEL) are directly coupled with each other in the same manner as illustrated in FIG. 11 to FIG. 13 may be formed.

Subsequently, the same steps as illustrated in FIG. 53 to FIG. 58 are carried out to form the passivation film PASF and the electrode pad PAD. Thus a semiconductor device having the STT-MRAM in the memory cell portion in the embodiment illustrated in FIG. 14 to FIG. 16 is formed.

Figure 81:
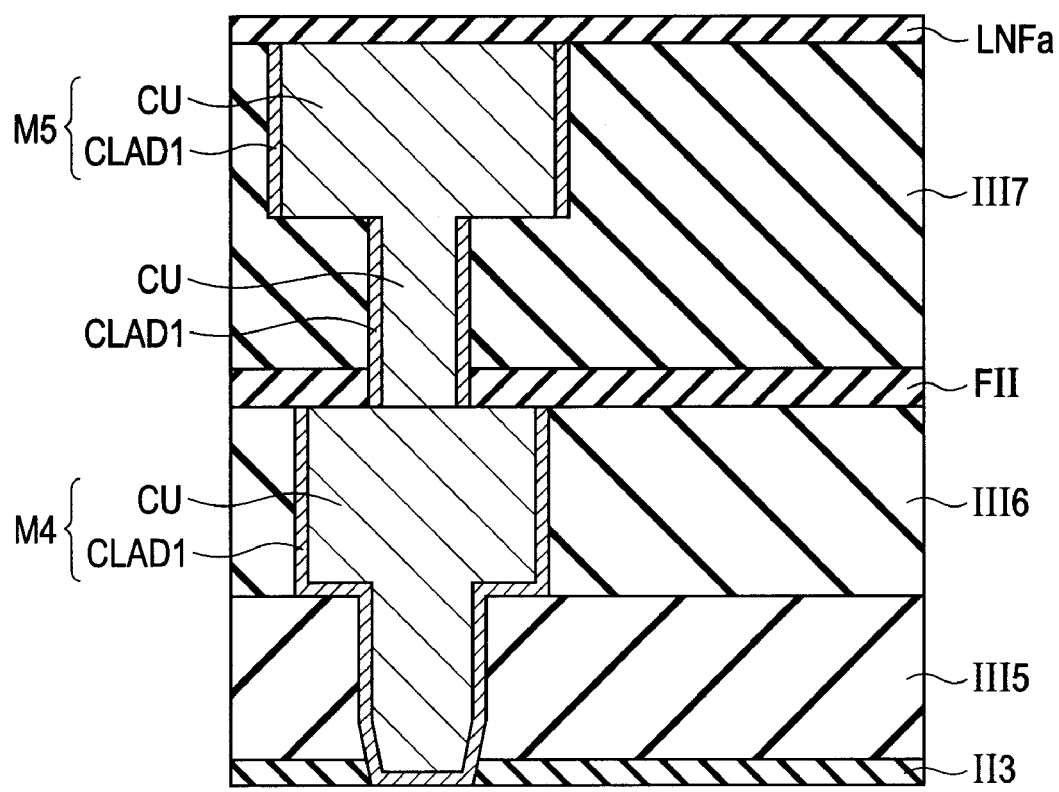
FIG. 81 is a schematic sectional view of the peripheral circuit portion, illustrating a manufacturing process step subsequent to the manufacturing process step illustrated in FIG. 50 in a method of manufacturing a conventional semiconductor device.
Figure 82:
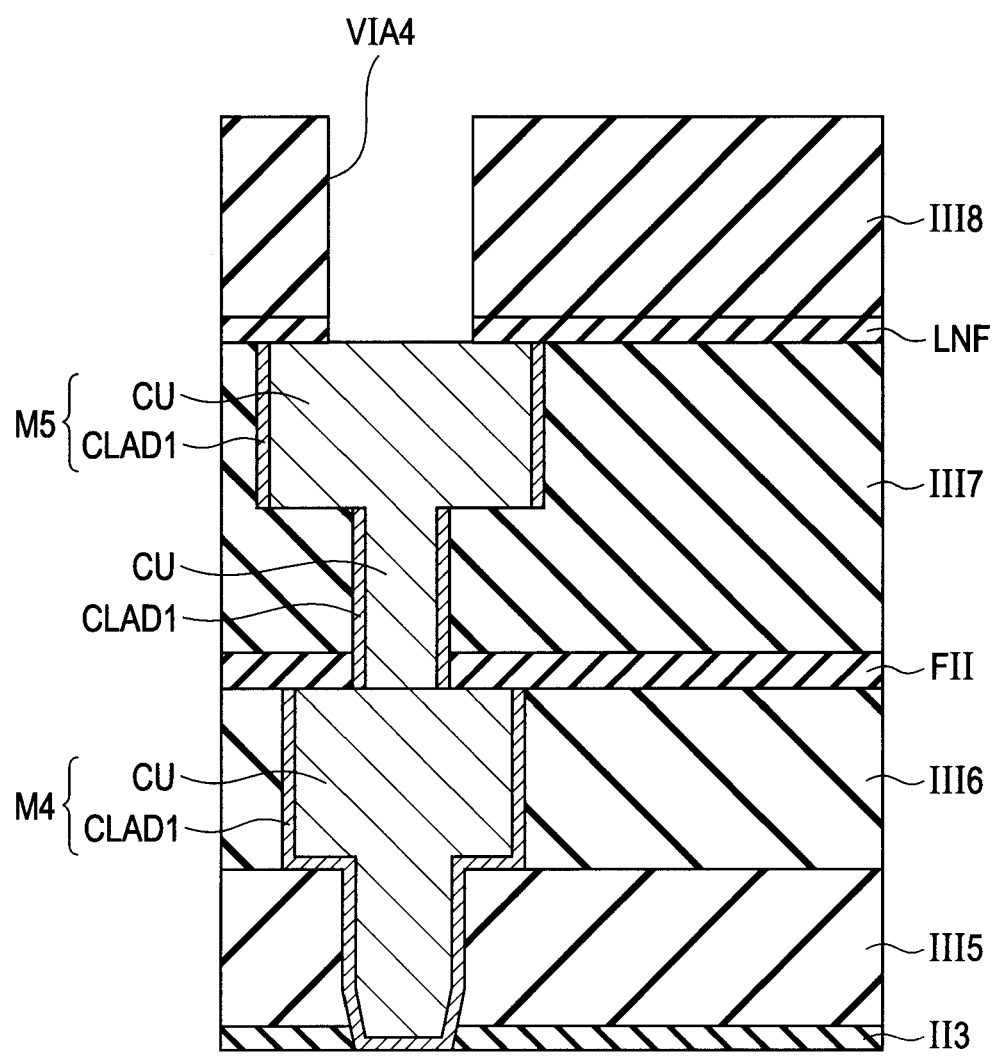
FIG. 82 is a schematic sectional view of the peripheral circuit portion, illustrating a manufacturing process step subsequent to the manufacturing process step illustrated in FIG. 81 in the method of manufacturing the conventional semiconductor device.

Description will be given to the operation and working effect of this embodiment. Here, a conventional method of manufacturing a semiconductor device will be described. In the conventional method of manufacturing a semiconductor device, with respect to the memory cell portion, the same processing as illustrated in FIG. 53 and FIG. 54 is carried out subsequently to the step illustrated in FIG. 50 to FIG. 52. In the peripheral circuit portion, at this time, the cladding layer CLAD2a is removed as illustrated in FIG. 81 unlike the processing illustrated in FIG. 55. That is, the processing in FIG. 81 is the same as that in FIG. 55 except the cladding layer CLAD2a is removed. Then the same processing of forming the interlayer insulating film III8 and the via hole VIA4 as illustrated in FIG. 58 is carried out as illustrated in FIG. 82.

In this case, there is a high possibility that an external magnetic field, such as a stray magnetic field, (to the relevant semiconductor device) has harmful effect on a magnetoresistive element TMR.

Figure 55:
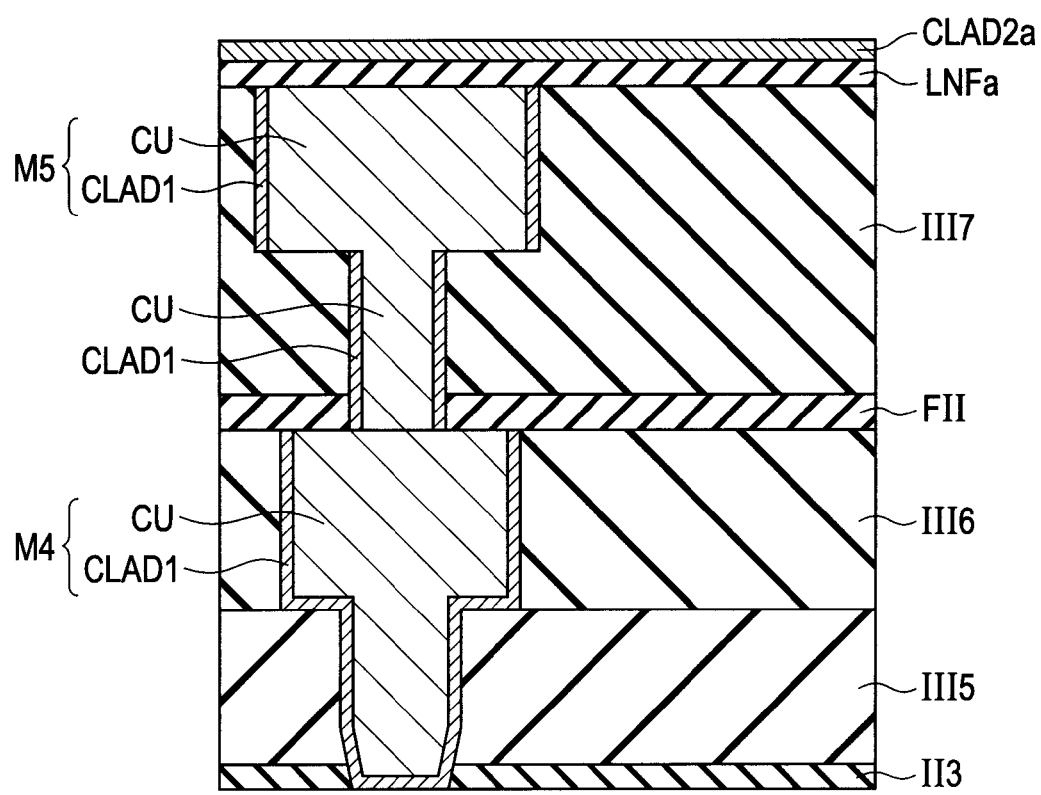
FIG. 55 is a schematic sectional view illustrating a mode of the peripheral circuit portion at the same manufacturing process step as in FIG. 53.
Figure 58:
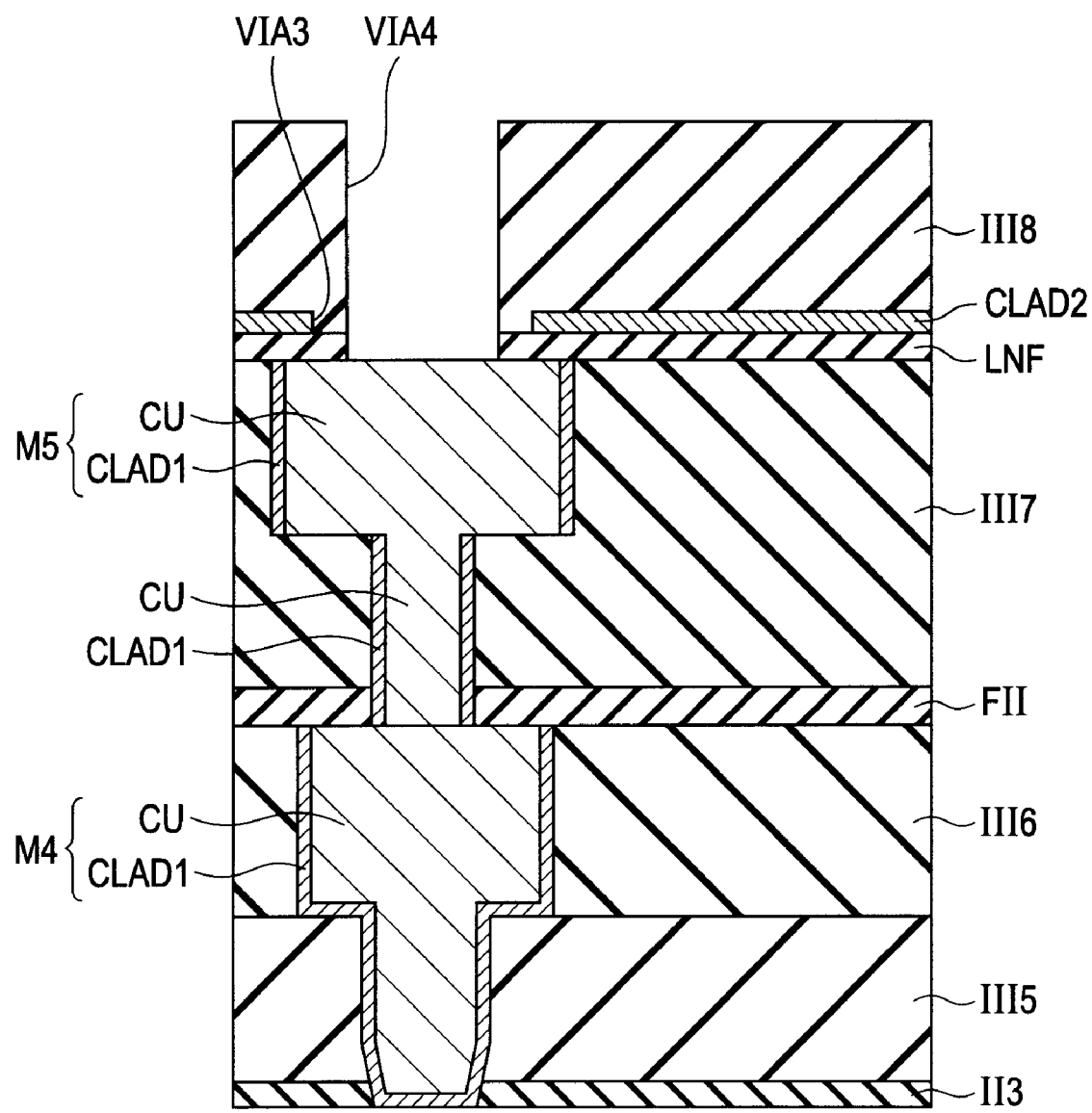
FIG. 58 is a schematic sectional view illustrating a mode of the peripheral circuit portion at the same manufacturing process step as in FIG. 56.

In this embodiment, meanwhile, the following measure is taken as illustrated in FIG. 55: the interlayer insulating film III8 and the via holes VIA3, VIA4 are formed at the step illustrated in FIG. 58 with the cladding layer CLAD2a unremoved from the peripheral circuit portion. Therefore, as illustrated in FIG. 7 and FIG. 16, the following is implemented in the peripheral circuit portion of the semiconductor device in this embodiment: the cladding layer CLAD2 including the high permeability film MAG is arranged at the upper part of the wiring M5 formed at the same time as the bit lines BL.

For this reason, there is a high possibility that an external magnetic field is once concentrated in the cladding layer CLAD2 at the upper part of the wiring M5 in the peripheral circuit portion and then goes out again.

Therefore, when the cladding layer CLAD2 is arranged in the peripheral circuit portion, the following can be implemented unlike cases where the cladding layer CLAD2 is not arranged in the peripheral circuit portion: owing to the presence of the cladding layer CLAD2 in the peripheral circuit portion, the magnetic shielding effect of the relevant semiconductor device can be enhanced. That is, the influence of external magnetic fields on a magnetoresistive element TMR in the memory cell portion can be suppressed.

A magnetic field generated by a current flowing through a bit line BL or the like in the memory cell portion highly probably enters the cladding layer CLAD2 arranged over the wiring in the peripheral circuit portion. For this reason, it is possible to suppress the influence of a magnetic field generated by a current in a bit line BL on magnetoresistive elements TMR other than a desired magnetoresistive element TMR. This effect becomes pronounced especially at the boundary between the memory cell portion and the peripheral circuit portion.

Further, the thickness W2 (especially, of the high permeability film MAG) of the cladding layer CLAD2 illustrated in FIG. 6 can be made larger than the thickness W1 of the cladding layer CLAD1. As mentioned above, the thickness W1 has influence on the sectional area of the copper wiring body portion CU of wiring, such as bit lines BL, encircled with the cladding layer CLAD1. The thickness W1 of a cladding layer covering the side wall surface of wiring cannot be made excessively thick from the viewpoint of prevention of interference with adjacent wirings as well.

When the thickness W2 of the cladding layer CLAD2 is made larger, the volume of the cladding layer CLAD2 can be increased. Consequently, the magnetic shielding effect of the cladding layer CLAD2 can be further enhanced.

The volume of the cladding layer CLAD2 is determined by the size of the cladding layer CLAD2 as viewed in a plane and its thickness. In this case, it is more desirable to increase the thickness of the cladding layer CLAD2 to increase the volume of the cladding layer CLAD2. The reason for this is as described below. By increasing the thickness of the cladding layer CLAD2, the cladding layer CLAD2 is arranged in an area farther away from, especially, a magnetoresistive element TMR. For this reason, the effect of inducing an external extra magnetic field to an area farther away from the magnetoresistive element TMR is heightened.

In the semiconductor device in this embodiment, especially, that having the MRAM structure illustrated in FIG. 4 to FIG. 7 and FIG. 11 to FIG. 13, the following takes place: while the inner surfaces of the contacts M1, M2, M3 are covered with only the barrier layer BRL, the inner surfaces of the plugs M4, wirings M5, bit lines BL, and digit lines DL are covered with the cladding layer CLAD1. Thus the inner surfaces of the plug M4 and the like formed in an area close to a magnetoresistive element TMR in the up and down direction are covered with the cladding layer CLAD1. This makes it possible to further heighten the effect of more efficiently exerting a desired magnetic field on a magnetoresistive element TMR and blocking off the other magnetic fields.

In the semiconductor device in this embodiment, a cladding layer is not arranged over the upper surface (surface opposed to a magnetoresistive element TMR) of the inner surfaces of a digit line DL. With this configuration, it is possible to concentrate a magnetic field generated by a current flowing through the digit line DL on the magnetoresistive element TMR.

As mentioned above, the cladding layer CLAD2 (as first high permeability film) located above the bit lines BL substantially entirely covers the memory cell portion and the peripheral circuit portion. In reality, however, the electrode pad PAD is formed in the cladding layer CLAD2 in the peripheral circuit portion; therefore, it may be removed in some area as viewed in a plane in addition to the area removed as the via hole VIA4, present in the cladding layer.

Figure 83:
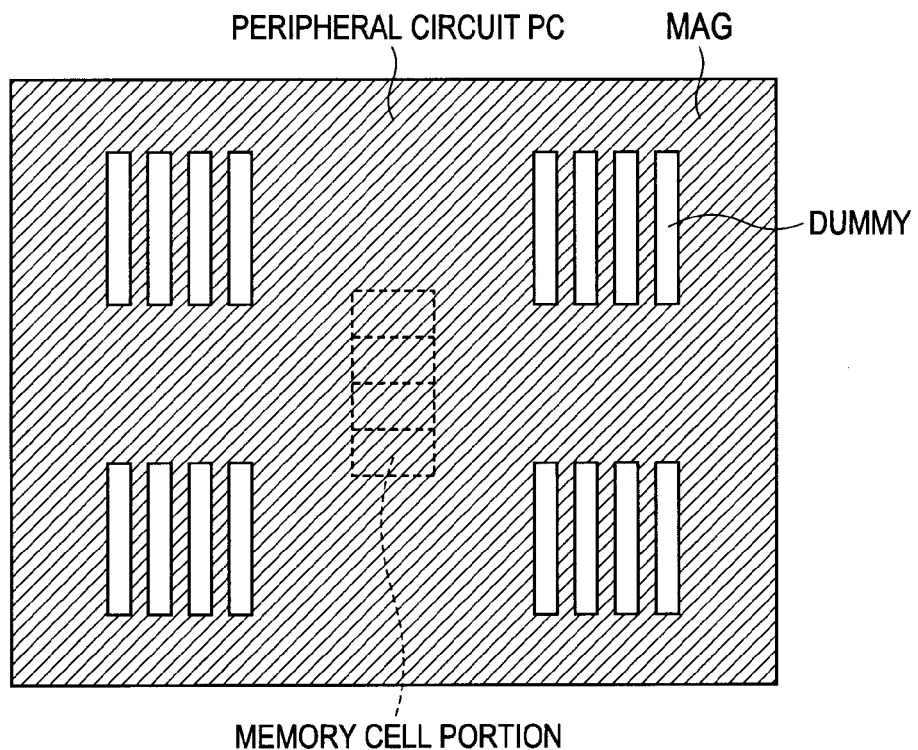
FIG. 83 is a schematic diagram illustrating an example of the shape of a dummy pattern with part of a high permeability film removed as viewed in a plane, in a semiconductor device in the first embodiment of the invention.
Figure 84:
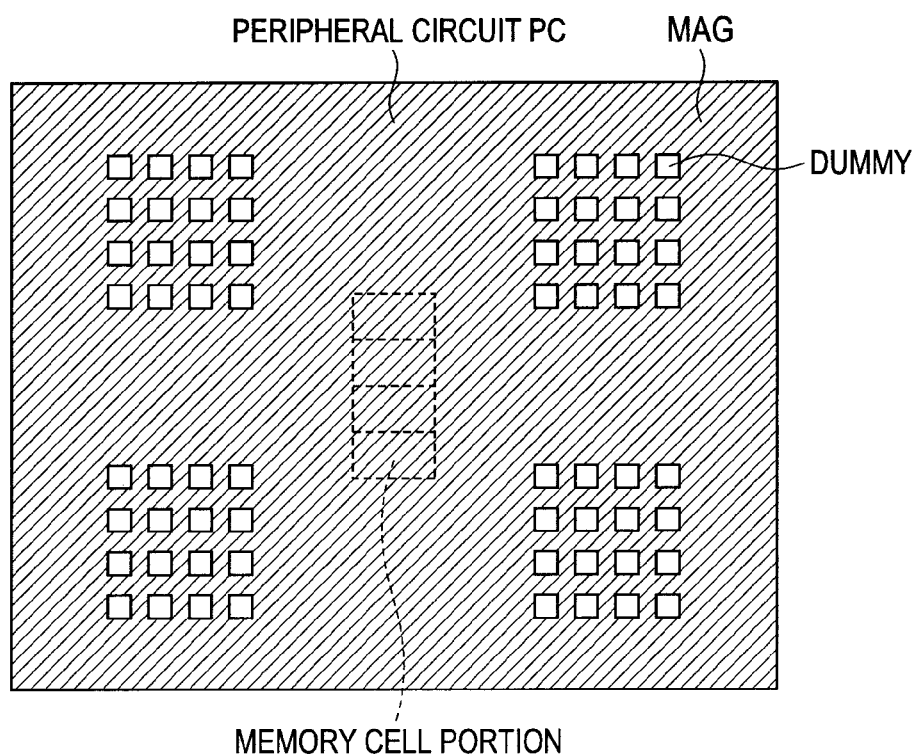
FIG. 84 is a schematic diagram illustrating another example, different from that in FIG. 83, of the shape of a dummy pattern with part of a high permeability film removed as viewed in a plane, in a semiconductor device in the first embodiment of the invention.
Figure 85:
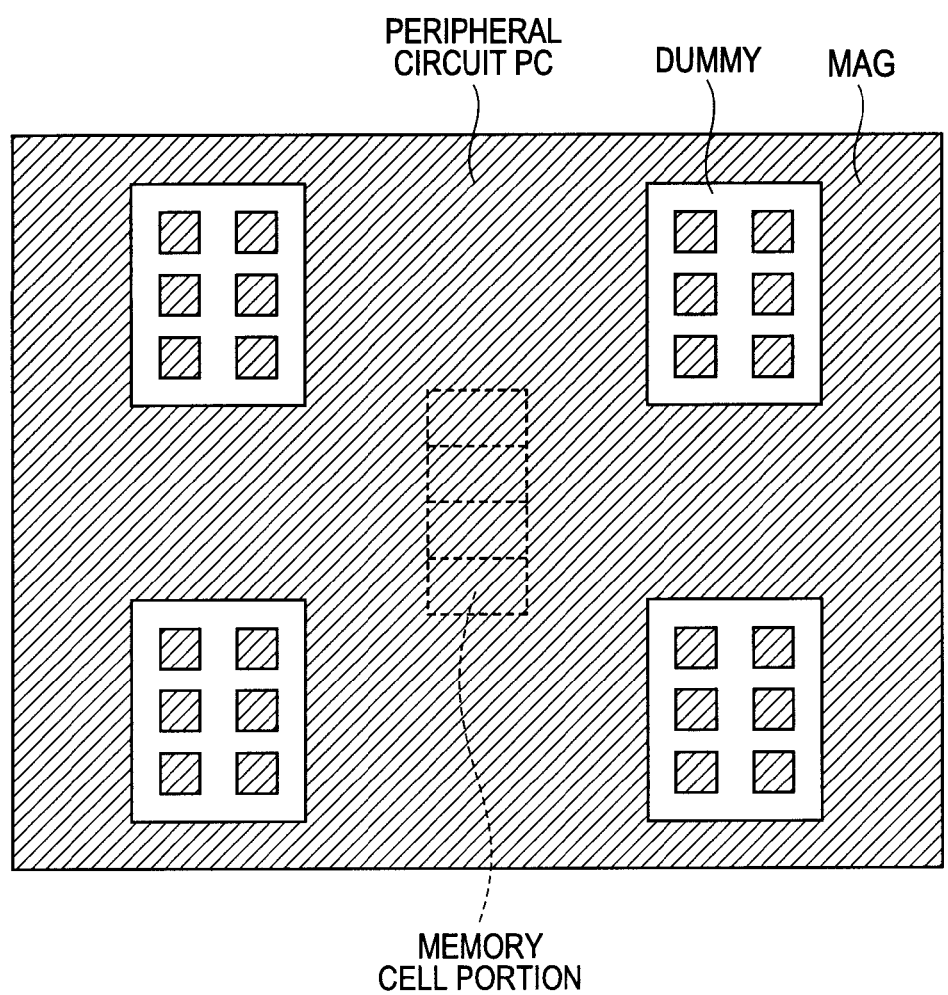
FIG. 85 is a schematic diagram illustrating further another example, different from that in FIG. 84, of the shape of a dummy pattern with part of a high permeability film removed as viewed in a plane, in a semiconductor device in the first embodiment of the invention.

Specifically, it is desirable that the high permeability film MAG in the cladding layer CLAD2 over the bit lines BL should be removed as illustrated in FIG. 83 to FIG. 85. That is, it is desirable that some area in the high permeability film MAG should be removed so that dummy patterns DUMMY having any of the following shapes are formed in the peripheral circuit portion: a substantially rectangle shape (FIG. 83); a substantially square shape (FIG. 84); and a shape obtained by boring multiple small squares in a rectangle (FIG. 85).

However, the shape of each dummy pattern is not limited to these shapes and it may be in any shape including a circle, oval, and the like.

FIG. 83 to FIG. 85 illustrate modes in which the high permeability film MAG comprising the cladding layer CLAD2 (as first high permeability film) has the above-mentioned dummy patterns. However, the overall cladding layer CLAD2 including the barrier layer BRL may have any of the same dummy patterns as described above.

With part of the cladding layer CLAD2 in the peripheral circuit portion removed as mentioned above, it is possible to further enhance the adhesion of the cladding layer CLAD2 to, for example, the liner film LNF or the interlayer insulating film III8. This is because the force with which the cladding layer CLAD2 adheres tightly to the interlayer insulating film III8 or the like is weaker than the force with which the liner film LNF adheres tightly to the interlayer insulating film III7 or the like. That is, detachment between the cladding layer CLAD2 and the interlayer insulating film III8 can be suppressed by reducing the area in which the cladding layer CLAD2 adheres tightly to the interlayer insulating film III8.

Figure 86:
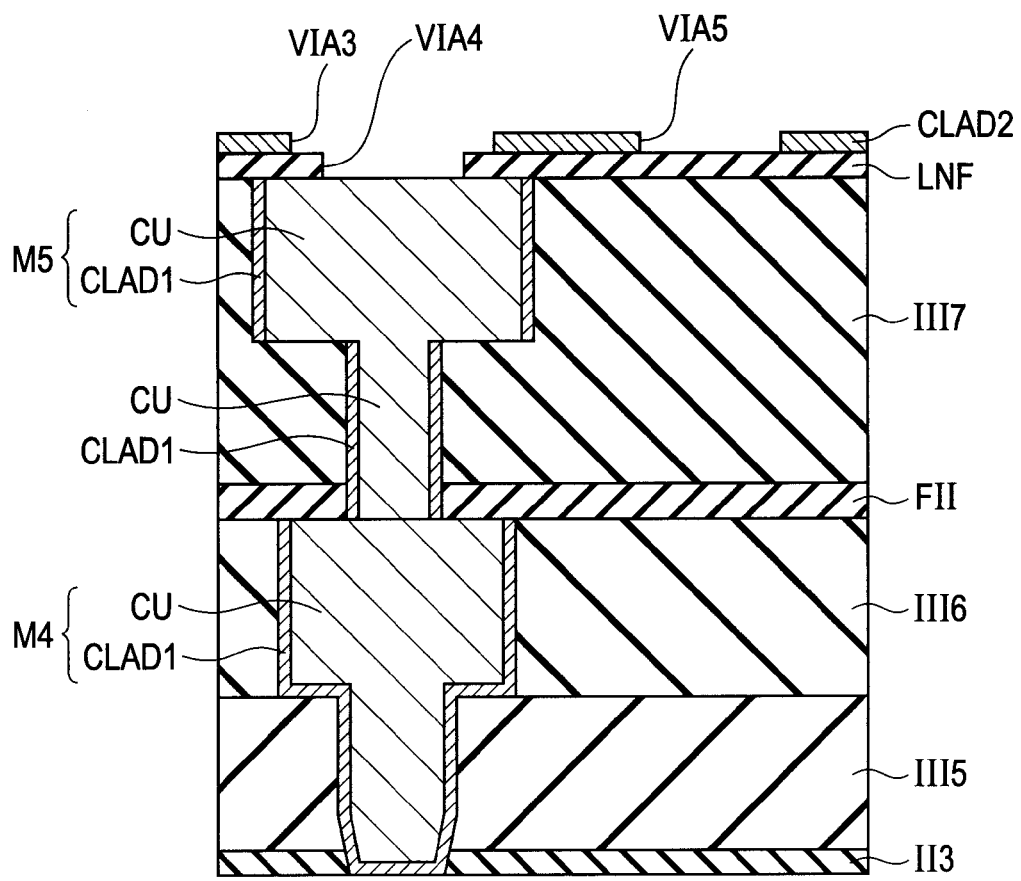
FIG. 86 is a schematic sectional view illustrating a mode of a via hole with part of a high permeability film removed as a dummy in a semiconductor device in the first embodiment of the invention.
Figure 87:
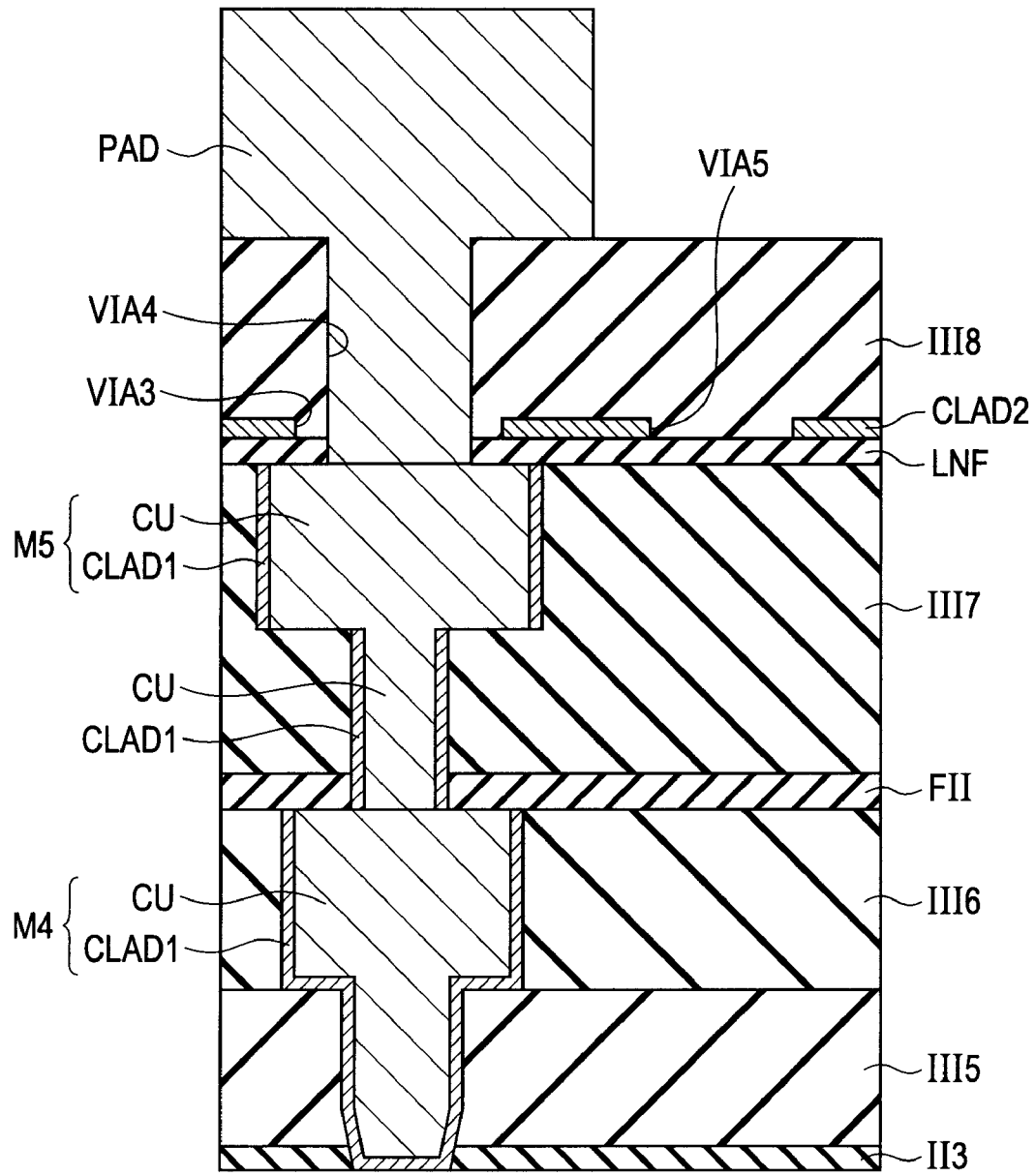
FIG. 87 is a schematic sectional view illustrating a mode in which an electrode pad PAD is formed as in FIG. 58 so as to fill the interior of the via hole VIA4 in FIG. 86.

As illustrated in FIG. 86 or FIG. 87, a via hole VIA5 as a dummy may be formed in an area where wiring is not formed. This via hole VIA5 is formed aside from the via hole VIA4 for the formation of the electrode pad PAD, formed directly above the wiring M5 in the cladding layer CLAD2 in the peripheral circuit portion. In this case, the via hole brings the same effect as the dummy patterns DUMMY in FIG. 83 to FIG. 85 do.

Second Embodiment

This embodiment is different from the first embodiment in the configuration of a cladding layer covering the memory cell portion and the peripheral circuit portion. Hereafter, description will be given to the configuration of this embodiment.

In the first embodiment, as illustrated in FIG. 2, both the memory cell portion and the peripheral circuit portion of a semiconductor device are covered with an identical cladding layer CLAD (continuous as viewed in a plane). Meanwhile, in the semiconductor device in the second embodiment, as illustrated in FIG. 88, the following cladding layers of the cladding layer CLAD as first high permeability film are discontinuous to each other: a cladding layer CLAD covering the memory cell portion and a cladding layer CLAD covering the peripheral circuit portion.

Figure 88:
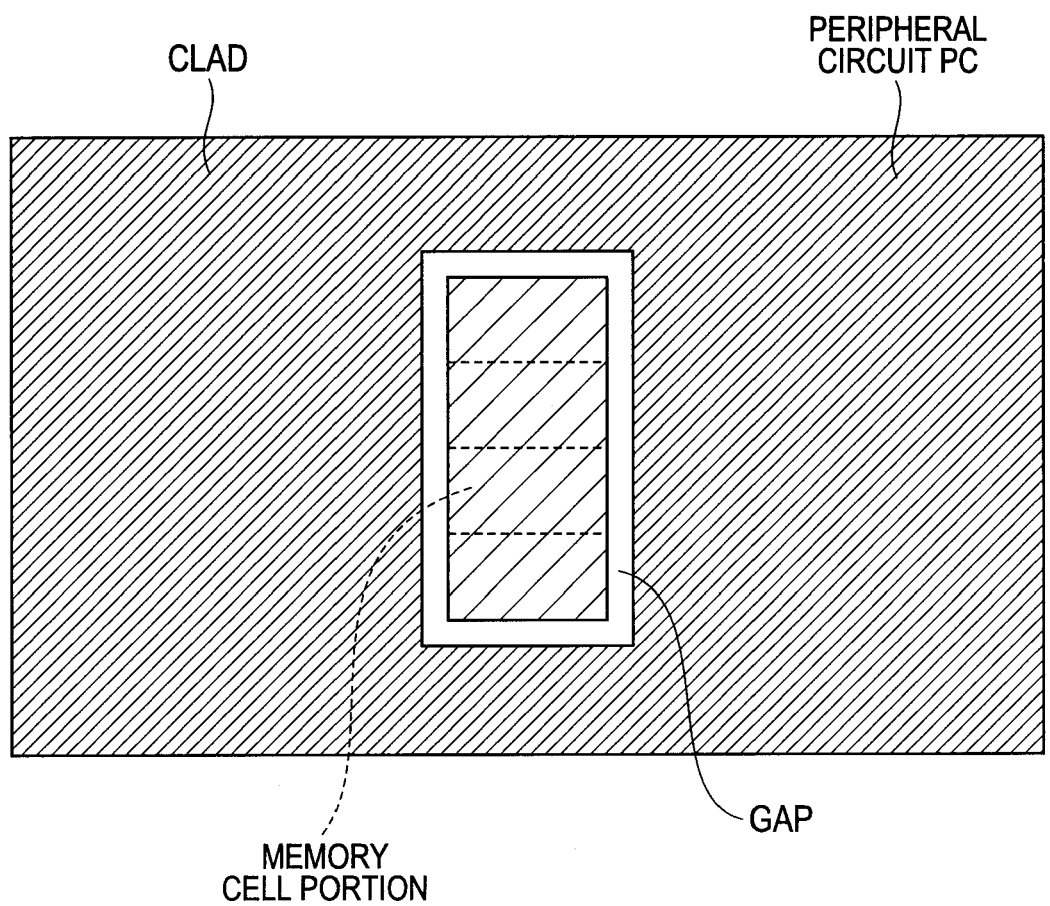
FIG. 88 is an enlarged schematic diagram illustrating the configuration of the same memory cell portion and peripheral circuit portion as in FIG. 2, as viewed in a plane, in a second embodiment of the invention.
Figure 89A:
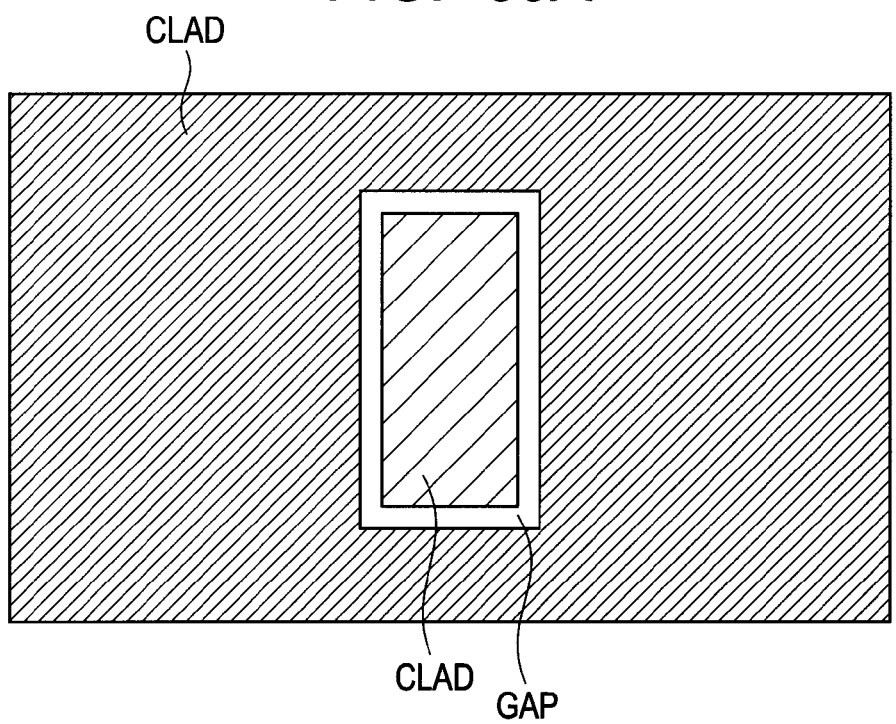
FIG. 89(A) is an enlarged schematic diagram illustrating a mode of a cladding layer covering the memory cell portion and the peripheral circuit portion from above, as viewed in a plane, in the second embodiment of the invention.
Figure 89B:
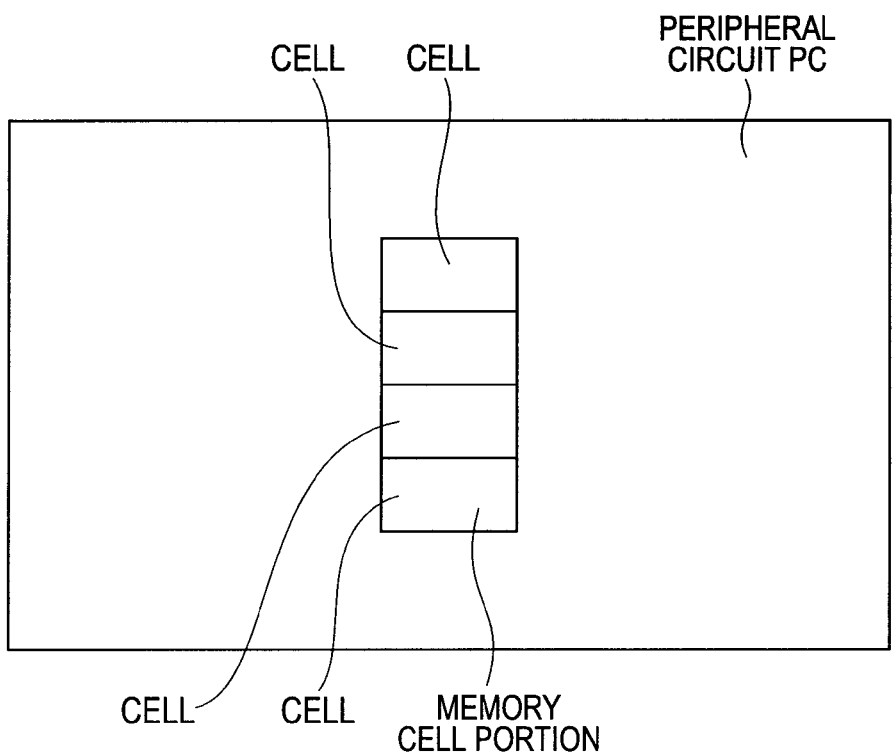
FIG. 89(B) is an enlarged schematic diagram illustrating a mode of the memory cell portion and peripheral circuit portion covered with the cladding layer in FIG. 89(A) from above, as viewed in a plane, in the second embodiment of the invention.

FIG. 88 illustrates a mode in which the upper layer and the lower layer of the memory cell portion and the peripheral circuit portion in FIG. 1 are superposed on each other as in FIG. 2. FIGS. 89(A) and 89(B) more clearly show FIG. 88 with the upper layer and the lower layer separated from each other. FIG. 89(A) illustrates the upper layer and FIG. 89(B) illustrates the lower layer. (These drawings are respectively equivalent to FIG. 3(A) and FIG. 3(B).)

In the second embodiment, as illustrated in FIG. 88 and FIG. 89(A), the cladding layer CLAD in the memory cell portion and the cladding layer CLAD in the peripheral circuit portion are separated from each other. A gap GAP where no cladding layer CLAD is arranged is formed between the cladding layer CLAD covering the memory cell portion from above and the cladding layer CLAD covering the peripheral circuit portion from above. The width of the gap GAP, that is, the shortest distance between the cladding layer CLAD in the memory cell portion and the cladding layer CLAD in the peripheral circuit portion is equal to or larger than the minimum dimension under the design rules.

The cladding layer in the memory cell portion and that in the peripheral circuit portion are separated from each other with this gap GAP in between. The configuration in FIG. 89(B) is identical with the configuration in FIG. 3(B).

Figure 90:
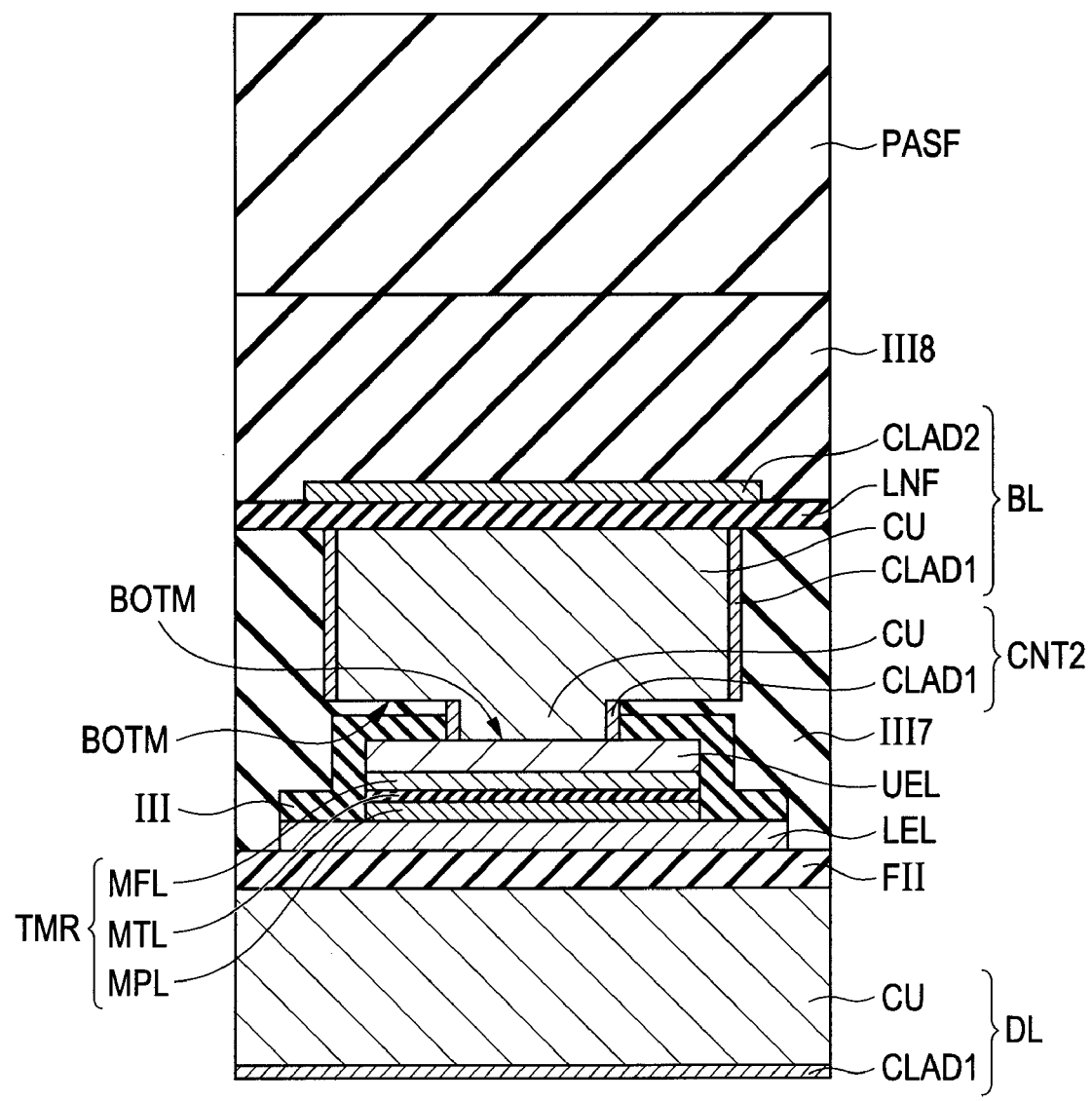
FIG. 90 is a schematic sectional view illustrating a mode of an example of a magnetoresistive element arranged in the memory cell portion, as viewed from the same direction as in FIG. 6, in the second embodiment of the invention.
Figure 91:
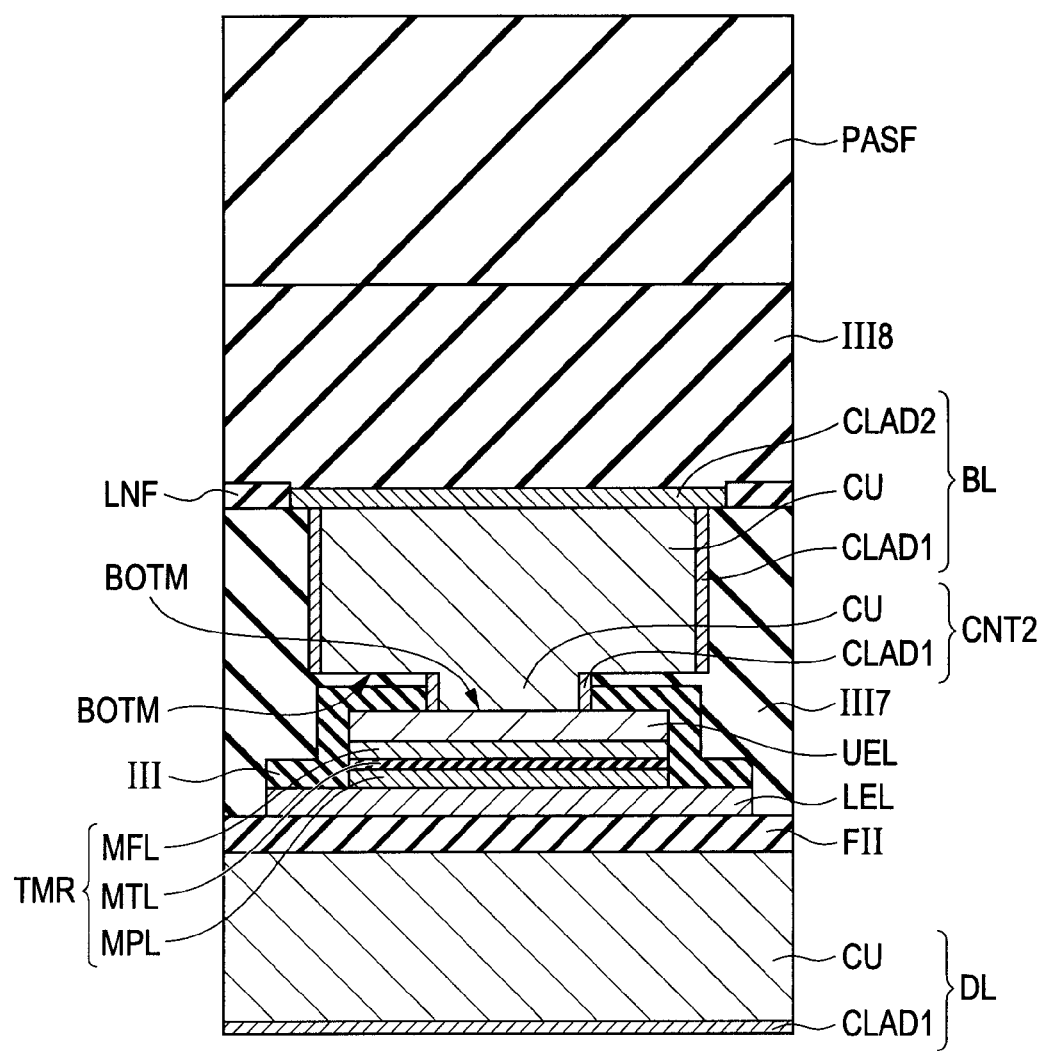
FIG. 91 is a schematic sectional view illustrating a mode of a modification, different from that in FIG. 90, to a magnetoresistive element arranged in the memory cell portion, as viewed from the same direction as in FIG. 6, in the second embodiment of the invention.

The cladding layer CLAD in the first embodiment is evenly arranged over substantially the entire surfaces of the memory cell portion and the peripheral circuit portion. In the semiconductor device in the second embodiment, meanwhile, the cladding layer CLAD covering the memory cell portion may substantially entirely cover the memory cell portion. Alternatively, as illustrated in FIG. 90, for example, it may cover the multiple magnetoresistive elements TMR arranged in the memory cell portion only from directly above the bit lines BL. Alternatively, when the cladding layer CLAD covers them only from directly above the bit lines BL, the following arrangement may be adopted as illustrated in FIG. 91, for example: an arrangement in which no liner film LNF is arranged directly above the bit lines BL and the cladding layer CLAD located directly above the bit lines BL and the surrounding liner film LNF are arranged in parallel to each other as viewed in a plane.

"Directly above the bit lines BL" cited here refers to an area overlapping with the bit lines BL as viewed in a plane of the areas located above the bit lines BL (on the opposite side to the semiconductor substrate SUB). However, the area includes an area that does not completely overlap with a bit line BL but is located close to an area overlapping with the bit line BL (area substantially overlapping with the bit line BL).

That is, a cladding layer CLAD (for example, the cladding layer CLAD2) is not formed in areas other than areas located directly above the bit lines BL in the memory cell portion, like the gap GAP.

The other respects in the configuration of this embodiment are substantially the same as the configuration of the first embodiment. In FIG. 88 to FIG. 92, therefore, the same elements as in the first embodiment will be marked with the same reference codes and the description thereof will not be repeated. For example, the configuration of the device in this embodiment as viewed from the same direction as in FIG. 5 and the peripheral circuit diagram thereof equivalent to FIG. 7 are respectively the same as FIG. 5 and FIG. 7; therefore, these drawings are omitted.

Description will be given to a method of manufacturing a semiconductor device in this embodiment. In the method of manufacturing the above-mentioned semiconductor device, the following pattern is formed after the step in the first embodiment illustrated in FIG. 53 to FIG. 55: such a pattern that the cladding layer CLAD2a covers substantially the entire peripheral circuit portion and only the areas in the memory cell portion located directly above the bit lines BL. It is desirable that this pattern formation should be carried out by photolithography and etching.

Then the same processing as at the step illustrated in FIG. 56 to FIG. 58 is carried out. Thus the mode illustrated in FIG. 92 is obtained.

Figure 92:
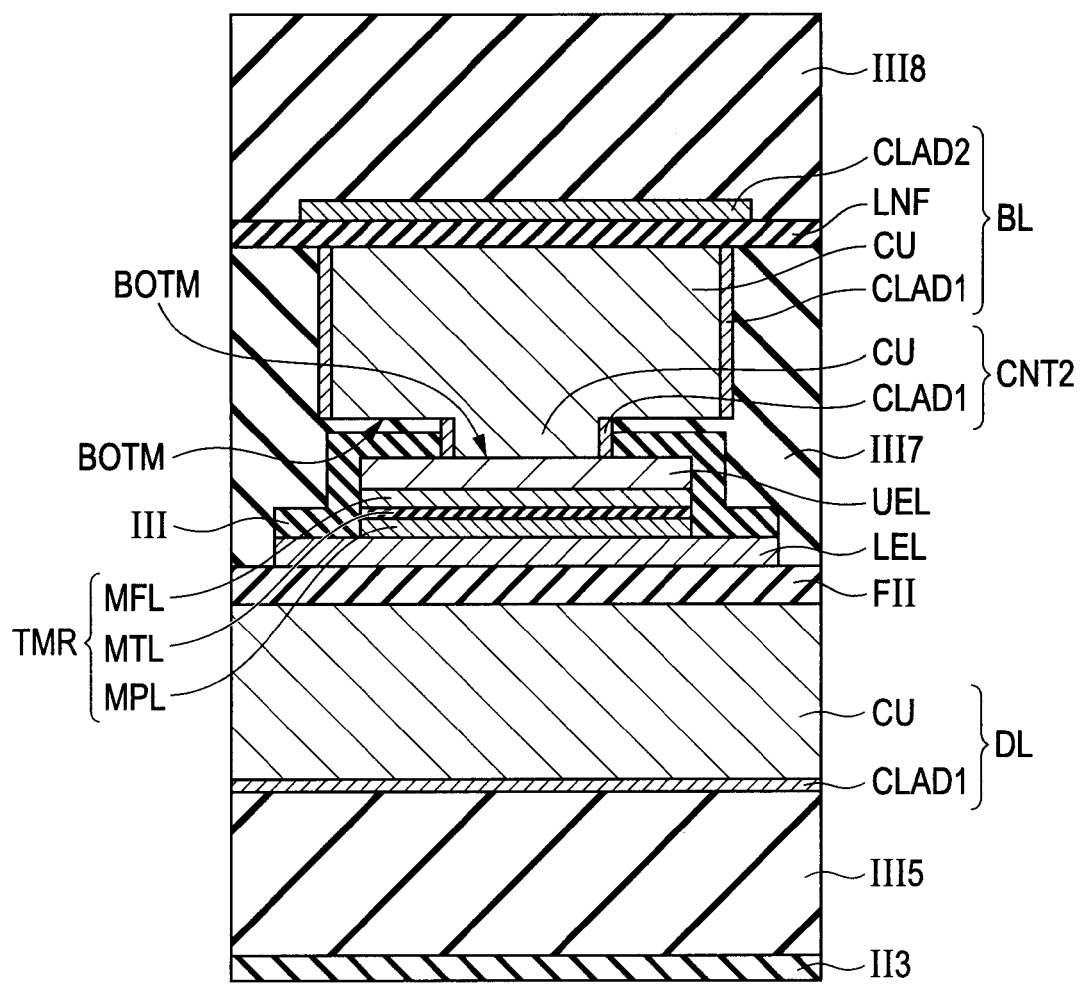
FIG. 92 is a schematic sectional view illustrating a manufacturing process step subsequent to the manufacturing process step illustrated in FIG. 53, as viewed from the same direction as in FIG. 6, in a method of manufacturing a semiconductor device in the second embodiment of the invention.

FIG. 92 is identical with FIG. 57 except the cladding layer CLAD2 over the liner film LNF is arranged only directly above the bit lines BL. The sectional views as viewed from the same direction as in FIG. 56 and FIG. 58, obtained after the step in FIG. 92 is carried out, are respectively identical with those in FIG. 56 and FIG. 58; therefore, these drawings are omitted here.

The manufacturing process steps subsequent to the manufacturing process step illustrated in FIG. 92 are the same as in the first embodiment. Description will be given to the operation and working effect of this embodiment.

Arranging cladding layers CLAD (cladding layers CLAD2) separated into that in the memory cell portion and that in the peripheral circuit portion as in this embodiment makes it possible to further enhance the magnetic shielding effect than in the first embodiment. The reason for this is as described below. The cladding layer CLAD2 in the peripheral circuit portion is discontinuous from the cladding layer CLAD2 in the memory cell portion. Therefore, there is a low possibility that a magnetic field in the cladding layer CLAD2 in the peripheral circuit portion arrives at the memory cell portion.

When the cladding layer CLAD2 is arranged only directly above, for example, the bit lines BL in the memory cell portion, the following possibility can be reduced: a possibility that a magnetic field generated by a current flowing through a bit line BL over one magnetoresistive element TMR has influence on the operation of a magnetoresistive element TMR adjacent to that magnetoresistive element TMR. This is because the following possibility is low with respect to a magnetic field concentrated in the cladding layer CLAD2 over a bit line BL of one magnetoresistive element TMR: a possibility that that the magnetic field leaks toward a magnetoresistive element TMR adjacent to the one magnetoresistive element TMR.

According to this embodiment, as mentioned above, it is possible to reduce a possibility that a magnetoresistive element TMR is influenced by an external magnetic field more than in the first embodiment.

The second embodiment of the invention is different from the first embodiment of the invention only in the above-mentioned respects. That is, all the respects of the second embodiment of the invention that have not been described above, including configuration, condition, procedure, effect, and the like, are in accordance with those of the first embodiment of the invention.

Up to this point, the second embodiment has been described based on the MRAM having the contact portion CNT2 in the first embodiment, illustrated in FIG. 4 to FIG. 7. However, the features of the second embodiment may be combined with other semiconductor devices (semiconductor devices having the MRAM illustrated in FIG. 11 to FIG. 13 and FIG. 14 to FIG. 16) in the first embodiment. Further, the dummy patterns DUMMY or the like described in relation to the first embodiment may be used for the second embodiment.

Third Embodiment

This embodiment is different from the first embodiment in the configuration of the cladding layer covering the memory cell portion and the peripheral circuit portion. Hereafter, description will be given to the configuration of this embodiment.

Figure 93:
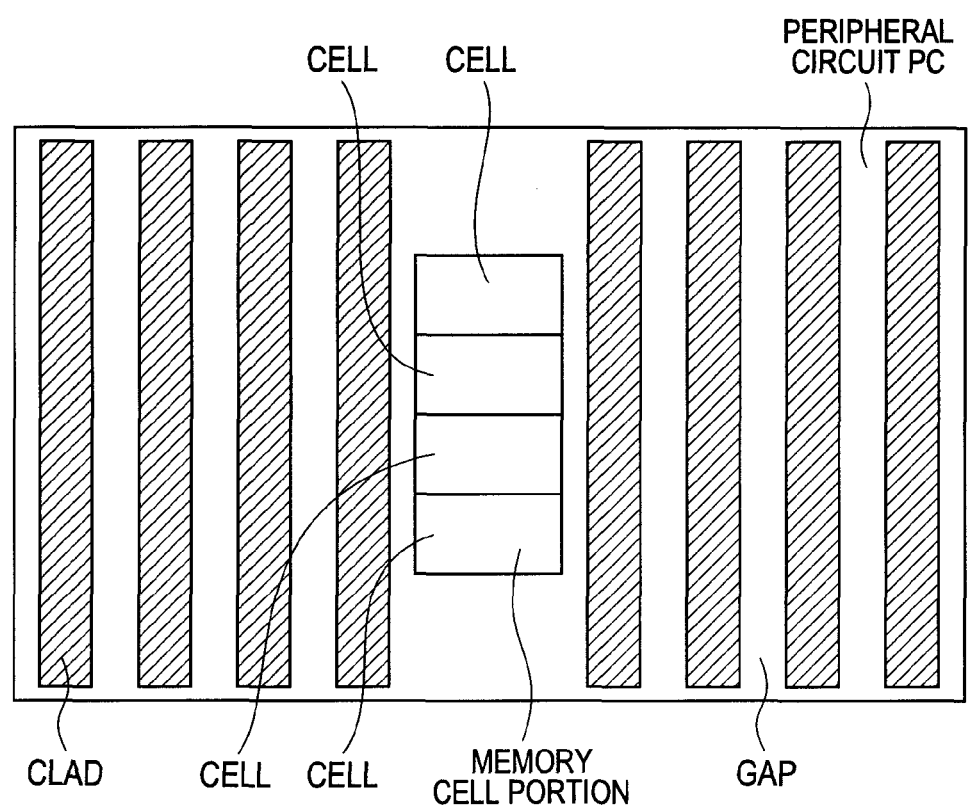
FIG. 93 is an enlarged schematic diagram illustrating the configuration of the same memory cell portion and peripheral circuit portion as in FIG. 2, as viewed in a plane, in a third embodiment of the invention.

In the semiconductor device in the third embodiment, the following measure is taken as illustrated in FIG. 93: a cladding layer CLAD (for example, the cladding layer CLAD2) above bit lines BL and wiring M5 is not formed in the memory cell portion; and it is formed only in the peripheral circuit portion. Also in the third embodiment, a cladding layer CLAD may be arranged in the memory cell portion as in the first embodiment and the second embodiment.

In the peripheral circuit portion, the following areas are repetitively arranged in a first direction in which the main surface of the semiconductor substrate is extended: an area where the cladding layer CLAD is arranged and an area where the cladding layer CLAD is not arranged.

With respect to the cladding layer CLAD, specifically, the following areas are repetitively and alternately arranged in the left and right direction as one direction in FIG. 93: an area where the cladding layer CLAD is arranged and an area where the cladding layer CLAD is not arranged. Each area where the cladding layer CLAD is continuously extended in the up and down direction in FIG. 93 orthogonal to the above one direction. Each area where the cladding layer CLAD is not arranged is extended as a gap GAP in the up and down direction in FIG. 93 similarly to the areas where the cladding layer CLAD is arranged.

With respect to the arrangement of the cladding layer CLAD, it may be continuously extended in the direction orthogonal to that in FIG. 93, that is, in the left and right direction orthogonal the direction in FIG. 93. This is the same with the gap GAP.

That is, in the peripheral circuit portion, both the areas where the cladding layer CLAD is arranged and the areas where it is not arranged are formed as Ls/Ss for the shape of strip of paper.

It is desirable that the shortest distance (the width of each gap GAP) between adjacent Ls/Ss should be equal to or larger than the minimum dimension under the design rules.

The above-mentioned repetitive arrangement also includes cases where an area with the cladding layer CLAD and an area without the cladding layer CLAD are not arranged at constant intervals. That is, the width of one cladding layer CLAD as viewed in a plane and the width of one gap GAP as viewed in a plane may differ from cladding layer CLAD to cladding layer CLAD or from gap GAP to gap GAP.

The semiconductor device may be so configured that the cladding layer CLAD forms Ls/Ss in substantially the entire peripheral circuit portion as illustrated in FIG. 93. Instead, the semiconductor device may be so configured that the cladding layer CLAD only in some areas in the peripheral circuit portion forms Ls/Ss.

Figure 94:
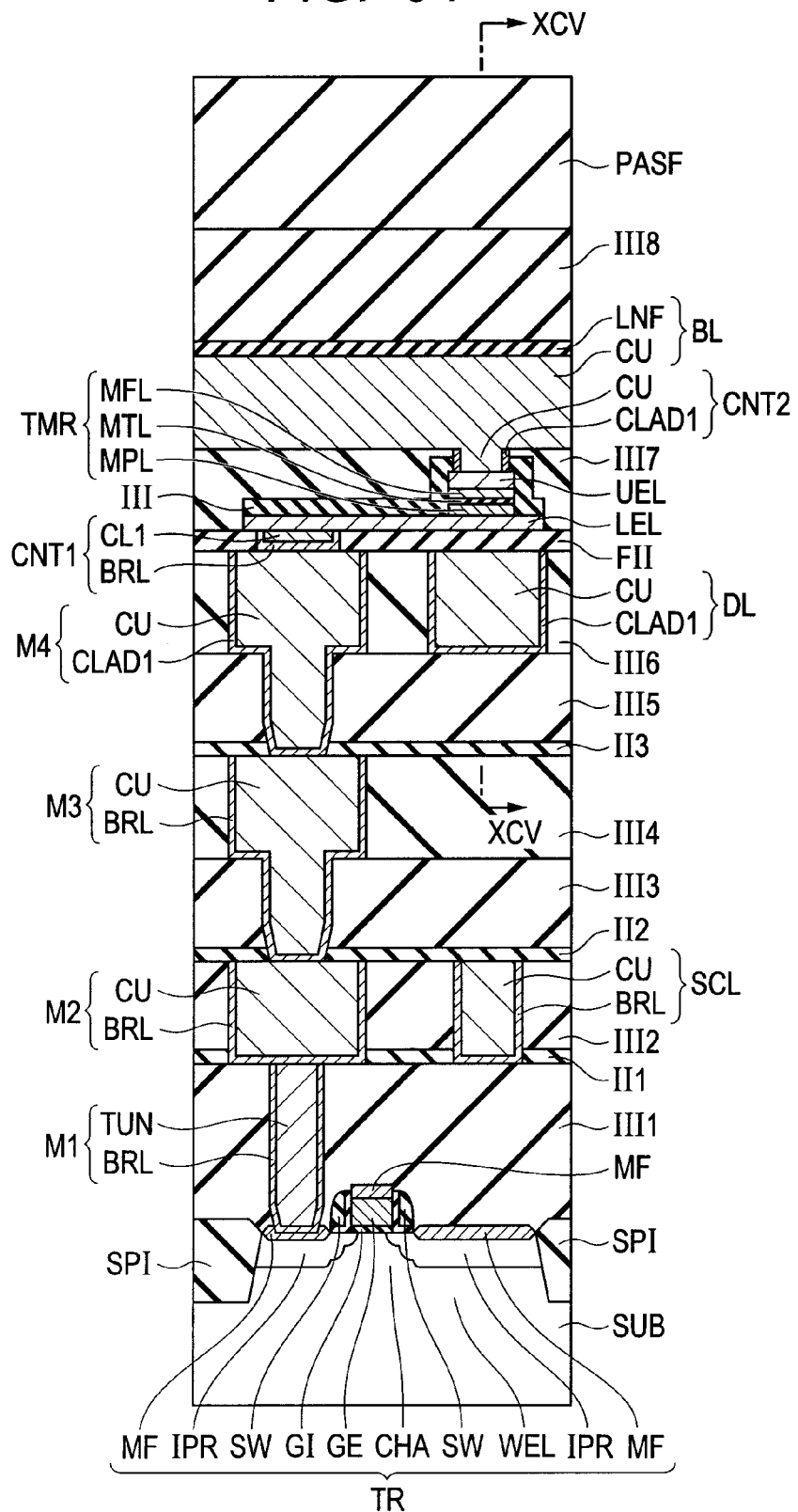
FIG. 94 is a schematic sectional view illustrating a mode of a magnetoresistive element arranged in the memory cell portion, as viewed from the same direction as in FIG. 5, in the third embodiment of the invention.
Figure 95:
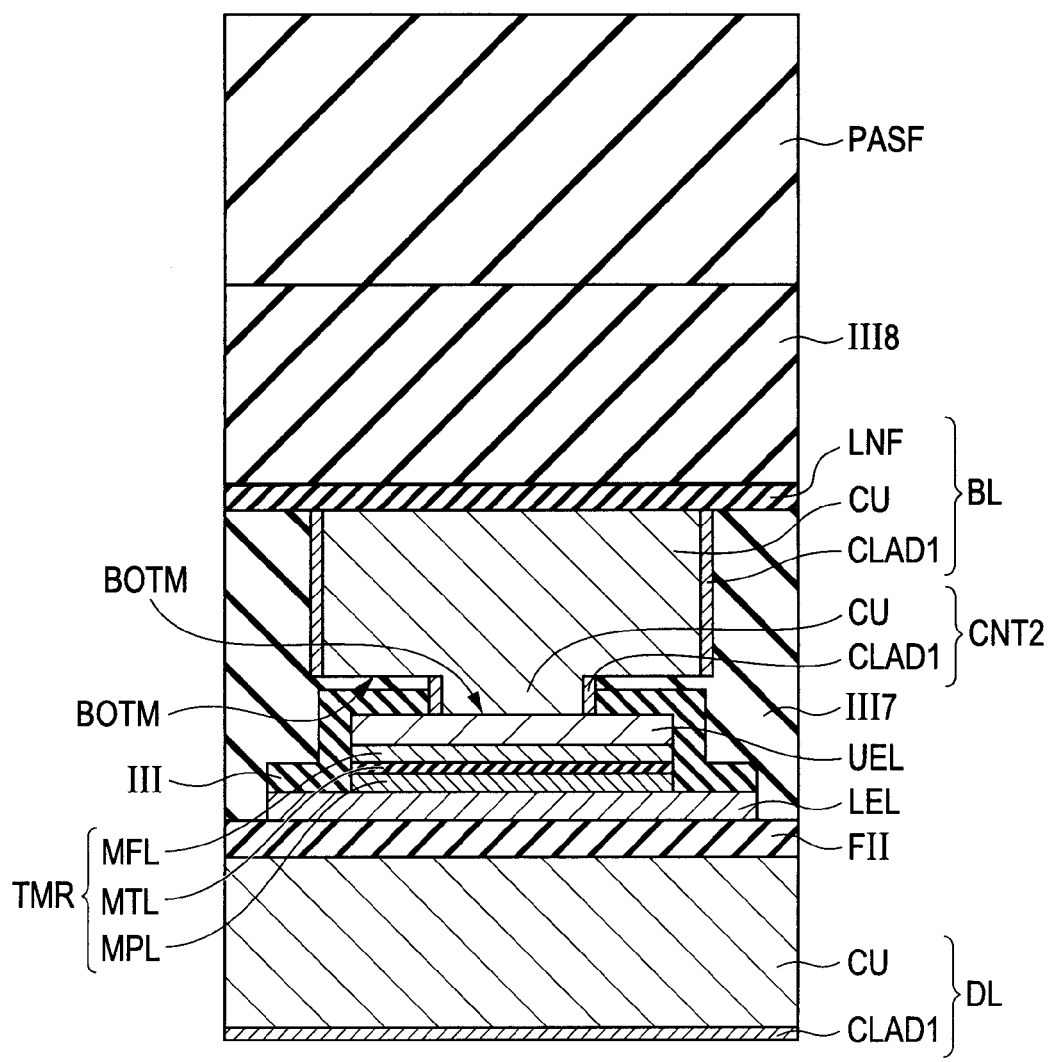
FIG. 95 is a schematic sectional view taken along line XCV-XCV of FIG. 94.
Figure 96:
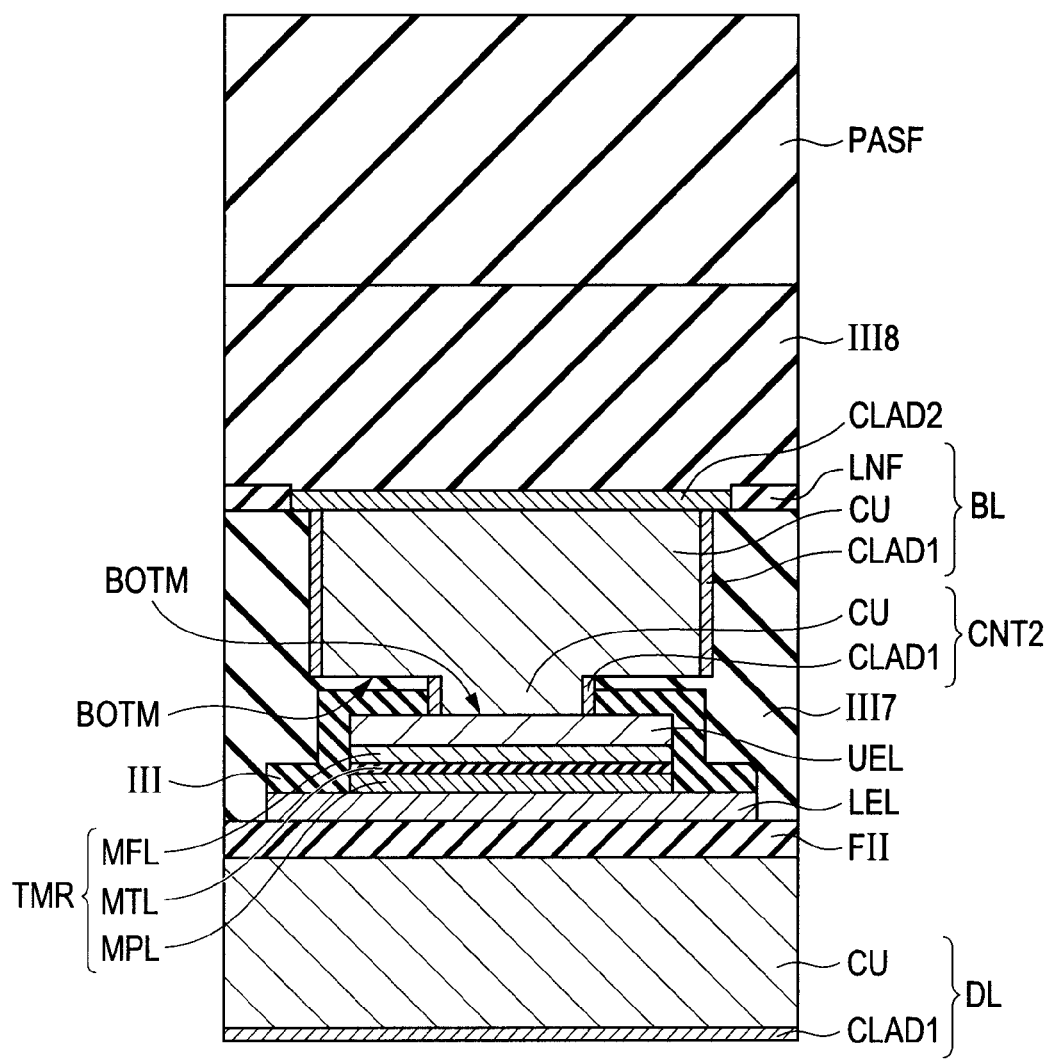
FIG. 96 is a schematic sectional view illustrating a mode of a modification, different from that in FIG. 95, to a magnetoresistive element arranged in the memory cell portion, as viewed from the same direction as in FIG. 6, in the third embodiment of the invention.
Figure 97:
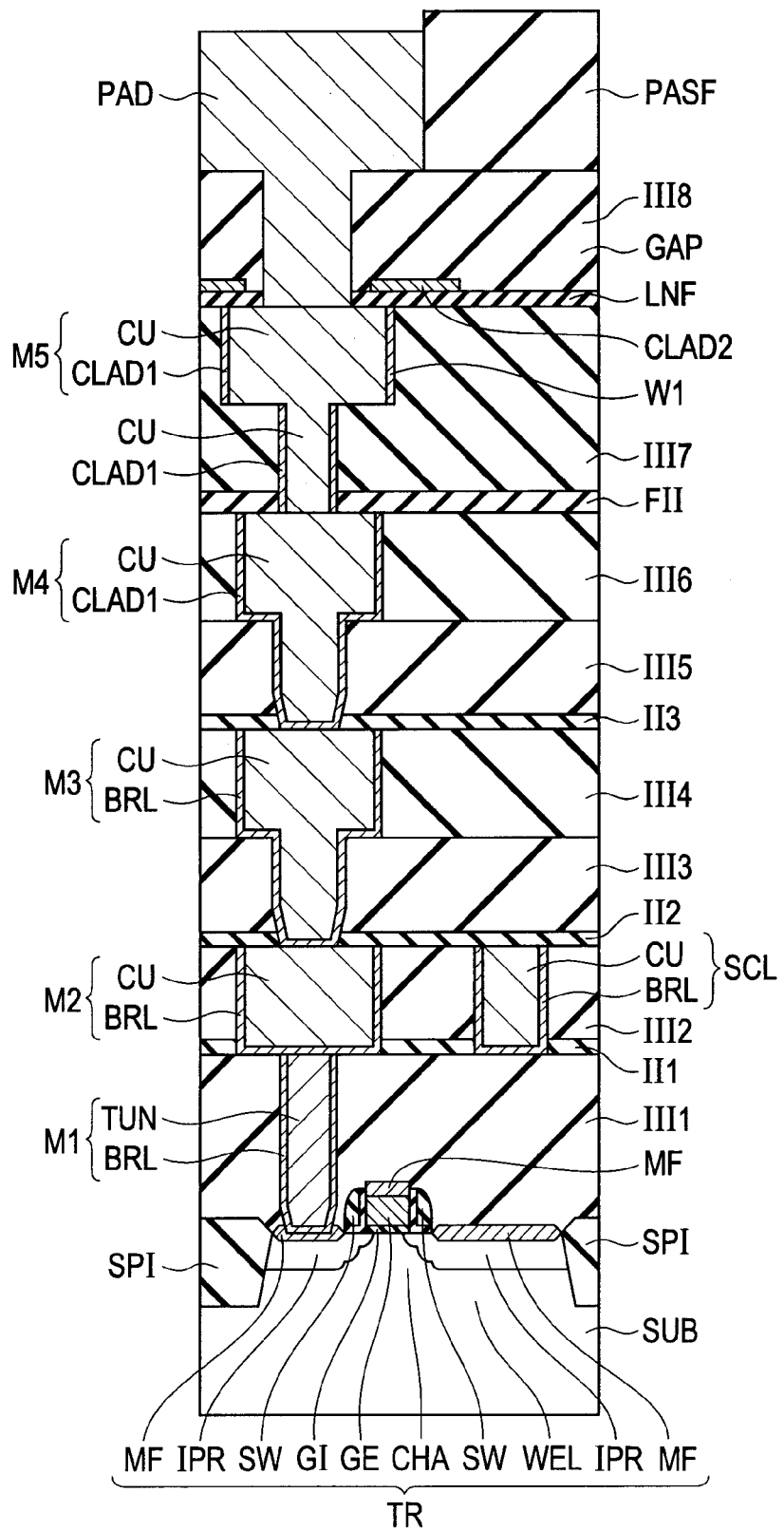
FIG. 97 is a schematic sectional view illustrating a mode of a magnetoresistive element arranged in the peripheral circuit portion, as viewed from the same direction as in FIG. 7, in the third embodiment of the invention.

FIG. 94 and FIG. 95 respectively illustrate MRAM comprising the semiconductor device in this embodiment as viewed from the same directions as in FIG. 5 and in FIG. 6. FIG. 97 illustrates the configuration of the peripheral circuit portion of the semiconductor device in this embodiment as viewed from the same direction as in FIG. 7. In FIG. 94 to FIG. 97, a gap GAP is depicted in an arbitrary position to schematically explain that a gap GAP in which the cladding layer CLAD2 is not arranged is formed.

FIG. 94 and FIG. 95 are different from FIG. 5 and FIG. 6 only in that the cladding layer CLAD2 is not arranged above a bit line BL. As mentioned above, however, the cladding layer CLAD2 may be arranged (both directly above a bit line BL and in the other areas) also in the memory cell portion as illustrated in FIG. 5 and FIG. 6. Alternatively, the cladding layer CLAD2 may be arranged only directly above a bit line BL as illustrated in FIG. 90 and FIG. 96.

FIG. 97 is different from FIG. 7 only in that an area where the cladding layer CLAD2 is not formed exists as a gap GAP also in the areas other than an area where the electrode pad PAD is formed. FIG. 97 illustrates the peripheral circuit portion of the semiconductor device having the memory cell portion (bit line BL) illustrated in FIG. 95 and FIG. 96.

The other respects in the configuration of this embodiment are substantially the same as those in the configuration of the first embodiment. In FIG. 93 to FIG. 100, therefore, the same elements as in the first embodiment will be marked with the same reference code and the description thereof will not be repeated.

Description will be given to a method of manufacturing the semiconductor device in this embodiment with reference to FIG. 98 to FIG. 100.

In the method of manufacturing the above-mentioned semiconductor device, the following processing is carried out after the step in the first embodiment illustrated in FIG. 53 to FIG. 55: for example, photolithography and etching are carried out so that the cladding layer CLAD2a is patterned as illustrated in FIG. 93 as viewed in a plane.

Then the same processing as at the step illustrated in FIG. 56 to FIG. 58 is carried out. Thus the mode illustrated in FIG. 98 and FIG. 99 (memory cell portion) and FIG. 100 (peripheral circuit portion) is obtained.

Figure 98:
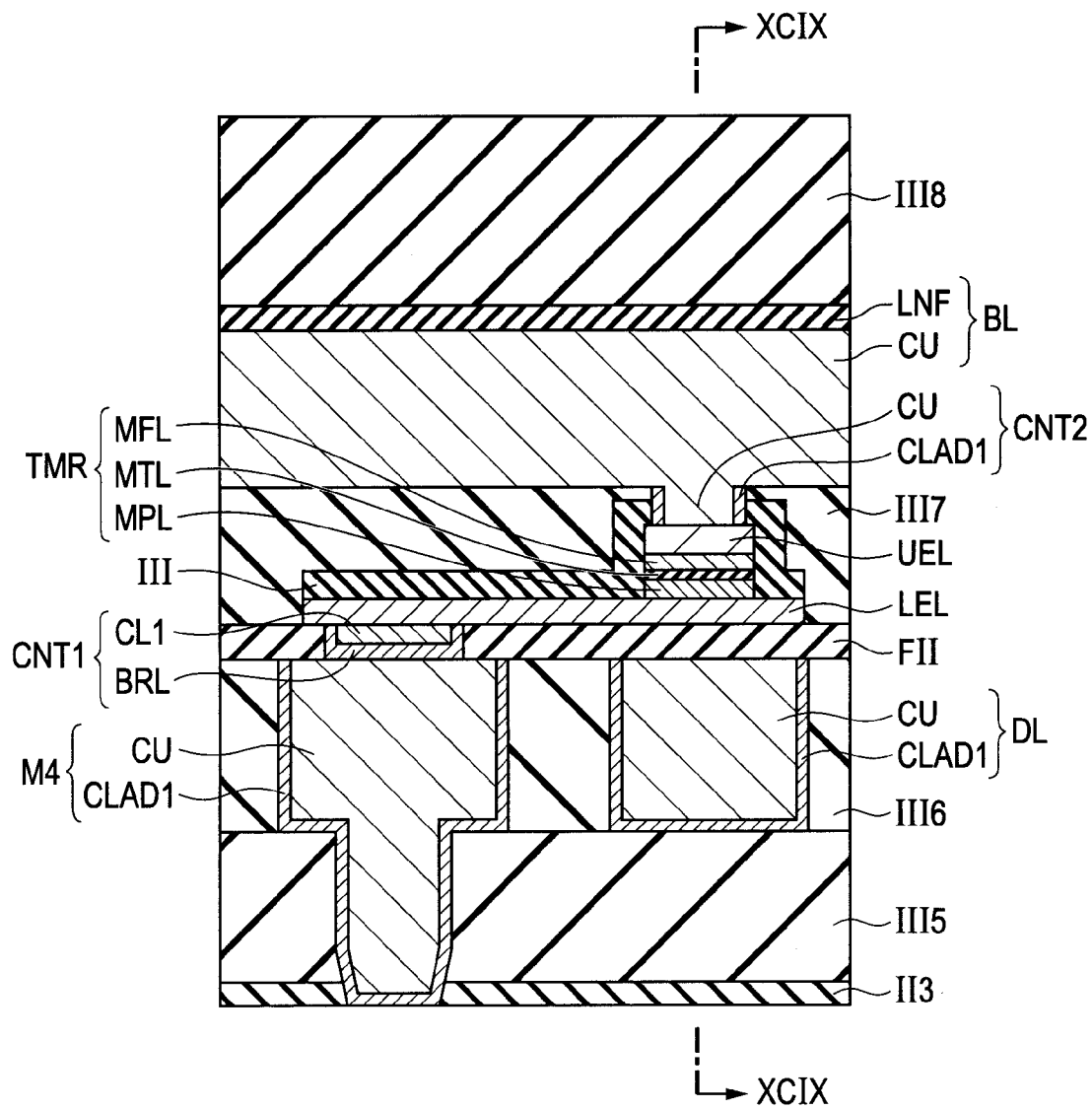
FIG. 98 is a schematic sectional view illustrating a manufacturing process step subsequent to the manufacturing process step illustrated in FIG. 53, as viewed from the same direction as in FIG. 5, in a method of manufacturing a semiconductor device in the third embodiment of the invention.
Figure 99:
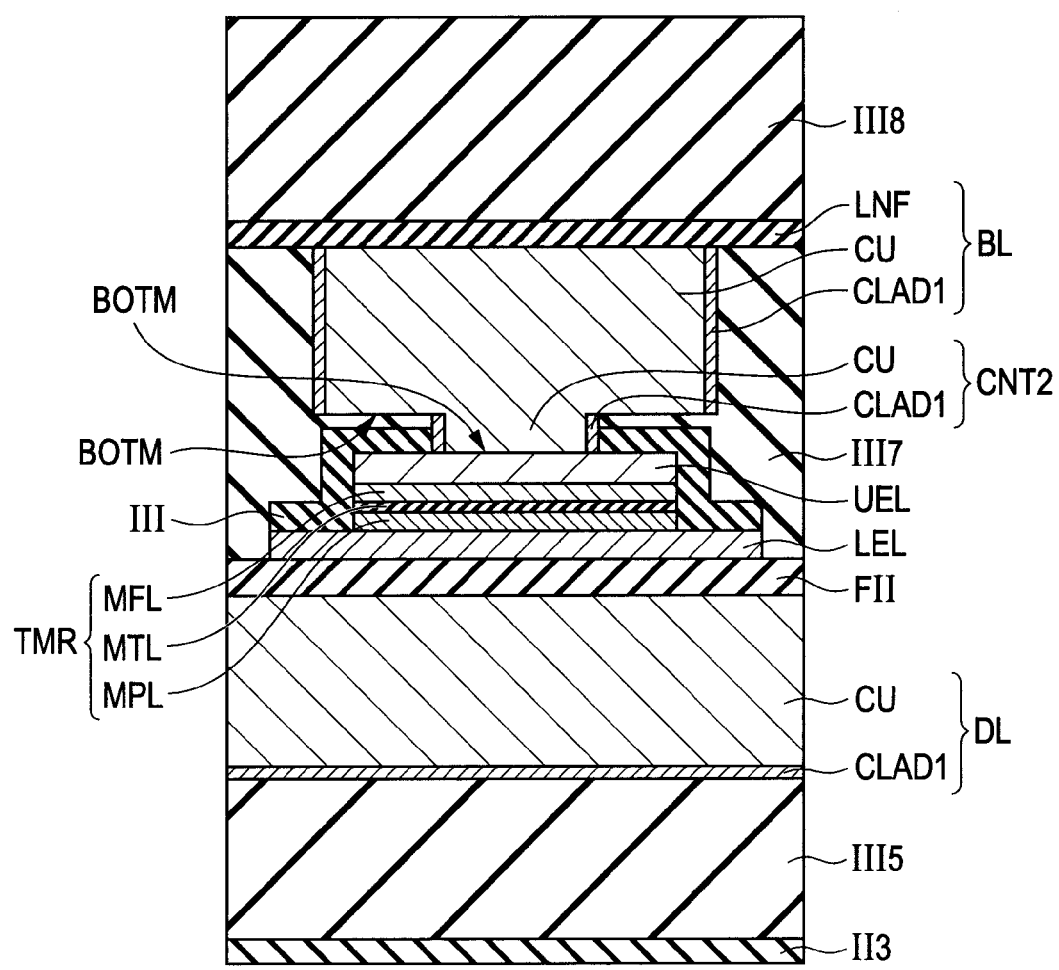
FIG. 99 is a schematic sectional view taken along line XCIX-XCIX of FIG. 98.

FIG. 98 and FIG. 99 are respectively identical with FIG. 56 and FIG. 57 except the cladding layer CLAD2 is not arranged over the liner film LNF. FIG. 100 is identical with FIG. 58 except the configuration of the cladding layer CLAD2 over the liner film LNF.

Figure 100:
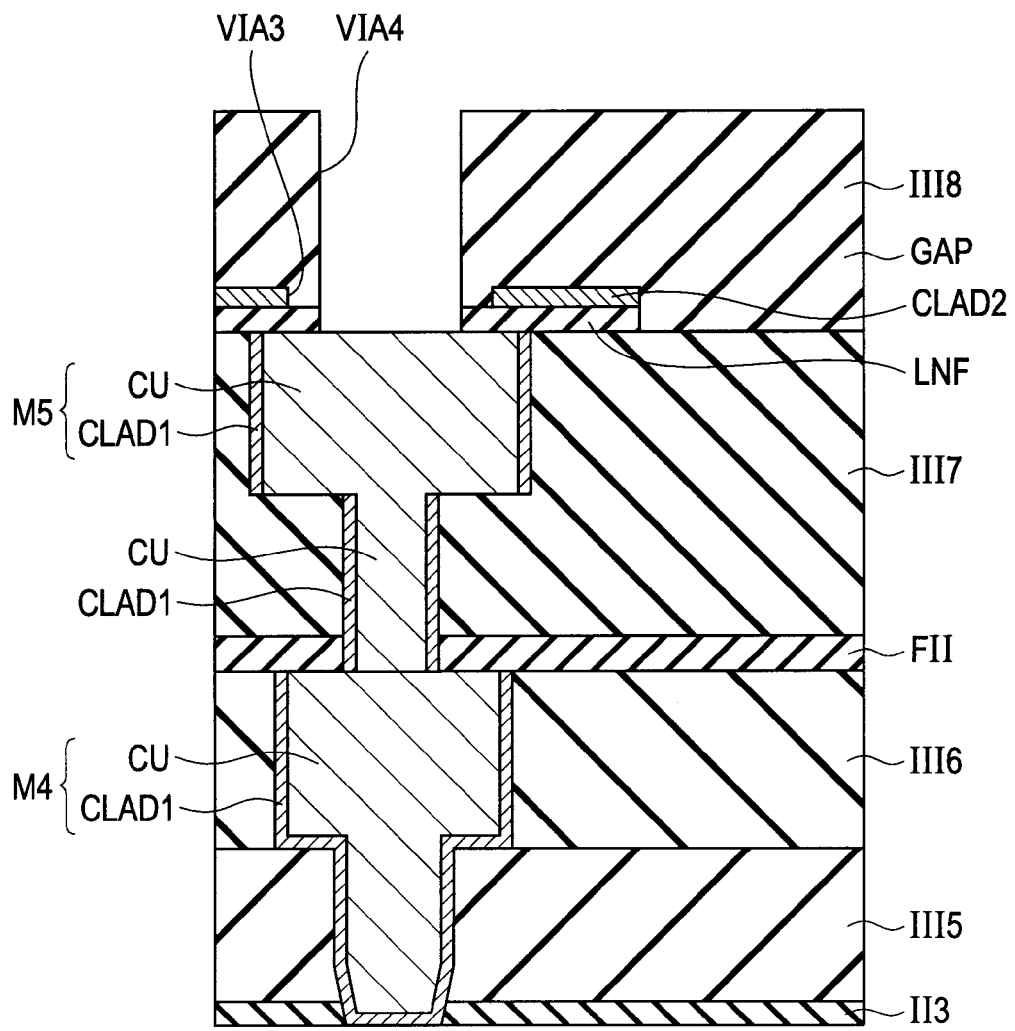
FIG. 100 is a schematic sectional view illustrating a mode of the peripheral circuit portion at the same manufacturing process step as in FIG. 98.

The manufacturing process steps subsequent to the manufacturing process step illustrated in FIG. 98 to FIG. 100 are the same as those in the first embodiment.

Description will be given to the operation and working effect of this embodiment. This embodiment brings the following effect in addition to the effect of the semiconductor device in the first embodiment:

In this embodiment, the cladding layer CLAD (cladding layer CLAD2) over the wiring M5 in the peripheral circuit portion is formed in the shape of strip of paper (L/S). This makes it possible to further enhance the magnetic shielding effect for the memory cell portion against external magnetic fields as in the second embodiment.

In this embodiment, the cladding layer CLAD2 is formed so that Ls/Ss are formed. For this reason, the following adhesion can be enhanced as compared with cases where it is formed in substantially the entire peripheral circuit portion like, for example, the cladding layer CLAD2 in the first embodiment: the adhesion of the cladding layer CLAD2 to the liner film LNF or the interlayer insulating film III8. The reason for this is the same as the dummy patterns DUMMY and the like in the first embodiment.

In this embodiment, the cladding layer CLAD2 forms Ls/Ss. This reduces the volume of the overall cladding layer CLAD2 as compared with cases where the cladding layer CLAD2 is so formed that it covers substantially the entire peripheral circuit portion as in the first embodiment, for example. This is because when the area occupied by gaps GAP is increased, the area where the cladding layer CLAD2 is arranged is accordingly reduced. However, as mentioned above, a volume sufficient to fulfill the functions of the cladding layer CLAD2 can be ensured by sufficiently increasing the thickness of, especially, the cladding layer CLAD2.

The third embodiment of the invention is different from the first embodiment of the invention only in the above-mentioned respects. That is, all the respects of the third embodiment of the invention that have not been described above, including configuration, condition, procedure, effect, and the like, are in accordance with those of the first embodiment of the invention. That is, the features of the third embodiment may be combined with the various types of semiconductor devices in the first embodiment.

Fourth Embodiment

This embodiment is different from the third embodiment in the configuration of the cladding layer covering the peripheral circuit portion. Hereafter, description will be given to the configuration of this embodiment.

Figure 101:
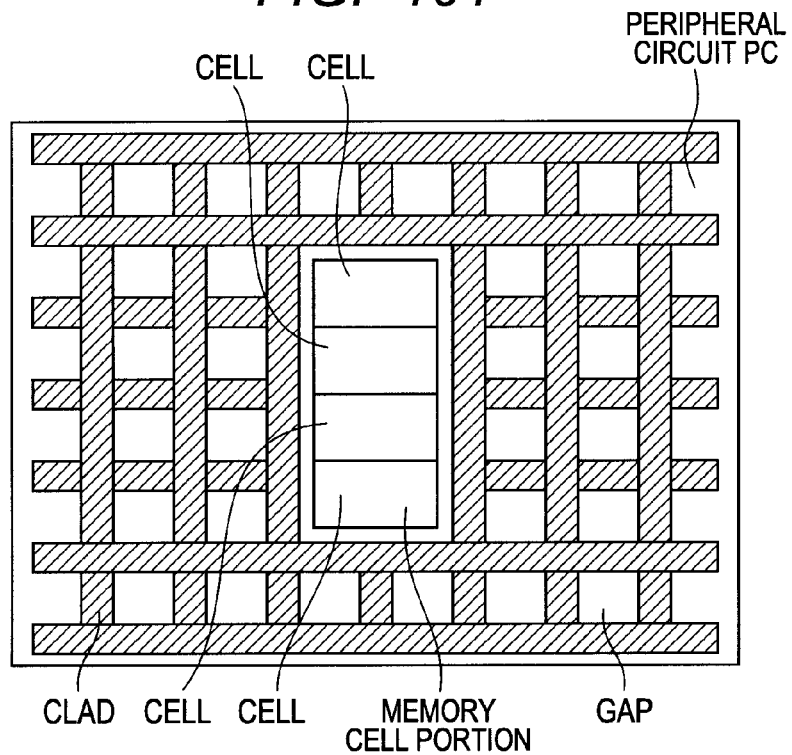
FIG. 101 is an enlarged schematic diagram illustrating the configuration of the same memory cell portion and peripheral circuit portion as in FIG. 2, as viewed in a plane, in a fourth embodiment of the invention.

In the semiconductor device in the fourth embodiment, the following measure is taken as illustrated in FIG. 101 with respect to the cladding layer CLAD (above the wiring M5) in the peripheral circuit portion: the following areas are repetitively arranged not only in the first direction in which the main surface of the semiconductor substrate is extended but also in a second direction orthogonal to the first direction: an area where the cladding layer CLAD is arranged and an area where the cladding layer CLAD is not arranged.

Specifically, the following measure is taken with respect to the cladding layer CLAD: an area where the cladding layer CLAD is arranged and an area where the cladding layer CLAD is not arranged are repetitively and alternately arranged in both the following directions: the left and right direction as one direction in FIG. 101 and the up and down direction orthogonal to the one direction. Therefore, the areas where the cladding layer CLAD is arranged form a mesh shape as viewed in a plane.

The areas where the cladding layer CLAD is not arranged are formed as gaps GAP, which are rectangular areas encircled with the cladding layer CLAD as viewed in a plane.

The semiconductor device may be so configured that the cladding layer CLAD forms Ls/Ss in substantially the entire peripheral circuit portion as illustrated in FIG. 101. Instead, the semiconductor device may be so configured that the cladding layer CLAD only in some areas in the peripheral circuit portion forms Ls/Ss.

A method of manufacturing the semiconductor device in this embodiment is identical with that in the third embodiment except the pattern of the cladding layer CLAD (cladding layer CLAD2) as viewed in a plane is different from that in the third embodiment. That is, also in this embodiment, the cladding layer CLAD2 may be arranged (both directly above a bit line BL and in the other areas) as in FIG. 5 and FIG. 6 in the memory cell portion. Alternatively, the cladding layer CLAD2 may be arranged only directly above a bit line BL as in FIG. 90 and FIG. 91. In this case, it is desirable that the following values should be equal to or larger than the minimum dimensions under the design rules: the width of each gap GAP in FIG. 101 and the shortest distance between the cladding layer CLAD in the memory cell portion and the cladding layer CLAD in the peripheral circuit portion.

The operation and working effect of this embodiment are also basically identical with those of the third embodiment. The fourth embodiment of the invention is different from the third embodiment of the invention only in the above-mentioned respects. That is, all the respects of the fourth embodiment of the invention that have not been described above, including configuration, condition, procedure, effect, and the like, are in accordance with the third embodiment of the invention. That is, the features of the fourth embodiment may be combined with the various types of semiconductor devices in the first embodiment.

Fifth Embodiment

This embodiment is different from the first embodiment in the number of cladding layers covering the memory cell portion and the peripheral circuit portion. Hereafter, description will be given to the configuration of this embodiment.

Figure 102:
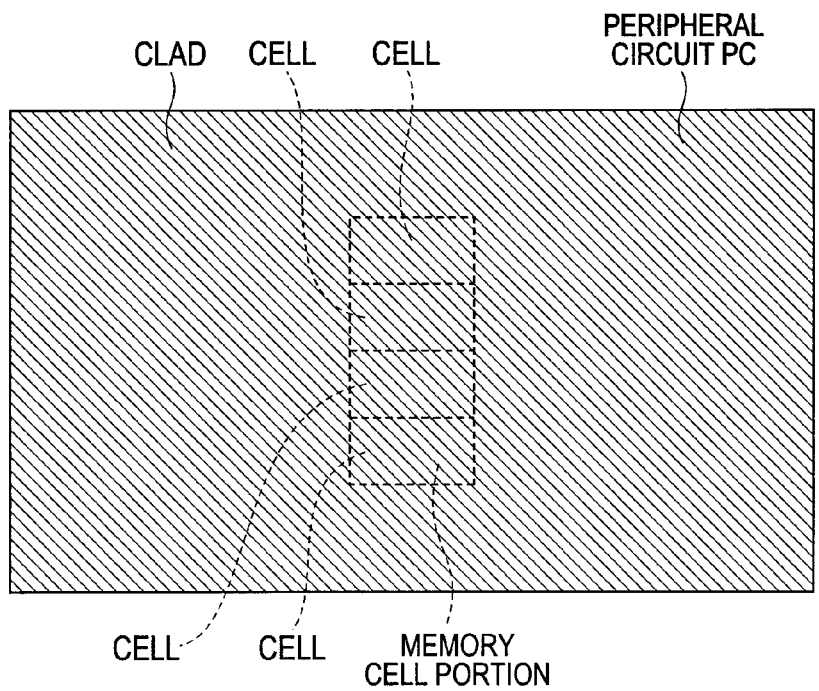
FIG. 102 is an enlarged schematic diagram illustrating the configuration of the same memory cell portion and peripheral circuit portion as in FIG. 2, as viewed in a plane, in a fifth embodiment of the invention.

In the semiconductor device in this embodiment, as illustrated in FIG. 102, the following film is arranged (laminated) in addition to the cladding layer CLAD (cladding layer CLAD2) as first high permeability film positioned above bit lines BL and wiring M5: a second high permeability film placed above the first high permeability film (on the opposite side to the semiconductor substrate SUB) at a distance from the first high permeability film.

FIG. 102 illustrates a mode in which the following are superposed on each other: the memory cell portion and part of the peripheral circuit portion in FIG. 1 (lower layer); and a cladding layer CLAD as the above-mentioned second high permeability film, arranged above wiring arranged in the memory cell portion or the peripheral circuit portion in FIG. 1 (upper layer).

Figure 103A:
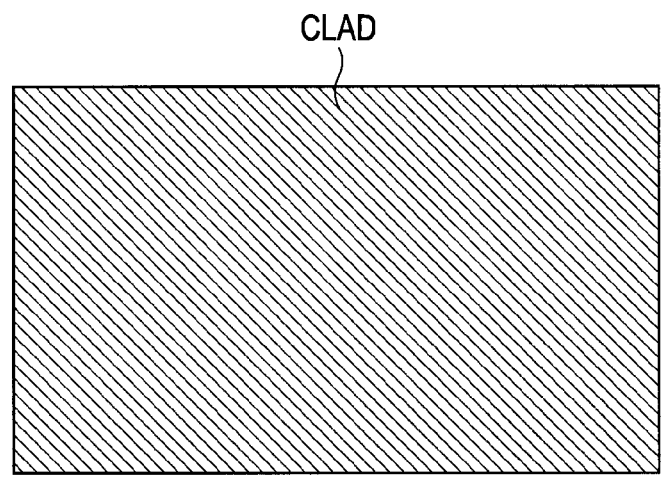
FIG. 103(A) is an enlarged schematic diagram illustrating a mode of the upper cladding layer, as viewed in a plane, covering the memory cell portion and the peripheral circuit portion from above in the fifth embodiment of the invention.
Figure 103B:
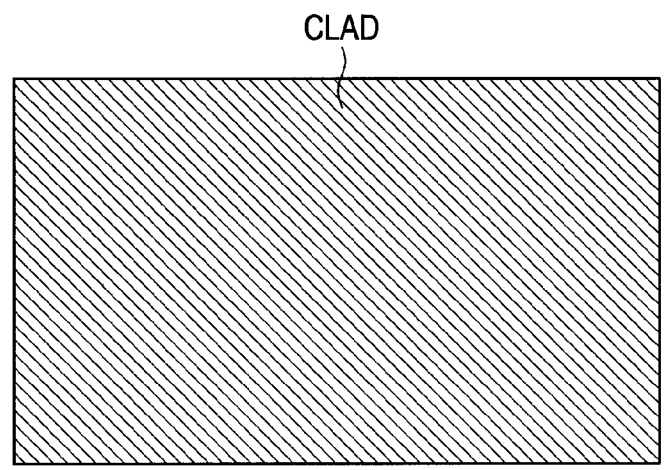
FIG. 103(B) is an enlarged schematic diagram illustrating a mode of the lower cladding layer, as viewed in a plane, covering the memory cell portion and the peripheral circuit portion from above in the fifth embodiment of the invention.
Figure 103C:
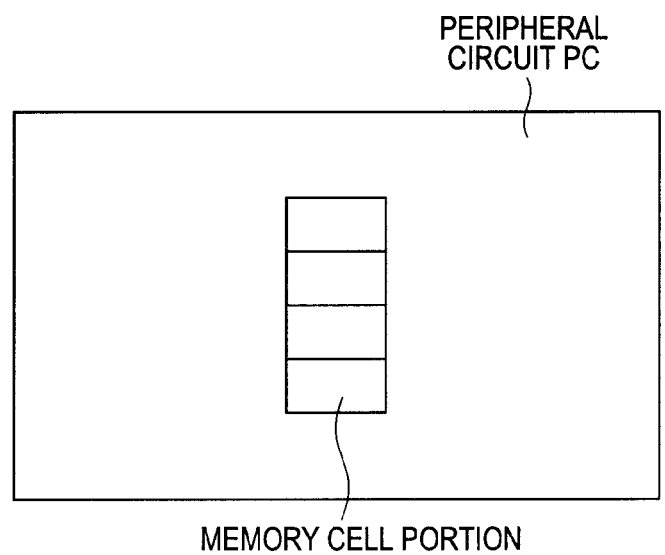
FIG. 103(C) is an enlarged schematic diagram illustrating a mode of the memory cell portion and the peripheral circuit portion, as viewed in a plane, covered with the cladding layers in FIGS. 103(A) and 103(B) from above in the fifth embodiment of the invention.

FIGS. 103(A) to 103(C) more clearly show FIG. 102 with the upper layer, middle layer (the layer of the first high permeability film), and lower layer separated from one another. FIG. 103(A) illustrates the upper layer (the upper one of the cladding layers CLAD covering the circuitry) and FIG. 103(B) illustrates the middle layer (the lower one of the cladding layers CLAD covering the circuitry). FIG. 103(C) illustrates the lower layer (memory cell portion and peripheral circuit portion) covered with the cladding layers in FIGS. 103(A) and 103(B).

In the fifth embodiment, as illustrated in FIG. 102 and FIG. 103(A), a cladding layer CLAD is arranged above the cladding layer CLAD above bit lines BL and wiring M5 so that it covers substantially the entire memory cell portion and peripheral circuit portion from above. That is, the cladding layer CLAD as second high permeability film (hereafter, referred to as "second cladding layer") is extended from the memory cell portion up to the peripheral circuit portion.

As illustrated in FIG. 103(B), the lower cladding layer CLAD is so arranged that it covers substantially the entire memory cell portion and peripheral circuit portion similarly to the cladding layer in the first embodiment. The lower cladding layer CLAD is a cladding layer CLAD (as first high permeability film) (hereafter, referred to as "first cladding layer") similar to the cladding layer CLAD arranged over the bit lines BL and wiring M5 in the first embodiment to the fourth embodiment.

Figure 104:
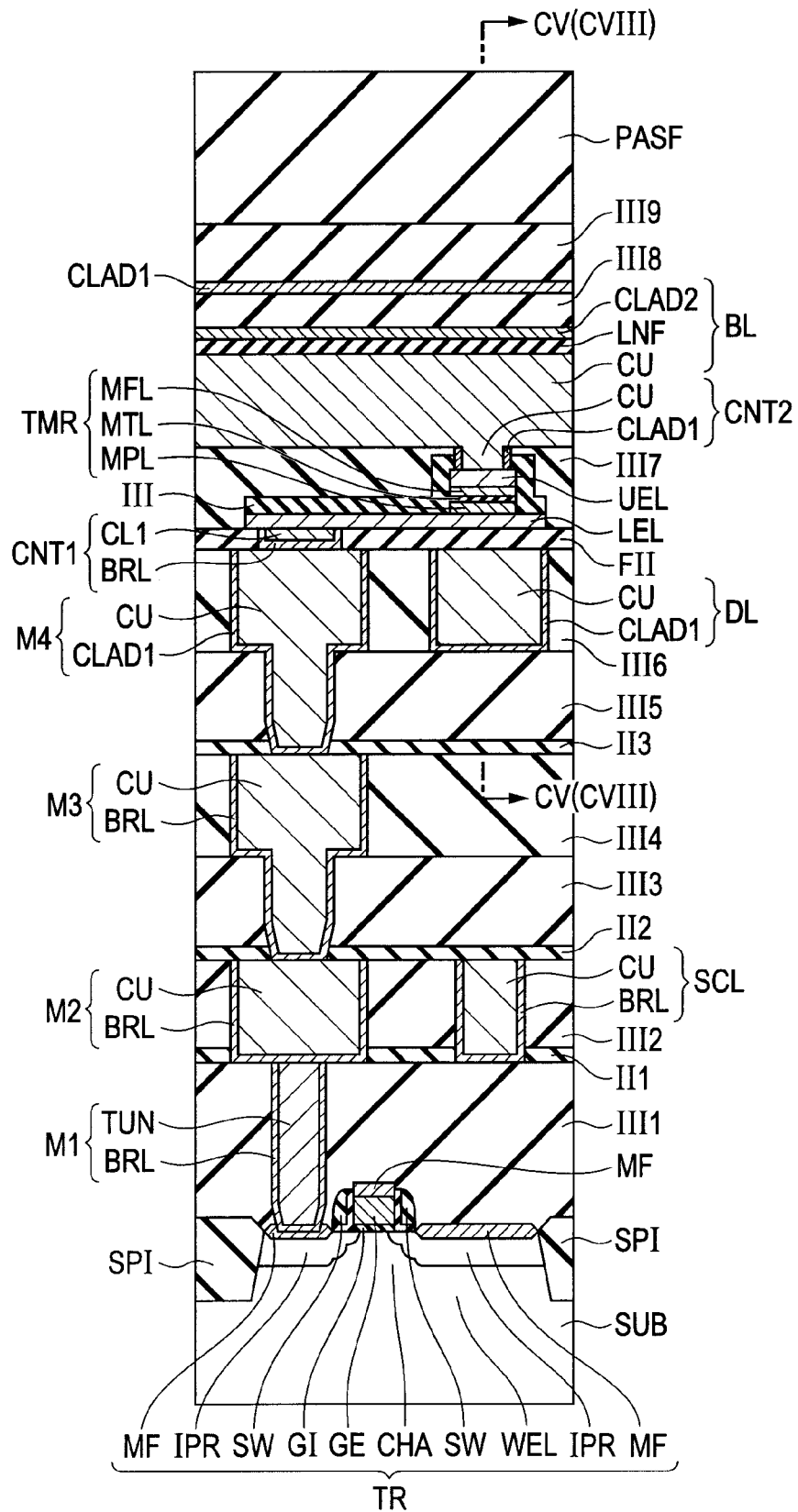
FIG. 104 is a schematic sectional view illustrating a mode of a magnetoresistive element arranged in the memory cell portion, as viewed from the same direction as in FIG. 5, in the fifth embodiment of the invention.
Figure 105:
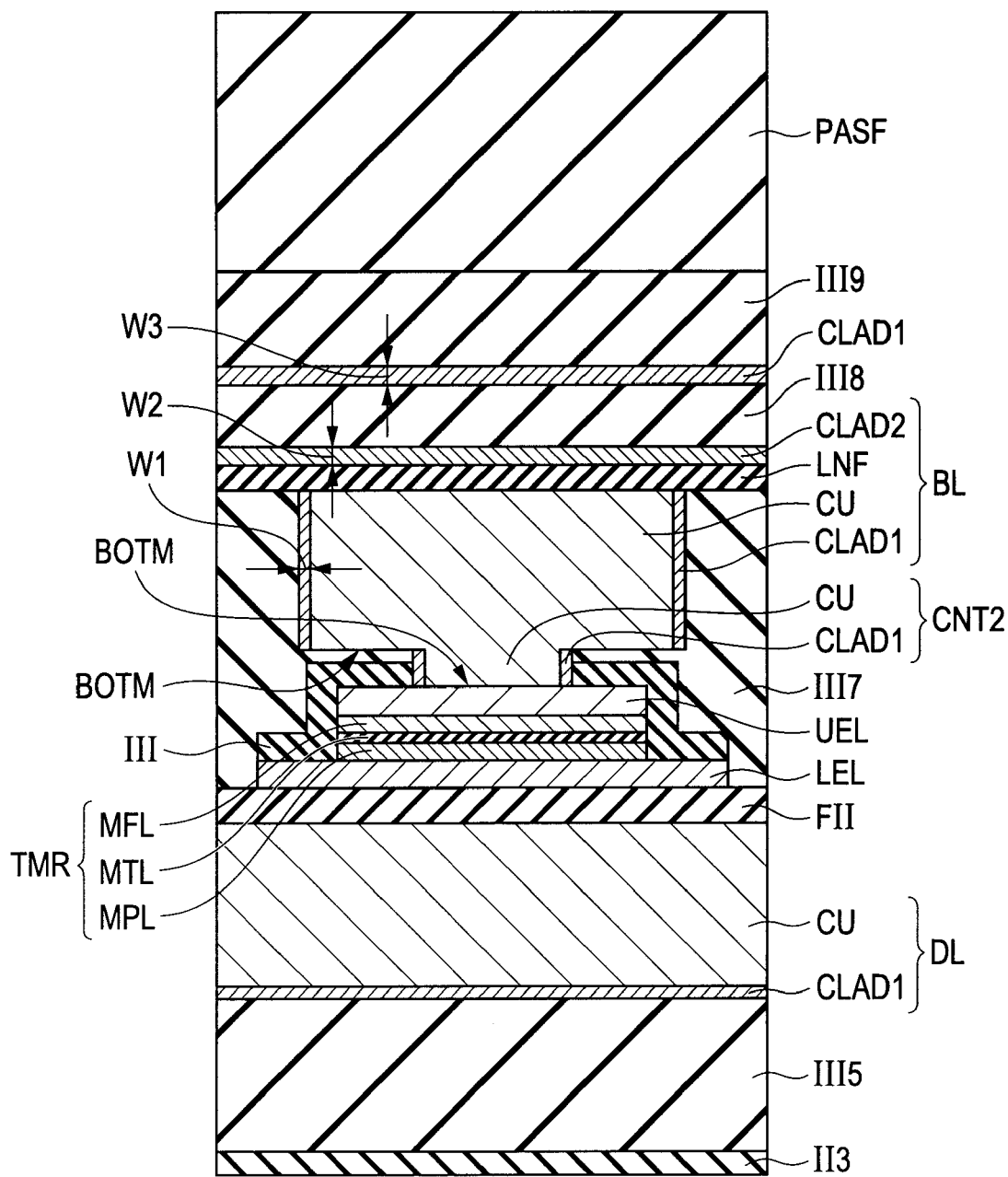
FIG. 105 is a schematic sectional view taken along line CV-CV of FIG. 104.
Figure 106:
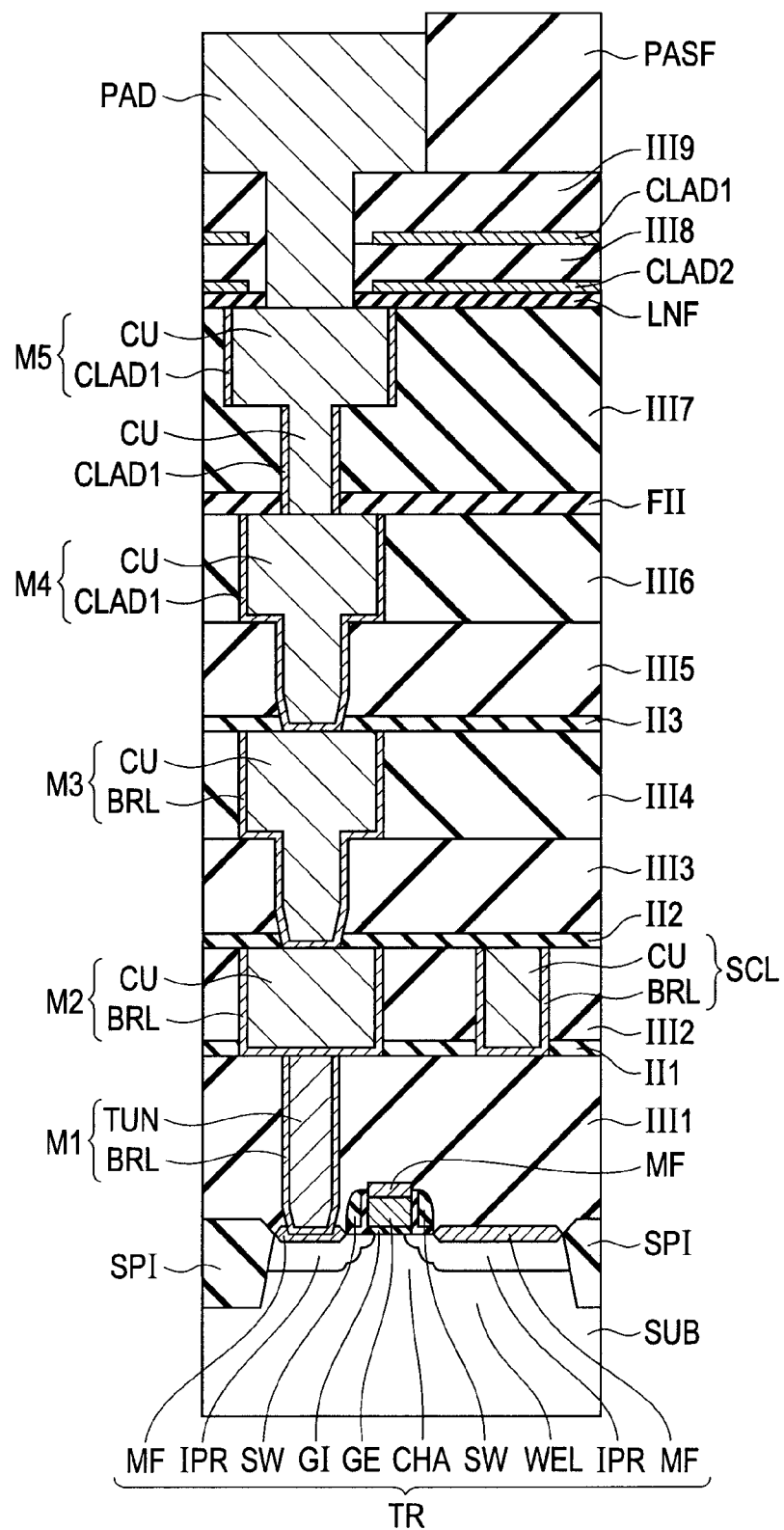
FIG. 106 is a schematic sectional view illustrating a mode of a magnetoresistive element arranged in the peripheral circuit portion, as viewed from the same direction as in FIG. 7, in the fifth embodiment of the invention.

FIG. 104 and FIG. 105 respectively illustrate the configuration of MRAM comprising the semiconductor device in this embodiment as viewed from the same direction as in FIG. 5 and in FIG. 6. FIG. 106 illustrates the configuration of the peripheral circuit portion of the semiconductor device in this embodiment as viewed from the same direction as in FIG. 7.

FIG. 104, FIG. 105, and FIG. 106 are respectively different from FIG. 5, FIG. 6, and FIG. 7 only in that: the cladding layer CLAD1 (second cladding layer) is arranged above the cladding layer CLAD2 (first cladding layer) above a bit line BL with the interlayer insulating film III8 in between; and an interlayer insulating film III9 is arranged over the cladding layer CLAD1.

The example in FIG. 104 to FIG. 106 uses the cladding layer CLAD1 (Refer to FIG. 8) as the second cladding layer. However, the second cladding layer is so configured that it is sandwiched between the interlayer insulating films III8, III9 comprised of a silicon dioxide film or the like in the direction of lamination (up and down direction). For this reason, there is a low possibility that the high permeability film MAG comprising the second cladding layer is interdiffused with the copper wiring body portion CU or the like. Therefore, a cladding layer CLAD2 (Refer to FIG. 9) having a two-layer structure or a single-layer high permeability film MAG may be used as the second cladding layer in place of the cladding layer CLAD1 having a three-layer structure.

As mentioned above, the cladding layer CLAD1 as the second cladding layer covers substantially the entire memory cell portion and peripheral circuit portion above the bit lines BL. In reality, however, the following measure is taken with respect to the second cladding layer as well as the first cladding layer: the cladding layer CLAD1 is discontinuous in an area where a wiring portion, such as an electrode pad PAD, is arranged. That is, areas not covered with the cladding layer CLAD1, though only a few, exist from place to place as required.

As illustrated in FIG. 105, it is desirable that the thickness W3 of the second cladding layer (especially, the high permeability film comprising the second cladding layer) should be larger than the thickness W1 in FIG. 105, similarly to the thickness W2 of the first cladding layer.

Description will be given to a modification to the semiconductor device in this embodiment. In this embodiment, as illustrated in FIGS. 107(A) to 107(C), the cladding layer in any of the second embodiment to the fourth embodiment may be used as the first cladding layer in place of the cladding layer in the first embodiment.

Figure 107A:
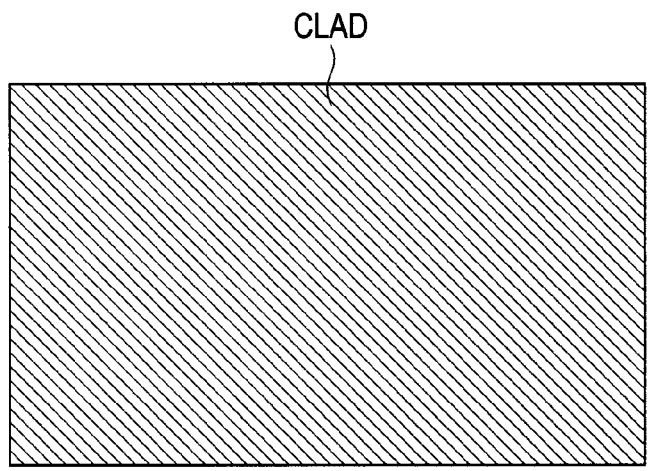
FIG. 107(A) is an enlarged schematic diagram illustrating a mode of the upper cladding layer, as viewed in a plane, covering the memory cell portion and the peripheral circuit portion from above, in a modification, different from that in FIGS. 103(A) to 103(C), to the fifth embodiment of the invention.
Figure 107B:
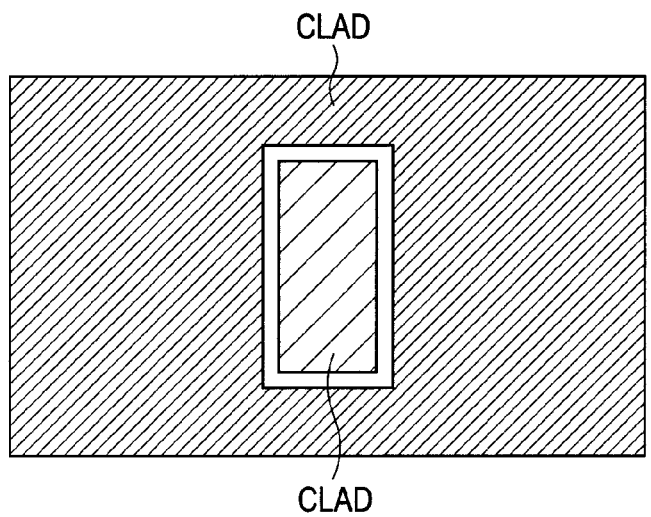
FIG. 107(B) is an enlarged schematic diagram illustrating a mode of the lower cladding layer, as viewed in a plane, covering the memory cell portion and the peripheral circuit portion from above in the modification, different from that in FIGS. 103(A) to 103(C), to the fifth embodiment of the invention.
Figure 107C:
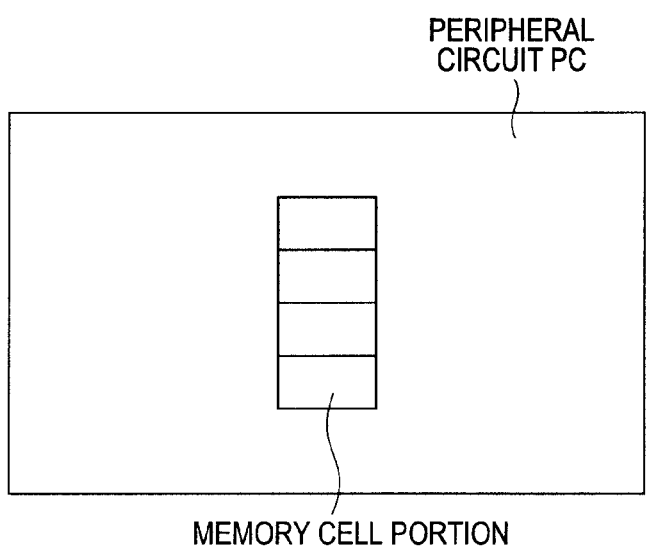
FIG. 107(C) is an enlarged schematic diagram illustrating a mode of the memory cell portion and the peripheral circuit portion, as viewed in a plane, covered with the cladding layers in FIGS. 107(A) and 107(B) from above in the modification, different from that in FIGS. 103(A) to 103(C), to the fifth embodiment of the invention.

As an example, FIG. 107(A) to FIG. 107(C) illustrate each layer as viewed in a plane, similarly to FIGS. 103(A) to 103(C), in the semiconductor device using the cladding layer CLAD in the second embodiment as the first cladding layer. Therefore, FIG. 107(A) is identical with FIG. 103(A); FIG. 107(B) is identical with FIG. 89(A); and FIG. 107(C) is identical with FIG. 103(C).

As another modification, the following mode is also acceptable though not shown in a drawing: a mode in which the first cladding layer is formed only in the memory cell portion and is not formed in the peripheral circuit portion. Also in this case, in this embodiment, the cladding layer CLAD as the second cladding layer is formed in the entire memory cell portion and peripheral circuit portion similarly to FIG. 103(A) and FIG. 107(A).

When the first cladding layer is formed only in the memory cell portion as in the other modification, the following measure may be taken: the cladding layer CLAD2 may be arranged (both directly above a bit line BL and in the other areas) as in FIG. 5 and FIG. 6 in the memory cell portion; or the cladding layer CLAD2 may be arranged only directly above a bit line BL as in FIG. 90 and FIG. 91.

Figure 108:
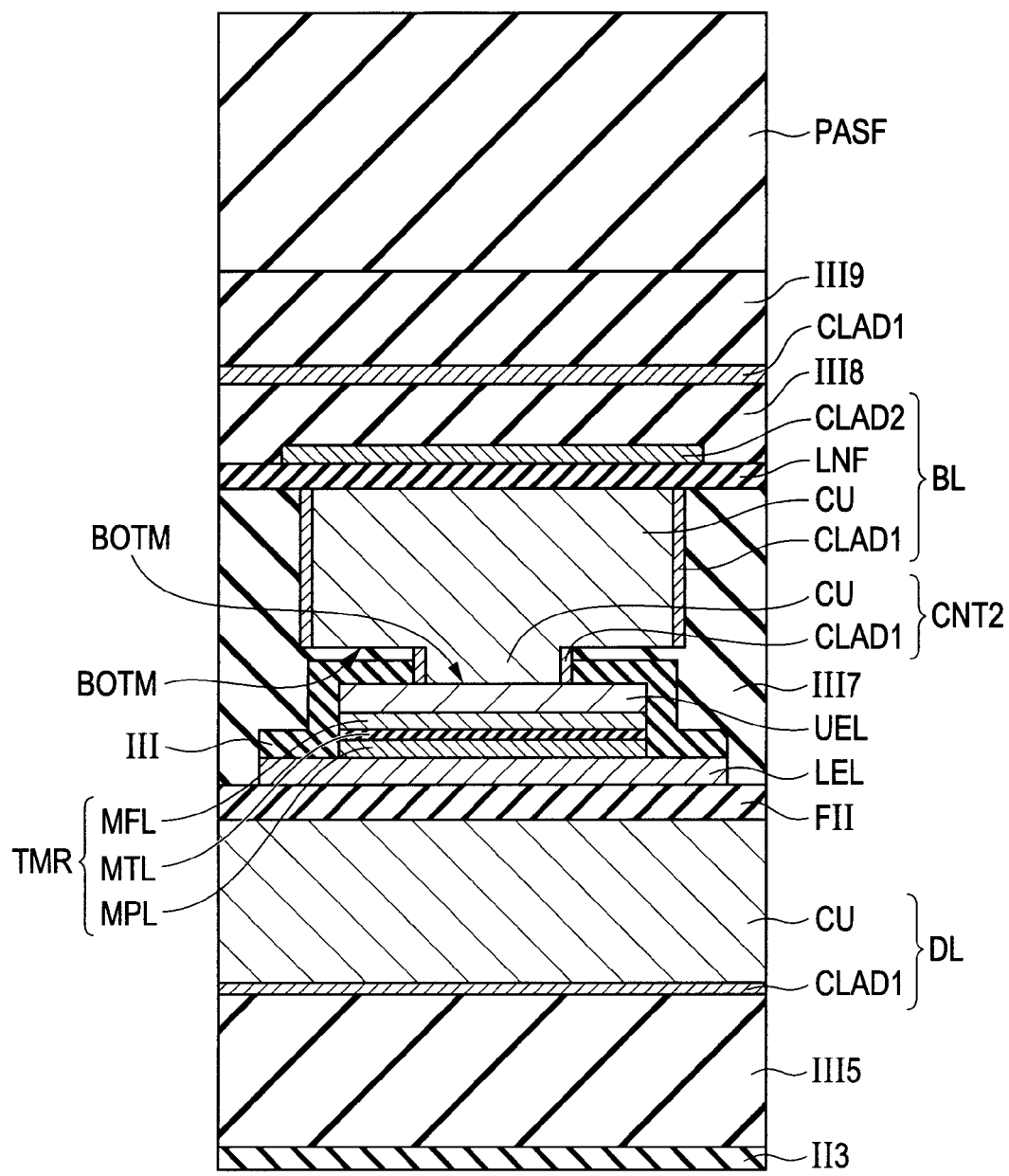
FIG. 108 is a schematic sectional view illustrating a mode of a magnetoresistive element arranged in the memory cell portion in FIGS. 107(A) to 170(C) as viewed from the same direction as in FIG. 6.

FIG. 108 is a schematic sectional view illustrating the semiconductor device in the modification in FIG. 107 as viewed from the same direction as in FIG. 6. As illustrated in FIG. 108, the cladding layer CLAD1 as the second cladding layer in this case has the same mode as the cladding layer CLAD2 directly above a bit line BL in the second embodiment illustrated in FIG. 90.

The semiconductor device in the modification in FIG. 107 and FIG. 108 are identical with FIG. 5 and FIG. 7 in the configuration of the device as viewed from the same direction as in FIG. 5 and the peripheral circuit portion in FIG. 7; therefore, the description thereof is omitted.

The other respects in the configuration of this embodiment are substantially the same as those of the first embodiment except the foregoing. In FIG. 102 to FIG. 114, therefore, the same elements as in the first embodiment will be marked with the same reference codes and description thereof will not be repeated.

Description will be given to a method of manufacturing the semiconductor device in this embodiment. Here, a method of manufacturing the following semiconductor device will be described as an example with reference to FIG. 109 to FIG. 114: a semiconductor device in which the first cladding layer is the cladding layer CLAD2 described in relation to the second embodiment as illustrated in FIG. 107(A) to FIG. 108.

Figure 109:
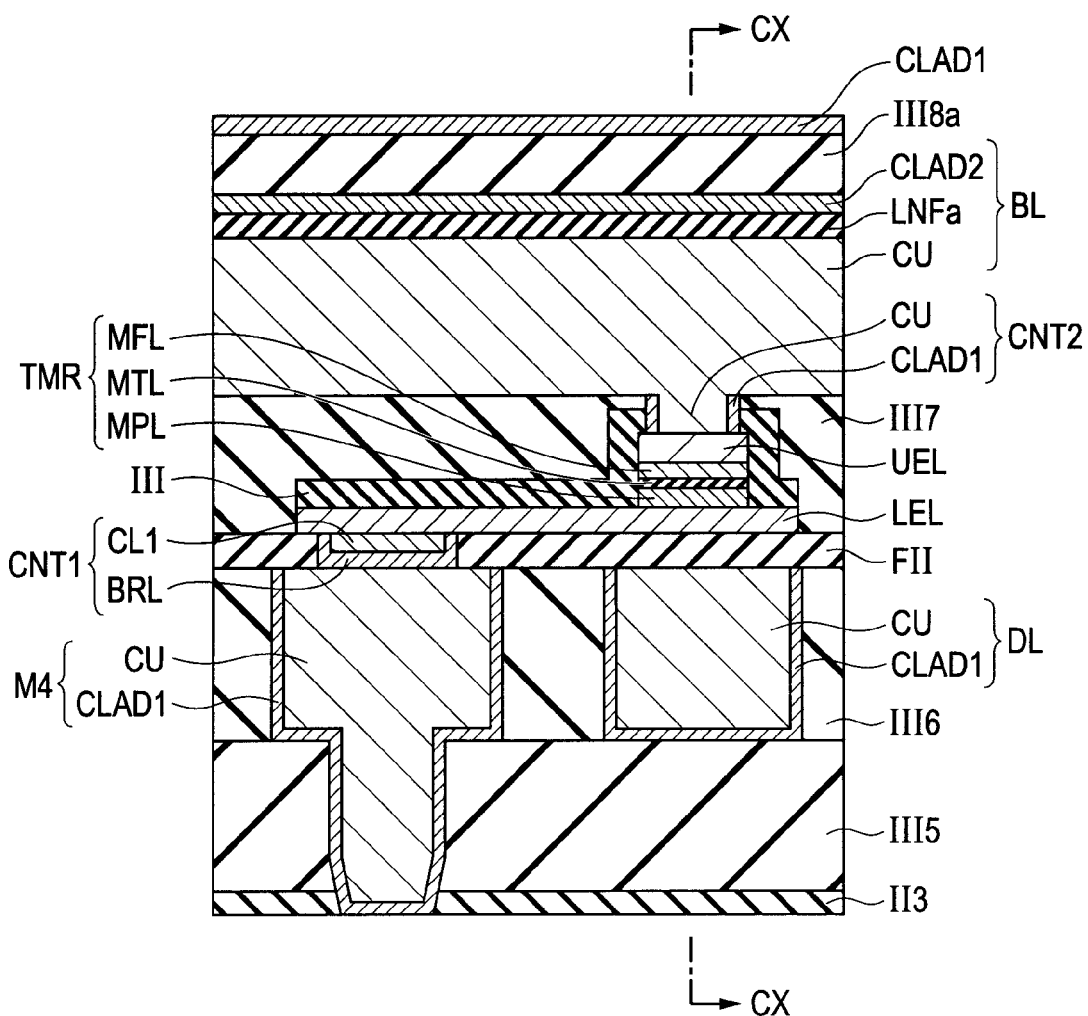
FIG. 109 is a schematic sectional view illustrating a manufacturing process step subsequent to the manufacturing process step illustrated in FIG. 53, as viewed from the same direction as in FIG. 5, in a method of manufacturing a semiconductor device in the fifth embodiment of the invention.
Figure 110:
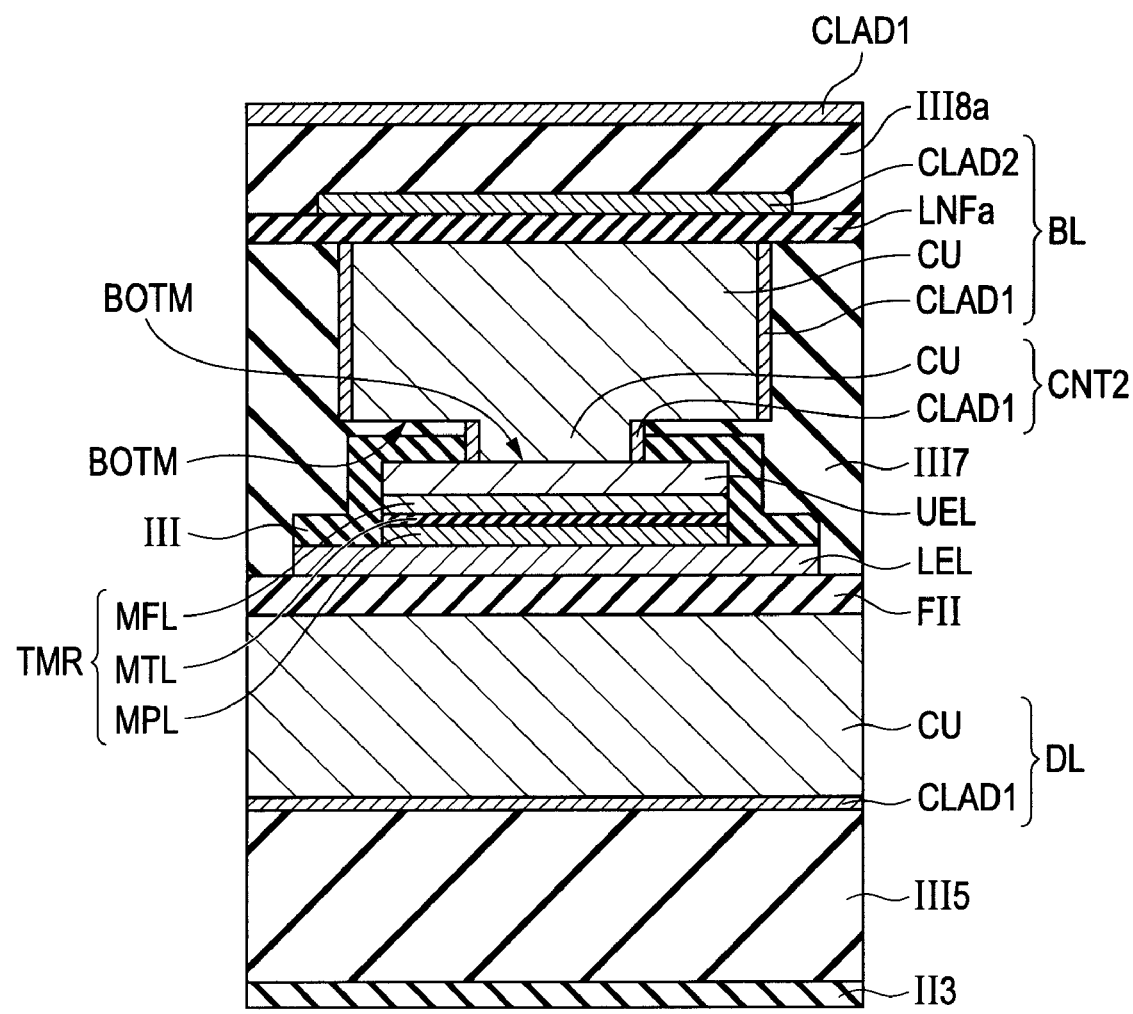
FIG. 110 is a schematic sectional view taken along line CX-CX of FIG. 109.
Figure 111:
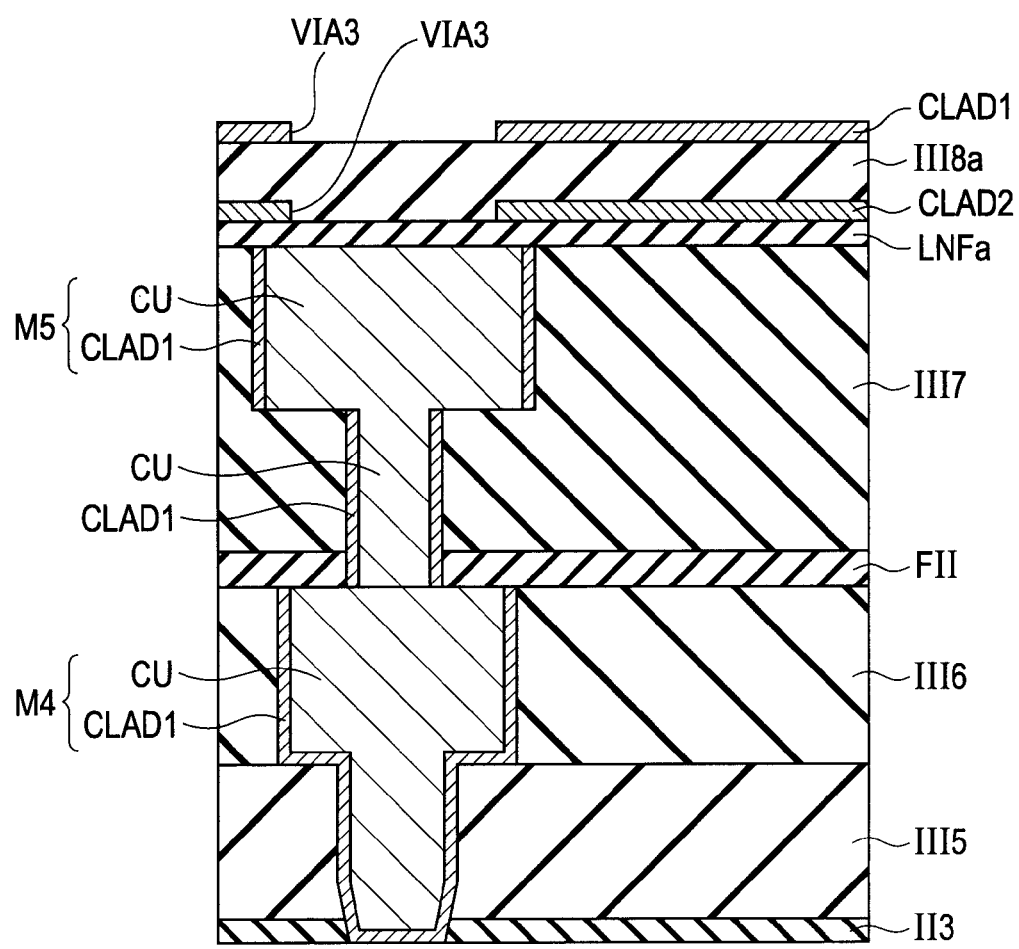
FIG. 111 is a schematic sectional view illustrating a mode of the peripheral circuit portion at the same manufacturing process step as in FIG. 109.

After the step in the first embodiment illustrated in FIG. 53 to FIG. 55 is carried out, the following processing is carried out as illustrated in FIG. 109 and FIG. 110 (memory cell portion) and FIG. 111 (peripheral circuit portion): a cladding layer is formed over the liner film LNFa. The via hole VIA3 illustrated in FIG. 111 is formed there to obtain the cladding layer CLAD2 (first cladding layer).

Subsequently, an interlayer insulating film III8a and a cladding layer are formed over the cladding layer CLAD2 in this order. The via hole VIA3 similar to that in the first cladding layer is formed in this cladding layer to obtain the cladding layer CLAD1 (second cladding layer).

Figure 112:
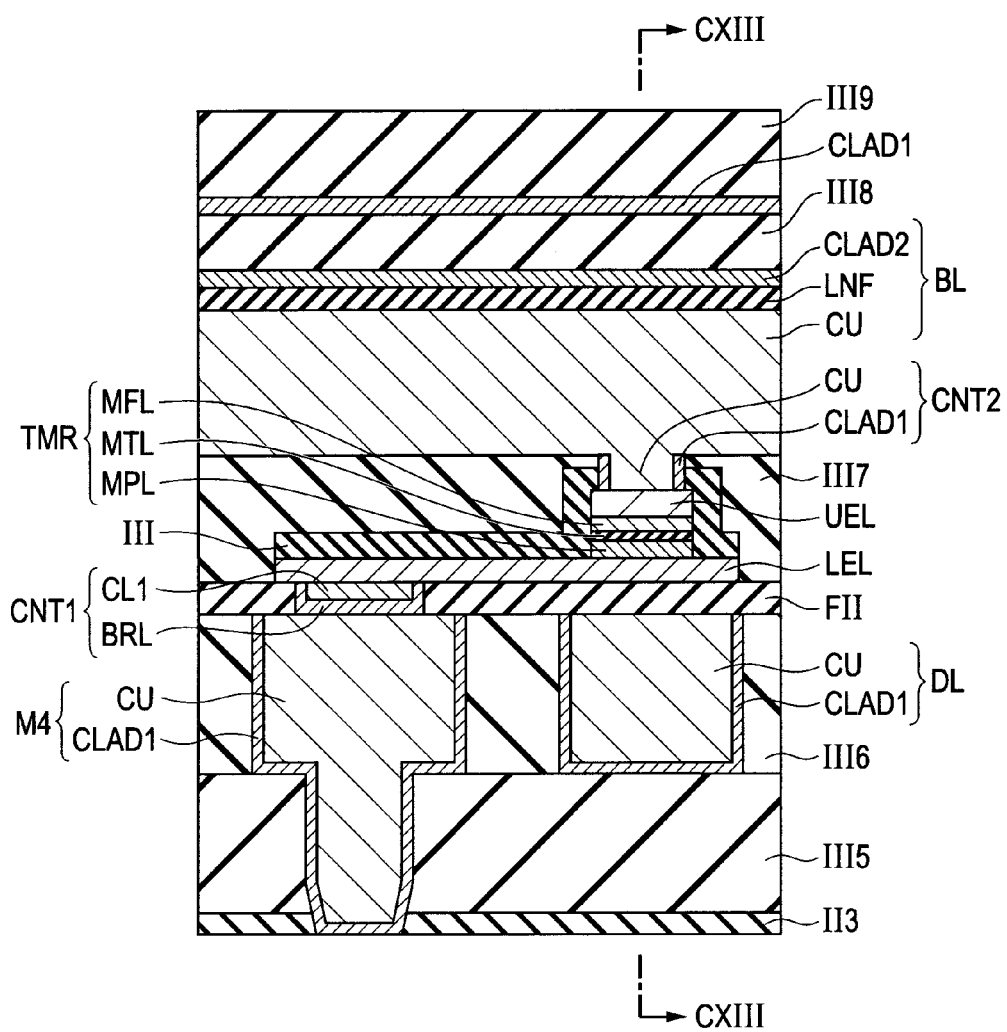
FIG. 112 is a schematic sectional view illustrating a manufacturing process step subsequent to the manufacturing process step illustrated in FIG. 109.
Figure 113:
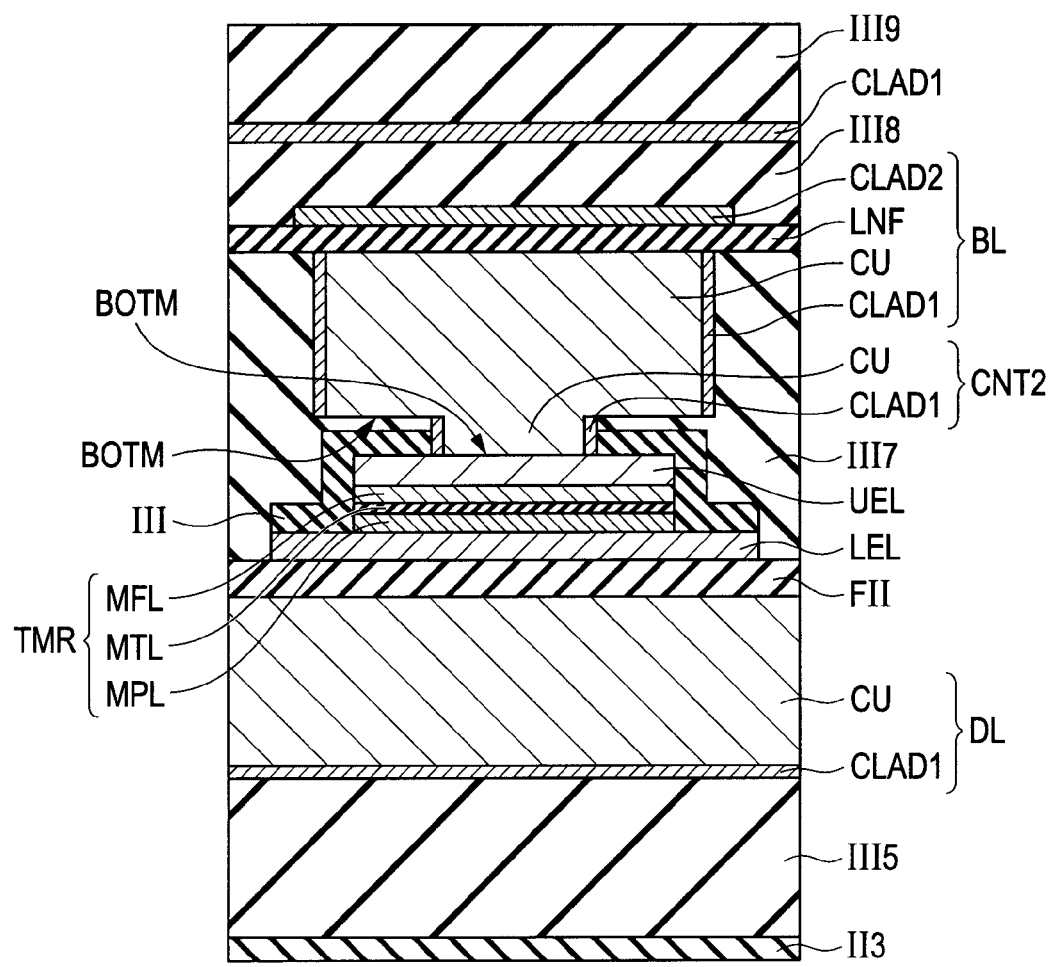
FIG. 113 is a schematic sectional view taken along line CXIII-CXIII of FIG. 112.
Figure 114:
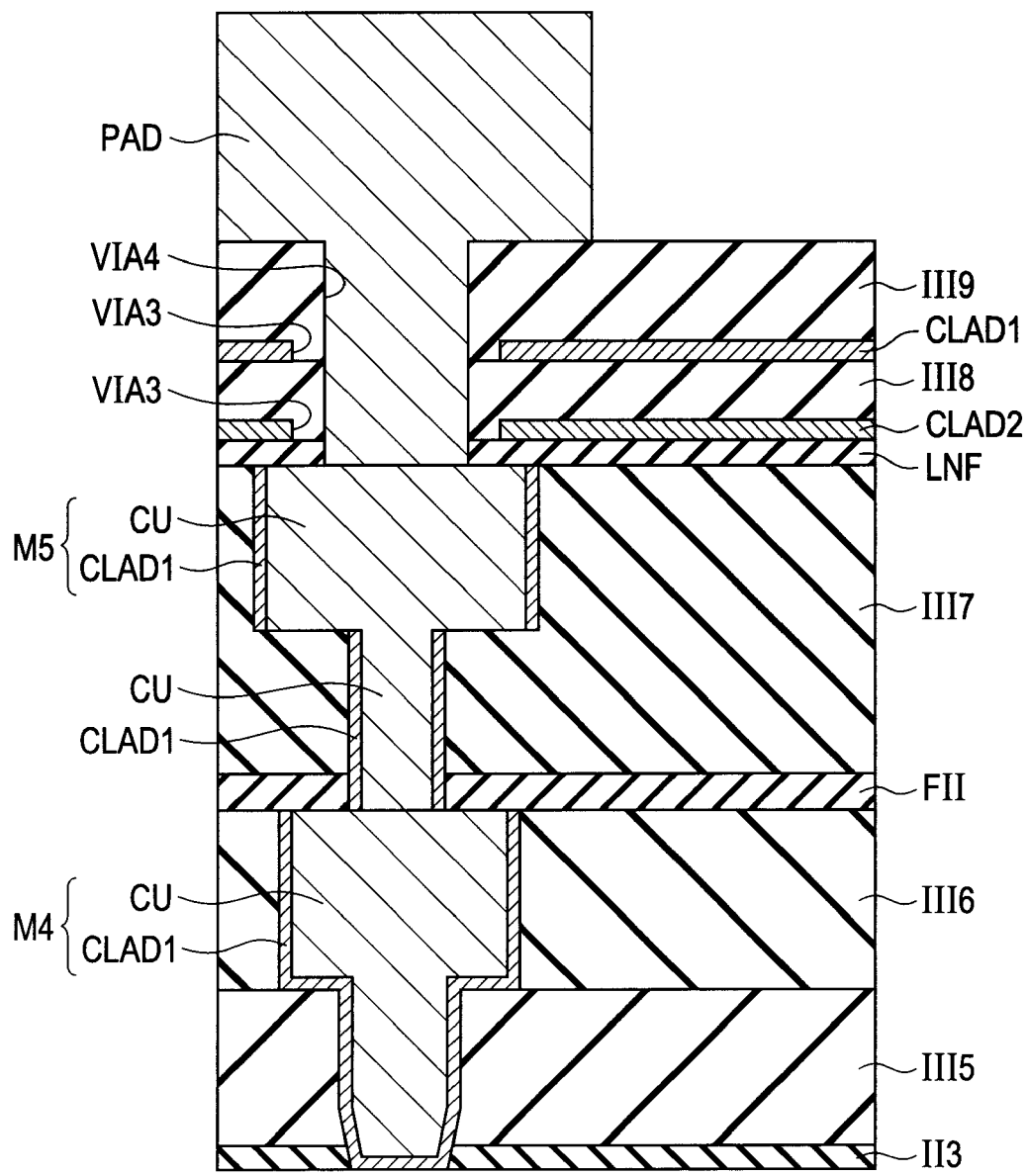

Subsequently, as illustrated in FIG. 112 and FIG. 113 (memory cell portion) and FIG. 114 (peripheral circuit portion), the interlayer insulating film III9 is formed over the cladding layer CLAD1 in FIG. 109 to FIG. 111. Thereafter, part of the interlayer insulating film III9, interlayer insulating film III8, and liner film LNFa overlapping with the wiring M5 as viewed in a plane to form the VIA4 to expose the wiring M5 similarly to FIG. 58.

Thereafter, an electrode pad PAD is formed so as to fill the via hole VIA4. At this time, the electrode pad PAD may be formed by taking the following procedure after the interior of the via hole VIA4 is filled with tungsten or the like as illustrated in FIG. 114: tungsten or the like is patterned in an area where the electrode pad PAD is to be formed in the layer on the upper side of the interlayer insulating film III9.

Alternatively, the electrode pad PAD may be formed by taking the following procedure: a passivation film PASF is formed over the interlayer insulating film III9; then part of the passivation film PASF (in an area where the electrode pad PAD is to be formed) is removed; and the area with the passivation film PASF removed is filled with a metal film of tungsten or the like.

The semiconductor device in this embodiment illustrated in FIG. 104, FIG. 106, FIGS. 107(A) to 107(C), and FIG. 108 is formed by the above-mentioned procedure.

Description will be given to the operation and working effect of this embodiment. When the cladding layer above the bit lines BL and the wiring M5 is provided with a two-layer structure as in this embodiment, the following effect is brought in addition to the effect of the semiconductor device in the first embodiment:

The two cladding layer are formed. Therefore, for example, the following external magnetic field is blocked off by the two layers, the second cladding layer and the first cladding layer: an external magnetic field that enters a magnetoresistive element TMR in the memory cell portion along the up and down direction (from above the second cladding layer) in FIG. 104 to FIG. 106. This enhances the magnetic shielding effect against magnetic fields entering from the up and down direction in FIG. 104 to FIG. 106 as compared with cases where a single cladding layer is provided.

External magnetic fields entering along the left and right direction in FIG. 104 to FIG. 106 can be passed through both the first cladding layer and the second cladding layer above the bit lines BL in the memory cell portion. For this reason, the volume of the cladding layer equivalent to that obtained by adding those of the first cladding layer and the second cladding layer is increased and thus the magnetic shielding effect against external magnetic fields can be enhanced. Therefore, the influence of external magnetic fields can be more reliably reduced.

From a different viewpoint, the second cladding layer in this embodiment is arranged in a position farther from the magnetoresistive elements TMR than the first cladding layer is. For this reason, the above-mentioned external magnetic fields can be induced to a place farther away from the magnetoresistive elements TMR. Therefore, the influence of external magnetic fields can be more reliably reduced by providing the second cladding layer.

The effect obtained when the thickness W3 and the thickness W2 in FIG. 105 are made larger than the thickness W1 is basically identical with the effect obtained when the thickness W2 is made larger than the thickness W1 in the first embodiment. However, since two cladding layers are provided and the overall volume of the cladding layers is increased, more magnetic flux can be accordingly passed through the cladding layers. This increases the saturation magnetic flux density of the cladding layers and thus the leakage of magnetic flux to outside the cladding layers is suppressed.

It is desirable that a marking area obtained by removing part of the cladding layers as viewed in a plane should be arranged in the above-mentioned first cladding layer or second cladding layer.

The marking area refers to an area where a mark is formed for carrying out alignment to arranged a mask in a desired position when photolithography is carried out. It is desirable that this marking area should be formed in the first cladding layer formed directly above the wiring M5 in, for example, the peripheral circuit portion. However, a marking area may be formed in the following cladding layer: any cladding layer, such as the second cladding layer, along the main surface of the semiconductor substrate SUB arranged above the bit lines BL (on the opposite side to the semiconductor substrate SUB as viewed from a bit line BL).

It is desirable that each mark formed in the first cladding layer is an area obtained by partly removing the first cladding layer, having an arbitrary shape, such as rectangle or crisscross, as viewed in a plane.

Figure 115:
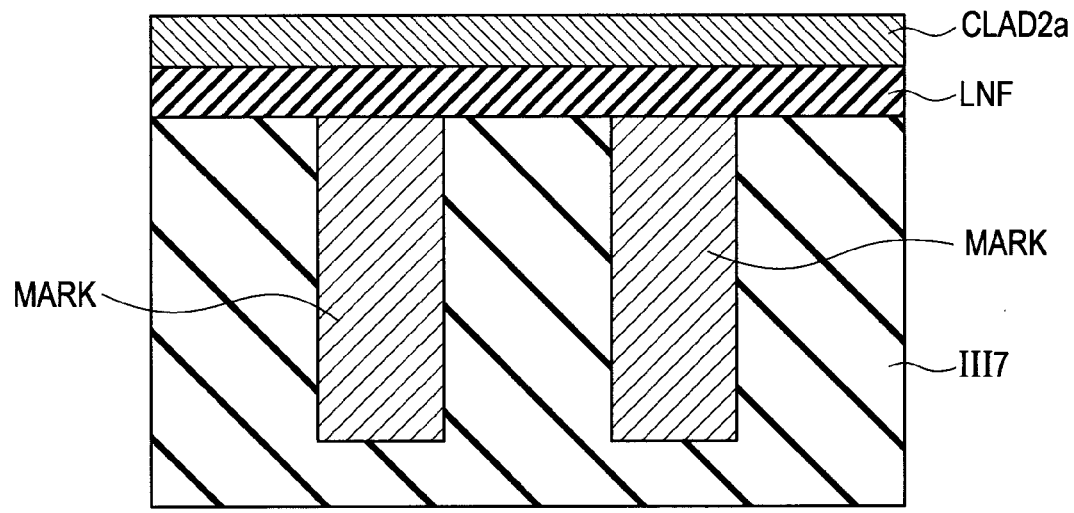

As illustrated in FIG. 115, for example, it will be assumed that a mark MARK formed of copper material or the like similarly to the copper wiring body portion CU is formed in part of the interlayer insulating film III7 in the peripheral circuit portion. The mark MARK is a pattern comprised of a copper thin film, formed as the same layer as the copper wiring body portion CU of each bit line BL.

The liner film LNF and cladding layer CLAD2 (CLAD2a) illustrated in FIG. 106, for example, are formed over the interlayer insulating film III7 including this mark MARK.

When the cladding layer CLAD2a is patterned, the above-mentioned mark MARK is used for exposure alignment in photoengraving techniques. However, since the opaque cladding layer CLAD2a is formed over the mark MARK, a problem of the viewability of the mark MARK arises.

Figure 116:
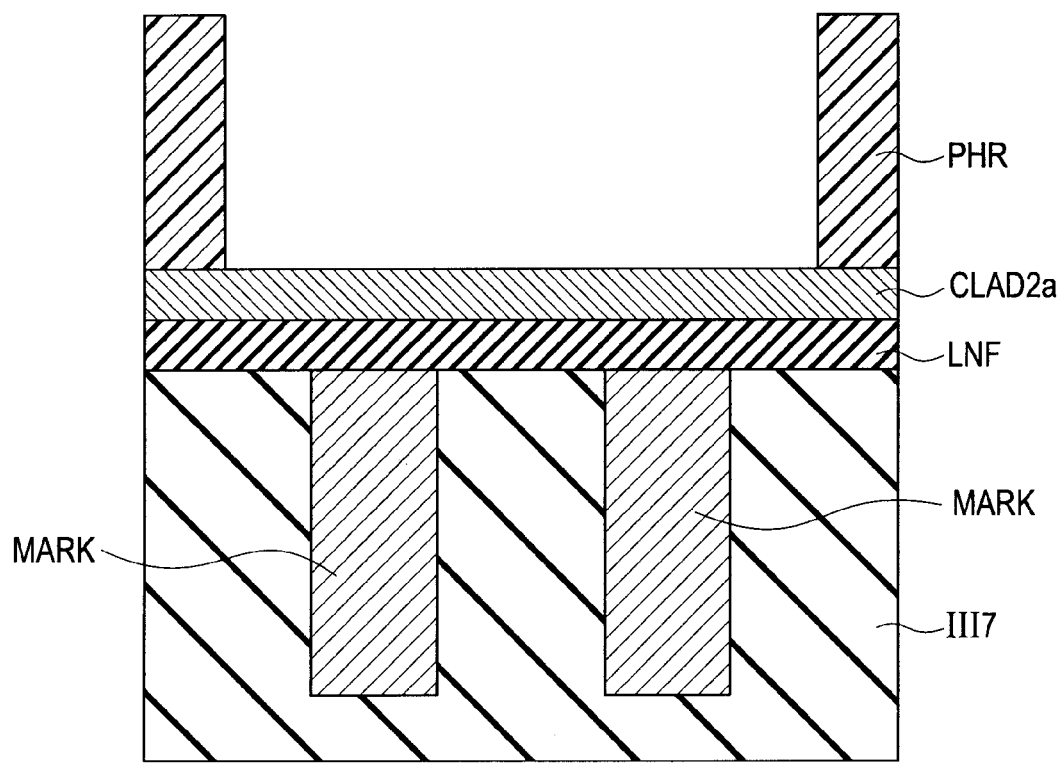
Figure 117:
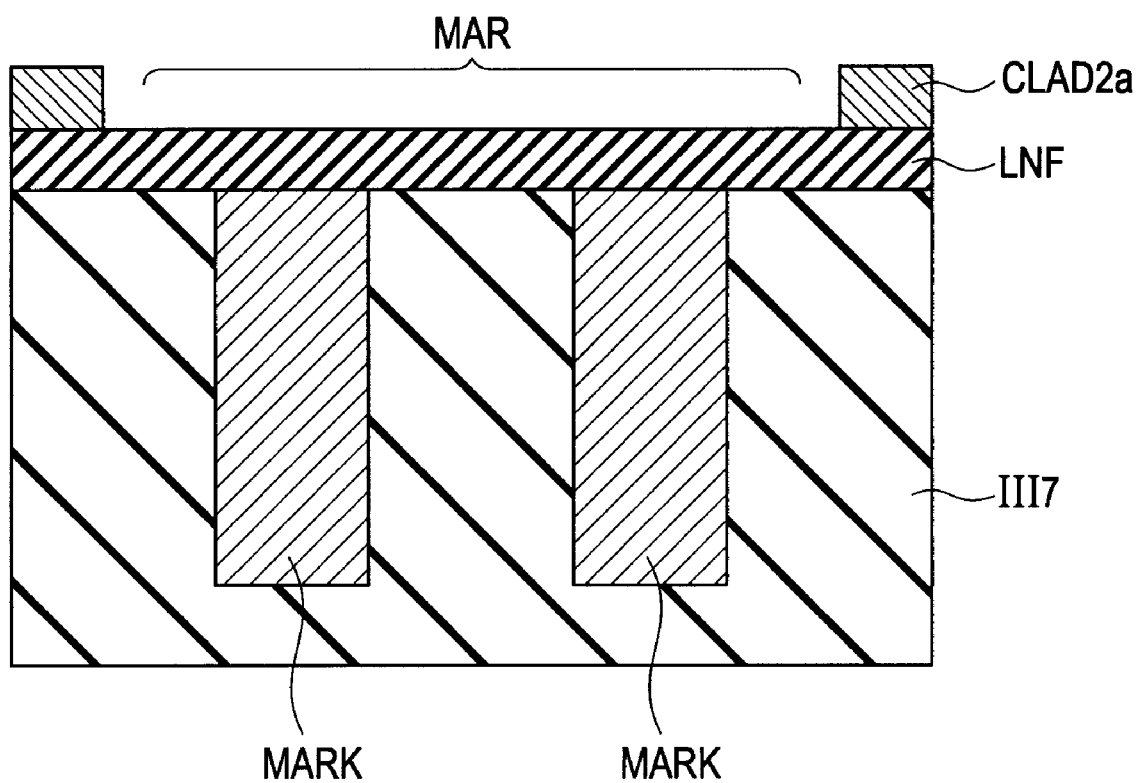

To cope with this, the following measure is taken. As illustrated in FIG. 116, a resist pattern PHR for etching and removing the cladding layer CLAD2a in an area opposed to an area with marks MARK formed therein is patterned. As illustrated in FIG. 117, subsequently, the cladding layer CLAD2a in the area (marking area MAR) with the marks formed therein removed to obtain the cladding layer CLAD2.

This makes is possible to reduce a possibility that the marks MARK are made invisible by the presence of the opaque cladding layer. Therefore, the workability in exposure alignment in photoengraving techniques is enhanced.

Figure 118A:
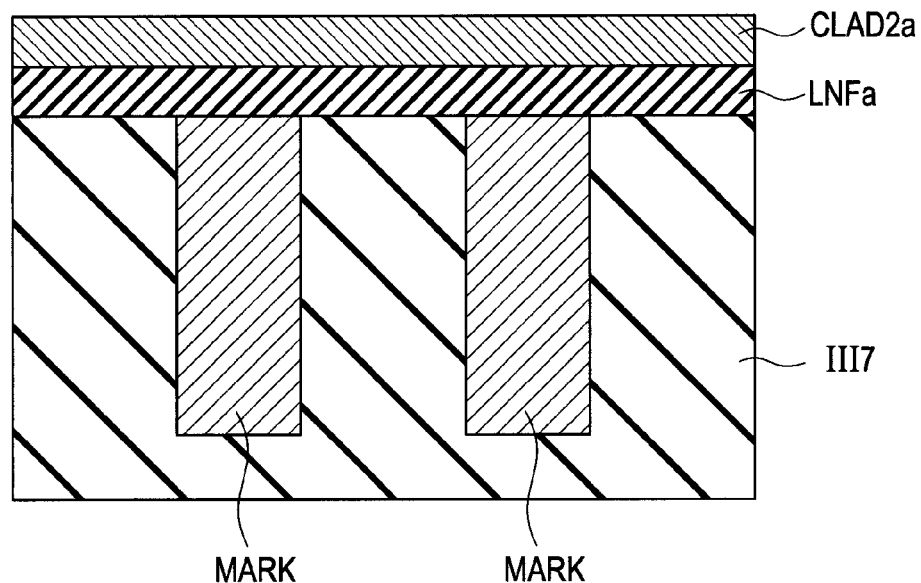

Alternatively, the following method may be used in place of the above-mentioned method to ensure the viewability of the marks MARK:

As illustrated in FIG. 118(A), for example, the width of each mark MARK (in the left and right direction in FIG. 118(A)) is typically 1 μm or so. In this state, it is difficult to view the marks MARK because of the presence of the cladding layer CLAD2a as in the case in FIG. 115.

Figure 118B:
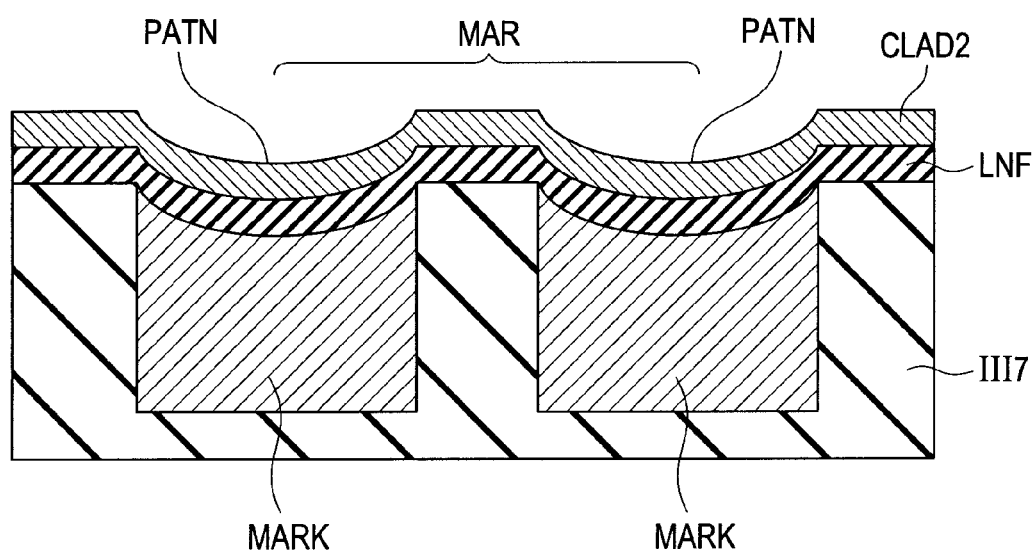

To cope with this, as illustrated in FIG. 118(B), the width of each mark MARK is increased to 4 μm or so and each mark MARK is polished to a certain depth from the upper surface by, for example, CMP processing. The reason why the width of each mark MARK is increased is to facilitate this CMP processing.

Thus, as illustrated in FIG. 118(B), the upper surface of each mark MARK is provided with such a shape that it is curved to the direction along the main surface of the semiconductor substrate SUB (to the concave direction). The liner film LNF and the cladding layer CLAD2 (CLAD2a) are formed thereover. As a result, the liner film LNF and cladding layer CLAD2 (CLAD2a) formed over the marks MARK are also provided with the following shape like the marks MARK positioned thereunder: such a shape that they are curved to the direction along the main surface of the semiconductor substrate SUB (to the concave direction).

As mentioned above, the liner film LNF and the cladding layer CLAD2 (CLAD2a) in the marking area MAR are provided with a pattern PATN having a curved shape, such as a concave shape. Therefore, it is possible to easily view the pattern PATN in the marking area MAR.

The fifth embodiment of the invention is different from the first embodiment of the invention only in the above-mentioned respects. That is, all the respects of the fifth embodiment of the invention that have not been described above, including configuration, condition, procedure, effect, and the like, are in accordance with those of the first embodiment of the invention.

More specific description will be given. The fifth embodiment has been described using the MRAM having the contact portion CNT2 in the first embodiment, illustrated in FIG. 4 to FIG. 7. However, the features of the fifth embodiment may be combined with other semiconductor devices (semiconductor devices having the MRAM illustrated in FIG. 11 to FIG. 13 and FIG. 14 to FIG. 16) in the first embodiment. Further, the dummy patterns DUMMY or the like described in relation to the first embodiment may be used for the fifth embodiment.

Sixth Embodiment

This embodiment is different from the fifth embodiment in the configuration of the second cladding layer. Hereafter, description will be given to the configuration of this embodiment.

In the semiconductor device in the sixth embodiment, the second high permeability film in the fifth embodiment is so configured that the following areas are repetitively arranged in a first direction in which the main surface of the semiconductor substrate is extended: an area where the second high permeability film is arranged and an area where the second high permeability film is not arranged.

Figure 119:
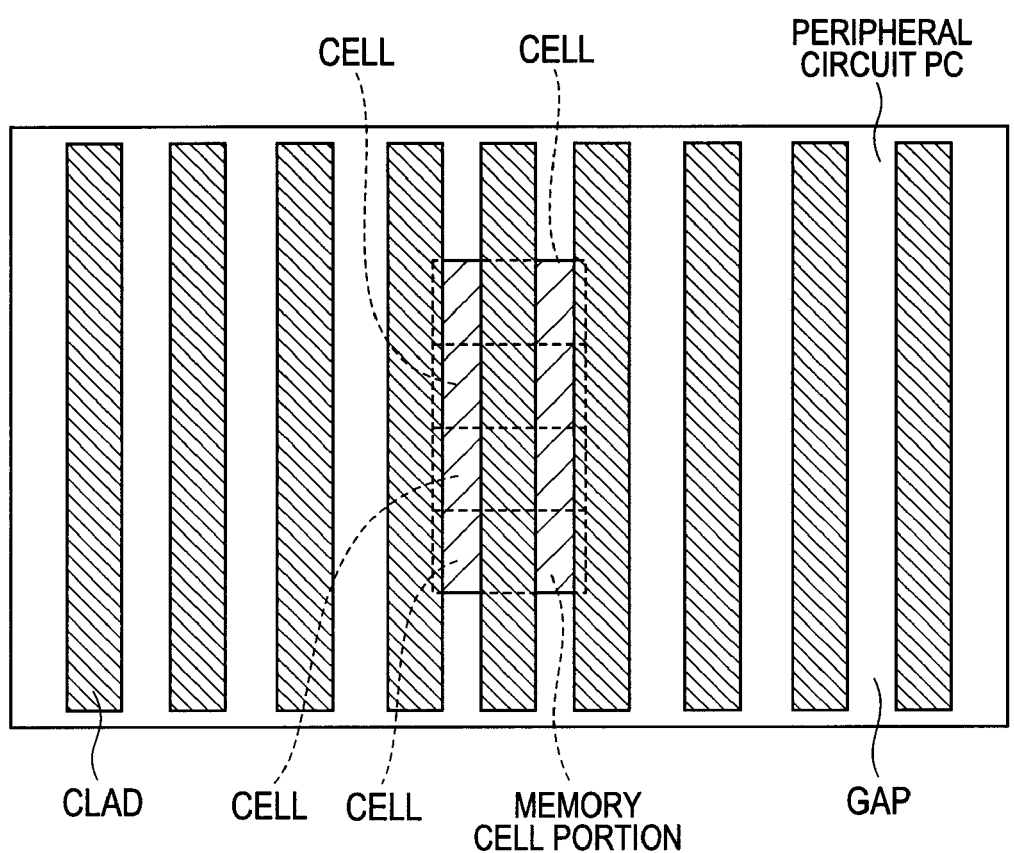

More specific description will be given. In the semiconductor device in the sixth embodiment, as illustrated in FIG. 119, the second cladding layer (cladding layer CLAD) is formed as Ls/Ss in the shape of strip of paper as viewed in a plane. This is similar to the cladding layer CLAD (Refer to FIG. 93) above the bit lines BL and the wiring M5 in the third embodiment, for example.

With respect to the cladding layer CLAD (cladding layer CLAD2) in the third embodiment, however, the Ls/Ss in the shape of strip of paper are arranged only in the peripheral circuit portion and are not arranged in the memory cell portion. Meanwhile, the second cladding layer in this embodiment may be formed also in the memory cell portion as in the peripheral circuit portion. The reason for this is as described below. The second cladding layer is arranged in a position farther from the magnetoresistive elements TMR than the first cladding layer is; therefore, the influence of the presence/absence of the second cladding layer in the memory cell portion is relatively minor. Also in this embodiment, however, the second cladding layer in the form of L/S may be arranged only in the peripheral circuit portion similarly to the cladding layer CLAD in the third embodiment.

FIGS. 120(A) to 120(C) more clearly show FIG. 119 with the upper layer, middle layer (the layer of the first high permeability film), and lower layer separated from one another. FIG. 120(A) illustrates the second cladding layer having the form of L/S as mentioned above. As an example, the middle layer in FIG. 120(B) uses the cladding layer in the second embodiment as the first cladding layer.

In the example in FIG. 120(B), the first cladding layer may be arranged (both directly above a bit line BL and in the other areas) as in FIG. 5 and FIG. 6 in the memory cell portion. Alternatively, the first cladding layer may be arranged only directly above a bit line BL as in FIG. 90 and FIG. 91.

Figure 121:
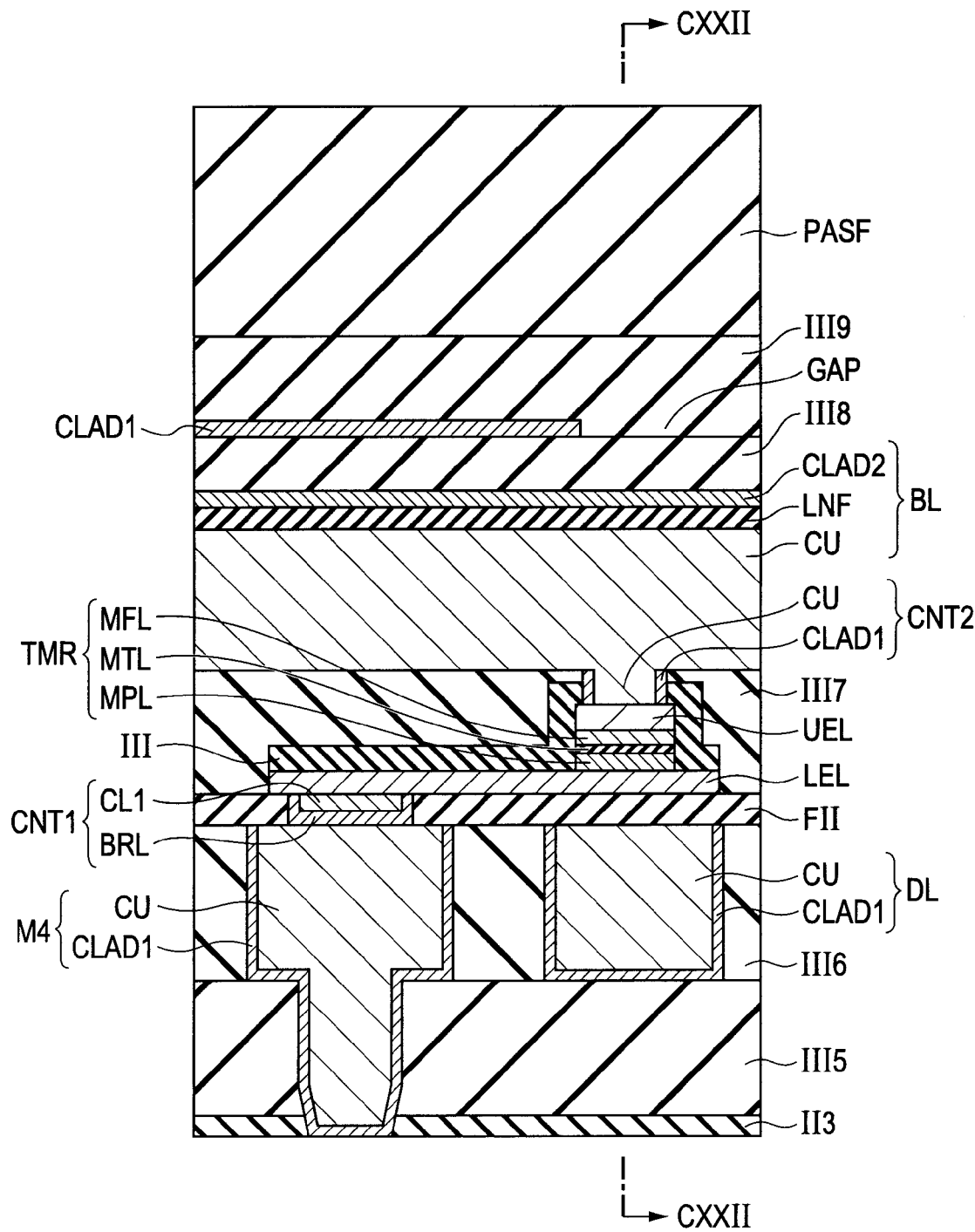
Figure 122:
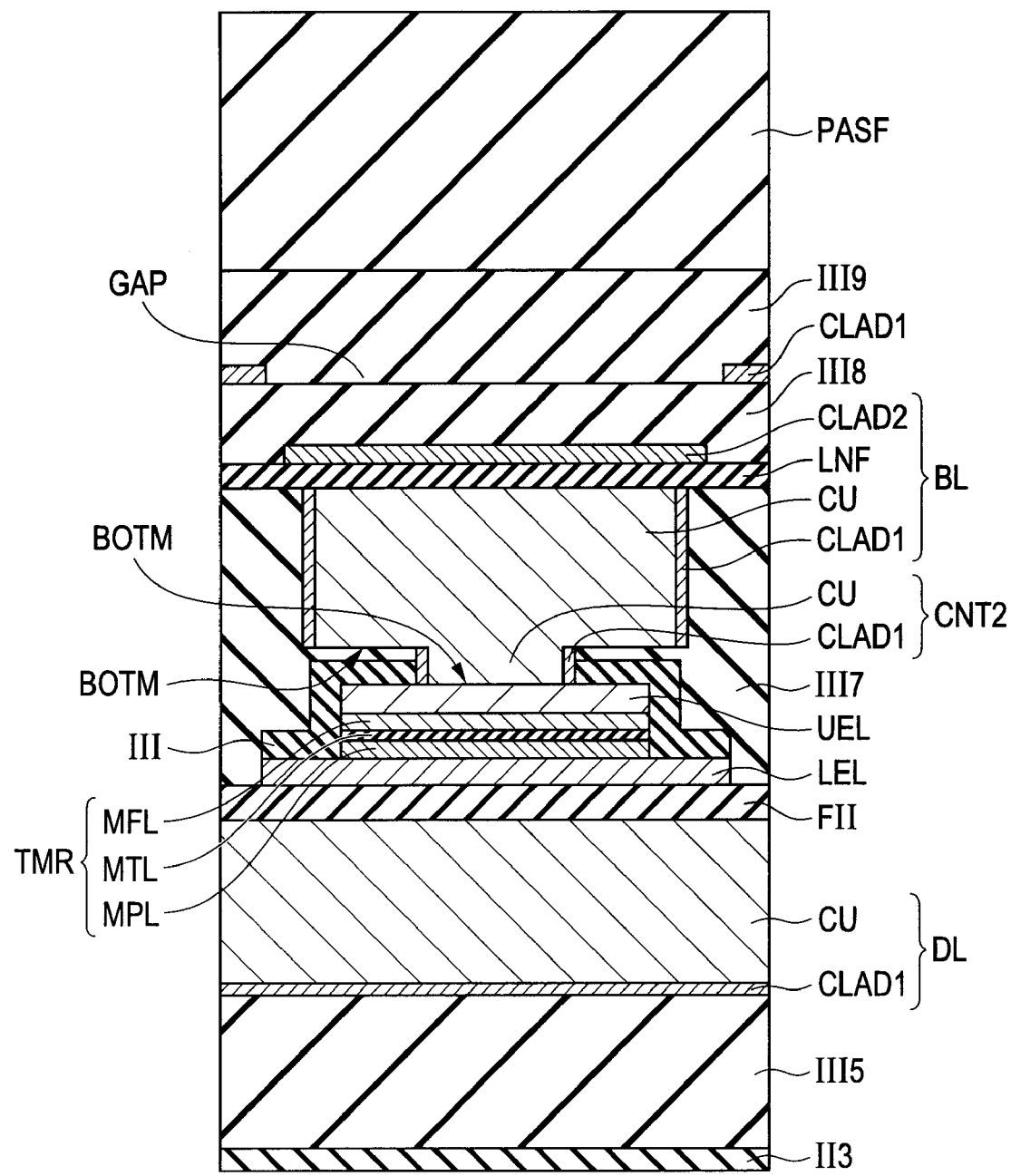

FIG. 121 and FIG. 122 respectively illustrate the configuration of MRAM comprising the semiconductor device in this embodiment illustrated in FIGS. 120(A) to 120(C) as viewed from the same direction as in FIG. 5 and in FIG. 6. FIG. 123 illustrates the configuration of the peripheral circuit portion of the semiconductor device in this embodiment illustrated in FIGS. 120(A) to 120(C) as viewed from the same direction as in FIG. 7. In FIG. 121 to FIG. 123, a gap GAP is depicted in an arbitrary position to schematically explain that a gap GAP in which the second cladding layer is not arranged is formed.

As a modification to the semiconductor device in this embodiment, the following measure may be taken as illustrated in FIG. 124(A), for example: the second cladding layer CLAD has the same form of L/S as in FIG. 120(A) both in the peripheral circuit portion and in the memory cell portion; and the second cladding layer CLAD is so arranged as to cover the entire memory cell portion. At this time, the first cladding layer may be identical with that in FIG. 120(B) (identical with the cladding layer in the second embodiment in FIG. 89(A)) as illustrated in FIG. 124(B). Alternatively, the first cladding layer may be arranged only in the memory cell portion. For how to arranged the first cladding layer in the memory cell portion illustrated in FIG. 124(B), both the configuration in FIG. 5 and FIG. 6 and the configuration in FIG. 90 and FIG. 91 are possible.

Further, the combination, illustrated in FIG. 125(A) to FIG. 125(C), of the second cladding layer illustrated in FIG. 120(A) and the first cladding layer (entirely arranged as in the first embodiment) illustrated in FIG. 103(B) is also possible.

The other respects in the configuration of this embodiment are substantially the same as those of the fifth embodiment. In FIG. 119 to FIG. 128, therefore, the same elements as in the fifth embodiment will be marked with the same reference codes and the description thereof will not be repeated.

Description will be given to a method of manufacturing the semiconductor device in this embodiment. Here, a method of manufacturing the following semiconductor device will be described as an example: a semiconductor device in which the first cladding layer is the cladding layer CLAD2 described in relation to the second embodiment as illustrated in FIG. 120 (A) to FIG. 123.

In the method of manufacturing the semiconductor device in FIG. 120(A) to FIG. 123, the following processing is carried out as illustrated in FIG. 126 and FIG. 127 (memory cell portion) and FIG. 128 (peripheral circuit portion): in addition to the via hole VIA3, a gap GAP is formed in the second cladding layer (cladding layer CLAD1) formed at the manufacturing process step for the semiconductor device illustrated in FIG. 109 to FIG. 111. This method of manufacturing is different from the method of manufacturing the semiconductor device in the fifth embodiment only in this regard.

Description will be given to the operation and working effect of this embodiment. The semiconductor device in this embodiment brings the following effect in addition to the effect of the semiconductor device in the fifth embodiment:

In this embodiment, the second cladding layer CLAD (cladding layer CLAD1) is formed in the shape of strip of paper (L/S). This makes it possible to further enhance the magnetic shielding effect of the memory cell portion against external magnetic fields similarly to the third embodiment in which the cladding layer CLAD2 is formed in the shape of strip of paper. In addition, it is possible to further enhance the adhesion of the second cladding layer to the interlayer insulating film III8 or the interlayer insulating film III9.

The sixth embodiment of the invention is different from the fifth embodiment of the invention only in the above-mentioned respects. That is, all the respects of the sixth embodiment of the invention that have not been described above, including configuration, condition, procedure, effect, and the like, are in accordance with the fifth embodiment of the invention. In other words, a semiconductor device having each configuration mentioned above and the features thereof may be combined with this embodiment.

Seventh Embodiment

This embodiment is different from the sixth embodiment in the configuration of the second cladding layer. Hereafter, description will be given to the configuration of this embodiment.

In the semiconductor device in the seventh embodiment, the following measure is taken with respect to the second high permeability film in the sixth embodiment: the following areas are repetitively arranged not only in a first direction in which the main surface of the semiconductor substrate is extended but also in a second direction orthogonal to the first direction: an area where the cladding layer CLAD is arranged and an area where the cladding layer CLAD is not arranged.

Specifically, as illustrated in FIG. 129, the following measure is taken in the semiconductor device in the seventh embodiment: the second cladding layer (cladding layer CLAD) forms a mesh shape as viewed in a plane similarly to the cladding layer CLAD (Refer to FIG. 101) above the bit lines BL and the wiring M5 in the fourth embodiment, for example.

The cladding layer CLAD (cladding layer CLAD2) in the fourth embodiment is arranged only in the peripheral circuit portion and is not arranged in the memory cell portion. Meanwhile, the second cladding layer in this embodiment may be formed also in the memory cell portion as in the peripheral circuit portion. However, the mesh-shaped second cladding layer in this embodiment may be arranged only in the peripheral circuit portion similarly to the cladding layer CLAD in the fourth embodiment.

FIGS. 130(A) to 130(C) more clearly show FIG. 129 with the upper layer, middle layer (the layer of the first high permeability film), and lower layer separated from one another. As an example, the middle layer in FIG. 130(B) uses the cladding layer in the second embodiment as the first cladding layer. The first cladding layer CLAD may be arranged both in the memory cell portion and in the peripheral circuit portion as illustrated in FIG. 130(B). Alternatively, the first cladding layer may be arranged only over the memory cell portion, for example.

In the example in FIG. 130(B), the first cladding layer may be arranged (both directly above a bit line BL and in the other areas) as in FIG. 5 and FIG. 6 in the memory cell portion. Alternatively, the first cladding layer may be arranged only directly above a bit line BL as in FIG. 90 and FIG. 91.

Further, the following measure may be taken also in this embodiment similarly to the example in FIG. 124(A): the second cladding layer CLAD is arranged in the entire memory cell portion and the mesh-shaped second cladding layer illustrated in FIG. 130(A) is arranged in the peripheral circuit portion.

The method of manufacturing the semiconductor device in this embodiment is the same as that in the sixth embodiment except the pattern of the second cladding layer as viewed in a plane is different from that in the sixth embodiment.

The operation and working effect of this embodiment are also basically identical with those of the sixth embodiment. The seventh embodiment of the invention is different from the sixth embodiment of the invention only in the above-mentioned respects. That is, all the respects of the seventh embodiment of the invention that have not been described above, including configuration, condition, procedure, effect, and the like, are in accordance with the sixth embodiment of the invention. In other words, a semiconductor device having each configuration mentioned above and the features thereof may be combined with this embodiment.

Eighth Embodiment

This embodiment is different from the first embodiment and the fifth embodiment in the number of cladding layers covering the memory cell portion and the peripheral circuit portion. Hereafter, description will be given to the configuration of this embodiment.

In the semiconductor device in the eighth embodiment, the following film is additionally arranged (laminated) above the second high permeability film at a distance from the second high permeability film: a high permeability film (third high permeability film in this case) different from the first high permeability film and the second high permeability film.

FIGS. 131(A) to 131(D) illustrate the semiconductor device in this embodiment with each high permeability film separated on a layer-by-layer basis, similarly to, for example, FIGS. 3(A) and 3(B) and FIGS. 103(A) to 103(C). More specific description will be given. FIG. 131(A) illustrates the third high permeability film (hereafter, referred to as "third cladding layer") arranged at the uppermost level (on the opposite side to the semiconductor substrate SUB) of the cladding layers CLAD covering the circuitry. FIG. 131(B) illustrates the cladding layer CLAD as the second high permeability film as in the fifth embodiment to the seventh embodiment. FIG. 131(C) illustrates the cladding layer CLAD as the first high permeability film as in the fifth embodiment to the seventh embodiment. FIG. 131(D) illustrates the lower layer (memory cell portion and peripheral circuit portion) covered with the cladding layers in FIGS. 131(A), 131(B), and 131(C).

In FIG. 131(A) to FIG. 131(C), the first cladding layer, second cladding layer, and third cladding layer are respectively (entirely) arranged both in the memory cell portion and in the peripheral circuit portion. However, for example, the first cladding layer may be arranged only in the memory cell portion. In this case, for how the first cladding layer is arranged in the memory cell portion, it may be entirely arranged as illustrated in FIG. 5 and FIG. 6 or may be arranged only directly above a bit line BL as illustrated in FIG. 90 and FIG. 91.

The way to arrange the second cladding layer or the third cladding layer is not limited to the mode illustrated in FIGS. 131(A) to 131(D). Any of the ways to arrange a cladding layer, described above in relation to the above embodiments, can be selected.

FIG. 132 and FIG. 133 respectively illustrate the configuration of MRAM comprising the semiconductor device in this embodiment illustrated in FIGS. 131(A) to 131(D) as viewed from the same direction as in FIG. 5 and in FIG. 6. FIG. 134 illustrates the configuration of the peripheral circuit portion of the semiconductor device in this embodiment illustrated in FIGS. 131(A) to 131(D) as viewed from the same direction as in FIG. 7.

With respect to the semiconductor device illustrated in FIG. 131(A) to FIG. 134, the first cladding layer is identical with the cladding layer CLAD2 in the first embodiment; and the second cladding layer and the third cladding layer are identical with the cladding layer CLAD1 in the fifth embodiment. That is, all of these cladding layers are so formed as to cover substantially the entire memory cell portion and peripheral circuit portion. However, these cladding layers may be obtained by appropriately combining cladding layers in the embodiments mentioned above.

FIG. 131(A) to FIG. 134 show a semiconductor device of a three-layer configuration in which three cladding layers are laminated. Instead, a semiconductor device may be so configured that four or more cladding layers are laminated.

The third cladding layer is sandwiched between the interlayer insulating film III9 and an interlayer insulating film III10. It is configured similarly to the second cladding layer sandwiched between the interlayer insulating film III8 and the interlayer insulating film III9. Therefore, the cladding layer CLAD1 having a three-layer structure is used for the third cladding layer similarly to the second cladding layer. Instead, however, the cladding layer CLAD2 having a two-layer structure or the single-layer high permeability film MAG may be used for the third cladding layer.

Also with respect to the third cladding layer, as illustrated in FIG. 133, it is desirable that its thickness W4 should be larger than the thickness W1 similarly to the thickness W2 of the first cladding layer and the thickness W3 of the second cladding layer.

The operation and working effect of the semiconductor device in this embodiment are basically equivalent to those obtained by making more outstanding the operation and working effect of the semiconductor device in the fifth embodiment. More specific description will be given. When the number of cladding layers over the bit lines BL and the wiring M5 is increased from two to three, the total volume of the cladding layers is increased. Therefore, the influence of external magnetic fields can be more reliably reduced.

Especially, the third cladding layer is arranged in a position farther away from the magnetoresistive elements TMR than the first cladding layer and the second cladding layer are. For this reason, the effect of an external magnetic field being induced to a place far away from the magnetoresistive elements TMR can be further enhanced by providing the third cladding layer.

The eighth embodiment of the invention is different from the first embodiment and fifth embodiment of the invention only in the above-mentioned respects. That is, all the respects of the eighth embodiment of the invention that have not been described above, including configuration, condition, procedure, effect, and the like, are in accordance with the first embodiment and fifth embodiment of the invention. In other words, a semiconductor device having each configuration mentioned above and the features thereof may be combined with this embodiment.

Ninth Embodiment

In each semiconductor device in the first embodiment to the eighth embodiment described above, the high permeability films (cladding layers) that bring the magnetic shielding effect are formed as follows: they are configured as one thin film included in a laminated structure comprising the semiconductor device by such a technique as sputtering. The semiconductor device may be provided with such a structure that the following structure is superposed aside from a high permeability film (cladding layer) formed at a process for the semiconductor device itself: a structure prepared in advance and formed of the same material as that of the high permeability film. This structure is superposed from outside the finished semiconductor device (a semiconductor chip including multiple elements, such as MRAMs).

The structure obtained by superposing a structure formed of the same material as that of the high permeability film from outside the semiconductor chip will be designated here as semiconductor device assembly.

In the semiconductor device assembly in this embodiment, as illustrated in FIG. 135 and FIG. 136, a flat plate-like high magnetic permeability material MAG formed of the same material as that of the above-mentioned high permeability film MAG is stuck. The flat plate-like high magnetic permeability material MAG is stuck to above (over the upper main surface) and under (over the lower main surface) of the following semiconductor substrate SUB: a semiconductor substrate SUB in which a semiconductor device in any of the first embodiment to the eighth embodiment is formed (semiconductor chip SCC).

It is desirable that the thickness of the high magnetic permeability material MAG in the up and down direction in FIG. 136 should be larger than those of the above-mentioned cladding layers CLAD (first cladding layer, second cladding layer, and the like). Specifically, it is desirable that the thickness of the high magnetic permeability material MAG should be not less than 10 µm and not more than 500 µm; and it is more desirable that the thickness should be not less than 50 µm and not more than 200 µm. It is desirable that what obtained by cutting a substrate formed of such a high magnetic permeability material MAG into a desired size should be used as the high magnetic permeability materials MAG bonded to the semiconductor chip SCC.

The high magnetic permeability material MAG is stuck to the upper and lower main surfaces of the semiconductor chip SCC by, for example, sticking it with paste at an assembly step after the semiconductor device (semiconductor chip SCC) is finished. The high magnetic permeability materials MAG are thereby integrated with the semiconductor chip SCC.

The semiconductor chip SCC with the high magnetic permeability materials MAG arranged thereover is placed over a die pad DIE and then used.

The die pad DIE is a member used to fix the semiconductor chip SCC in a desired position. The die pad DIE functions to efficiently radiate heat produced by the semiconductor chip SCC. For this reason, it is desirable that the die pad DIE should be formed of a material, such as copper (Cu), high in thermal conductivity.

To place the semiconductor chip SCC with the high magnetic permeability materials MAG arranged thereover over the die pad DIE, it is desirable to use adhesive composed of epoxy resin or conductive material, such as sliver (Ag).

In FIG. 135 and FIG. 136, the high magnetic permeability material MAG on the upper side of the semiconductor chip SCC is substantially identical with the semiconductor chip SCC in area as viewed in a plane. That is, this high magnetic permeability material MAG is so arranged as to cover substantially the entire memory cell portion and peripheral circuit portion of the semiconductor chip SCC.

Meanwhile, the high magnetic permeability material MAG on the lower side of the semiconductor chip SCC is slightly larger than the semiconductor chip SCC in area as viewed in a plane. This is because the area of the die pad DIE as viewed in a plane is larger than that of the semiconductor chip. Therefore, the high magnetic permeability material MAG on the lower side of the semiconductor chip SCC may also be made identical with the semiconductor chip SCC in area as viewed in a plane.

Description will be given to the operation and working effect of the above-mentioned semiconductor device assembly. The semiconductor device assembly brings the following effect in addition to the effect of the semiconductor devices in the first embodiment to the eighth embodiment:

The high magnetic permeability materials MAG of the semiconductor device assembly have the same magnetic shielding effect as that of the above-mentioned high permeability films (cladding layers). Therefore, the following can be implemented by bonding the external high magnetic permeability materials MAG to a semiconductor device (semiconductor chip SCC): the magnetic shielding effect can be further enhanced as compared with cases where a cladding layer singly exists.

In general, the high magnetic permeability material MAG is larger in thickness than the high permeability film MAG. For this reason, the high magnetic permeability material MAG is generally larger in volume than the high permeability film MAG. Provision of thick high magnetic permeability materials MAG makes it possible to further enhance the effect of inducing an external magnetic field to an area farther away upward from the magnetoresistive elements TMR in the semiconductor device assembly. That is, the magnetic shielding effect brought by the high magnetic permeability materials MAG can be further enhanced.

The high magnetic permeability material MAG is not formed by sputtering unlike the high permeability film MAG. For this reason, the high magnetic permeability material MAG is higher in mechanical strength than the high permeability film MAG as a thin film. Therefore, the magnetic shielding effect can be further stabilized by providing the high magnetic permeability materials MAG.

The die pad DIE may have the magnetic shielding effect depending on the material composing the die pad DIE. In this case, the magnetic shielding effect of the semiconductor device assembly can be further enhanced.

Description will be given to how the above-mentioned semiconductor device assembly is sealed. It is desirable that the semiconductor device assembly should be used as is sealed in a package or the like.

This makes it possible to suppress such problems as malfunction of a fine circuit incorporated in the formed semiconductor device (semiconductor chip) due to the influence of foreign matter, such as particles and moisture. Further, it is possible to suppress such problems as abnormal operation of the circuit under the influence of light.

Possible package configurations include SOP (Small Outline Package) illustrated in FIG. 137 and BGA (Ball Grid Array package) illustrated in FIG. 138. FIG. 137 and FIG. 138 illustrate the semiconductor device assembly as viewed from the direction of the arrow on the left of FIG. 135.

The package SOP formed of, for example, epoxy resin illustrated in FIG. 137 is provided with a lead frame FRAME. The lead frame FRAME is a wiring used to couple the semiconductor chip SCC with the wiring of an external board or the like. The lead frame FRAME is comprised of a metal plate of, for example, an iron-nickel (Fe—Ni) alloy, copper, or the like.

The lead frame FRAME and the semiconductor chip SCC are coupled with each other through a bonding wiring WIR- ING composed of, for example, aluminum (Al) or gold (Au). Each member arranged inside the package SOP is sealed with sealing resin RESIN.

Meanwhile, the package BGA formed of, for example, epoxy resin illustrated in FIG. 138 includes: a package substrate PSUB arranged thereunder (on the die pad DIE side), terminal portions EE, joining portions CON, and solder balls BALL.

The terminal portions EE are arranged over the upper main surface of the package substrate PSUB. The solder balls BALL are arranged under the package substrate PSUB and used for coupling with an external board or the like similarly to the lead frame FRAME of the package SOP.

The multiple joining portions CON are arranged over the lower main surface of the package substrate PSUB so that they are juxtaposed as viewed in a plane. The joining portions CON electrically couple the terminal portions EE and the solder balls BALL with each other. The semiconductor chip SCC and the terminal portions EE are electrically coupled with each other through a bonding wiring WIRING.

The die pad DIE with the semiconductor device assembly placed thereover is fixed over the upper main surface of the package substrate PSUB. Also for this fixation, it is desirable to use adhesive composed of epoxy resin or conductive material, such as silver (Ag). Each member arranged inside the package BGA is sealed with sealing resin RESIN.

The high magnetic permeability materials MAG may be arranged as in the above-mentioned semiconductor device assembly. Alternatively, they may be arranged as described below. Hereafter, description will be given to each modification to this embodiment.

As illustrated in FIG. 139 and FIG. 140, the following measure is taken in the semiconductor device assembly in one modification to this embodiment: the area of the first high magnetic permeability material (high magnetic permeability material MAG) arranged above the semiconductor chip SCC in the direction along the main surfaces of the semiconductor substrate (as viewed in a plane) is smaller than the following area: the area of the second high magnetic permeability material (high magnetic permeability material MAG) arranged under the semiconductor chip SCC in the direction along the main surfaces of the semiconductor substrate.

More specific description will be given. For example, the first high magnetic permeability material MAG is so arranged as to cover only substantially the entire memory cell portion (cell regions CELL) from above. As illustrated in FIG. 139 and FIG. 140, the peripheral circuit portion, especially, its area close to the memory cell portion may also be covered with the first high magnetic permeability material MAG.

In FIG. 139, each cell region CELL in the memory cell portion is in a rectangular shape as viewed in a plane; however, it may have any shape, such as circular or oval. Accordingly, for example, the first high magnetic permeability material MAG may also have any shape as viewed in a plane.

How the semiconductor device assembly in FIG. 139 and FIG. 140 is sealed in respective packages in FIG. 137 and FIG. 138 is as illustrated in FIG. 141 and FIG. 142. FIG. 141 and FIG. 142 also show the semiconductor device assembly as viewed from the direction of the arrow in FIG. 139.

The other respects in the configuration of this modification are substantially the same as those of the semiconductor device assembly in FIG. 135 to FIG. 138. In FIG. 139 to FIG. 142, therefore, the same elements as in FIG. 135 to FIG. 138 will be marked with the same reference codes and the description thereof will not be repeated.

Description will be given to the operation and working effect of the semiconductor device assembly in FIG. 139 to FIG. 142. The semiconductor device assembly in FIG. 139 to FIG. 142 brings the following effect in addition to the effect of the semiconductor device assembly in FIG. 135 to FIG. 138:

The first high magnetic permeability material MAG is arranged only above the memory cell portion (cell regions CELL). Therefore, the high magnetic permeability materials MAG are separated between the memory cell portion and the peripheral circuit portion similarly to the cladding layers CLAD in the second embodiment and the third embodiment. Therefore, it is possible to further enhance the magnetic shielding effect for the memory cell portion against a magnetic field generated by a current flowing through the wiring in the peripheral circuit portion.

Further, the shape of the memory cell portion or each cell region CELL as viewed in a plane could be changed from rectangular to, for example, near-square rectangular or circler. In this case, the shape of the first high magnetic permeability material MAG also becomes that with a lower aspect ratio than oblong, for example, near-square rectangular or circler. Thus an unnecessarily long area as viewed in a plane does not exist in the first high magnetic permeability material MAG. For this reason, it is possible to reduce a possibility that the first high magnetic permeability material MAG takes in extra magnetic flux from the peripheral circuit portion or the like along the long area.

That is, the magnetic shielding effect of the first high magnetic permeability material MAG can be further enhanced by changing the shape of the first high magnetic permeability material MAG as viewed in a plane.

Further, the following modification to the semiconductor device assembly is possible. As illustrated in FIG. 143 and FIG. 144, the following measure is taken in another modification to the semiconductor device assembly in this embodiment: multiple memory cell portions of the semiconductor device are juxtaposed at intervals in the direction along the main surfaces of the semiconductor substrate (as viewed in a plane).

In each of the above-mentioned embodiments and each modification to the ninth embodiment, multiple cell regions CELL succeed as viewed in a plane to form one memory cell portion. In this modification, meanwhile, multiple cell regions CELL are separated from one another as viewed in a plane and the memory cell portion is also accordingly divided.

Also in the example in FIG. 143 to FIG. 144, as in the example in FIG. 139 to FIG. 142, the first high magnetic permeability material MAG is so arranged that it covers only the memory cell portions from above. Therefore, the first high magnetic permeability material MAG is also divided so that multiple first high magnetic permeability materials MAG are juxtaposed as viewed in a plane similarly to the cell regions CELL.

How the semiconductor device assembly in FIG. 143 and FIG. 144 is sealed in respective packages in FIG. 137 and FIG. 138 is as illustrated in FIG. 145 and FIG. 146. With respect to how the divided memory cell portions are arranged, for example, that illustrated in FIG. 147 and FIG. 148 is possible, aside from that illustrated in FIG. 143 and FIG. 144.

The other respects in the configuration of this modification are substantially the same as those of the semiconductor device assembly in FIG. 135 to FIG. 138. In FIG. 143 to FIG. 148, therefore, the same elements as in FIG. 135 to FIG. 138 will be marked with the same reference codes and the description thereof will not be repeated.

Description will be given to the operation and working effect of the semiconductor device assemblies in FIG. 143 to FIG. 148. The semiconductor device assemblies in FIG. 143 to FIG. 148 bring the following effect in addition to the semiconductor device assembly in the one modification to this embodiment illustrated in FIG. 139 to FIG. 142:

When the memory cell portion is divided so that multiple cell regions CELL are arranged in areas distant from one another as viewed in a plane as in these modifications, the following is implemented: the influence of a magnetic field to be exerted on a different cell region CELL on the magnetoresistive element TMR, such as MRAM, formed in one cell region CELL of the multiple cell regions CELL is suppressed.

That is, the following can be implemented similarly to the magnetic shielding effect due to the formation of the cladding layer CLAD2 only directly above a bit line BL in, for example, the second embodiment: the magnetic shielding effect of the first high magnetic permeability material MAG against external magnetic fields between memory cell portions can be further enhanced.

From a different viewpoint, the areas sandwiched between multiple cell regions CELL (memory cell area) as viewed in a plane are areas where such an element as MRAM is not arranged. That is, in these areas, no problem arises in terms of the operation of each magnetoresistive element TMR even though a leaked external magnetic field flows in, for example.

That is, the inflow of external magnetic fields to the memory cell portions can be more reliably suppressed by intentionally forming such an area where the inflow of external magnetic fields is permissible in each of as narrow ranges as possible as viewed in a plane.

In the above-mentioned semiconductor device assemblies illustrated in FIG. 135 to FIG. 148, the provision of such a lower high permeability film MAG as shown in the sectional view in FIG. 136, for example, may be omitted.

Further, the following modification to the semiconductor device assembly is possible. As illustrated in FIG. 149 and FIG. 150, the following measure is taken in further another modification to the semiconductor device assembly in this embodiment: the first high magnetic permeability material MAG and the second high magnetic permeability material MAG are coupled with each other through a third high magnetic permeability material MAG arranged in the outer region of the semiconductor device.

The outer region of the semiconductor device cited here refers to the outer region (outer edge portion) of the semiconductor substrate as viewed in a plane. That is, as illustrated in FIG. 149 and FIG. 150, a third high magnetic permeability material MAG is arranged in addition to the following high magnetic permeability materials MAG: the first high magnetic permeability material MAG covering the upper main surface of the semiconductor chip SCC from above; and the second high magnetic permeability material MAG covering the lower main surface of the semiconductor chip SCC from below. The third high magnetic permeability material MAG is extended in the direction of the thickness of the semiconductor chip SCC (the up and down direction in FIG. 150). It is so arranged as to couple the first high magnetic permeability material MAG and the second high magnetic permeability material MAG with each other.

The third high magnetic permeability material MAG is so arranged that it intersects both with the first high magnetic permeability material MAG and with the second high magnetic permeability material MAG. The first, second, and third high magnetic permeability materials MAG are so arranged that they cover the semiconductor chip SCC, especially, its area located on the left of FIG. 149.

The first high magnetic permeability material MAG is so arranged as to substantially cover only the memory cell portion from above.

How the semiconductor device assembly in FIG. 149 and FIG. 150 is sealed in respective packages in FIG. 137 and FIG. 138 is as illustrated in FIG. 151 and FIG. 152.

The other respects in the configuration of this modification are substantially the same as those of the semiconductor device assembly in FIG. 135 to FIG. 138. In FIG. 149 to FIG. 152, therefore, the same elements as in FIG. 135 to FIG. 138 will be marked with the same reference codes and the description thereof will not be repeated.

Description will be given to the operation and working effect of the semiconductor device assembly in FIG. 149 to FIG. 152. In the semiconductor device assembly illustrated in FIG. 149 to FIG. 152, high magnetic permeability materials MAG are so arranged as to encircle the memory cell portion from two directions: the direction along the main surfaces of the semiconductor chip SCC and the direction of the thickness of the semiconductor chip SCC. For this reason, it is possible to further enhance the magnetic shielding effect against external magnetic fields as compared with cases where a high magnetic permeability material MAG is arranged only over a main surface of the semiconductor chip SCC.

Up to this point, description has been given to various modifications to the ninth embodiment. However, multiple modifications described here may be appropriately combined. A combination of various modifications to the ninth embodiment may be appropriately combined with any of the various semiconductor devices in the first embodiment to the eighth embodiment.

The embodiments disclosed here are just examples in every respect and they should not be considered to be limitative. The scope of the invention is indicated by "What is claimed is," not by the above description. It is intended that all the modifications within the meaning and scope equivalent to "What is claimed is" are included in the invention.

The invention can be especially advantageously applied to a semiconductor device including an element, such as MRAM, for storage and an assembly using this semiconductor device.

What is claimed is:
1. A semiconductor device comprising:
a semiconductor substrate;
a switching element formed over a main surface of the semiconductor substrate;
an interlayer insulating film formed so as to cover the switching element;
a flat plate-like wiring formed over the interlayer insulating film;
a coupling wiring coupling the flat plate-like wiring and the switching element with each other;
a magnetoresistive element including a magnetization free layer the orientation of magnetization of which is variable and formed over the flat plate-like wiring; and
a wiring positioned above the magnetoresistive element, extended in the direction along the main surface, and capable of changing the magnetization state of the magnetization free layer,
wherein in a memory cell area where a plurality of the magnetoresistive elements are arranged, a first high permeability film arranged above the magnetoresistive elements covers both the memory cell area and a peripheral area as an area other than the memory cell area, and
wherein the first high permeability film arranged over the memory cell area is separated from the first high permeability film arranged above the peripheral area.

2. The semiconductor device according to claim 1,
wherein a second high permeability film is additionally provided above the first high permeability film at a distance from the first high permeability film.

3. The semiconductor device according to claim 2,
wherein with respect to the second high permeability film, an area where the second high permeability film is arranged and an area where the second high permeability film is not arranged are repetitively arranged in a first direction in which the main surface is extended.

4. The semiconductor device according to claim 3,
wherein with respect to the second high permeability film, an area where the second high permeability film is arranged and an area where the second high permeability film is not arranged are alternately arranged in a second direction orthogonal to the first direction.

5. The semiconductor device according to claim 2,
wherein one or more high permeability films different from the first high permeability film and the second high permeability film are provided above the second high permeability film at a distance from the second high permeability film.

6. The semiconductor device according to claim 5,
wherein in the first high permeability film, the second high permeability film, or the high permeability films, a marking area obtained by removing part thereof as viewed in a plane is arranged.

7. The semiconductor device according to claim 5,
wherein a marking area is arranged in the first high permeability film, the second high permeability film, or the high permeability films, and
wherein a pattern formed in the marking area has a curved shape with respect to the direction along the main surface.

8. A semiconductor device assembly, comprising:
a flat plate-like high magnetic permeability material arranged above and below a semiconductor device according to claim 1 so as to be opposite to a main surface of the semiconductor device.

9. The semiconductor device assembly according to claim 8,
wherein the area of a first high magnetic permeability material, arranged above the semiconductor device, of the high magnetic permeability materials in the direction along the main surface is smaller than the area of a second high magnetic permeability material arranged under the semiconductor device in the direction along the main surface.

10. The semiconductor device assembly according to claim 9,
wherein the first high magnetic permeability material has an area sufficient to cover the entire memory cell area from above in the direction along the main surface.

11. The semiconductor device assembly according to claim 10,
wherein a plurality of the memory cell areas are juxtaposed at intervals in the direction along the main surface.

12. The semiconductor device assembly according to claim 9,
wherein the first high magnetic permeability material and the second high magnetic permeability material are coupled with each other through a third high magnetic permeability material arranged in the outer region of the semiconductor device.

13. A semiconductor device comprising:
a semiconductor substrate:
a switching element formed over a main surface of the semiconductor substrate;
an interlayer insulating film formed so as to cover the switching element;
a flat plate-like wiring formed over the interlayer insulating film;
a coupling wiring coupling the flat plate-like wiring and the switching element with each other;
a magnetoresistive element including a magnetization free layer the orientation of magnetization of which is variable and formed over the flat plate-like wiring; and
a wiring position above the magnetoresistive element, extended to the direction along the main surface, and capable of changing the magnetization state of the magnetization free layer,
wherein in a memory cell area where a plurality of the magnetoresistive elements are arranged, a first high permeability film arranged above the magnetoresistive elements covers both the memory cell area and a peripheral area as an area other than the memory cell area,
wherein with respect to the first high permeability film, an area where the first high permeability film is arranged and an area where the first high permeability film is not arranged are alternately arranged in both a first direction in which the main surface is extended and a second direction orthogonal to the first direction.

14. A semiconductor device comprising:
a semiconductor substrate:
a switching element formed over a main surface of the semiconductor substrate;
an interlayer insulating film formed so as to cover the switching element;
a flat plate-like wiring formed over the interlayer insulating film;
a coupling wiring coupling the flat plate-like wiring and the switching element with each other;
a magnetoresistive element including a magnetization free layer the orientation of magnetization of which is variable and formed over the flat plate-like wiring; and
a wiring position above the magnetoresistive element, extended in the direction along the main surface, and capable of changing the magnetization state of the magnetization free layer,
wherein in a memory cell area where a plurality of the magnetoresistive elements are arranged, a first high permeability film arranged above the magnetoresistive elements covers a peripheral area as an area outside of the memory cell area, and
wherein with respect to the first high permeability film, an area where the first high permeability film is arranged and an area where the first high permeability film is not arranged are alternately arranged in both a first direction in which the main surface is extended and a second direction orthogonal to the first direction.

* * * * *